US012652341B2

(12) United States Patent
Monaco et al.

(10) Patent No.: US 12,652,341 B2
(45) Date of Patent: Jun. 9, 2026

(54) HANDHELD ELECTRONIC DEVICE HAVING A CHASSIS SECTION WITH A BATTERY MOUNTING RECESS

(71) Applicant: Apple Inc., Cupertino, CA (US)

(72) Inventors: Devon A. Monaco, San Jose, CA (US); Benjamin J. Pope, Woodside, CA (US); Douglas G. Fournier, San Jose, CA (US); Michael W. Firka, Santa Clara, CA (US); Yaocheng Zhang, Cupertino, CA (US)

(73) Assignee: APPLE INC., Cupertino, CA (US)

( * ) Notice: Subject to any disclaimer, the term of this patent is extended or adjusted under 35 U.S.C. 154(b) by 433 days.

(21) Appl. No.: 17/903,952

(22) Filed: Sep. 6, 2022

(65) Prior Publication Data

US 2023/0224387 A1     Jul. 13, 2023

Related U.S. Application Data

(60) Provisional application No. 63/298,182, filed on Jan. 10, 2022.

(51) Int. Cl.
  *H04M 1/02*       (2006.01)
  *G06F 1/20*       (2006.01)
        (Continued)

(52) U.S. Cl.
  CPC .......... *H04M 1/0264* (2013.01); *G06F 1/203* (2013.01); *G06F 3/016* (2013.01); *G06F 3/0488* (2013.01);
        (Continued)

(58) Field of Classification Search
  CPC ........ G06F 1/203; G06F 3/016; G06F 3/0488; G09G 3/18; H02K 33/02; H04M 1/0202;
        (Continued)

(56) References Cited

U.S. PATENT DOCUMENTS

| | | | |
|---|---|---|---|
| 2,798,895 A | 7/1957 | Nowotny | |
| 2,798,896 A | 7/1957 | Bly | |

(Continued)

FOREIGN PATENT DOCUMENTS

| | | | | |
|---|---|---|---|---|
| CN | 101702412 | 5/2010 | | |
| CN | 111182101 A | * 5/2020 | .............. | H04M 1/18 |

(Continued)

*Primary Examiner* — German Viana Di Prisco
(74) *Attorney, Agent, or Firm* — Brownstein Hyatt Farber Schreck, LLP

(57) ABSTRACT

A mobile phone may include a display, an enclosure enclosing the display and including a front cover positioned over the display and defining a front exterior surface, and a housing component coupled to the front cover and defining a chassis section below the front cover. The chassis section may define a first side facing the front cover, a second side opposite the first side and defining a battery mounting region, a first recess formed along the second side in the battery mounting region, and a second recess formed along the second side in the battery mounting region. The mobile phone may further include a battery coupled to the chassis section in the battery mounting region, a first adhesive positioned in the first recess and adhering the battery to the chassis section, and a second adhesive positioned in the second recess and adhering the battery to the chassis section.

17 Claims, 59 Drawing Sheets

(51) Int. Cl.

| | |
|---|---|
| *G06F 3/01* | (2006.01) |
| *G06F 3/0488* | (2022.01) |
| *G09G 3/18* | (2006.01) |
| *H02K 33/02* | (2006.01) |
| *H04N 23/51* | (2023.01) |
| *H04N 23/55* | (2023.01) |
| *H04N 23/90* | (2023.01) |
| *H05K 7/20* | (2006.01) |

(52) U.S. Cl.
CPC .............. *G09G 3/18* (2013.01); *H02K 33/02* (2013.01); *H04M 1/0202* (2013.01); *H04M 1/0262* (2013.01); *H04M 1/0266* (2013.01); *H04N 23/51* (2023.01); *H04N 23/55* (2023.01); *H04N 23/90* (2023.01); *H05K 7/20481* (2013.01); *H05K 7/205* (2013.01); *H04M 2201/08* (2013.01); *H04M 2201/38* (2013.01)

(58) Field of Classification Search
CPC ............. H04M 1/0262; H04M 1/0266; H04M 2201/08; H04M 2201/38; H05K 7/20481; H05K 7/205
USPC .................................. 455/575.1, 550.1, 572
See application file for complete search history.

(56) References Cited

U.S. PATENT DOCUMENTS

| | | | |
|---|---|---|---|
| 4,152,825 | A | 5/1979 | Bruneau |
| 4,344,603 | A | 8/1982 | Hozumi |
| 4,455,026 | A | 6/1984 | Pinkus |
| 4,709,202 | A | 11/1987 | Koenck et al. |
| 5,238,222 | A | 8/1993 | Sumida |
| 5,396,163 | A | 3/1995 | Nor et al. |
| 5,580,676 | A | 12/1996 | Honda et al. |
| 5,736,834 | A | 4/1998 | Kuno |
| 5,895,440 | A | 4/1999 | Proctor et al. |
| 6,106,973 | A | 8/2000 | Sonozaki et al. |
| 6,174,164 | B1 | 1/2001 | Masjedi |
| 6,278,873 | B1 | 8/2001 | Itakura et al. |
| 6,285,166 | B1 | 9/2001 | Cannon |
| 6,358,644 | B1 | 3/2002 | Shibata et al. |
| 6,368,744 | B1 | 4/2002 | Hatazawa et al. |
| 6,448,621 | B1 | 9/2002 | Thakur et al. |
| 6,528,204 | B1 | 3/2003 | Hikmet et al. |
| 6,549,756 | B1 | 4/2003 | Engstrom |
| 6,563,318 | B2 | 5/2003 | Kawakami et al. |
| 6,674,265 | B2 | 1/2004 | Yoshida et al. |
| 6,683,440 | B2 | 1/2004 | Kawakami et al. |
| 6,790,178 | B1 | 9/2004 | Mault et al. |
| 6,924,551 | B2 | 8/2005 | Rumer et al. |
| 7,012,405 | B2 | 3/2006 | Nishida et al. |
| 7,098,627 | B2 | 8/2006 | Nishida |
| 7,103,407 | B2 | 9/2006 | Hjelt et al. |
| 7,109,684 | B2 | 9/2006 | Takaoka et al. |
| 7,193,394 | B2 | 3/2007 | Ueda et al. |
| 7,270,910 | B2 | 9/2007 | Yahnker et al. |
| 7,282,891 | B2 | 10/2007 | Smallwood et al. |
| 7,288,340 | B2 | 10/2007 | Iwamoto |
| 7,356,923 | B2 | 4/2008 | Honer |
| 7,545,120 | B2 | 6/2009 | Breen et al. |
| 7,570,015 | B2 | 8/2009 | Bansal et al. |
| 7,622,895 | B1 | 11/2009 | Griffin |
| 7,663,064 | B2 | 2/2010 | Dutta et al. |
| 7,714,542 | B2 | 5/2010 | Lee et al. |
| 7,887,948 | B2 | 2/2011 | Jang et al. |
| 7,910,243 | B2 | 3/2011 | Koh et al. |
| 7,948,208 | B2 | 5/2011 | Partovi et al. |
| 7,952,322 | B2 | 5/2011 | Partovi et al. |
| 7,972,721 | B2 | 7/2011 | Kozu et al. |
| 7,976,981 | B2 | 7/2011 | Lee |
| 8,016,610 | B1 | 9/2011 | Lee et al. |
| 8,031,122 | B2 | 10/2011 | Jang et al. |
| 8,034,477 | B2 | 10/2011 | Yamada |
| 8,040,110 | B2 | 10/2011 | Al-Anbuky et al. |
| 8,119,278 | B2 | 2/2012 | Bailey et al. |
| 8,124,269 | B2 | 2/2012 | Takahashi et al. |
| 8,169,185 | B2 | 5/2012 | Partovi et al. |
| 8,183,826 | B2 | 5/2012 | Tuffner et al. |
| 8,203,305 | B1 | 6/2012 | Wortham et al. |
| 8,237,410 | B2 | 8/2012 | Young et al. |
| 8,241,786 | B2 | 8/2012 | Taniguchi et al. |
| 8,253,388 | B2 | 8/2012 | Cordes et al. |
| 8,259,013 | B2 | 9/2012 | Jang et al. |
| 8,260,371 | B2 | 9/2012 | Kawata et al. |
| 8,293,402 | B2 | 10/2012 | Lee |
| 8,330,427 | B2 | 12/2012 | Taniguchi et al. |
| 8,345,420 | B2 | 1/2013 | McClure et al. |
| 8,427,825 | B2 | 4/2013 | Szczypinski |
| 8,445,125 | B2 | 5/2013 | Baek et al. |
| 8,518,569 | B2 | 8/2013 | Murphy et al. |
| 8,526,998 | B2 | 9/2013 | Koide et al. |
| 8,548,761 | B2 | 10/2013 | Lim et al. |
| 8,558,509 | B2 | 10/2013 | He et al. |
| 8,598,850 | B2 | 12/2013 | Pisharodi |
| 8,603,670 | B2 | 12/2013 | Taniguchi et al. |
| 8,629,652 | B2 | 1/2014 | Partovi et al. |
| 8,629,654 | B2 | 1/2014 | Partovi et al. |
| 8,638,070 | B2 | 1/2014 | Maluf et al. |
| 8,679,674 | B2 | 3/2014 | Liang et al. |
| 8,778,529 | B2 | 7/2014 | Seo |
| 8,796,996 | B2 | 8/2014 | Nakatsuji et al. |
| 8,847,543 | B2 | 9/2014 | Yagi et al. |
| 8,854,012 | B2 | 10/2014 | Dai et al. |
| 8,890,470 | B2 | 11/2014 | Partovi |
| 8,896,264 | B2 | 11/2014 | Partovi |
| 8,901,881 | B2 | 12/2014 | Partovi |
| 8,920,949 | B2 | 12/2014 | Hashimoto et al. |
| 8,936,653 | B2 | 1/2015 | Kim et al. |
| 8,942,409 | B2 | 1/2015 | Kantor et al. |
| 8,947,047 | B2 | 2/2015 | Partovi et al. |
| 8,989,821 | B2 | 3/2015 | Pope et al. |
| 8,999,566 | B2 | 4/2015 | Chung et al. |
| 9,040,192 | B2 | 5/2015 | Lee et al. |
| 9,048,679 | B2 | 6/2015 | Patino |
| 9,081,068 | B2 | 7/2015 | Mattisson et al. |
| 9,106,083 | B2 | 8/2015 | Partovi |
| 9,112,362 | B2 | 8/2015 | Partovi |
| 9,112,363 | B2 | 8/2015 | Partovi |
| 9,112,364 | B2 | 8/2015 | Partovi |
| 9,136,510 | B2 | 9/2015 | Werner |
| 9,172,088 | B2 | 10/2015 | Loveness et al. |
| 9,178,369 | B2 | 11/2015 | Partovi |
| 9,276,437 | B2 | 3/2016 | Partovi et al. |
| 9,301,034 | B2 | 3/2016 | Kantor et al. |
| 9,343,716 | B2 | 5/2016 | Rothkopf et al. |
| 9,350,188 | B2 | 5/2016 | Hasebe et al. |
| 9,356,459 | B2 | 5/2016 | Chung |
| 9,356,659 | B2 | 5/2016 | Partovi |
| 9,368,995 | B2 | 6/2016 | Nishino et al. |
| 9,379,565 | B2 | 6/2016 | Woo |
| 9,385,353 | B2 | 7/2016 | Byun |
| 9,455,582 | B2 | 9/2016 | Zadesky et al. |
| 9,461,501 | B2 | 10/2016 | Partovi et al. |
| 9,476,946 | B2 | 10/2016 | Schlag et al. |
| 9,479,007 | B1 | 10/2016 | Jol et al. |
| 9,496,732 | B2 | 11/2016 | Partovi |
| 9,511,679 | B2 | 12/2016 | Izumi |
| 9,575,526 | B2 | 2/2017 | Nagahama et al. |
| 9,577,440 | B2 | 2/2017 | Partovi et al. |
| 9,582,034 | B2 | 2/2017 | Von Badinski et al. |
| 9,593,969 | B2 | 3/2017 | King |
| 9,634,295 | B2 | 4/2017 | Dube |
| 9,692,949 | B2 | 6/2017 | Hollinger et al. |
| 9,720,467 | B2 | 8/2017 | Jain et al. |
| 9,722,447 | B2 | 8/2017 | Partovi |
| 9,768,473 | B2 | 9/2017 | Roh et al. |
| 9,774,193 | B2 | 9/2017 | Gaylo et al. |
| 9,793,721 | B2 | 10/2017 | Partovi et al. |
| 9,812,680 | B2 | 11/2017 | Werner et al. |
| 9,837,835 | B2 | 12/2017 | Zadesky et al. |

(56) References Cited

U.S. PATENT DOCUMENTS

| | | | |
|---|---|---|---|
| 9,837,846 B2 | 12/2017 | Partovi | |
| 9,879,652 B2 | 1/2018 | Eden et al. | |
| 9,917,335 B2 | 3/2018 | Jarvis et al. | |
| 10,115,520 B2 | 10/2018 | Partovi | |
| 10,170,918 B2 | 1/2019 | Zadesky et al. | |
| 10,523,021 B2 | 12/2019 | Zadesky et al. | |
| 10,840,715 B2 | 11/2020 | Zadesky et al. | |
| 10,847,846 B2 | 11/2020 | Jarvis et al. | |
| 11,411,412 B2 | 8/2022 | Zadesky et al. | |
| 11,539,086 B2 | 12/2022 | Jarvis et al. | |
| 12,267,449 B2 * | 4/2025 | Bertin | H04M 1/0262 |
| 2002/0094475 A1 | 7/2002 | Aoyama | |
| 2003/0124902 A1 | 7/2003 | Wu | |
| 2003/0129483 A1 | 7/2003 | Gross | |
| 2004/0130294 A1 | 7/2004 | Ng et al. | |
| 2005/0142439 A1 | 6/2005 | Lee et al. | |
| 2005/0225299 A1 | 10/2005 | Petrovic | |
| 2006/0164035 A1 | 7/2006 | Van Beek et al. | |
| 2007/0260136 A1 | 11/2007 | Hunter | |
| 2007/0264535 A1 | 11/2007 | Lee et al. | |
| 2008/0001573 A1 | 1/2008 | Carey | |
| 2008/0018475 A1 | 1/2008 | Breed et al. | |
| 2008/0286644 A1 | 11/2008 | Yeo | |
| 2009/0243549 A1 | 10/2009 | Matsumura et al. | |
| 2009/0317708 A1 | 12/2009 | Brandl et al. | |
| 2010/0026240 A1 | 2/2010 | Jiang et al. | |
| 2010/0052603 A1 | 3/2010 | Bourilkov et al. | |
| 2010/0081049 A1 | 4/2010 | Holl et al. | |
| 2010/0308998 A1 | 12/2010 | Hesch, Jr. et al. | |
| 2010/0316911 A1 | 12/2010 | Tesson et al. | |
| 2011/0014954 A1 | 1/2011 | Dossas et al. | |
| 2011/0043309 A1 | 2/2011 | Wamala et al. | |
| 2011/0050164 A1 | 3/2011 | Partovi et al. | |
| 2011/0175569 A1 | 7/2011 | Austin | |
| 2011/0215480 A1 | 9/2011 | Gorczyca et al. | |
| 2011/0223447 A1 | 9/2011 | Ignor et al. | |
| 2011/0236727 A1 | 9/2011 | Jang | |
| 2012/0094594 A1 | 4/2012 | Rofougaran et al. | |
| 2012/0101551 A1 * | 4/2012 | Aghassian | A61N 1/37235 29/601 |
| 2012/0116176 A1 | 5/2012 | Moravec et al. | |
| 2012/0121944 A1 | 5/2012 | Yamamoto et al. | |
| 2012/0176095 A1 | 7/2012 | Okuda et al. | |
| 2012/0286739 A1 | 11/2012 | O'Brien et al. | |
| 2012/0305605 A1 | 12/2012 | Vaussaux et al. | |
| 2012/0319653 A1 | 12/2012 | Kumar et al. | |
| 2013/0071696 A1 | 3/2013 | Kim et al. | |
| 2013/0093388 A1 | 4/2013 | Partovi | |
| 2013/0119942 A1 | 5/2013 | Sutarwala et al. | |
| 2013/0260677 A1 | 10/2013 | Partovi | |
| 2013/0271069 A1 | 10/2013 | Partovi | |
| 2013/0285605 A1 | 10/2013 | Partovi | |
| 2014/0055085 A1 | 2/2014 | Downey et al. | |
| 2014/0147703 A1 | 5/2014 | Werner et al. | |
| 2014/0191568 A1 | 7/2014 | Partovi | |
| 2015/0130412 A1 | 5/2015 | Partovi | |
| 2015/0188324 A1 | 7/2015 | Nicholson et al. | |
| 2015/0255776 A1 | 9/2015 | Dabov | |
| 2015/0276885 A1 | 10/2015 | Hariharasudhan et al. | |
| 2015/0357859 A1 | 12/2015 | Pourdarvish et al. | |

| | | | |
|---|---|---|---|
| 2016/0049821 A1 | 2/2016 | Aridome | |
| 2016/0055729 A1 | 2/2016 | Maddox et al. | |
| 2016/0064960 A1 | 3/2016 | DiCarlo et al. | |
| 2016/0064961 A1 | 3/2016 | DiCarlo et al. | |
| 2016/0260945 A1 | 9/2016 | Rothkopf et al. | |
| 2016/0276842 A1 | 9/2016 | Shizuno et al. | |
| 2017/0033335 A1 * | 2/2017 | Kojima | H01M 50/211 |
| 2017/0303048 A1 | 10/2017 | Hooton et al. | |
| 2018/0026341 A1 | 1/2018 | Mow et al. | |
| 2018/0263151 A1 * | 9/2018 | Cho | H04M 1/0262 |
| 2019/0083715 A1 | 3/2019 | Redmond et al. | |
| 2019/0326567 A1 * | 10/2019 | Hur | H01M 50/211 |
| 2021/0384583 A1 * | 12/2021 | Chung | C09J 123/22 |
| 2022/0006143 A1 | 1/2022 | Graham et al. | |
| 2022/0329678 A1 * | 10/2022 | Zhang | H04M 1/0264 |
| 2023/0224388 A1 * | 7/2023 | Bates | G06F 1/1656 455/566 |
| 2023/0224389 A1 * | 7/2023 | Hill | H04M 1/0264 455/556.1 |
| 2023/0224391 A1 * | 7/2023 | Hill | H04M 1/0264 455/566 |
| 2023/0224392 A1 * | 7/2023 | Hill | H10K 50/828 455/566 |
| 2023/0224393 A1 * | 7/2023 | Froese | H04M 1/035 455/575.8 |
| 2023/0224394 A1 * | 7/2023 | Yan | H04M 1/0277 361/749 |
| 2023/0239558 A1 * | 7/2023 | Hill | G06F 1/1635 348/371 |

FOREIGN PATENT DOCUMENTS

| | | |
|---|---|---|
| DE | 102011050393 | 5/2011 |
| EP | 0792741 | 2/1986 |
| EP | 1931010 | 6/2008 |
| EP | 2540221 | 1/2013 |
| EP | 2653053 | 10/2013 |
| JP | 61032951 | 2/1986 |
| JP | 63314770 | 12/1988 |
| JP | 10012200 | 1/1998 |
| JP | 2000058018 | 2/2000 |
| JP | 2001118547 | 4/2001 |
| JP | 2001250515 | 9/2001 |
| JP | 2001250516 | 9/2001 |
| JP | 2001332752 | 11/2001 |
| JP | 2002142378 | 5/2002 |
| JP | 2005108750 | 4/2005 |
| JP | 2005129260 | 5/2005 |
| JP | 2005268138 | 9/2005 |
| JP | 2007048725 | 2/2007 |
| JP | 2007165200 | 6/2007 |
| JP | 2010021074 | 1/2010 |
| KR | 20010007769 | 2/2005 |
| KR | 20090075396 | 7/2009 |
| KR | 20180025126 | 3/2018 |
| TW | M567488 | 9/2018 |
| WO | WO00/41252 | 7/2000 |
| WO | WO2008/023199 | 2/2008 |
| WO | WO2011/000239 | 1/2011 |
| WO | WO2011/095758 | 8/2011 |

* cited by examiner

1247

1249

1250

1248

1251

1252

1253

1254

1255

1256

HANDHELD ELECTRONIC DEVICE HAVING A CHASSIS SECTION WITH A BATTERY MOUNTING RECESS

CROSS-REFERENCE TO RELATED APPLICATION(S)

This application is a nonprovisional patent application of and claims the benefit of U.S. Provisional Patent Application No. 63/298,182, filed Jan. 10, 2022 and titled "Handheld Electronic Device," the disclosure of which is hereby incorporated herein by reference in its entirety.

FIELD

The subject matter of this disclosure relates generally to handheld electronic devices, and more particularly, to mobile phones.

BACKGROUND

Modern consumer electronic devices take many shapes and forms, and have numerous uses and functions. Smartphones, for example, provide various ways for users to interact with other people that extend beyond telephone communications. Such devices may include numerous systems to facilitate such interactions. For example, a smartphone may include a touch-sensitive display for providing graphical outputs and for accepting touch inputs, wireless communications systems for connecting with other devices to send and receive voice and data content, cameras for capturing photographs and videos, and so forth. However, integrating these subsystems into a compact and reliable product that is able to withstand daily use presents a variety of technical challenges. The systems and techniques described herein may address many of these challenges while providing a device that offers a wide range of functionality.

SUMMARY

A portable electronic device may include an enclosure including a housing component and a front cover coupled to the housing component and defining a front exterior surface of the portable electronic device. The portable electronic device may also include a display positioned below the front cover, the display defining an active display region, a first hole surrounded by the active display region, and a second hole surrounded by the active display region. The portable electronic device may also include a first optical sensor positioned below the front cover and below the first hole, a second optical sensor positioned below the front cover and below the second hole, and a touch-sensing component configured to detect a first touch input applied to the front cover in the active display region of the display and a second touch input applied to the front cover over the first hole in the display.

The touch-sensing component may be further configured to detect a third touch input applied to the front cover over the second hole in the display. The portable electronic device may further include a light emitter positioned below the front cover and below the first hole and configured to emit light onto an object, and the first optical sensor may be configured to receive a portion of the emitted light reflected from the object. The second touch input may be detected over the first optical sensor, and the touch-sensing component may be further configured to detect a fourth touch input applied to the front cover over the light emitter.

The portable electronic device may also include an opaque mask positioned below the front cover and defining a first opening positioned over the first hole, and a second opening positioned over the second hole. The portable electronic device may further include a polymer coating layer positioned on an interior surface of the front cover, and the opaque mask may be positioned on the polymer coating layer. The polymer coating layer may define a textured surface, and the opaque mask may be positioned on the textured surface and conforms to the textured surface.

A mobile phone may include an enclosure including a housing component and a front cover coupled to the housing component and defining a display region and a front-facing sensor region surrounded by the display region. The portable electronic device may also include a touch-sensing component below the front cover, including a display layer defining a graphically active region configured to display graphical outputs in the display region and a touch sensing layer defining a first touch-sensitive region configured to detect touch inputs applied to the graphically active region, and a second touch-sensitive region configured to detect touch inputs applied to a graphically inactive region of the front-facing sensor region. The touch inputs applied to the graphically inactive region of the front-facing sensor region may include a gesture input. The gesture input may be a swipe input.

The mobile phone may further include a first optical sensor positioned in the front-facing sensor region and a second optical sensor positioned in the front-facing sensor region, and the touch-sensing component may define a first hole positioned over the first optical sensor and a second hole positioned over the second optical sensor. The touch inputs applied to the graphically inactive region of the front-facing sensor region may include a first touch input applied over the first optical sensor and a second touch input applied over the second optical sensor. The mobile phone may be configured to perform a first action in response to detecting the first touch input applied over the first optical sensor and perform a second action different from the first action in response to detecting the second touch input applied over the second optical sensor.

The mobile phone may further include a light emitter positioned in the front-facing sensor region, and the touch-sensing component may define a third hole positioned over the light emitter. A first portion of the second touch-sensitive region may be positioned between the first hole and the second hole and a second portion of the second touch-sensitive region may be positioned between the second hole and the third hole.

A portable electronic device may include an enclosure including a front cover, a first optical component positioned below a first region of the front cover and configured to receive light through the first region of the front cover, a second optical component positioned below a second region of the front cover and configured to receive light though the second region of the front cover, and a display component positioned below the front cover. The display component may define a first hole positioned over the first optical component and a second hole positioned over the second optical component. The display component may be configured to output a first graphical output in a first display region that extends around the first hole and the second hole, and output a second graphical output in a second display region that is located between the first hole and the second hole. The second graphical output may be displayed in response to the portable electronic device receiving a notification event. Prior to receiving the notification event, the second display region may display no graphical output. Prior to receiving the notification event, the second display region may display a third graphical output. The portable electronic device may further include a touch-sensitive component positioned below the front cover and defining a first hole positioned over the first optical component and a second hole positioned over the second optical component. The touch-sensitive component may be configured to detect an input applied to the front cover in the first display region and detect an input applied to the front cover in the second display region.

A mobile phone may include a display, wireless communication circuitry, a battery, and an enclosure enclosing the display, the wireless communication circuitry, and the battery. The enclosure may include a front cover formed from a transparent material and defining a front exterior surface of the mobile phone, a rear cover formed from a glass material and defining a rear exterior surface of the mobile phone, and a first housing component including a first wall section defining a first side exterior surface of the mobile phone, a second wall section defining a second side exterior surface opposite the first side exterior surface, and a mid-chassis section extending between the first wall section and the second wall section. The enclosure may further include a second housing component positioned at a first end of the first housing component and defining a first exterior corner surface, and a third housing component positioned at the first end of the first housing component and defining a second exterior corner surface.

The first wall section, the second wall section and the mid-chassis section of the first housing component may be integrally formed from a first metal material, the second housing component may be formed from a second metal material, and the third housing component may be formed from a third metal material. The enclosure may further include a first intermediate element positioned between the first and second housing components and formed from a first polymer material, and a second intermediate element positioned between the first and third housing components and formed from a second polymer material. The first wall section, the second wall section, and the mid-chassis section may be integrally formed from an extrusion of the first metal material.

The wireless communication circuitry may be operably coupled to the second housing component and the third housing component, and the second and third housing components may be configured to operate as radiating antenna elements for the wireless communication circuitry. The display may be positioned at a first side of the mid-chassis section, and the battery may be positioned at a second side of the mid-chassis section opposite the first side.

The mobile phone may further include a circuit board assembly coupled to the mid-chassis section, and a thermal bridge thermally coupling the circuit board assembly to the mid-chassis section. The thermal bridge may be positioned proximate a first side of the circuit board assembly, and the first side of the circuit board assembly may be opposite a second side of the circuit board assembly positioned proximate the first wall section of the first housing component. The thermal bridge may include a graphite material coupled to the circuit board assembly and to the mid-chassis section of the first housing component. The thermal bridge may be offset inward from the first wall section.

A portable electronic device may include an enclosure defining an interior cavity and including a front cover assembly defining a front exterior surface of the enclosure, a rear cover assembly defining a rear exterior surface of the enclosure, and a middle housing component formed from an extruded metal material. The middle housing component may include a first wall section defining a first side exterior surface of the enclosure, a second wall section defining a second side exterior surface opposite the first side exterior surface, and a mid-chassis section integrally formed with the first wall section and the second wall section and defining at least a portion of the interior cavity. The portable electronic device may further include a battery positioned within interior cavity of the enclosure and thermally coupled to the mid-chassis section, a display positioned below the front cover assembly, and a camera array positioned below the rear cover assembly.

The front cover assembly may include a glass-ceramic sheet defining a display region and a metal frame coupled to the glass-ceramic sheet and surrounding the display region, the metal frame including an array of tabs structurally coupled to the middle housing component. A first tab of the array of tabs may be structurally coupled to a first spring coupling element attached to the middle housing component, and the first tab of the array of tabs may be electrically coupled to the first spring coupling element.

The portable electronic device may further include an optical facial recognition system configured to detect facial features of a user, the mid-chassis section may define an opening, and the optical facial recognition system may be positioned below the front cover assembly and at least partially within the opening. The mid-chassis section may define a first surface that faces the front cover assembly and a second surface opposite the first surface, and the optical facial recognition system may be coupled to the second surface. The enclosure may further include a first housing component positioned at a first end of the middle housing component and defining a first exterior corner surface, and a second housing component positioned at the first end of the middle housing component and defining a second exterior corner surface.

An electronic device may include an enclosure including a front cover formed from a first glass material and defining a front exterior surface of the enclosure, a rear cover formed from a second glass material and defining a rear exterior surface of the enclosure, and a housing component. The housing component may include a mid-chassis section partially defining a first cavity between the mid-chassis section and the front cover and partially defining a second cavity between the mid-chassis section and the rear cover, a first wall section positioned along a first side of the mid-chassis section and defining a first side exterior surface of the enclosure, and a second wall section positioned along a second side of the mid-chassis section and defining a second side exterior surface of the enclosure. The electronic device may further include a display coupled to the front cover, a circuit board assembly positioned in the second cavity and thermally coupled to the mid-chassis section, and a battery positioned in the second cavity and structurally coupled to the mid-chassis section. The first glass material may be a glass-ceramic material, and the second glass material may be an alkali-aluminosilicate material.

The mid-chassis section may define a plate structure and an array of mounting bosses integrally formed with the plate structure, and the circuit board assembly may be coupled to the array of mounting bosses by a set of threaded fasteners. The electronic device may further include a thermal bridge formed from a thermally conductive material, and the thermal bridge may be positioned between the circuit board assembly and the mid-chassis section. The thermal bridge may be positioned proximate to a midline of the mid-chassis section. Thermal bridge may be a first thermal bridge formed from a first thermally conductive material, and the electronic device may further include a second thermal bridge formed from a second thermally conductive material and positioned between the circuit board assembly and the mid-chassis section.

A portable electronic device may include an enclosure including a front cover defining a front exterior surface, and a display positioned below the front cover and including a set of transparent conductive traces positioned in a graphically active region of the display and including a first plurality of transparent conductive traces and a second plurality of transparent conductive traces oriented perpendicular to the first plurality of transparent conductive traces. The portable electronic device may further include a proximity sensor including an optical emitter below the display and configured to emit light through the display and through the front cover, and an optical receiver below the display and configured to receive, through the display and through the front cover, a reflected portion of the emitted light. The optical emitter may be arranged relative to the optical receiver along a direction oblique to the first plurality of transparent conductive traces and to the second plurality of transparent conductive traces.

The proximity sensor may be configured to detect a proximity of an object to the front exterior surface. The optical emitter may be a laser emitter configured to emit light having a wavelength between about 1300 nanometers and about 1400 nanometers. The display may include a substrate, and the first plurality of transparent conductive traces may be positioned on the substrate. The display may be an organic light-emitting diode (OLED) display, the first plurality of transparent conductive traces may be a set of anodes for the OLED display, and the second plurality of transparent conductive traces may be a set of cathodes for the OLED display.

The display may include a touch sensor, the first plurality of transparent conductive traces may be a first set of electrodes for the touch sensor, and the second plurality of transparent conductive traces may be a second set of electrodes for the touch sensor. The display may include an opaque backing layer defining a first hole and a second hole, the optical emitter may be positioned below the first hole, and the optical receiver may be positioned below the second hole.

A mobile phone may include an enclosure including a housing component and a transparent cover coupled to the housing component and defining a display region and a front-facing sensor region surrounded by the display region. The mobile phone may further include a display below the transparent cover and defining a graphically active region configured to display graphical outputs in the display region. The display may include a grid of conductive traces including a first set of conductive traces extending along a first direction and a second set of conductive traces extending along a second direction perpendicular to the first direction. The mobile phone may further include a proximity sensor positioned below the graphically active region of the display and including a pair of optical components positioned along a third direction that is oblique to the first direction and to the second direction, the pair of optical components including an optical emitter configured to emit light through the display and an optical receiver configured to receive a reflected portion of the emitted light through the display. Conductive traces of the first set of conductive traces and of the second set of conductive traces may be formed from an optically transmissive conductive material.

The third direction may be oriented at 45 degrees from the first direction and the second direction. The proximity sensor may be configured to detect a proximity of an object to the transparent cover based at least in part on a characteristic of the reflected portion of the emitted light.

The display may include an opaque layer defining a first hole having a first size and a second hole having a second size greater than the first size, the optical emitter may be positioned below the first hole, and the optical receiver may be positioned below the second hole. A first side of the second hole may extend along a fourth direction that is oblique to the first direction and to the second direction, and a second side of the second hole may extend along a fifth direction that may be oblique to the first direction.

The mobile phone may further include a bracket structure within the enclosure and defining a first wall section extending along a fourth direction parallel to the third direction, and the proximity sensor may include a housing defining a second wall section extending along a fifth direction parallel to the third direction, the second wall section set apart from the first wall section by a gap.

A portable electronic device may include an enclosure including a front cover defining a front exterior surface and a display positioned below the front cover and including one or more electrode layers. The one or more electrode layers may include a first plurality of transparent conductive traces and a second plurality of transparent conductive traces oriented perpendicular to the first plurality of transparent conductive traces. The display may further include an opaque layer positioned below the one or more electrode layers and defining a pair of holes extending through the opaque layer and oriented along a direction oblique to the first plurality of transparent conductive traces and to the second plurality of transparent conductive traces. The portable electronic device may further include an optical emitter positioned below a first hole of the pair of holes and configured to emit light through the first hole, and an optical receiver positioned below a second hole of the pair of holes and configured to detect a proximity of an object to the portable electronic device based at least in part on a reflected portion of the light emitted by the optical emitter. The light emitted by the optical emitter may have a wavelength between about 1300 nanometers and about 1400 nanometers.

The second hole may be larger than the first hole. Transparent conductive traces of the first plurality of transparent conductive traces and of the second plurality of transparent conductive traces may include indium tin oxide. The display may be an organic light-emitting diode (OLED) display, the first plurality of transparent conductive traces may be a set of anodes for the OLED display, and the second plurality of transparent conductive traces may be a set of cathodes for the OLED display. The optical receiver may be configured to detect the proximity of the object to the portable electronic device while the display may be producing a graphical output above the first hole and the second hole.

A portable electronic device may include an enclosure including a front cover defining a front exterior surface of the portable electronic device and a rear cover defining a rear exterior surface of the portable electronic device. The portable electronic device may further include a rear-facing camera and a rear-facing flash including a light emitting component defining a plurality of illuminable regions. The light emitting component may be configured to illuminate a first subset of the plurality of illuminable regions to illuminate a first field of view and illuminate a second subset of the plurality of illuminable regions, the second subset different from the first subset, to illuminate a second field of view different from the first field of view.

The rear-facing camera may be a first rear-facing camera having the first field of view, the portable electronic device may further include a second rear-facing camera having the second field of view and a third rear-facing camera having a third field of view different from the first field of view and different from the second field of view. The light emitting component may be configured to illuminate the first field of view while capturing a first image with the first rear-facing camera, illuminate the second field of view while capturing a second image with the second rear-facing camera, and illuminate a third subset of the plurality of illuminable regions, the third subset different from the first subset and the second subset, to illuminate the third field of view while capturing a third image with the third rear-facing camera. The rear-facing flash may include a flash lens positioned over the light emitting component, the first subset of the plurality of illuminable regions may be a first illuminable region positioned under a center of the flash lens, the second subset of the plurality of illuminable regions may be positioned about a periphery of the first illuminable region, and the third subset of the plurality of illuminable regions may be positioned about the periphery of the first illuminable region. The plurality of illuminable regions may include an array of illuminable regions arranged in a grid.

The rear-facing flash may further include a flash lens and a flash window over the flash lens. The flash window may define an exterior side, and an interior side having a plurality of ridges configured to produce a pattern visible from the exterior side of the flash window. The plurality of ridges may be concentric ridges. A ridge of the plurality of ridges may be defined by a peak having a first side extending from the flash window at a first angle and a second side extending from the flash window at a second angle, the first angle and the second angle having a same magnitude and an opposite sign.

A mobile phone may include a display, an enclosure at least partially enclosing the display. The enclosure may include a housing component, a front cover coupled to the housing component and positioned over the display, and a rear cover coupled to the housing component. The mobile phone may further include a rear-facing camera having a field of view and configured to capture an image of a scene, and a rear-facing flash configured to illuminate the scene and including a light emitting component, a lens over the light emitting component and configured to project light emitted by the light emitting component to produce a flood of light corresponding to the field of view of the rear-facing camera, and a flash window over the lens. The flash window may define an exterior side, and an interior side having a series of concentric circular ridges, the series of concentric circular ridges including a ridge defined by a symmetrical peak extending from the interior side of the flash window. An air gap may be defined between the flash window and the lens.

The symmetrical peak may have a first side extending from the interior side of the flash window at a first angle and a second side extending from the interior side of the flash window at a second angle, the first angle and the second angle having a same magnitude and an opposite sign. The ridge may be a first ridge, the symmetrical peak may be a first symmetrical peak, and the series of concentric circular ridges may further include a second ridge defined by a second symmetrical peak extending from the interior side of the flash window, the second symmetrical peak having a third side extending from the interior side of the flash window at a third angle equal to the first angle and a fourth side extending from the interior side of the flash window at a fourth angle equal to the second angle.

The mobile phone may further include a flash body, the flash window may be defined by a transparent portion of the flash body, and the flash body may define an opaque portion positioned below the transparent portion. A portion of the opaque portion of the flash body may be visible through the lens. The transparent portion of the flash body and the opaque portion of the flash body may be portions of a monolithic polymer structure.

A portable electronic device may include a housing, a front cover coupled to the housing and defining a front of the portable electronic device, and a sensor array positioned along a rear of the portable electronic device The sensor array may include a camera configured to capture an image and a flash configured to produce a field of illumination, the flash including a flash body defining a window portion, a substrate coupled to the flash body, a light emitting component positioned on the substrate and configured to emit light, and a lens positioned below the window portion and above the light emitting component. The lens may define a flash-directing region configured to transmit, through the window portion, the light from the light emitting component to illuminate a field of view of the camera, and a support region surrounding the flash-directing region and configured to transmit, through the window portion, light reflected by the flash body.

The support region of the lens may define an outer surface facing the window portion of the flash body, and an inner surface opposite the outer surface, and a portion of at least one of the outer surface or the inner surface may have a textured surface. The textured surface may have a different surface texture than a surface defined by the flash-directing region of the lens.

The window portion may define an exterior side and an interior side. The interior side may have a plurality of ridges configured to produce a pattern visible from the exterior side of the window portion, the plurality of ridges including a series of concentric circular ridges extending from the interior side of the window portion and defining a symmetrical peak.

The window portion may be defined by a transparent portion of the flash body, and the flash body may further define an opaque portion positioned below the transparent portion. The light reflected by the flash body may be reflected by the opaque portion of the flash body.

A mobile phone may include a display, an enclosure enclosing the display and including a front cover positioned over the display and defining a front exterior surface, and a rear cover defining a rear exterior surface and a raised sensor array region along the rear exterior surface. The raised sensor array region may define a first hole extending through the raised sensor array region, and a second hole extending through the raised sensor array region. The second hole may be defined by a first opening along an interior surface of the rear cover and having a first opening size and a second opening along the rear exterior surface of the rear cover and having a second opening size smaller than the first opening size. The mobile phone may further include a first camera having a first lens assembly at least partially within the enclosure and extending into the first hole, and a second camera having a second lens assembly at least partially within the enclosure and extending into the second hole. The second lens assembly may define a base portion having a first outer diameter and extending through the first opening and an end portion having a second outer diameter smaller than the first outer diameter and extending through the second opening. The rear cover may be formed from a glass material.

The second hole may be defined by a hole surface having a tapered portion proximate the first opening, and a cylindrical portion proximate the second opening. The tapered portion may define a frusto-conical surface.

The mobile phone may further include a frame member coupled to the rear cover and defining a tapered wall section extending into the second hole, and the second camera may be attached to the frame member. The mobile phone may further include a trim ring positioned in the second hole and coupled to the frame member. The trim ring may be a first trim ring, and the mobile phone may further include a second trim ring positioned in the second hole and coupled to the first trim ring.

The second hole may be defined by a hole surface having a tapered portion proximate the first opening and a cylindrical portion proximate the second opening, and the mobile phone may further include a sealing member positioned between and in contact with the trim ring and the cylindrical portion of the hole surface. The mobile phone may further include an opaque coating applied to the tapered portion of the hole surface and the cylindrical portion of the hole surface.

A portable electronic device may include a display, a battery, and an enclosure enclosing the display and the battery and including a housing component, a front cover coupled to the housing component and defining a front exterior surface of the portable electronic device, and a rear cover coupled to the housing component and defining a rear exterior surface of the portable electronic device. The portable electronic device may also include a rear-facing sensor array including a camera bracket, a first camera coupled to the camera bracket and having a first field of view, a second camera coupled to the camera bracket and having a second field of view different from the first field of view, and a third camera coupled to the camera bracket and having a third field of view different from the first and second fields of view. The portable electronic device may also include a first biasing spring positioned along a first side of the camera bracket and configured to bias the camera bracket towards the battery along a first direction, and a second biasing spring positioned along a second side of the camera bracket and configured to bias the camera bracket along a second direction transverse to the first direction.

The portable electronic device may further include a wall structure extending about a periphery of the camera bracket and defining a first wall segment extending along the first side of the camera bracket and positioned between the camera bracket and a top side wall of the housing component, a second wall segment extending along the second side of the camera bracket and positioned between the camera bracket and a lateral side wall of the housing component, and a third wall segment extending along a third side of the camera bracket opposite the second side and positioned between the camera bracket and the battery.

The first camera may include a first camera enclosure including a first enclosure component coupled to the camera bracket and defining a bottom of the first camera, and a second enclosure component coupled to the first enclosure component at a first seam and defining a top of the first camera. The second camera may include a second camera enclosure including a third enclosure component coupled to the camera bracket and defining a bottom of the second camera, and a fourth enclosure component coupled to the third enclosure component at a second seam and defining a top of the second camera enclosure. The camera bracket may define a flange positioned between the first camera and the second camera and having a top edge that may be below the first seam and the second seam. A portion of at least one of the second enclosure component or the fourth enclosure component may extend at least partially over the top edge of the flange.

The rear cover may define, in a rear-facing sensor array region of the rear cover a first hole, a second hole, and a third hole. A portion of the first camera may extend into the first hole, a portion of the second camera may extend into the second hole, and a portion of the third camera may extend into the third hole. The portable electronic device may also include a trim assembly positioned along an exterior surface of the rear-facing sensor array region and extending into the first hole. The trim assembly may include an inner trim ring extending around a lens portion of the first camera and defining a first surface facing the lens portion and a second surface opposite the first surface and defining a first channel, and an outer trim ring extending around the inner trim ring and defining a third surface facing the second surface of the inner trim ring and defining a second channel, the first and second channels defining a hollow chamber between the inner trim ring and the outer trim ring. The outer trim ring may further define a fourth surface opposite the third surface and defining a peripheral exterior surface of the trim assembly.

A portion of the first camera extends past the rear exterior surface of the portable electronic device, and the portable electronic device may further include a trim ring surrounding the portion of the first camera, the trim ring defining an interface surface positioned on the rear exterior surface of the portable electronic device, an exterior peripheral surface having a first surface texture, and a chamfer surface extending from the interface surface to the exterior peripheral surface and having a second surface texture different from the first surface texture.

A portable electronic device may include a display and an enclosure enclosing the display. The enclosure may include a housing component, a front cover coupled to the housing component and positioned over the display, and a rear cover coupled to the housing component. The portable electronic device may further include a camera bracket coupled to the housing component, a first camera having a first field of view and coupled to the camera bracket, thereby coupling the first camera to the enclosure, a second camera having a second field of view different from the first field of view and coupled to the camera bracket, thereby coupling the second camera to the enclosure, a first biasing spring extending into a first hole defined in the camera bracket and configured to bias the camera bracket in a first direction, and a second biasing spring extending into a second hole in the camera bracket and configured to bias the camera bracket in a second direction different from the first direction.

The housing component may include a first wall section defining a first side exterior surface of the portable electronic device, a second wall section defining a second side exterior surface opposite to the first side exterior surface, and a mid-chassis section extending between the first wall section and the second wall section. The camera bracket may be attached to the mid-chassis section. The first direction may be towards a top of the portable electronic device, and the second direction may be a side of the portable electronic device. The camera bracket may be configured to maintain the first camera in a fixed position relative to the second camera.

A portable electronic device may include an enclosure including a housing component defining a side exterior surface of the portable electronic device, and a front cover assembly coupled to the housing component and defining a front exterior surface of the portable electronic device. The front cover assembly may include a cover defining a notch. The portable electronic device may include a speaker assembly positioned below the front cover assembly and coupled to an audio passage configured to transmit audio output from the speaker assembly, an end portion of the audio passage including a void defined between the housing component and the notch of the cover.

The void may be bounded by a set of four sides, the cover may define three sides of the set of four sides, and an inner surface of the housing component may define one side of the set of four sides. The portable electronic device may further include a grate element positioned in the audio passage, the grate element may define an outward-facing surface, and the outward-facing surface may be offset from the front exterior surface by a distance that may be greater than a thickness of the cover. The grate element may define an array of openings, and each opening of the array of openings may have a width ranging from 0.1 mm to 0.5 mm. Each of a subset of openings of the array of openings may have an elongated shape with a length at least twice the width. The grate element may be molded from a polymer material.

The grate element may include a frame and a screen mesh attached to the frame. The frame may be over-molded over an edge portion of the screen mesh, and the screen mesh may have an array of perforations, each perforation having a diameter ranging between 100 microns and 200 microns.

A mobile phone may include a touch-sensitive display and an enclosure at least partially enclosing the touch-sensitive display. The enclosure may include a front cover assembly having a transparent cover defining a front exterior surface of the mobile phone, the transparent cover having a recess defined along an edge, a first housing component coupled to the front cover assembly and defining an upper exterior surface of the mobile phone, the first housing component and the recess of the transparent cover defining a first audio port, and a second housing component coupled to the front cover assembly and defining a lower exterior surface of the mobile phone, the second housing component defining a second audio port. The mobile phone may further include a speaker assembly positioned below the front cover assembly and acoustically coupled to the first audio port and a microphone positioned within the enclosure and acoustically coupled to the second audio port. The first audio port may have a width less than 0.5 mm and a length that ranges from 10 mm to 20 mm.

The first housing component and the recess of the transparent cover may define a void of the first audio port. The first audio port may be acoustically coupled to the speaker assembly by an audio passage and the mobile phone may further include a grate element positioned within the audio passage. The grate element may be molded from a polymer material, and the polymer material may define a set of elongated openings positioned along a length of the grate element. The grate element may include a screen defining an array of openings and a frame molded along at least one edge of the screen.

An electronic device may include a display, a speaker assembly configured to produce an audio output, and an enclosure enclosing the display and the speaker assembly, the enclosure including a housing component defining a side exterior surface of the electronic device and a first portion of a front exterior surface of the electronic device, and a front cover assembly coupled to the housing component and defining a second portion of the front exterior surface. The front cover assembly may include a cover defining a notch along an edge of the cover, the notch and the housing component defining an open cavity that is acoustically coupled to the speaker assembly and configured to transmit the audio output.

The electronic device may further include a grate element. The grate element may be positioned below the open cavity, and the grate element may be offset inward from the front exterior surface by a distance greater than a thickness of the cover. The enclosure may define an internal shelf offset inward from the front exterior surface, and the grate element may be attached to the internal shelf. The grate element may define an array of slits arranged along a length of the grate element, and each slit may have a width ranging from 0.1 mm to 0.5 mm.

The electronic device may be a mobile phone, and the open cavity may define a receiver port for the mobile phone configured to direct the audio output to an ear of a user. The open cavity may define an opening having an area between $4 \text{ mm}^2$ and $8 \text{ mm}^2$.

A portable electronic device may include an enclosure defining an interior cavity having a front cover, a touch-sensitive display positioned below the front cover, and a haptic engine positioned in the interior cavity and configured to produce a haptic output along an exterior surface of the portable electronic device in response to an actuation signal. The haptic engine may include a first body component defining a first side of the haptic engine and including a first spring flexure and a first end element molded over a portion of the first spring flexure, a second body component defining a second side of the haptic engine opposite the first side and including a second spring flexure and a second end element molded over a portion of the second spring flexure, a movable mass component coupled to the first spring flexure and the second spring flexure, and a coil configured to induce a linear movement of the movable mass component in response to the actuation signal thereby producing the haptic output. The first spring flexure may compress and the second spring flexure may expand in response to a portion of the linear movement of the movable mass component.

The first spring flexure may define a first end portion, a second end portion, and a bend portion, the first end element may be molded over the first end portion of the first spring flexure, the movable mass component may be coupled to the second end portion of the first spring flexure, and the bend portion deforms in response to the linear movement of the movable mass component. The movable mass component may include a molded polymer frame, and the molded polymer frame may be molded over the second end portion of the first spring flexure, thereby coupling the first spring flexure to the movable mass component. The movable mass component may further include a magnet coupled to the molded polymer frame and configured to produce a magnetic field configured to interact with the coil to induce the linear movement of the movable mass component, and a metallic weight coupled to the molded polymer frame. The first end element and the molded polymer frame may be formed from a liquid crystal polymer material.

The first body component and the second body component may be coupled to a middle body component that may define a portion of four additional sides of the haptic engine. The first body component and the second body component may be welded to the middle body component. The coil may be coupled to an interior of the middle body component.

A mobile phone may include an enclosure including a front cover, a display positioned at least partially within the enclosure, a touch sensor configured to detect a touch input along the front cover, and a haptic engine positioned within the enclosure and configured to produce a haptic output in response to the touch input. The haptic engine may include a main body at least partially defining a cavity, a coil coupled to an interior surface of the main body, a movable mass positioned over the coil, a first body component coupled to the main body and including a first spring element and a first polymer element encapsulating a portion of the first spring element, and a second body component coupled to the main body and including a second spring element and a second polymer element encapsulating a portion of the second spring element, wherein the coil may be configured to cause movement of the movable mass thereby producing the haptic output.

The portion of the first spring element may be a first end portion of the first spring element, the portion of the second spring element may be a first end portion of the second spring element, and the movable mass may include a frame member encapsulating a second end portion of the first spring element and a second end portion of the second spring element. The first polymer element may be configured to contact a first portion of the movable mass during the movement of the movable mass to limit travel of the movable mass towards the first body component, and the second polymer element may be configured to contact a second portion of the movable mass during the movement of the movable mass to limit travel of the movable mass towards the second body component. The first polymer element, the second polymer element, and the frame member may be formed from a liquid crystal polymer material.

The first body component may further include a first metal wall structure, the first polymer element may be molded to the first metal wall structure, the second body component may further include a second metal wall structure, and the second polymer element may be molded to the second metal wall structure. The main body may include a metal component, the first metal wall structure may be welded to the metal component, and the second metal wall structure may be welded to the metal component.

The mobile phone may further include a processor configured to detect an event, the haptic output may be produced in response to the detection of the event, and the haptic output includes an oscillation of the movable mass within the cavity.

An electronic device may include an enclosure, a display positioned at least partially within the enclosure, and a haptic engine positioned within the enclosure and configured to produce a haptic output along an exterior surface of the electronic device. The haptic engine may include a first housing component at least partially defining a cavity, a coil positioned within the cavity, a movable mass positioned within the cavity, a first flexure coupled to a first end of the movable mass, a second housing component coupled to the first housing component and at least partially encapsulating a portion of the first flexure, a second flexure coupled to a second end of the movable mass, and a third housing component coupled to the first housing component and at least partially encapsulating a portion of the second flexure.

The second housing component may include a first metal wall structure and a first polymer material molded to the first metal wall structure and at least partially encapsulating the portion of the first flexure. The third housing component may include a second metal wall structure and a second polymer material molded to the second metal wall structure and at least partially encapsulating the portion of the second flexure. The first flexure may be a first bent sheet-metal member, and the second flexure may be a second bent sheet-metal member. The portion of the first flexure may be a first portion of the first flexure, the portion of the second flexure may be a first portion of the second flexure, and the movable mass may include a polymer frame encapsulating a second portion of the first flexure and a second portion of the second flexure.

A mobile phone may include a display, an enclosure enclosing the display and including a front cover positioned over the display and defining a front exterior surface of the mobile phone, and a housing component coupled to the front cover and defining a chassis section below the front cover. The chassis section may define a first side facing the front cover, a second side opposite the first side and defining a battery mounting region, a first recess formed along the second side in the battery mounting region, and a second recess formed along the second side in the battery mounting region. The mobile phone may further include a battery coupled to the chassis section in the battery mounting region, a first adhesive positioned in the first recess and adhering the battery to the chassis section, and a second adhesive positioned in the second recess and adhering the battery to the chassis section. The first and second adhesives may be pressure sensitive adhesive films.

The first recess and the second recess may have a recess depth between about 50 and about 100 microns. A thickness of the first adhesive and the second adhesive may be between about 5 microns and about 30 microns greater than the recess depth.

The battery may extend a first distance along a length axis and a second distance along a width axis, the first adhesive may be a first strip of adhesive positioned on a bonding side of the battery and extending along the length axis, and the second adhesive may be a second strip of adhesive positioned on the bonding side of the battery and extending along the length axis. The first and second adhesives together may cover greater than about 60% of a surface area of the bonding side of the battery. The first strip of adhesive may be positioned along a first edge of the bonding side of the battery, the second strip of adhesive may be positioned along a second edge of the bonding side of the battery, the second edge opposite the first edge, and a graphical marking may be positioned between the first strip of adhesive and the second strip of adhesive on the bonding side of the battery.

A portable electronic device may include a display assembly, a battery, and an enclosure enclosing the battery and the display assembly and including a front cover assembly positioned over the display assembly and defining a front exterior surface of the portable electronic device, a rear cover assembly defining a rear exterior surface of the portable electronic device, and a middle housing component formed from a metal material. The middle housing component may include a first wall section defining a first side exterior surface of the portable electronic device, a second wall section defining a second side exterior surface opposite the first side exterior surface, and a mid-chassis section integrally formed with the first wall section and the second wall section. The mid-chassis section may define a first portion defining a first protrusion along a first side of the mid-chassis section and defining a first recess along a second side of the mid-chassis section opposite the first side, a portion of the battery extending into the first recess, and a second portion defining a second protrusion along the second side of the mid-chassis section and a second recess along the first side of the mid-chassis section, a portion of the display assembly extending into the second recess.

The display assembly may include a circuit element positioned along an interior surface of the display assembly, and the portion of the display assembly extending into the second recess may be a portion of the circuit element. The battery may define a third recess, and the second protrusion along the second side of the mid-chassis section extends into the third recess defined by the battery. The battery may include a battery cell portion having a first thickness, and a battery circuit portion positioned along a side of the battery cell portion and having a second thickness less than the first thickness. The battery cell portion may be attached to the first portion of the mid-chassis section, and the battery circuit portion may be positioned over the second protrusion. An adhesive may be positioned in the first recess and adheres the battery to the mid-chassis section. A thickness of the adhesive may be between about 5 microns and about 20 microns greater than a depth of the second recess. An air gap may be defined between the first portion of the mid-chassis section and the display assembly.

A portable electronic device may include a display, a battery, a circuit board assembly, and an enclosure enclosing the display, the battery, and the circuit board assembly. The enclosure may include a front cover positioned over the display and defining a front exterior surface of the portable electronic device, and a housing component coupled to the front cover and including a wall defining a side exterior surface of the portable electronic device. The portable electronic device may further include an impact barrier structure within the enclosure and extending around a periphery of the battery, the impact barrier structure including a first barrier member positioned between the battery and the wall of the housing component, and a second barrier member positioned between the battery and the circuit board assembly.

The portable electronic device may further include a camera module, and the impact barrier structure may further include a third barrier member positioned between the battery and the camera module. The first barrier member, the second barrier member, and the third barrier member may be formed from a nonconductive polymer material. The first barrier member may be adhered to the wall, the second barrier member may be adhered to the circuit board assembly, and the third barrier member may be adhered to the camera module.

The housing component may further include a metal chassis below the front cover, and at least one of the first barrier member, the second barrier member, and the third barrier member may be coupled to the metal chassis. The at least one of the first barrier member, the second barrier member, and the third barrier member may be welded to the metal chassis.

A mobile phone may include an enclosure defining an internal volume, the enclosure including a front cover formed from a transparent material and defining a front exterior surface of the mobile phone, a rear cover formed from a glass material and defining a rear exterior surface of the mobile phone, and a housing component defining a side exterior surface of the mobile phone. The mobile phone may include a circuit board assembly within the internal volume. The circuit board assembly may include a circuit board, a circuit component coupled to an exterior surface of the circuit board, and a cowling coupled to the circuit board and covering the circuit component, the cowling having a thickness less than about 0.5 mm and including a base structure formed from an aluminum alloy having a thickness less than about 0.4 mm and a thermally conductive structure positioned over the base structure and configured to dissipate heat from the circuit board assembly.

The aluminum alloy may be a 7475 series aluminum alloy. The thermally conductive structure may include graphite. The thermally conductive structure may include a multi-layer structure including a plurality of graphite layers, and a plurality of adhesive layers.

The thermally conductive structure may be a first thermally conductive structure, the cowling may be coupled to a first side of the circuit board assembly, and the circuit board assembly may further include a second thermally conductive structure positioned on the second side of the circuit board assembly. The enclosure may include a front cover assembly, the front cover assembly may include the front cover, and the mobile phone may further include a first thermal bridge coupled to the first thermally conductive structure and thermally coupling the circuit board assembly to the front cover assembly, and a second thermal bridge coupled to the second thermally conductive structure and thermally coupling the circuit board assembly to an internal structure of the enclosure.

The cowling may define a bend segment extending from a main portion of the cowling to a raised portion of the cowling, and the bend segment may have bend radius that may be greater than about 0.5 mm. A thickness of the cowling in the raised portion may be less than a thickness of the cowling in the main portion.

A portable electronic device may include an enclosure including a housing structure, a front cover assembly coupled to the housing structure and including a first transparent member defining a front surface of the portable electronic device, and a rear cover assembly coupled to the housing structure and including a second transparent member defining a rear surface of the portable electronic device. The portable electronic device may further include a display at least partially within the enclosure and below the front cover assembly, a battery at least partially within the enclosure, and a circuit board assembly at least partially within the enclosure. The circuit board assembly may include a circuit board and a cowling coupled to the circuit board and defining an exterior surface of the circuit board assembly. The cowling may include an aluminum alloy base structure and a graphite layer over the aluminum alloy base structure. The aluminum alloy base structure may be formed of a 7475 series aluminum alloy. The aluminum alloy base structure may have a thickness less than about 0.4 mm.

The cowling may cover substantially an entire top surface of the circuit board. The circuit board assembly may include a first circuit component coupled to the top surface of the circuit board and a second circuit component coupled to the top surface of the circuit board, and the cowling may cover the first circuit component and the second circuit component.

The graphite layer may be a first graphite layer, the cowling may be coupled to a first side of the circuit board assembly, and the circuit board assembly may further include a multi-layer thermally conductive structure coupled to a second side of the circuit board assembly and including a plurality of second graphite layers and a plurality of adhesive layers.

The circuit board may be a first circuit board, and the circuit board assembly may further include a wall structure coupled to the first circuit board and a second circuit board coupled to the wall structure and supported above the first circuit board by the wall structure.

An electronic device may include a display, a battery, and an enclosure enclosing the display and the battery. The enclosure may include a front cover assembly defining a front exterior surface of the electronic device, a rear cover assembly defining a rear exterior surface of the electronic device, and a housing component including a first wall section defining a first side exterior surface of the electronic device, a second wall section defining a second side exterior surface opposite to the first side exterior surface, and a mid-chassis section extending between the first wall section and the second wall section. The electronic device may further include a circuit board assembly coupled to the mid-chassis section and defining a first peripheral side proximate the first wall section of the housing component and a second peripheral side opposite the first peripheral side, and a thermal bridge thermally coupling the circuit board assembly to the mid-chassis section, the thermal bridge positioned proximate the first peripheral side of the circuit board assembly.

A center of the thermal bridge may be offset from a midline of the circuit board assembly. The thermal bridge may be a first thermal bridge, and the electronic device may further include a second thermal bridge thermally coupling the circuit board assembly to the front cover assembly.

The thermal bridge may be a first thermal bridge and the circuit board assembly may define a first segment extending along a first side of the battery and a second segment extending along a second side of the battery, the second side perpendicular to the first side. The first thermal bridge may be positioned on the first segment of the circuit board assembly, and the electronic device may further include a second thermal bridge positioned on the second segment of the circuit board assembly. The circuit board assembly may further include a first cowling coupled to the first segment of the circuit board assembly and covering a first circuit component of the circuit board assembly, a second cowling coupled to the second segment of the circuit board assembly and covering a second circuit component of the circuit board assembly, and a thermally conductive structure extending over both the first cowling and the second cowling, and the first thermal bridge and the second thermal bridge may be coupled to the thermally conductive structure.

BRIEF DESCRIPTION OF THE DRAWINGS

The disclosure will be readily understood by the following detailed description in conjunction with the accompanying drawings, wherein like reference numerals designate like structural elements, and in which.

DETAILED DESCRIPTION

Reference will now be made in detail to representative embodiments illustrated in the accompanying drawings. It should be understood that the following descriptions are not intended to limit the embodiments to one preferred embodiment. To the contrary, it is intended to cover alternatives, modifications, and equivalents as can be included within the spirit and scope of the described embodiments as defined by the appended claims.

Mobile phones as described herein may include complex, sophisticated components and systems that facilitate a multitude of functions. For example, mobile phones according to the instant disclosure may include touch- and/or force-sensitive displays, numerous cameras (including both front- and rear-facing cameras), GPS systems, haptic actuators, wireless charging systems, and all requisite computing components and software to operate these (and other) systems and otherwise provide the functionality of the mobile phones.

Figure 1A:
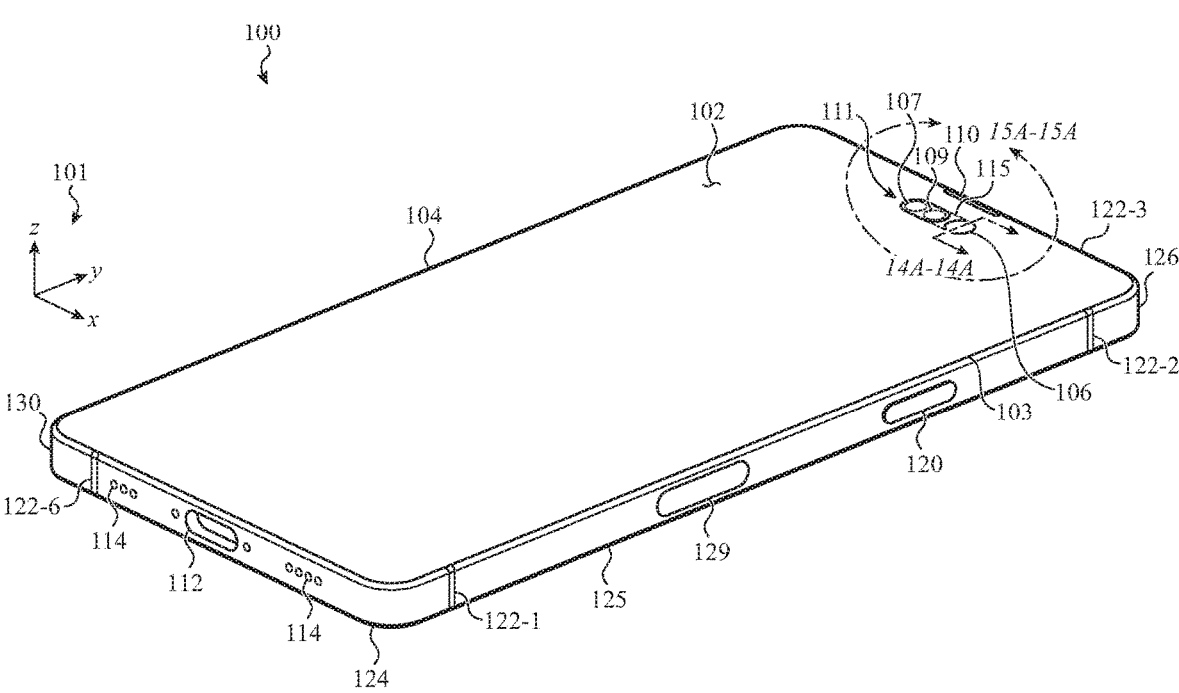
FIGS. 1A-1B depict an example electronic device.
Figure 1B:
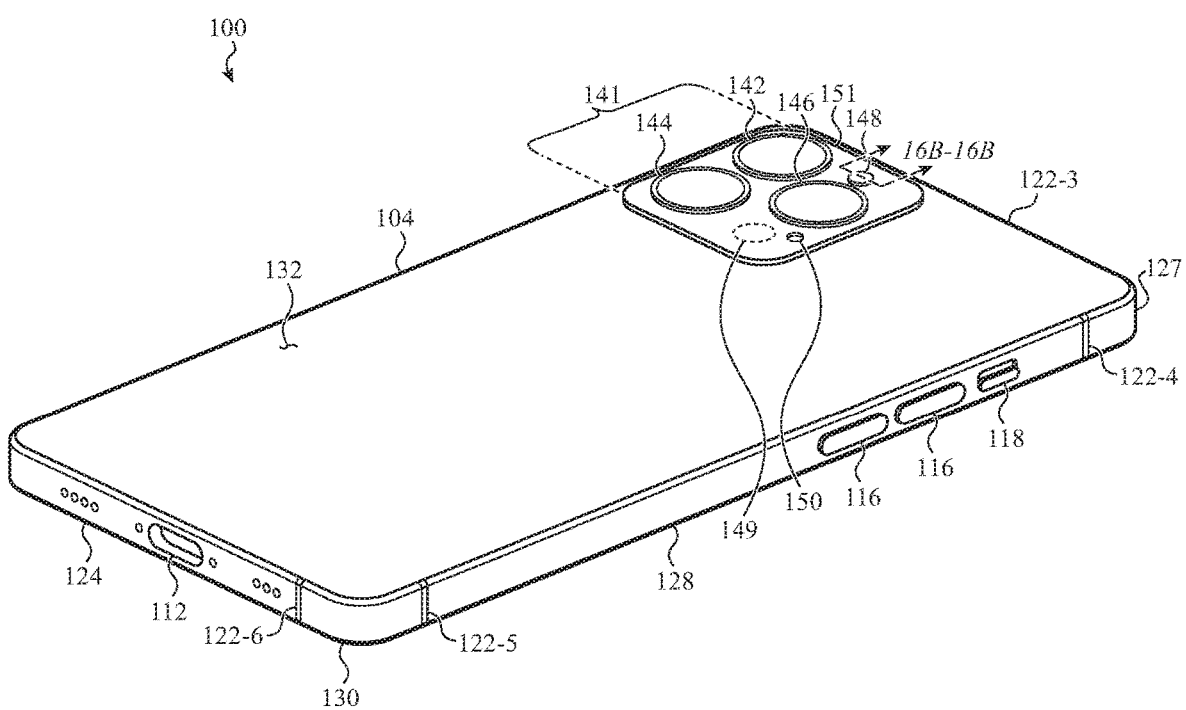

FIGS. 1A and 1B show an example electronic device 100 embodied as a mobile phone. FIG. 1A illustrates a front of the device 100, while FIG. 1B illustrates a back side of the device. While the device 100 is a mobile phone, the concepts presented herein may apply to any appropriate electronic devices, including portable electronic devices, wearable devices (e.g., watches), laptop computers, handheld gaming devices, tablet computers, computing peripherals (e.g., mice, touchpads, keyboards), or any other device. Accordingly, any reference to an "electronic device" encompasses any and all of the foregoing.

The electronic device 100 includes a cover 102 (e.g., a front cover) attached to a housing 104 (which may include a housing structure defined by one or more housing components). The cover 102 may be positioned over a display 103. The cover 102 may be a sheet or sheet-like structure formed from or including a transparent or optically transmissive material. In some cases, the cover 102 is formed from or includes a glass material, and may therefore be referred to as a glass cover member. The glass material may be a silica-based glass material, an aluminosilicate glass, a boroaluminosilicate glass, an alkali metal aluminosilicate glass (e.g., a lithium aluminosilicate glass), or a chemically strengthened glass. Other example materials for the cover 102 include, without limitation, sapphire, ceramic, glass-ceramic, crystallizable glass materials, or plastic (e.g., poly-carbonate). A glass-ceramic material may be a silica-based glass ceramic material, such as an aluminosilicate glass ceramic material or a boroaluminosilicate glass ceramic material. The glass-ceramic material may be chemically strengthened by ion exchange. The cover 102 may be formed as a monolithic or unitary sheet. The cover 102 may also be formed as a composite of multiple layers of different materials, coatings, and other elements.

The display 103 may be at least partially positioned within the interior volume of the housing 104. The display 103 may be coupled to the cover 102, such as via an adhesive or other coupling scheme. The display 103 may include a liquid-crystal display (LCD), a light-emitting diode (LED) display, an organic light-emitting diode (OLED) display, an active layer organic light emitting diode (AMOLED) display, an organic electroluminescent (EL) display, an electrophoretic ink display, or the like. The display 103 may be configured to display graphical outputs, such as graphical user interfaces, that the user may view and interact with. Graphical outputs may be displayed in a graphically active region of the display 103 (e.g., an active display region).

The device 100 may also include an ambient light sensor that can determine properties of the ambient light conditions surrounding the device 100. Example ambient light sensors are described herein. The device 100 may use information from the ambient light sensor to change, modify, adjust, or otherwise control the display 103 (e.g., by changing a hue, brightness, saturation, or other optical aspect of the display based on information from the ambient light sensor). The device 100 may also include a proximity sensor that can determine the proximity of an object (e.g., a user's face) to the device 100. The device 100 may use information from the proximity sensor to change, modify, adjust, or otherwise control the display 103 or other function of the device 100 (e.g., to deactivate the display when the device 100 is held near a user's face during a telephone call).

As described herein, the ambient light sensor and/or the proximity sensor may be positioned below an active area of the display 103 (e.g., below a portion of the display that produces graphical output). The ambient light sensor and/or the proximity sensor may transmit and/or receive light through the active area of the display 103 to perform sensing functions.

The display 103 may include or be associated with one or more touch- and/or force-sensing systems. In some cases, components of the touch- and/or force-sensing systems are integrated with the display stack. For example, touch-sensing components such as electrode layers of a touch and/or force sensor may be provided in a stack that includes display components (and is optionally attached to or at least viewable through the cover 102). The touch- and/or force-sensing systems may use any suitable type of sensing technology and touch-sensing components, including capacitive sensors, resistive sensors, surface acoustic wave sensors, piezo-electric sensors, strain gauges, or the like. The outer or exterior surface of the cover 102 may define an input surface (e.g., a touch- and/or force-sensitive input surface) of the device. While both touch- and force-sensing systems may be included, in some cases the device 100 includes a touch-sensing system and does not include a force-sensing system.

The device 100 may also include a front-facing camera 106. The front-facing camera 106 may be positioned below or otherwise covered and/or protected by the cover 102. The front-facing camera 106 may have any suitable operational parameters. For example, the front-facing camera 106 may include a 12 megapixel sensor (with 1 micron pixel size), and an 80-90° field of view. The front-facing camera 106 may have an aperture number of f/1.9. The front-facing camera 106 may include auto-focus functionality (e.g., one or more lens elements may move relative to an optical sensor to focus an image on the sensor). Other types of cameras may also be used for the front-facing camera 106, such as a fixed-focus camera.

The front-facing camera 106 (as well as other components) may be positioned in a front-facing sensor region 111. The front-facing sensor region 111 may be positioned in an island-like area of the front of the device 100, and may be surrounded by a display region (e.g., a main display region) of the device 100. In some cases, as described herein, the front-facing sensor region 111 may be positioned in or defined by one or more holes formed through the display 103. In such cases, the front-facing sensor region 111 may be bordered on all sides by active areas or regions of the display 103. Stated another way, the front-facing sensor region 111 may be completely surrounded by active display areas (e.g., an outer periphery of the front-facing sensor region 111 may be surrounded by active areas of the display). In some cases, the front-facing sensor region 111 includes or is defined by one or more masks or other visually opaque component(s) or treatment(s) that define openings for the sensors of the front-facing sensor region 111. The front-facing sensor region 111 may include components such as an infrared illuminator module 107 (which may include a flood illuminator and a dot projector), an infrared image capture device 109, and the front-facing camera 106. The infrared illuminator module 107 is an example of a light emitter, and the infrared image capture device 109 is an example of an optical receiver.

In some cases, the front-facing sensor region 111 is defined by or includes two holes formed through the display 103, such as a first hole to provide optical access for the front facing camera 106 and a second hole to provide access for the infrared illuminator module 107 and the infrared image capture device 109. A supplemental display region 115 may be located between the first and second holes. The supplemental display region 115 may provide graphical output and touch- and/or force-sensing functionality to the front-facing sensor region 111. For example, the supplemental display region 115 may be used to display graphical outputs such as lights, shapes, icons, or other elements (e.g., to provide notifications and/or information to the user). In some cases, the supplemental display region 115 may be visually distinguished from other active regions of the display, such that the supplemental display region 115 does not appear to be part of the display. For example, graphical outputs (e.g., graphical user interfaces, images, videos, etc.) displayed on the display 103 may not extend into the supplemental display region 115. In such cases, the front-facing sensor region 111 may appear visually as a single continuous area of the display, despite the display having two separate holes separated by an active display region or area. The supplemental display region 115, and optionally the touch-sensing components of the display that surround the front-facing sensor region 111, may also include touch- and/or force-sensing functionality, such that a user can touch the front-facing sensor region 111 to provide an input to the device. In some cases, touch inputs applied anywhere in the front-facing sensor region 111 (e.g., even directly over the optical components) may be detected by the device. These and other features of the front-facing sensor region 111 are described herein.

The device 100 may also include one or more buttons (e.g., button 120, and buttons 116 in FIG. 1B), switches (e.g., switch 118, FIG. 1B), and/or other physical input systems. Such input systems may be used to control power states (e.g., the button 120), change speaker volume (e.g., the buttons 116), switch between "ring" and "silent" modes, and the like (e.g., the switch 118).

The device 100 may also include a speaker port 110 to provide audio output to a user, such as to a user's ear during voice calls. The speaker port 110, which is an example of an audio port, may also be referred to as a receiver, receiver port, or an earpiece in the context of a mobile phone. The speaker port 110 may be defined by an opening that is defined, along at least one side, by the housing 104, and along at least another side, by the cover 102. In some cases, the cover 102 defines a notch along an edge of the cover, and the notch (also referred to as a recess or cutout) defines at least three sides of the speaker port 110. The speaker port 110 may lack a mesh or other covering that is flush with the front surface of the cover 102. In some cases, a protective grill or grate is positioned within the device 100 and in an audio path between a speaker and the speaker port 110 to inhibit ingress of debris into the device 100. The protective grill or grate may be recessed relative to the front surface or front face of the cover 102. Example protective grate elements are described with respect to FIGS. 15A-15F.

The device 100 may also include a charging port 112 (e.g., for receiving a connector of a power cable for providing power to the device 100 and charging the battery of the device 100). The device 100 may also include audio openings 114. The audio openings 114 may allow sound output from an internal speaker system (e.g., the speaker system 224, FIG. 2) to exit the housing 104. The device 100 may also include one or more microphones. In some cases, a microphone within the housing 104 may be acoustically coupled to the surrounding environment through an audio opening 114.

The housing 104 may be a multi-piece housing. For example, the housing 104 may be formed from multiple housing components 124, 125, 126, 127, 128, and 130, which are structurally coupled together via one or more intermediate elements, such as joint structures 122 (e.g., 122-1-122-6). Together, the housing components 124, 125, 126, 127, 128, and 130 and the joint structures 122 may define a band-like housing structure that defines four side walls (and thus four exterior side surfaces) of the device 100. Thus, both the housing components and the joint structures define portions of the exterior side surfaces of the device 100.

The housing components 124, 125, 126, 127, 128, and 130 may be formed of a conductive material (e.g., a metal such as aluminum, stainless steel, or the like), and the joint structures 122 may be formed of one or more polymer materials (e.g., glass-reinforced polymer). The joint structures 122 may include two or more molded elements, which may be formed of different materials. For example, an inner molded element may be formed of a first material (e.g., a polymer material), and an outer molded element may be formed of a second material that is different from the first (e.g., a different polymer material). The materials may have different properties, which may be selected based on the different functions of the inner and outer molded elements. For example, the inner molded element may be configured to make the main structural connection between housing components, and may have a higher mechanical strength and/or toughness than the outer molded element. On the other hand, the outer molded element may be configured to have a particular appearance, surface finish, chemical resistance, water-sealing function, or the like, and its composition may be selected to prioritize those functions over mechanical strength.

In some cases, one or more of the housing components 124, 125, 126, 127, 128, and 130 (or portions thereof) are configured to operate as antennas (e.g., components that are configured to transmit and/or receive electromagnetic waves to facilitate wireless communications with other computers and/or devices). To facilitate the use of the housing components as antennas, feed and ground lines may be conductively coupled to the housing components to couple the housing components to other antennas and/or communication circuitry. Further, the joint structures 122 may be substantially non-conductive to provide suitable separation and/or electrical isolation between the housing components (which may be used to tune the radiating portions, reduce capacitive coupling between radiating portions and other structures, and the like). In addition to the housing components 124, 125, 126, 127, 128, and 130, the device 100 may also include various internal antenna elements that are configured to transmit and receive wireless communication signals through various regions of the housing 104. As shown in FIG. 1A, the device 100 may include an antenna window 129 that allows for the passage of radio-frequency communication signals through a corresponding region of the housing 104.

The joint structures 122 may be mechanically interlocked with the housing components to structurally couple the housing components and form a structural housing assembly.

The exterior surfaces of the housing components 124, 125, 126, 127, 128, and 130 may have substantially a same color, surface texture, and overall appearance as the exterior surfaces of the joint structures 122. In some cases, the exterior surfaces of the housing components 124, 125, 126, 127, 128, and 130 and the exterior surfaces of the joint structures 122 are subjected to at least one common finishing procedure, such as abrasive-blasting, machining, polishing, grinding, or the like. Accordingly, the exterior surfaces of the housing components and the joint structures may have a same or similar surface finish (e.g., surface texture, roughness, pattern, etc.). In some cases, the exterior surfaces of the housing components and the joint structures may be subjected to a two-stage blasting process to produce the target surface finish.

FIG. 1A also includes an example coordinate system 101 that may define directions with reference to the device 100 (or other electronic devices described herein). The coordinate system 101 defines a positive x direction, a positive y direction, and a positive z direction. Unless stated otherwise, references herein to a positive x, positive y, or positive z direction will be understood to refer generally to the coordinate system 101 and its relationship to the device 100 in FIG. 1A. Negative x, y, and z directions will be understood to be opposite to the positive x, y, and z directions shown in the coordinate system in FIG. 1A.

FIG. 1B illustrates a back side of the device 100. The device 100 may include a back or rear cover 132 coupled to the housing 104 and defining at least a portion of the exterior rear surface of the device 100. The cover 102 (e.g., the front cover), the rear cover 132, and the housing 104 may at least partially define an enclosure of the device 100. The enclosure 100 may define an internal volume in which components of the device 100 are positioned. The rear cover 132 may be formed from or include a transparent or optically transmissive material. For example, the rear cover 132 may include a substrate formed of a glass material. The glass material may be a silica-based glass material, an aluminosilicate glass, a boroaluminosilicate glass, an alkali metal aluminosilicate glass (e.g., a lithium aluminosilicate glass), or a chemically strengthened glass. Other example materials for the rear cover 132 include, without limitation, sapphire, ceramic, glass-ceramic, crystallizable glass materials, and plastic (e.g., polycarbonate). A glass-ceramic material may be a silica-based glass ceramic material, such as an aluminosilicate glass ceramic material or a boroaluminosilicate glass ceramic material. The glass-ceramic material may be chemically strengthened by ion exchange. The rear cover 132 may be formed as a monolithic or unitary sheet. The rear cover 132 may also be formed as a composite of multiple layers of different materials, coatings, and other elements. The rear cover 132 may include one or more decorative layers on the exterior or interior surface of the substrate. For example, one or more opaque layers may be applied to the interior surface of the substrate (or otherwise positioned along the interior surface of the substrate) to provide a particular appearance to the back side of the device 100. The opaque layer(s) may include a sheet, ink, dye, or combinations of these (or other) layers, materials, or the like. In some cases the opaque layer(s) have a color that substantially matches a color of the housing 104 (e.g., the exterior surfaces of the housing components and the joint structures). The device 100 may include a wireless charging system, whereby the device 100 can be powered and/or its battery recharged by an inductive (or other electromagnetic) coupling between a charger and a wireless charging system within the device 100. In such cases, the rear cover 132 may be formed of a material that allows and/or facilitates the wireless coupling between the charger and the wireless charging system (e.g., glass).

Figure 2:
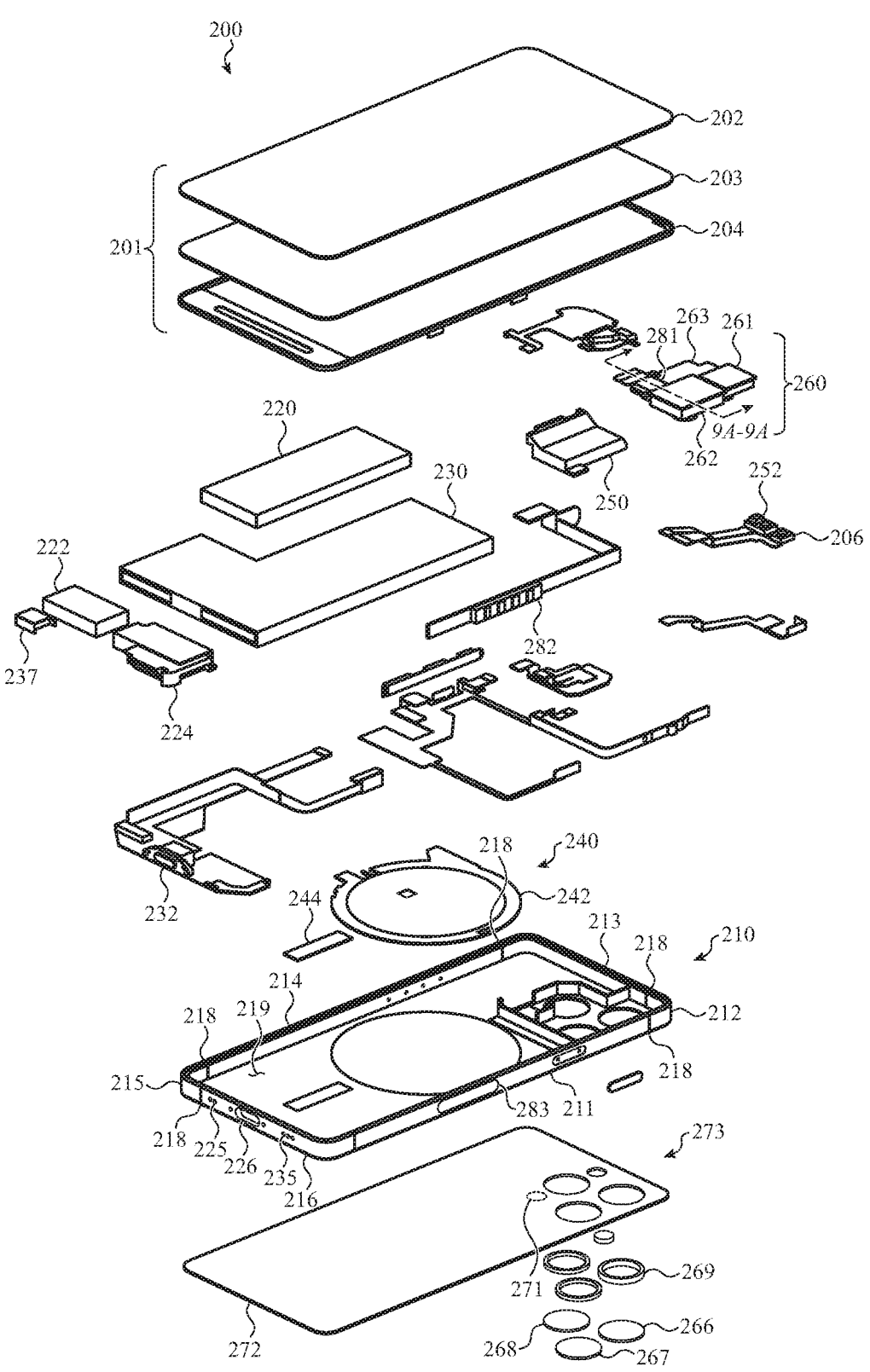
FIG. 2 depicts an exploded view of an example electronic device.

The device 100 may also include a sensor array 141 (e.g., a rear-facing sensor array in a rear-facing sensor array region) that includes three cameras (as shown, for example, in FIG. 2, described herein). The sensor array 141 may be in a sensor array region that is defined by a protrusion 151 in a rear cover of the device 100. The protrusion 151 may define a portion of the rear exterior surface of the device 100, and may at least partially define a raised sensor array region of the sensor array 141. In some cases, the protrusion 151 may be formed by attaching a piece of material (e.g., glass) to another piece of material (e.g., glass). In other cases, the rear cover 132 may include a monolithic structure, and the protrusion 151 may be part of the monolithic structure. For example, the rear cover 132 may include a monolithic glass structure (or glass ceramic structure or alkali-aluminosilicate structure, or other suitable material) that defines the protrusion 151 as well as the surrounding area. In such cases, the protrusion 151 may be an area of increased thickness of the monolithic structure, or it may have a same or substantially same thickness as the rest of the cover (e.g., the protrusion 151 may correspond to or generally be opposite a recessed region along an interior side of the monolithic structure, such that the monolithic structure has a uniform thickness while also defining the protrusion 151).

A first camera 142 may include a 12 megapixel sensor and a telephoto lens with a 3× optical zoom and an aperture number of f/2.8; a second camera 144 may include a 48 megapixel sensor with sensor-shift image stabilization and a wide angle lens having an aperture number of f/1.7; and a third camera 146 may include a 12 megapixel sensor and a super-wide camera with a wide field of view (e.g., 120° FOV) and an aperture number of f/2.2. One or more of the cameras of the sensor array 141 may also include lens-based optical image stabilization, whereby the lens is dynamically moved relative to a fixed structure within the device 100 to reduce the effects of "camera shake" or other movements on images captured by the camera, and/or sensor-based image stabilization, whereby the image sensor is moved relative to a fixed lens or optical assembly. One or more of the cameras may include autofocus functionality, in which one or more lens elements (and/or sensors) are movable to focus an image on a sensor.

The first camera 142 may include an image sensor with a pixel size between about 0.8 microns and about 1.4 microns. The second camera 144 may include an image sensor with a pixel size between about 1.6 microns and about 2.3 microns. The third camera 146 may include an image sensor with a pixel size between about 0.8 microns and about 1.4 microns.

The sensor array 141, along with associated processors and software, may provide several image-capture features. For example, the sensor array 141 may be configured to capture full-resolution video clips of a certain duration each time a user captures a still image. As used herein, capturing full-resolution images (e.g., video images or still images) may refer to capturing images using all or substantially all of the pixels of an image sensor, or otherwise capturing images using the maximum resolution of the camera (regardless of whether the maximum resolution is limited by the hardware or software).

The captured video clips may be associated with the still image. In some cases, users may be able to select individual frames from the video clip as the representative still image associated with the video clip. In this way, when the user takes a snapshot of a scene, the camera will actually record a short video clip (e.g., 1 second, 2 seconds, or the like), and the user can select the exact frame from the video to use as the captured still image (in addition to simply viewing the video clip as a video).

The cameras of the sensor array 141 may also have or provide a high-dynamic-range (HDR) mode, in which the camera captures images having a dynamic range of luminosity that is greater than what is captured when the camera is not in the HDR mode. In some cases, the sensor array 141 automatically determines whether to capture images in an HDR or non-HDR mode. Such determination may be based on various factors, such as the ambient light of the scene, detected ranges of luminosity, tone, or other optical parameters in the scene, or the like. HDR images may be produced by capturing multiple images, each using different exposure or other image-capture parameters, and producing a composite image from the multiple captured images.

The cameras of the sensor array 141 may also include software-based color balance correction. For example, when a flash (e.g., the flash 148) is used during image capture, the cameras (and/or associated processing functionality of the device 100) may adjust the image to compensate for differences in color temperature between the flash output and the ambient lighting in the image. Thus, for example, if a background of an image has a different color temperature than a foreground subject (e.g., because the foreground subject is illuminated by the flash output), the cameras may modify the background and/or the foreground of the image to produce a more consistent color temperature across the image.

The sensor array 141 may also include or be configured to operate in an object detection mode, in which a user can select (and/or the device 100 can automatically identify) objects within a scene to facilitate those objects being processed, displayed, or captured differently than other parts of the scene. For example, a user may select (or the device 100 may automatically identify) a person's face in a scene, and the device 100 may focus on the person's face while selectively blurring the portions of the scene other than the person's face. Notably, features such as the HDR mode and the object detection mode may be provided with a single camera (e.g., a single lens and sensor).

The sensor array 141 may also include a depth sensing device 149 that is configured to estimate a distance between the device and a separate object or target. The depth sensing device 149 may estimate a distance between the device and a separate object or target using lasers and time-of-flight calculations, or using other types of depth sensing components or techniques.

The device 100 may also include a flash 148 (e.g., a rear-facing flash) that is configured to illuminate a scene to facilitate capturing images with the cameras of the sensor array 141. The flash 148 is configured to illuminate a scene to facilitate capturing images with the sensor array 141. The flash 148 may include one or more light sources, such as one or more light emitting diodes (e.g., 1, 2, 3, 4, or more LEDs). In some cases, the light source(s) may be illuminable in multiple different illumination patterns, which, along with a lens positioned over the light source(s), can produce different fields of illumination on a subject or scene. For example, and as described in greater detail herein, a light source may be segmented into a plurality of illuminable regions, with the illuminable regions positioned under different regions of the lens. When a first illumination pattern is active (e.g., one or more central illuminable regions), the emitted light may pass through a first region of the lens (e.g., a central region) and produce a first field of illumination on a subject or scene (e.g., a relatively narrow light distribution corresponding to a field of view of a telephoto lens). When a second illumination pattern is active (e.g., one or more peripheral illuminable regions), the emitted light may pass through a second region of the lens (e.g., a peripheral region) and produce a second field of illumination on a subject or scene (e.g., a relatively wider light distribution corresponding to a field of view of a wide angle lens). The flash 148 may be configured to produce two, three, or more different fields of illumination, each corresponding to a field of view of one of the cameras of the sensor array 141. Thus, for example, the flash 148 may produce a first field of illumination that corresponds to (e.g., is substantially equal to or greater than) a field of view of the first camera 142, a second field of illumination that corresponds to (e.g., is substantially equal to or greater than) a field of view of the second camera 144, and a third field of illumination that corresponds to (e.g., is substantially equal to or greater than) a field of view of the third camera 146.

The sensor array 141 may also include a microphone 150. The microphone 150 may be acoustically coupled to the exterior environment through a hole defined in the rear cover of the device 100 (e.g., through the portion of the rear cover that defines the protrusion 151).

Figure 1C:
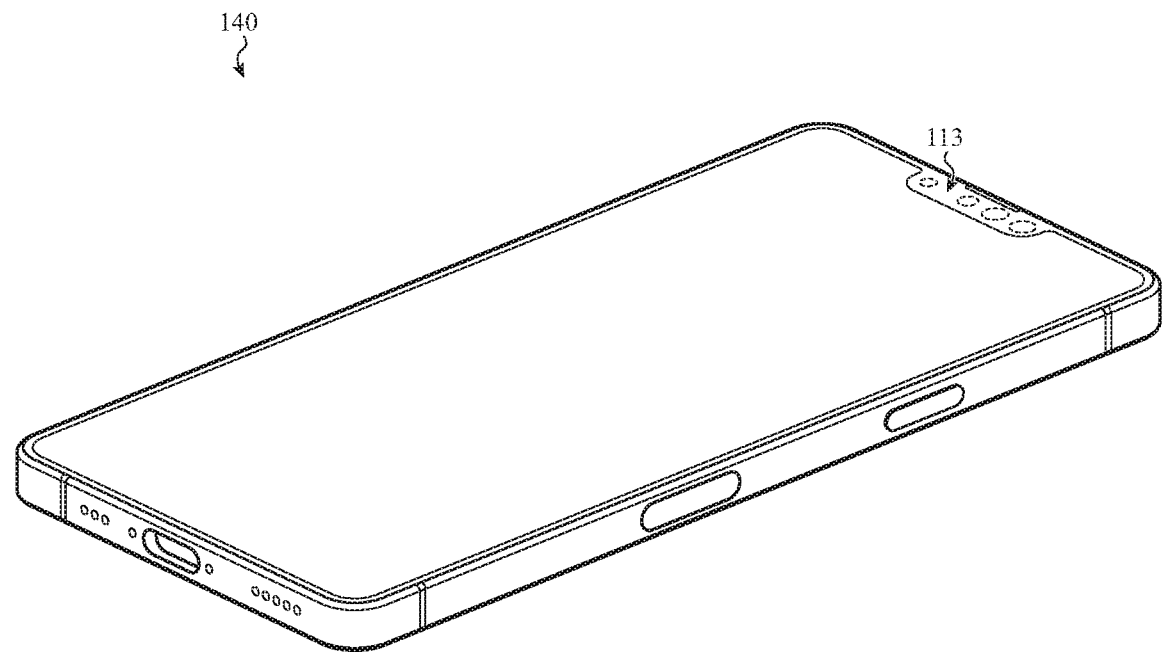
FIGS. 1C-1D depict another example electronic device.
Figure 1D:
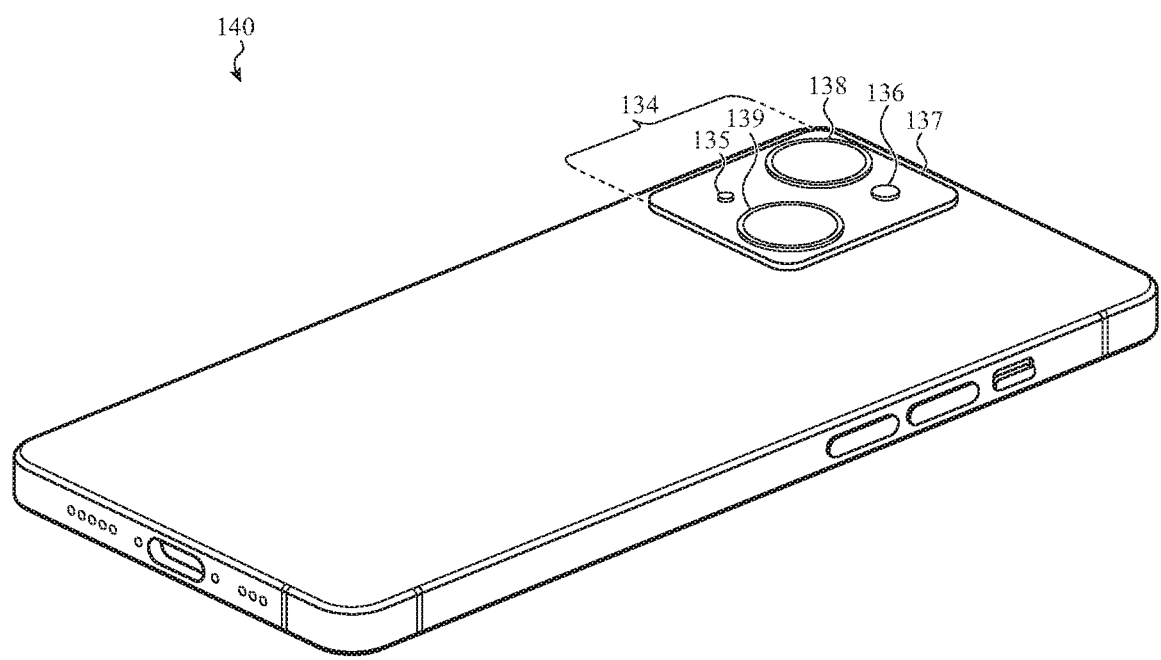

FIGS. 1C and 1D show another example electronic device 140 embodied as a mobile phone. The electronic device 140 may have many of the same or similar outward-facing components as the electronic device 100. Accordingly, descriptions and details of such components from FIGS. 1A-1B (e.g., displays, buttons, switches, housings, covers, charging ports, joint structures, etc.) apply equally to the corresponding components shown in FIGS. 1C and 1D.

In some cases, the device 140 may include a front-facing sensor region 113 positioned in a notch-like area of the front of the device 140. In some cases, as described herein, the front-facing sensor region 113 may be positioned in or defined by a recessed area of the display (e.g., an area that is not occupied by the display or by a visually active portion of the display). In some cases, the front-facing sensor region 113 includes a mask or other visually opaque component or treatment that defines openings for the sensors. In some cases, one or more of the sensors or other devices in the front-facing sensor region 113 (e.g., the front-facing camera) are aligned with a hole formed through one or more layers of the display to provide optical access to the sensor. The front-facing sensor region 113 may include components such as a flood illuminator module, a proximity sensor module, an infrared light projector, an infrared image capture device, and a front-facing camera.

While the device 100 in FIG. 1B is shown as including a sensor array 141 with three cameras, the device 140 as shown in FIG. 1D includes a sensor array 134 (e.g., a rear-facing sensor array in a rear-facing sensor array region) that includes two cameras. The sensor array 134 may be in a sensor array region that is defined by a protrusion 137 in a rear cover of the device 140. The protrusion 137 may have the same or similar construction as the protrusion 151 in FIG. 1B.

The device 140 may also include, as part of the sensor array 134, one or more rear-facing devices, which may include an ambient light sensor (ALS), a microphone 135, and/or a depth sensing device that is configured to estimate a distance between the device 140 and a separate object or target. The sensor array 134 may also include multiple cameras, such as a first camera 138 and a second camera 139. The first camera 138 may include a super-wide camera having a 12 megapixel sensor and a wide field of view (e.g., 120° FOV) optical stack with an aperture number of f/2.4; the second camera 139 may include a wide view camera having a 12 megapixel sensor and an aperture number of f/1.6. In some cases, the sensor array 134 may include a telephoto lens having a 12 megapixel sensor with a 3× optical zoom optical stack having an aperture number ranging from f/2.0 to f/2.8 (e.g., in addition to the first and second cameras 138, 139, or in place of one of the first or second cameras). One or more of the cameras (e.g., cameras 138, 139) of the sensor array 134 may also include optical image stabilization, whereby the lens is dynamically moved relative to a fixed structure within the device 140 to reduce the effects of "camera shake" on images captured by the camera. The camera(s) may also perform optical image stabilization by moving the image sensor relative to a fixed lens or optical assembly. One or more of the cameras may include autofocus functionality, in which one or more lens elements (and/or sensors) are movable to focus an image on a sensor. The sensor array 134 may also include a flash 136 (e.g., a rear-facing flash). The flash 136 may include a multi-segment LED, as described herein, or a single LED or other light emitting component.

As shown in FIG. 1D, the cameras of the sensor array 134 may be positioned diagonally with respect to the protrusion 137 (e.g., the raised sensor array). For example, a first hole may extend through the rear cover 132 at a location proximate a first corner region of the sensor array 134, and the first camera 138 may be positioned at least partially in the first hole, and a second hole may extend through the rear cover 132 at a location proximate a second corner region diagonal from the first corner region of the sensor array 134, and the second camera 139 may be positioned at least partially in the second hole. Thus, the first and second holes, and therefore the first and second cameras, may be positioned along a diagonal path from the first corner to the second corner of the sensor array 134.

The second camera 139 may have an image sensor with a pixel size between about 1.5 microns and about 2.0 microns, and the first camera 138 may have an image sensor with a pixel size between about 0.8 microns and about 1.4 microns. If a camera with a telephoto lens is provided, it may have an image sensor with a pixel size between about 0.8 microns and about 1.4 microns.

Other details about the sensor array, the individual cameras of the sensor array, and/or the flash described with respect to the device 100 may be applicable to the sensor array, the individual cameras, and/or the flash of the device 140, and such details will not be repeated here to avoid redundancy.

FIG. 2 depicts an exploded view of an example electronic device. In particular, FIG. 2 depicts an exploded view of a device 200, showing various components of the device 200 and example arrangements and configurations of the components. The device 200 may be an embodiment of the device 100, and the description of the various components and elements of the device 100 of FIGS. 1A and 1B may also be applicable to the device 200 depicted in FIG. 2. A redundant description of some of the components is not repeated herein for clarity.

As shown in FIG. 2, the device 200 includes a cover 202 (e.g., a front cover), which may be formed from or include a transparent or optically transmissive material. In some cases, the cover 202 is formed from or includes a glass material, and may therefore be referred to as a glass cover member. The glass material may be a silica-based glass material, an aluminosilicate glass, a boroaluminosilicate glass, an alkali metal aluminosilicate glass (e.g., a lithium aluminosilicate glass), or a chemically strengthened glass. Other example materials for the cover 202 include, without limitation, sapphire, ceramic, glass-ceramic, crystallizable glass materials, and plastic (e.g., polycarbonate). The cover 202 may be formed as a monolithic or unitary sheet. The cover 202 may also be formed as a composite of multiple layers of different materials, coatings, and other elements. In this example, the cover 202 may be formed from a glass-ceramic material. A glass-ceramic material may include both amorphous and crystalline or non-amorphous phases of one or more materials and may be formulated to improve strength or other properties of the cover 202. A glass-ceramic material may be a silica-based glass ceramic material, such as an aluminosilicate glass ceramic material or a boroaluminosilicate glass ceramic material. The glass-ceramic material may be chemically strengthened by ion exchange. In some cases, the cover 202 may include a sheet of chemically strengthened glass or glass-ceramic having one or more coatings including an anti-reflective (AR) coating, an oleophobic coating, or other type of coating or optical treatment. In some cases, the cover 202 includes a sheet of material that is less than 1 mm thick. In some cases, the sheet of material is less than 0.80 mm. In some cases, the sheet of material is approximately 0.50 mm or less. The cover 202 may be chemically strengthened using an ion exchange process to form a compressive stress layer along exterior surfaces of the cover 202.

The cover 202 extends over a substantial entirety of the front surface of the device and may be positioned within an opening defined by the housing 210. As described in more detail below, the edges or sides of the cover 202 may be surrounded by a protective flange or lip of the housing 210 without an interstitial component between the edges of the cover 202 and the respective flanges of the housing 210. This configuration may allow an impact or force applied to the housing 210 to be transferred to the cover 202 without directly transferring shear stress through the display 203 or frame 204.

As shown in FIG. 2, the display 203 is coupled to an internal surface of the cover 202. The display 203 may include an edge-to-edge organic light emitting diode (OLED) display that measures 16.97 cm (6.69 inches) corner-to-corner (or 6.12 inches corner-to-corner). The perimeter or non-active area of the display 203 may be reduced to allow for very thin device borders around the active area of the display 203. In some cases, the display 203 allows for border regions of 1.5 mm or less. In some cases, the display 203 allows for border regions of 1 mm or less. In one example implementation, the border region is approximately 0.9 mm. The display 203 may have a relatively high pixel density of approximately 460 pixels per inch (PPI) or greater. The display 203 may have an integrated (on-cell) touch-sensing system. For example, an array of electrodes (or other touch-sensing components) that are integrated into the OLED display may be time and/or frequency multiplexed in order to provide both display and touch-sensing functionality. The electrodes may be configured to detect a location of a touch, a gesture input, multi-touch input, or other types of touch input along the external surface of the cover 202. In some cases, the display 203 includes another type of display element, such as a liquid-crystal display (LCD) without an integrated touch-sensing system. That is, the device 200 may include one or more touch- and/or force-sensing components or layers that are positioned between the display 203 and the cover 202.

The display 203, also referred to as a display stack, may include always-on-display (AOD) functionality. For example, the display 203 may be configurable to allow designated regions or subsets of pixels to be displayed when the device 200 is powered on such that graphical content is visible to the user even when the device 200 is in a low-power or sleep mode. This may allow the time, date, battery status, recent notifications, and other graphical content to be displayed in a lower-power or sleep mode. This graphical content may be referred to as persistent or always-on graphical output. While some battery power may be consumed when displaying persistent or always-on graphical output, the power consumption is typically less than during normal or full-power operation of the display 203. This functionality may be enabled by only operating a subset of the display pixels and/or at a reduced resolution in order to reduce power consumption by the display 203.

The display 203 may include multiple layers, including touch-sensing layers or components, optional force-sensing layers or components, display layers, and the like. The display 203 may define a graphically active region in which graphical outputs may be displayed. In some cases, portions of the display 203 may include graphically inactive regions, such as portions of the display layers that do not include active display components (e.g., pixels) or are otherwise not configured to display graphical outputs. In some cases, graphically inactive regions may be located along the peripheral borders or other edges of the display stack 203.

As shown in FIG. 2, the device 200 may also include a frame member 204, also referred to simply as a frame 204, that is positioned below the cover 202 and that extends around at least an outer periphery of the display 203. A perimeter of the frame 204 may be attached to a lower or inner surface of the cover 202. A portion of the frame 204 may extend below the display 203 and may attach the cover 202 to the housing 210. Because the display 203 is attached to a lower or inner surface of the cover 202, the frame 204 may also be described as attaching both the display 203 and the cover 202 to the housing 210. The frame 204 may be formed of a polymer material, metal material, or combination of polymer and metal materials. The frame 204 may support elements of the display stack, provide anchor points for flexible circuits, and/or be used to mount other components and device elements. In some cases, the frame 204 includes one or more metal or conductive elements that provide shielding between device components, such as between the display stack (including display components and touch sensor components) and other components like the haptic actuator 222, the speaker system 224, and the like.

The cover 202, display stack 203, and frame member 204 may be part of a front cover assembly 201 of the device 200. The front cover assembly 201 (e.g., the cover 202 of the front cover assembly) may define a front exterior surface of the device.

The front cover assembly 201 may be assembled as a subassembly, which may then be attached to a housing component. For example, as described herein, the display 203 may be attached to the cover 202 (e.g., via a transparent adhesive), and the frame member 204 may be attached (e.g., via adhesive) to the cover around a periphery of the display stack 203. The front cover assembly 201 may then be attached to a housing component of the device 200 by mounting and adhering the frame member 204 to a ledge defined by the housing component.

The device 200 also includes a speaker module 250 that is configured to output sound via a speaker port. The speaker port may be positioned in and/or at least partially defined by a recess of the cover 202. As described herein, a trim piece may be positioned at least partially in the recess to facilitate the output of sound while also inhibiting the ingress of debris, liquid, or other materials or contaminants into the device 200. Output from the speaker module 250 may pass through an audio passage or acoustic path defined at least in part by the speaker module 250 itself, and the trim piece. In some cases, part of the acoustic path (e.g., between the speaker module 250 and the trim piece) is defined by the housing 210 and/or a molded material that is coupled to the housing 210. For example, a molded material (e.g., a fiber-reinforced polymer) may be molded against a metal portion of the housing 210 (e.g., the housing component 213, described herein). The molded material may also form one or more intermediate elements, such as joint structures, that also structurally join housing components together (e.g., the joint structures 218). A port or passage (e.g., a tube-like tunnel) may be defined through the molded material to acoustically couple the speaker module 250 to the trim piece and/or the recess more generally, thereby directing sound from the speaker module 250 to the exterior of the device 200.

As shown in FIG. 2, the device 200 also includes one or more cameras, optical emitters, and/or sensing elements that are configured to transmit signals, receive signals, or otherwise operate along the front surface of the device. In this example, the device 200 includes a front camera 206 that includes a high-resolution camera sensor. The front camera 206 may have a 12 megapixel resolution sensor with optical elements that provide an 85° field of view and an aperture number of f/1.9. The front camera 206 may include auto-focus functionality in which one or more of the lens elements move (e.g., up to about 100 microns perpendicular to the cover) in order to focus an image on the camera's sensor. In some cases, the autofocusing front-facing camera is capable of providing continuous autofocus functionality during video capture. The device 200 also includes an optical facial recognition system 252 that includes an infrared light projector and infrared light sensor that are configured to sense an array of depth points or regions along the face of the user. The array of depth points may be characterized as a unique signature or bio-identifier, which may be used to identify the user and unlock the device 200 or authorize functionality on the device 200 like the purchase of software apps or the use of payment functionality provided by the device 200.

The device 200 may also include one or more other sensors or components. For example, the device 200 may include a front light illuminator element for providing a flash or illumination for the front camera 206. The device 200 may also include an ambient light sensor (ALS) that is used to detect ambient light conditions for setting exposure aspects of the front camera 206 and/or for controlling the operation of the display. The device 200 may also include a proximity sensor for detecting the proximity of a user or other object to the device 200. In some cases, as described herein, the proximity sensor detects proximity to other objects through an active region of the display.

The display 203 may include one or more holes extending through the display to accommodate the front camera 206, the facial recognition system 252, and optionally other front-facing sensors or other components. In some cases, the display 203 includes two holes, including a first hole for the front camera 206 and a second hole for the facial recognition system 252. In some cases, the display 203 includes one hole (e.g., a single hole shared by the front camera 206 and the facial recognition system 252). In some cases, the display 203 includes three holes (e.g., a first hole for the front camera 206, a second hole for an emitter of the facial recognition system 252, and a third hole for a receiver of the facial recognition system 252).

FIG. 2 also illustrates one or more cameras, optical emitters, and/or sensing elements that are configured to transmit signals, receive signals, or otherwise operate along the rear surface of the device. As depicted in FIG. 2, these elements may be integrated in a sensor array 260. In this example, the sensor array 260 includes a first camera 261 having a 12 megapixel sensor and a telephoto lens with a 3× optical zoom and an aperture number of f/2.8. The sensor array 260 also includes a second camera 262 having a 48 megapixel sensor with a wide angle lens having an aperture number of f/1.7. The sensor array 260 may also include a third camera 263 having a 12 megapixel sensor and a super-wide camera with a wide field of view (e.g., 120° FOV) and an aperture number of f/2.2. The third camera 263 may also have an aperture number of f/2.4. The first, second, and third cameras may include lens-based or sensor-based image stabilization.

The sensor array 260 also includes a light illuminator that may be used as a flash for photography or as an auxiliary light source (e.g., a flashlight). The sensor array 260 also features an integrated chassis design that minimizes space while providing the precision alignment required for multiple high-resolution cameras. In some cases, the sensor array 260 also includes a microphone, an ambient light sensor, and other sensors that are adapted to sense along the rear surface of the device 200.

The sensor array 260 may also include a depth sensing device 281 (which may correspond to or be an embodiment of the depth sensing device 149, FIG. 1B, or any other depth sensing device described herein) that is able to estimate a distance to objects positioned behind the device 200. The depth sensing device 281 may include an optical sensor that uses time-of-flight or other optical effect to measure a distance between the device 200 and an external object. The depth sensing device 281 may include one or more optical emitters that are adapted to emit one or more beams of light, which may be used to estimate the distance. In some cases, the one or more beams of light are coherent light beams having a substantially uniform wavelength/frequency. A coherent light source may facilitate depth measurements using a time of flight, phase shift, or other optical effect. In some cases, the depth sensing device 281 uses a sonic output, radio output, or other type of output that may be used to measure the distance between the device 200 and one or more external objects. The depth sensing device 281 may be positioned proximate a window 271 (e.g., a region of the rear cover 272 or other component that covers the components of the sensor array 260) through which the depth sensing device 281 may send and/or receive signals (e.g., laser light, infrared light, visible light, etc.).

As shown in FIG. 2, the cameras 261, 262, 263 may be aligned with camera covers 266, 267, 268, respectively. The covers 266, 267, 268 may be formed from a glass or sapphire material and may provide a clear (e.g., transparent or optically transmissive) window through which the cameras 261, 262, 263 are able to capture a photographic image. In other cases, the covers 266, 267, 268 are optical lenses that filter, magnify, or otherwise condition light received by the respective camera 261, 262, 263. The other sensing or transmitting elements of the sensor array 260 may transmit and/or receive signals through a region of the rear cover 272 or through a separate cover that is coupled to the rear cover 272. As shown in FIG. 2, the covers 266, 267, 268 may extend beyond the exterior surface of the cover 272, and may define a recess along the interior side of the cover 272, such that the lens or other element of the cameras 261, 262, 263 can extend into the respective recesses. In this way, the device 200 may accommodate a larger lens or other elements of the cameras 261, 262, 263 than would be possible if the recess were not provided. In some cases, trim assemblies (e.g., trim assembly 269) may be coupled to the rear cover 272 and may support the covers 266, 267, 268.

The device 200 also includes a battery 230. The battery 230 provides electrical power to the device 200 and its various systems and components. The battery 230 may include a 4.45 V lithium ion battery that is encased in a foil or other enclosing element (e.g., a pouch). The battery 230 may include a rolled electrode configuration, sometimes referred to as a "jelly roll" or a folded or stacked electrode configuration. The battery 230 may be attached to the device 200 (e.g., to a support structure 219) with one or more adhesives and/or other attachment techniques. In one example, the battery 230 may be attached to the support structure 219, or another structure of the device 200, with a two-layer adhesive, where a first adhesive is adhered to the battery 230 and to a second adhesive, and the second adhesive is bonded to the first adhesive and to the support structure 219 (or other structure of the device 200). The first and second adhesives may have different properties, such as different stiffness (e.g., Young's modulus), different adhesive properties, or the like. For example, in some cases, the first adhesive is configured to adhere to the material of the battery 230 (e.g., with a bond strength above a threshold value), while the second adhesive is configured to adhere to the support structure 219 or other structure of the device (e.g., with a bond strength above the threshold value). In such cases, the first adhesive may not form a sufficiently strong bond with the support structure 219, and the second adhesive may not form a sufficiently strong bond with the battery 230, though the first and second adhesives may form a sufficiently strong bond with one another. Accordingly, by using the two different adhesives (e.g., in the layered configuration described) to ultimately secure the battery 230 to the support structure 219, the overall strength and/or security of the attachment may be greater than if a single adhesive were used.

The battery 230 may be recharged via the charging port 232 (e.g., from a power cable plugged into the charging port 232 through a charging access opening 226), and/or via a wireless charging system 240. The battery 230 may be coupled to the charging port 232 and/or the wireless charging system 240 via battery control circuitry that controls the power provided to the battery and the power provided by the battery to the device 200. The battery 230 may include one or more lithium ion battery cells or any other suitable type of rechargeable battery element.

The wireless charging system 240 may include a coil that inductively couples to an output or transmitting coil of a wireless charger. The coil may provide current to the device 200 to charge the battery 230 and/or power the device. In this example, the wireless charging system 240 includes a coil assembly 242 that includes multiple wraps of a conductive wire or other conduit that is configured to produce a (charging) current in response to being placed in an inductive charging electromagnetic field produced by a separate wireless charging device or accessory. The coil assembly 242 also includes or is associated with an array of magnetic elements that are arranged in a circular or radial pattern. The magnetic elements may help to locate the device 200 with respect to a separate wireless charging device or other accessory. In some implementations, the array of magnets also help to radially locate, orient, or "clock" the device 200 with respect to the separate wireless charging device or other accessory. For example, the array of magnets may include multiple magnetic elements having alternating magnetic polarity that are arranged in a radial pattern. The magnetic elements may be arranged to provide a magnetic coupling to the separate charging device in a particular orientation or set of discrete orientations to help locate the device 200 with respect to the separate charging device or other accessory. This functionality may be described as self-aligning or self-locating wireless charging. As shown in FIG. 2, the device 200 also includes a magnetic fiducial 244 for helping to locate the separate wireless charging device or accessory. In one example, the magnetic fiducial 244 is adapted to magnetically couple to a cable or power cord of the separate wireless charging device or other accessory. By coupling to the cable or power cord, the rotational alignment of the device 200 and the separate wireless charging device or other accessory may be maintained with respect to an absolute or single position. Also, by magnetically coupling the cable or cord to the rear surface of the device 200, the charging device or other accessory may be more securely coupled to the device 200.

In some implementations, the wireless charging system 240 includes an antenna or other element that detects the presence of a charging device or other accessory. In some cases, the charging system includes a near-field communications (NFC) antenna that is adapted to receive and/or send wireless communications between the device 200 and the wireless charger or other accessory. In some cases, the device 200 is adapted to perform wireless communications to detect or sense the presence of the wireless charger or other accessory without using a dedicated NFC antenna. The communications may also include information regarding the status of the device, the amount of charge held by the battery 230, and/or control signals to increase charging, decrease charging, start charging, and/or stop charging for a wireless charging operation.

The device 200 may also include a speaker system 224. The speaker system 224 may be positioned in the device 200 so that a respective port 235 is aligned with or otherwise proximate an audio output of the speaker system 224. Accordingly, sound that is output by the speaker system 224 exits the housing 210 via the respective port 235. The speaker system 224 may include a speaker positioned in a housing that defines a speaker volume (e.g., an empty space in front of or behind a speaker diaphragm). The speaker volume may be used to tune the audio output from the speaker and optionally mitigate destructive interference of the sound produced by the speaker.

The device 200 may also include a haptic actuator 222. The haptic actuator 222 may include a movable mass and an actuation system that is configured to move the mass to produce a haptic output. The actuation system may include one or more coils and one or more magnets (e.g., permanent and/or electromagnets) that interact to produce motion. The magnets may be or may include recycled magnetic material.

When the coil(s) are energized, the coil(s) may cause the mass to move, which results in a force being imparted on the device 200. The motion of the mass may be configured to cause a vibration, pulse, tap, or other tactile output detectable via an exterior surface of the device 200. The haptic actuator 222 may be configured to move the mass linearly, though other movements (e.g., rotational) are also contemplated. Other types of haptic actuators may be used instead of or in addition to the haptic actuator 222.

The device 200 also includes a circuit board assembly 220. The circuit board assembly 220 may include a substrate, and processors, memory, and other circuit elements coupled to the substrate. The circuit board assembly 220 may include multiple circuit substrates that are stacked and coupled together in order to maximize the area available for electronic components and circuitry in a compact form factor. The circuit board assembly 220 may include provisions for a subscriber identity module (SIM). The circuit board assembly 220 may include electrical contacts and/or a SIM tray assembly for receiving a physical SIM card and/or the circuit board assembly 220 may include provisions for an electronic SIM. The circuit board assembly 220 may be wholly or partially encapsulated to reduce the chance of damage due to ingress of water or other fluid.

The circuit board assembly 220 may also include wireless communication circuitry, which may be operably coupled to and/or otherwise use the housing components 211, 212, 213, 214, 215, or 216 (or portions thereof) as radiating members to provide wireless communications. The circuit board assembly 220 may also include components such as accelerometers, gyroscopes, near-field communications circuitry and/or antennas, compasses, and the like. In some implementations, the circuit board assembly 220 may include a magnetometer that is adapted to detect and/or locate an accessory. For example, the magnetometer may be adapted to detect a magnetic (or non-magnetic) signal produced by an accessory of the device 200 or other device. The output of the magnetometer may include a direction output that may be used to display a directional indicia or other navigational guidance on the display 203 in order to guide the user toward a location of the accessory or other device.

The device 200 may also include one or more pressure transducers that may be operable to detect changes in external pressure in order to determine changes in altitude or height. The pressure sensors may be externally ported and/or positioned within a water-sealed internal volume of the housing 210. The output of the pressure sensors may be used to track flights of stairs climbed, a location (e.g., a floor) of a multi-story structure, movement performed during an activity in order to estimate physical effort or calories burned, or other relative movement of the device 200. A pressure transducer may be positioned in a module 237 that is in fluidic communication with the exterior environment through ports 225 in the housing 210. The module 237 may include additional components, such as a microphone and a barometric vent (e.g., to allow pressure equalization between the interior of the device 200 and the exterior environment, while inhibiting water ingress).

The circuit board assembly 220 may also include global positioning system (GPS) electronics that may be used to determine the location of the device 200 with respect to one or more satellites (e.g., a Global Navigation Satellite System (GNSS)) in order to estimate an absolution location of the device 200. In some implementations, the GPS electronics are operable to utilize dual frequency bands. For example, the GPS electronics may use L1 (L1C), L2 (L2C), L5, L1+L5, and other GPS signal bands in order to estimate the location of the device 200.

The housing 210 may also include a support structure 219, which may be attached to the housing 210. The support structure 219 may be formed of metal, and may act as a structural mounting point for components of the device 200. The support structure 219 may define an opening that corresponds to the size of the coil assembly 242 of the wireless charging system 240, such that the support structure 219 does not shield the wireless coil assembly 242 or otherwise negatively affect the inductive coupling between the coil of the charging system 240 and an external wireless charger or accessory. In some cases, the support structure 219 is attached to the cover 272 (e.g., with adhesive and/or other fastening techniques and/or components) to form a subassembly that includes the cover 272 and the support structure 219, which is then attached to the housing 210.

As shown in FIG. 2, the housing may include a cover 272 (e.g., back or rear cover 272) that may define a substantial entirety of the rear surface of the device 200. The rear cover 272, the front cover 202, and the housing 210 may at least partially define an enclosure of the device 200, which may define an internal volume in which components of the device 200 are positioned. The cover 272 may be formed from or include a transparent or optically transmissive material. For example, the cover 272 may include a substrate formed from or including a glass material or other suitable material (e.g., a silica-based glass material, an aluminosilicate glass, a boroaluminosilicate glass, an alkali metal aluminosilicate glass, a chemically strengthened glass, sapphire, ceramic, glass-ceramic, crystallizable glass materials, or plastic). A glass-ceramic material may be a silica-based glass ceramic material, such as an aluminosilicate glass ceramic material or a boroaluminosilicate glass ceramic material. The glass-ceramic material may be chemically strengthened by ion exchange. The substrate may have portions that are less than 1 mm thick. In some cases, the substrate has portions that are less than 0.80 mm. In some cases, the substrate has portions that are approximately 0.60 mm or less. The cover 272 may have a uniform thickness or, in some cases, may have a thickened or raised portion that surrounds the camera covers 263, 264. The cover 272 may be machined (e.g., ground) into a final shape before being polished and/or textured to provide the desired surface finish. The texture may be specially configured to provide a matte appearance while also being resistant to collecting a buildup of skin, lint, or other debris. A series of cosmetic layers may be formed along the inner surface of the cover 272 to provide a desired optical effect and final color of the device 200.

The cover 272 may be part of a rear cover assembly 273. The rear cover assembly 273 may be coupled to the housing 210. In some cases, the rear cover assembly 273 includes components such as the camera covers 266, 267, 268, the trim assemblies (e.g., trim assemblies 269) components of a wireless charging system, structural components (e.g., frames), mounting clips, and/or other components, systems, subsystems, and/or materials.

Similar to as described above with respect to cover 202, the cover 272 may be positioned at least partially within an opening defined in the housing 210. Also similar to as described above with respect to cover 202, the edges or sides of the cover 272 may be surrounded by a protective flange or lip of the housing 210 without an interstitial component between the edges of the cover 272 and the respective flanges of the housing 210. The cover 272 is typically chemically strengthened using an ion exchange process to form a compressive stress layer along exterior surfaces of the cover 272.

As described above, the housing 210 may include housing components 211, 212, 213, 214, 215, and 216 structurally joined together via joint structures 218. The joint structures 218 (e.g., the material of the joint structures) may extend over inner surfaces of the housing components. More particularly, a portion of the joint structures 218 may contact, cover, encapsulate, and/or engage with retention features of the housing components that extend from the inner surfaces of the housing components.

Housing components 211, 212, 213, 214, 215, and 216 may also be referred to herein as housing segments and may be formed from aluminum, stainless steel, or other metal or metal alloy material. As described herein, the housing components 211, 212, 213, 214, 215, and 216 may provide a robust and impact resistant sidewall for the device 200. In the present example, the housing components 211, 212, 213, 214, 215, and 216 define a flat sidewall that extends around the perimeter of the device 200. The flat sidewall may include rounded or chamfered edges that define the upper and lower edges of the sidewall of the housing 210. The housing components 211, 212, 213, 214, 215, and 216 may each have a flange portion or lip that extends around and at least partially covers a respective side of the front and rear covers 202, 272. There may be no interstitial material or elements between the flange portion or lip and the respective side surface of the front and rear covers 202, 272. This may allow forces or impacts that are applied to the housing 210 to be transferred to the front and rear covers 202, 272 without affecting the display or other internal structural elements, which may improve the drop performance of the device 200.

As shown in FIG. 2, the device 200 includes multiple antennas that may be adapted to conduct wireless communication using a 5G communication protocol. In particular, the device 200 may include a (side-fired) antenna array 282 that is configured to transmit and receive wireless communication signals through an antenna window 283 or waveguide formed along or otherwise integrated with the sidewall of the housing 210. The side-fired antenna array 282 may be coupled to the circuit board assembly 220 via a flexible circuit element or other conductive connection, as described herein, and may include multiple radiating elements (e.g., 5 radiating elements) that send and/or receive wireless signals. The device 200 may also include a rear antenna module that may include one or more (rear-fired) antenna arrays that may be configured to transmit and receive wireless communication signals through the cover 272. The antenna module may be attached to a back or bottom surface of the circuit board assembly 220.

The antenna modules may include multiple antenna arrays. For example, the antenna modules may include one or more millimeter-wave antenna arrays. In the case where the antenna modules include multiple millimeter-wave antenna arrays (each of which may include one or more radiating elements), the multiple millimeter-wave antenna arrays may be configured to operate according to a diversity scheme (e.g., spatial diversity, pattern diversity, polarization diversity, or the like). The antenna modules may also include one or more ultra-wideband antennas.

The antenna arrays may be adapted to conduct millimeter wave 5G communications and may be adapted to use or be used with beam-forming or other techniques to adapt signal reception depending on the use case. The device 200 may also include multiple antennas for conducting multiple-in multiple-out (MIMO) wireless communications schemes, including 4G, 4G LTE, and/or 5G MIMO communication protocols. As described herein, one or more of the housing components 211, 212, 213, 214, 215, and 216 (or portions thereof) may be adapted to operate as antennas for a MIMO wireless communication scheme (or other wireless communication scheme).

Figure 3:
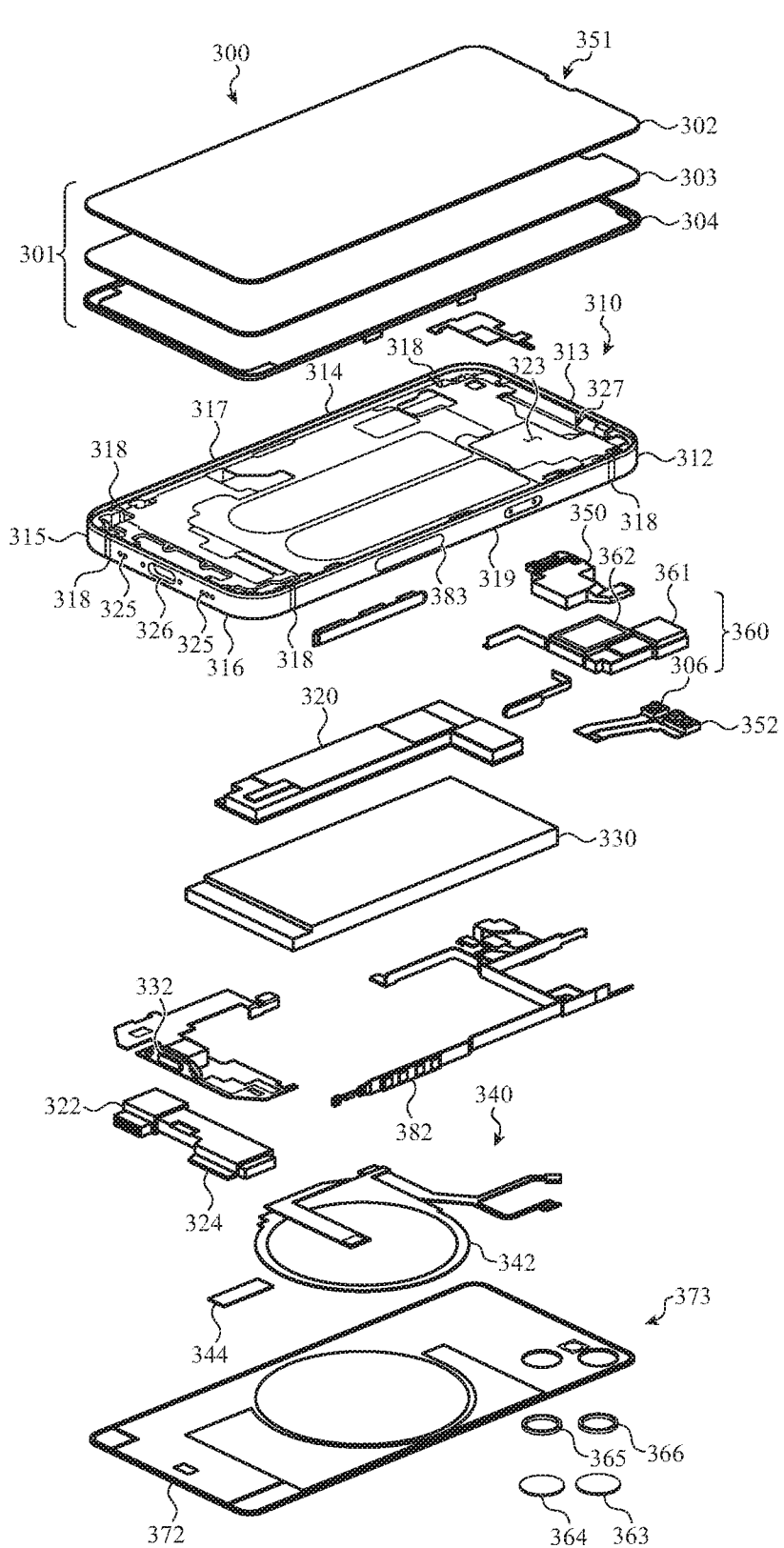
FIG. 3 depicts an exploded view of an example electronic device.

FIG. 3 depicts an exploded view of an example electronic device. In particular, FIG. 3 depicts an exploded view of a device 300, showing various components of the device 300 and example arrangements and configurations of the components. The device 200 may be an embodiment of the device 140, and the description of the various components and elements of device 100 of FIGS. 1A and 1B may also be applicable to the device 300 depicted in FIG. 3. A redundant description of some of the components is not repeated herein for clarity.

As shown in FIG. 3, the device 300 includes a cover 302 (e.g., a front cover), which may be formed from or include a transparent or optically transmissive material. In some cases, the cover 302 is formed from or includes a glass material or other suitable transparent or optically transmissive material (e.g., a silica-based glass material, an aluminosilicate glass, a boroaluminosilicate glass, an alkali metal aluminosilicate glass, a chemically strengthened glass, sapphire, ceramic, glass-ceramic, crystallizable glass materials, or plastic). In this example, the cover 302 may be formed from a glass-ceramic material. A glass-ceramic material may include both amorphous and crystalline or non-amorphous phases of one or more materials and may be formulated to improve strength or other properties of the cover 302. A glass-ceramic material may be a silica-based glass ceramic material, such as an aluminosilicate glass ceramic material or a boroaluminosilicate glass ceramic material. The glass-ceramic material may be chemically strengthened by ion exchange. In some cases, the cover 302 may include a sheet of chemically strengthened material having one or more coatings including an anti-reflective (AR) coating, an oleophobic coating, or other type of coating or optical treatment. In some cases, the cover 302 includes a sheet of material that is less than 1 mm thick. In some cases, the sheet of material is less than 0.80 mm. In some cases, the sheet of material is approximately 0.60 mm or less. The cover 302 may be chemically strengthened using an ion exchange process to form a compressive stress layer along exterior surfaces of the cover 302.

The cover 302 extends over a substantial entirety of the front surface of the device and may be positioned within an opening defined by the housing structure 310. In some cases, the edges or sides of the cover 302 may be surrounded by a protective flange or lip of the housing structure 310 without an interstitial component between the edges of the cover 302 and the respective flanges of the housing structure 310. This configuration may allow an impact or force applied to the housing structure 310 to be transferred to the cover 302 without directly transferring shear stress through the display 303 or frame 304.

As shown in FIG. 3, the display 303 is attached to an internal surface of the cover 302. The display 303 may include an edge-to-edge organic light emitting diode (OLED) display that measures 15.4 cm (6.1 inches) corner-to-corner. The perimeter or non-active area of the display 303 may be reduced to allow for very thin device borders around the active area of the display 303. In some cases, the display 303 allows for border regions of 1.5 mm or less. In some cases, the display 303 allows for border regions of 1 mm or less. In one example implementation, the border region is approximately 0.9 mm. The display 303 may have a relatively high pixel density of approximately 460 pixels per inch (PPI) or greater. In some cases, the display 303 has a pixel density of approximately 475 PPI. The display 303 may have an integrated (on-cell) touch-sensing system. For example, an array of electrodes (or other touch-sensing components) that are integrated into the OLED display may be time and/or frequency multiplexed in order to provide both display and touch-sensing functionality. The electrodes may be configured to detect a location of a touch, a gesture input, multi-touch input, or other types of touch input along the external surface of the cover 302. In some cases, the display 303 includes another type of display element, such as a liquid-crystal display (LCD) without an integrated touch-sensing system. That is, the device 300 may include one or more touch- and/or force-sensing components or layers that are positioned between the display 303 and the cover 302.

The display 303, also referred to as a display stack, may include always-on-display (AOD) functionality. For example, the display 303 may be configurable to allow designated regions or subsets of pixels to be displayed when the device 300 is powered on such that graphical content is visible to the user even when the device 300 is in a low-power or sleep mode. This may allow the time, date, battery status, recent notifications, and other graphical content to be displayed in a lower-power or sleep mode. This graphical content may be referred to as persistent or always-on graphical output. While some battery power may be consumed when displaying persistent or always-on graphical output, the power consumption is typically less than during normal or full-power operation of the display 303. This functionality may be enabled by only operating a subset of the display pixels and/or at a reduced resolution in order to reduce power consumption by the display 303.

The display 303 may include multiple layers, including touch-sensing layers or components, optional force-sensing layers or components, display layers, and the like. The display 303 may define a graphically active region in which graphical outputs may be displayed. In some cases, portions of the display 303 may include graphically inactive regions, such as portions of the display layers that do not include active display components (e.g., pixels) or are otherwise not configured to display graphical outputs. In some cases, graphically inactive regions may be located along the peripheral borders or other edges of the display stack 303.

As shown in FIG. 3, the device 300 may also include a frame member 304, also referred to simply as a frame 304, that is positioned below the cover 302 and that extends around an outer periphery of the display 303. A perimeter of the frame 304 may be attached to a lower or inner surface of the cover 302. A portion of the frame 304 may extend below the display 303 and may attach the cover 302 to the housing structure 310. Because the display 303 is attached to a lower or inner surface of the cover 302, the frame 304 may also be described as attaching both the display 303 and the cover 302 to the housing structure 310. The frame 304 may be formed of a polymer material, a metal material, or a combination of polymer and metal materials. The frame 304 may support elements of the display stack, provide anchor points for flexible circuits, and/or be used to mount other components and device elements. In some cases, the frame 304 includes one or more metal or conductive elements that provide shielding between device components, such as between the display stack (including display components and touch sensor components) and other components like the haptic actuator 322, the speaker system 324, and the like.

The cover 302, display or display stack 303, and frame member 304 may be part of a front cover assembly 301 of the device 300. The front cover assembly 301 (e.g., a front cover of the front cover assembly) may define a front exterior surface of the device. The front cover assembly 301 may be assembled as a subassembly, which may then be attached to a housing component. For example, as described herein, the display 303 may be attached to the cover 302 (e.g., via a transparent adhesive), and the frame member 304 may be attached (e.g., via adhesive) to the cover around a periphery of the display stack 303. The front cover assembly 301 may then be attached to a housing component of the device 300 by mounting and adhering the frame member 304 to a ledge defined by the housing component.

The device 300 also includes a speaker module 350 that is configured to output sound via a speaker port. The speaker port may be positioned in and/or at least partially defined by a recess 351 of the cover 302. As described herein, a trim piece may be positioned at least partially in the recess 351 to facilitate the output of sound while also inhibiting the ingress of debris, liquid, or other materials or contaminants into the device 300. Output from the speaker module 350 may pass through an audio passage or acoustic path defined at least in part by the speaker module 350 itself and the trim piece. In some cases, part of the acoustic path (e.g., between the speaker module 350 and the trim piece) is defined by the housing structure 310 and/or a molded material that is coupled to the housing structure 310. For example, a molded material (e.g., a fiber-reinforced polymer) may be molded against a metal portion of the housing structure 310 (e.g., the housing component 313, described herein). The molded material may also form one or more intermediate elements, such as joint structures, that also structurally join housing components together (e.g., the joint structures 318). A port or passage (e.g., a tube-like tunnel) may be defined through the molded material to acoustically couple the speaker module 350 to the trim piece and/or the recess 351 more generally, thereby directing sound from the speaker module 350 to the exterior of the device 300.

As shown in FIG. 3, the device 300 also includes one or more cameras, optical emitters, and/or sensing elements that are configured to transmit signals, receive signals, or otherwise operate along the front surface of the device. In this example, the device 300 includes a front camera 306 that includes a high-resolution camera sensor. The front camera 306 may have a 12 megapixel resolution sensor with optical elements that provide an 85° field of view. The front camera 306 may have an aperture number of f/1.9. The front camera 306 may include autofocus functionality in which one or more of the lens elements move (e.g., up to about 100 microns perpendicular to the cover) in order to focus an image on the camera's sensor. In some cases, the autofocusing front-facing camera is capable of providing continuous autofocus functionality during video capture. The device 300 also includes an optical facial recognition system 352 that includes an infrared light projector and infrared light sensor that are configured to sense an array of depth points or regions along the face of the user. The array of depth points may be characterized as a unique signature or bioidentifier, which may be used to identify the user and unlock the device 300 or authorize functionality on the device 300 like the purchase of software apps or the use of payment functionality provided by the device 300.

The device 300 may also include one or more other sensors or components. For example, the device 300 may include a front light illuminator element for providing a flash or illumination for the front camera 306. The device 300 may also include an ambient light sensor (ALS) that is used to detect ambient light conditions for setting exposure aspects of the front camera 306 and/or for controlling the operation of the display.

FIG. 3 also illustrates one or more cameras, optical emitters, and/or sensing elements that are configured to transmit signals, receive signals, or otherwise operate along the rear surface of the device. As depicted in FIG. 3, these elements may be part of a sensor array 360. In this example, the sensor array 360 includes a first camera 361 having a 12 megapixel image sensor and a wide angle lens with an aperture number of f/1.6. The first camera 361 may also include a dual photodiode sensor having an APS+ sensor format. The sensor array 360 may also include a second camera 362 having a 12 megapixel image sensor and a super-wide angle lens (120° FOV) with an aperture number of f/2.4. The sensor array 360 also includes a light illuminator that may be used as a flash for photography or as an auxiliary light source (e.g., a flashlight). In some cases, the sensor array 360 also includes a microphone, an ambient light sensor, a depth sensing device, and/or other sensors that are adapted to sense along the rear surface of the device 300.

As shown in FIG. 3, the cameras 361 and 362 may be aligned with camera covers 363 and 364, respectively. The covers 363, 364 may be formed from a glass, glass-ceramic, or sapphire material and may provide a clear (e.g., transparent or optically transmissive) window through which the cameras 361, 362 are able to capture a photographic image. In other cases, the covers 363, 364 are optical lenses that filter, magnify, or otherwise condition light received by the respective camera 361, 362. The other sensing or transmitting elements of the sensor array 360 may transmit and/or receive signals through a region of the rear or rear cover 372 or through a separate cover that is coupled to the rear cover 372. As shown in FIG. 3, the covers 363, 364 may extend beyond the exterior surface of the cover 372, and may define a recess along the interior side of the cover 372, such that the lens or other element of the cameras 361 and 362 can extend into the respective recesses. In this way, the device 300 may accommodate a larger lens or other elements of the cameras 361 and 362 than would be possible if the recess were not provided. In some cases, trim assemblies 365, 366 may be coupled to the cover 372 and may support the covers 363, 364.

The device 300 also includes a battery 330. The battery 330 provides electrical power to the device 300 and its various systems and components. The battery 330 may include a 4.40 V lithium ion battery that is encased in a foil or other enclosing element. The battery 330 may include a rolled electrode configuration, sometimes referred to as a "jelly roll" or a folded or stacked electrode configuration. The battery 330 may be recharged via the charging port 332 (e.g., from a power cable plugged into the charging port 332 through a charging access opening 326), and/or via a wireless charging system 340. The battery 330 may be coupled to the charging port 332 and/or the wireless charging system 340 via battery control circuitry that controls the power provided to the battery and the power provided by the battery to the device 300. The battery 330 may include one or more lithium ion battery cells or any other suitable type of rechargeable battery element.

The wireless charging system 340 may include a coil that inductively couples to an output or transmitting coil of a wireless charger. The coil may provide current to the device 300 to charge the battery 330 and/or power the device. In this example, the wireless charging system 340 includes a coil assembly 342 that includes multiple wraps of a conductive wire or other conduit that is configured to produce a (charging) current in response to being placed in an inductive charging electromagnetic field produced by a separate wireless charging device or accessory. The coil assembly 342 also includes an array of magnetic elements that are arranged in a circular or radial pattern. The magnetic elements may help to locate the device 300 with respect to a separate wireless charging device or other accessory. In some implementations, the array of magnets also help to radially locate, orient, or "clock" the device 300 with respect to the separate wireless charging device or other accessory. For example, the array of magnets may include multiple magnetic elements having alternating magnetic polarity that are arranged in a radial pattern. The magnetic elements may be arranged to provide a magnetic coupling to the separate charging device in a particular orientation or set of discrete orientations to help locate the device 300 with respect to the separate charging device or other accessory. This functionality may be described as self-aligning or self-locating wireless charging. As shown in FIG. 3, the device 300 also includes a magnetic fiducial 344 for helping to locate the separate wireless charging device or accessory. In one example, the magnetic fiducial 344 is adapted to magnetically couple to a cable or power cord of the separate wireless charging device or other accessory. By coupling to the cable or power cord, the rotational alignment of the device 300 and the separate wireless charging device or other accessory may be maintained with respect to an absolute or single position. Also, by magnetically coupling the cable or cord to the rear surface of the device 300, the charging device or other accessory may be more securely coupled to the device 300.

In some implementations, the wireless charging system 340 includes an antenna or other element that detects the presence of a charging device or other accessory. In some cases, the charging system includes a near-field communications (NFC) antenna that is adapted to receive and/or send wireless communications between the device 300 and the wireless charger or other accessory. In some cases, the device 300 is adapted to perform wireless communications to detect or sense the presence of the wireless charger or other accessory without using a dedicated NFC antenna. The communications may also include information regarding the status of the device, the amount of charge held by the battery 330, and/or control signals to increase charging, decrease charging, start charging and/or stop charging for a wireless charging operation.

The device 300 may also include a speaker system 324. The speaker system 324 may be positioned in the device 300 so that a respective port 325 is aligned with or otherwise proximate an audio output of the speaker system 324. Accordingly, sound that is output by the speaker system 324 exits the housing structure 310 via the respective port 325. The speaker system 324 may include a speaker positioned in a housing that defines a speaker volume (e.g., an empty space in front of or behind a speaker diaphragm). The speaker volume may be used to tune the audio output from the speaker and optionally mitigate destructive interference of the sound produced by the speaker.

The device 300 may also include a haptic actuator 322. The haptic actuator 322 may include a movable mass and an actuation system that is configured to move the mass to produce a haptic output. The actuation system may include one or more coils and one or more magnets (e.g., permanent and/or electromagnets) that interact to produce motion. The magnets may be or may include recycled magnetic material.

When the coil(s) are energized, the coil(s) may cause the mass to move, which results in a force being imparted on the device 300. The motion of the mass may be configured to cause a vibration, pulse, tap, or other tactile output detectable via an exterior surface of the device 300. The haptic actuator 322 may be configured to move the mass linearly, though other movements (e.g., rotational) are also contemplated. Other types of haptic actuators may be used instead of or in addition to the haptic actuator 322.

The device 300 also includes a circuit board assembly 320 (which may also be referred to as a circuit board assembly). The circuit board assembly 320 may include a substrate, and processors, memory, and other circuit elements coupled to the substrate. The circuit board assembly 320 may include multiple circuit substrates that are stacked and coupled together in order to maximize the area available for electronic components and circuitry in a compact form factor. The circuit board assembly 320 may include provisions for a subscriber identity module (SIM). The circuit board assembly 320 may include electrical contacts and/or a SIM tray assembly for receiving a physical SIM card and/or the circuit board assembly 320 may include provisions for an electronic SIM. The circuit board assembly 320 may be wholly or partially encapsulated to reduce the chance of damage due to ingress of water or other fluid.

The circuit board assembly 320 may be thermally coupled to a mid-chassis section 323 of the housing structure 310. As described herein, the mid-chassis section 323, also referred to simply as a chassis 323, may be part of a housing component 314 (e.g., a middle housing component) that is formed from a unitary structure and that defines the chassis 323 as well as a first wall section 317 that defines a first side exterior surface of the device 300, and a second wall section 319 that defines a second side exterior surface of the device 300. The circuit board assembly 320 may be thermally coupled to the chassis 323 via one or more thermal bridges, such as a graphite structure, a graphite-wrapped foam, or other thermally conductive structure(s). Heat from the circuit board assembly may be transferred to the chassis 323 via the thermal bridges, thereby removing heat from the circuit board assembly 320 (where heat may be detrimental to durability, performance, or the like), and also drawing heat away from exterior surfaces and/or components of the device 300 that come into contact with a user (e.g., the wall sections 317, 319, which define exterior side surfaces of the device and which may be held by a user when the device 300 is in use).

The circuit board assembly 320 may also include wireless communication circuitry, which may be operably coupled to and/or otherwise use the wall sections and/or housing components 312, 313, 317, 315, 316, or 319 (or portions thereof) as radiating members or structures to provide wireless communications. The circuit board assembly 320 may also include components such as accelerometers, gyroscopes, near-field communications circuitry and/or antennas, compasses, and the like. In some implementations, the circuit board assembly 320 may include a magnetometer that is adapted to detect and/or locate an accessory. For example, the magnetometer may be adapted to detect a magnetic (or non-magnetic) signal produced by an accessory of the device 300 or other device. The output of the magnetometer may include a direction output that may be used to display a directional indicia or other navigational guidance on the display 303 in order to guide the user toward a location of the accessory or other device.

The device 300 may also include one or more pressure transducers that may be operable to detect changes in external pressure in order to determine changes in altitude or height. The pressure sensors may be externally ported and/or positioned within a water-sealed internal volume of the housing structure 310. The output of the pressure sensors may be used to track flights of stairs climbed, a location (e.g., a floor) of a multi-story structure, movement performed during an activity in order to estimate physical effort or calories burned, or other relative movement of the device 300.

The circuit board assembly 320 may also include global positioning system (GPS) electronics that may be used to determine the location of the device 300 with respect to one or more satellites (e.g., a Global Navigation Satellite System (GNSS)) in order to estimate an absolution location of the device 300. In some implementations, the GPS electronics are operable to utilize dual frequency bands. For example, the GPS electronics may use L1 (L1C), L2 (L2C), L5, L1+L5, and other GPS signal bands in order to estimate the location of the device 300.

As shown in FIG. 3, the housing may include a cover 372 (e.g., rear or rear cover) that may define a substantial entirety of the rear surface of the device 300. The rear cover 372, the front cover 302, and the housing structure 310 may at least partially define an enclosure of the device 300, which may define an internal volume in which components of the device 300 are positioned. The cover 372 may be formed from or include a transparent or optically transmissive material. For example, the cover 372 may include a substrate formed from or including a glass material or other suitable material (e.g., a silica-based glass material, an aluminosilicate glass, a boroaluminosilicate glass, an alkali metal aluminosilicate glass, a chemically strengthened glass, sapphire, ceramic, glass-ceramic, crystallizable glass materials, or plastic). A glass-ceramic material may be a silica-based glass ceramic material, such as an aluminosilicate glass ceramic material or a boroaluminosilicate glass ceramic material. The glass-ceramic material may be chemically strengthened by ion exchange. The substrate may have portions that are less than 1 mm thick. In some cases, the substrate has portions that are less than 0.80 mm. In some cases, the substrate has portions that are approximately 0.60 mm or less. The cover 372 may have a uniform thickness or, in some cases, may have a thickened or raised portion that surrounds the camera covers 363, 364. The cover 372 may be machined (e.g., ground) into a final shape before being polished and/or textured to provide the desired surface finish. The texture may be specially configured to provide a matte appearance while also being resistant to collecting a buildup of skin, lint, or other debris. A series of cosmetic layers may be formed along the inner surface of the cover 372 to provide a desired optical effect and final color of the device 300.

The cover 372 may be part of a rear cover assembly 373. The rear cover assembly 373 may be coupled to the housing structure 310. In some cases, the rear cover assembly 373 includes components such as camera covers 363 and 364, trim assemblies 365, 366, components of a wireless charging system, structural components (e.g., frames), trim assemblies, mounting clips, and/or other components, systems, subsystems, and/or materials.

Similar to as described above with respect to cover 302, the cover 372 may be positioned at least partially within an opening defined in the housing structure 310. Also similar to as described above with respect to cover 302, the edges or sides of the cover 372 may be surrounded by a protective flange or lip of the housing structure 310 without an interstitial component between the edges of the cover 372 and the respective flanges of the housing structure 310. The cover 372 may be chemically strengthened using an ion exchange process to form a compressive stress layer along exterior surfaces of the cover 372. In some cases, the (rear) cover 372 is formed from the same or a similar material as (front) cover 302.

The rear cover 372 may be removably coupled to the rest of the housing structure 310 such that the rear cover 372 can be removed and/or replaced quickly and efficiently. In some cases, the wireless charging system 340 is the only component that is attached to the rear cover 372 that needs to be electrically coupled to the circuit board assembly 320 (which is coupled to the housing component 314). Accordingly, the rear cover 372 may be completely removed from the device by unfastening the rear cover 372 from the remainder of the housing (e.g., from the housing component 314) and decoupling the wireless charging system's electrical connector(s). In this way, the device 300 may provide improved reparability.

The housing structure 310 may include a housing component 314 (e.g., a middle housing component 314) that includes the wall sections 317 and 319 and the mid-chassis section 323 (e.g., a metal plate-like structure that extends between the wall sections 317 and 319). The chassis 323 may define a mounting structure for components of the device 300. For example, as described herein, components such as the circuit board assembly 320, battery 330, sensor array 360, receiver 350, speaker module 324, haptic actuator 322, and the like, may be coupled to the chassis 323 (e.g., along a rear-facing side of the chassis 323). By coupling components to the chassis 323 instead of the front cover assembly 301 and/or the rear cover 372, the cost and complexity of the front cover assembly 301 and rear cover assembly 373 may be reduced, and removal and/or replacement of the front cover assembly 301 and/or rear cover 372 may be simplified. The chassis 323 may also define one or more holes (e.g., hole 327) extending therethrough to facilitate the coupling of components on one side of the chassis 323 (e.g., the display 303 and/or sensors of the front cover assembly 301) to components on the other side of the chassis 323 (e.g., the circuit board assembly 320). Additionally, as noted above, the chassis 323 may also be thermally coupled to components of the device 300, such as the circuit board assembly 320, to conduct heat away from the thermally coupled components.

The housing component 314 may be a unitary structure formed from a single piece of material. For example, the unitary structure of the housing component 314 may be a metal, such as aluminum, steel, titanium, or the like and may be formed by extrusion, machining, and/or combinations of these and other forming processes. Thus, the wall sections 317 and 319 (which define side exterior surfaces of the device 300) and the chassis 323 may be different portions of a single piece of material. In some cases the housing component 314 is formed of a polymer material, reinforced polymer material (e.g., fiber reinforced), carbon fiber, or other suitable material.

As described above, the housing structure 310 may include housing components 312, 313, 315, and 316 structurally joined together and/or to the housing component 314 (the middle housing component 314) via joint structures 318. The joint structures 318 (e.g., the material of the joint structures) may extend over inner surfaces of the housing components. More particularly, a portion of the joint structures 318 may contact, cover, encapsulate, and/or engage with retention features of the housing components that extend from the inner surfaces of the housing components (including, for example, from the wall sections of the middle housing component 314). As the wall sections 317 and 319 are part of a single unitary structure, the joint structures 318 may also function to structurally join the housing components 312, 313, 315, and 316 to the housing component 314. When coupled via the joint structures 318, the housing component 314, the housing components 312, 313, 315, and 316, and the joint structures 318 may define a main housing assembly that defines the exterior side surfaces of the device 300 as well as the chassis 323 within the device.

Housing components 312, 313, 315, and 316 may also be referred to herein as housing segments and may be formed from aluminum, stainless steel, or other metal or metal alloy material. As described herein, the housing components 312, 313, 315, and 316, and the wall sections 317, 319, may provide a robust and impact resistant sidewall for the device 300. In the present example, the housing components 312, 313, 315, and 316 and the wall sections 317, 319 define a flat sidewall that extends around the perimeter of the device 300. The flat sidewall may include rounded or chamfered edges that define the upper and lower edges of the sidewall of the housing structure 310. The housing components 312, 313, 315, and 316 and the wall sections 317, 319 may each have a flange portion or lip that extends around and at least partially covers a respective side of the front and rear covers 302, 372. There may be no interstitial material or elements between the flange portion or lip and the respective side surface of the front and rear covers 302, 372. This may allow forces or impacts that are applied to the housing structure 310 to be transferred to the front and rear covers 302, 372 without affecting the display or other internal structural elements, which may improve the drop performance of the device 300.

As shown in FIG. 3, the device 300 includes multiple antennas that may be adapted to conduct wireless communication using a 5G communication protocol. In particular, the device 300 may include a (side-fired) antenna array 382 that is configured to transmit and receive wireless communication signals through an antenna window 383 or waveguide formed along or otherwise integrated with the side wall of the housing structure 310. The side-fired antenna array 382 may be coupled to the circuit board assembly 320 via a flexible circuit element or other conductive connection, as described herein. The device 300 may also include a rear antenna module that may include one or more (rear-fired) antenna arrays that may be configured to transmit and receive wireless communication signals through the cover

372. The antenna module may be attached to a back or bottom surface of the circuit board assembly 320.

The antenna modules may include multiple antenna arrays. For example, the antenna modules may include one or more millimeter-wave antenna arrays. In the case where the antenna modules include multiple millimeter-wave antenna arrays (each of which may include one or more radiating elements), the multiple millimeter-wave antenna arrays may be configured to operate according to a diversity scheme (e.g., spatial diversity, pattern diversity, polarization diversity, or the like). The antenna modules may also include one or more ultra-wideband antennas.

Each of the antenna arrays (e.g., the antenna array 382 and the millimeter-wave arrays of the antenna module) may be adapted to conduct millimeter wave 5G communications and may be adapted to use or be used with beam-forming or other techniques to adapt signal reception depending on the use case. The device 300 may also include multiple antennas for conducting multiple-in multiple-out (MIMO) wireless communications schemes, including 4G, 4G LTE, and/or 5G MIMO communication protocols. As described herein, one or more of the housing components 312, 313, 315, and 316 and the wall sections 317, 319 (or portions thereof) may be adapted to operate as antennas for a MIMO wireless communication scheme (or other wireless communication scheme).

Figure 4A:
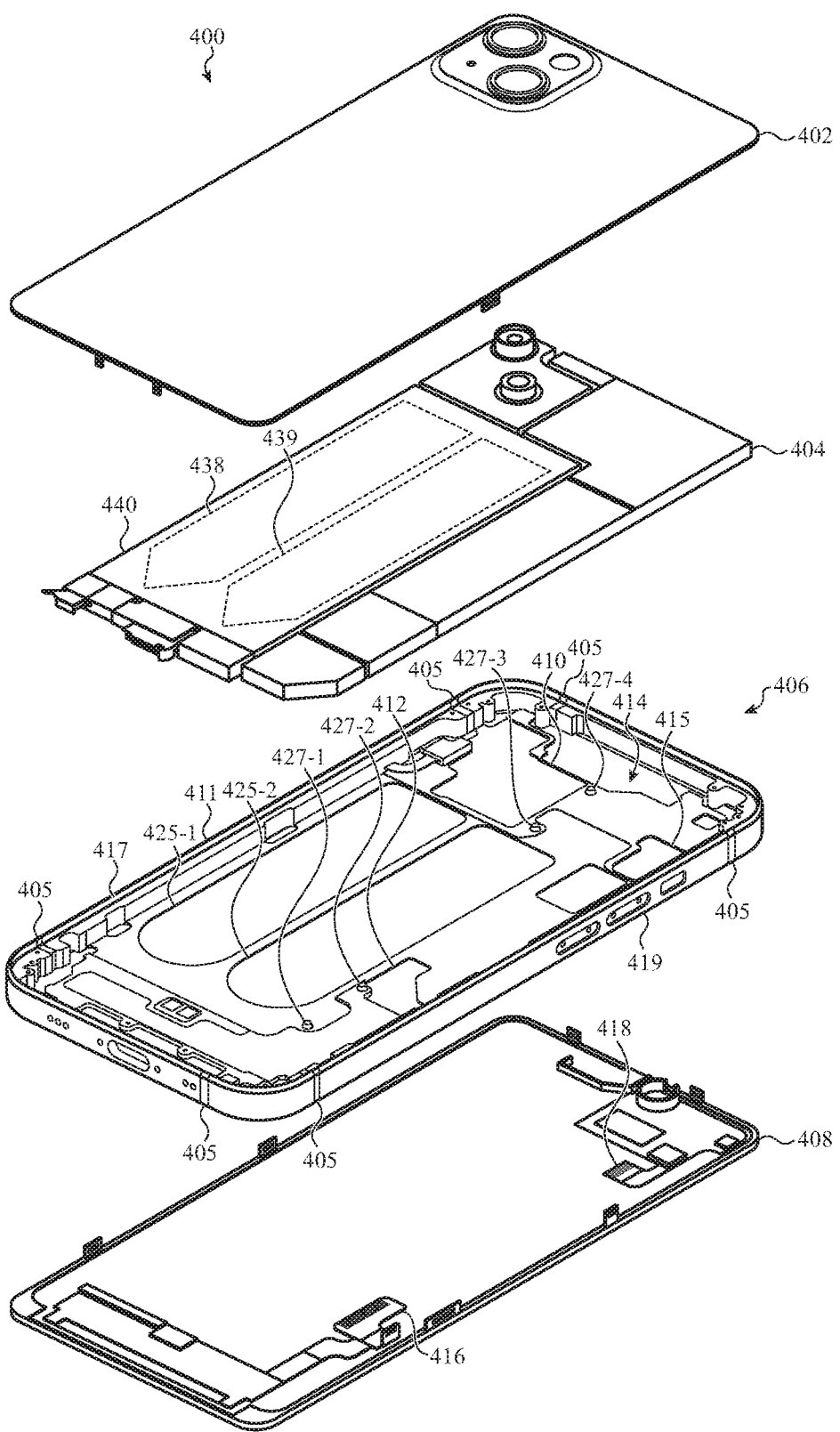
FIG. 4A depicts a partial exploded view of an example electronic device.

FIG. 4A depicts a partial exploded view of an example electronic device 400. The electronic device 400 may correspond to or be an embodiment of the electronic devices 140, 300, or any other device described herein.

As shown in FIG. 4A, the device 400 may include an enclosure that defines an interior cavity and includes a rear cover assembly 402, a housing structure 406, and a front cover assembly 408. The front cover assembly 408 may define a front exterior surface of the enclosure, and the rear cover assembly 402 may define a rear exterior surface of the device. The housing structure 406 may be positioned between the front cover assembly 408 and the rear cover assembly 402.

Figure 4B:
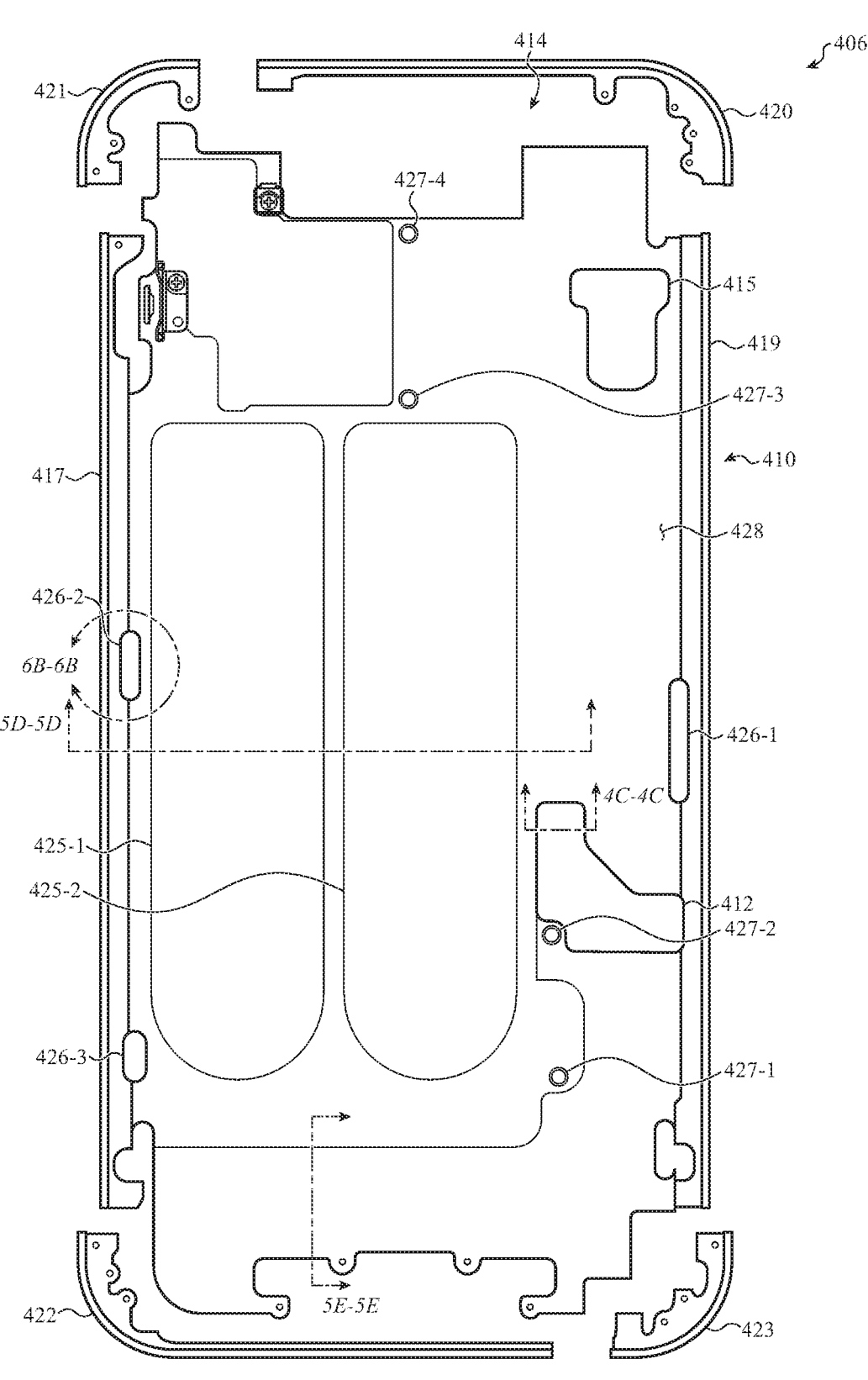
FIG. 4B depicts an exploded view of a portion of the electronic device of FIG. 4A.

The housing structure 406 includes a middle housing component 410 as well as housing components 420, 421, 422, and 423 (FIG. 4B). The middle housing component 410, which may correspond to or be an embodiment of the housing component 314, includes a mid-chassis section 428, as well as wall sections 417, 419. As described above with respect to the housing component 314, the housing component 410 may be a unitary structure formed from a single piece of material. For example, the unitary structure of the housing component 410 may be a metal, such as aluminum, steel, titanium, or the like and may be formed by extrusion, machining, and/or combinations of these and other forming processes. Thus, the wall sections 417 and 419 (which define side exterior surfaces of the device 400) and the mid-chassis section 428 may be different portions of a single piece of material. In some cases the housing component 410 is formed of a polymer material, reinforced polymer material (e.g., fiber reinforced), carbon fiber, or other suitable material.

The housing components 420, 421, 422, and 423 may each define an exterior corner surface of the device. In some cases, the housing components also define a portion of one or more side exterior surfaces. For example, the housing component 420 defines an exterior corner surface, and a portion of each of two side exterior surfaces (e.g., the side exterior surfaces on the right and top of the housing structure 406, as oriented in FIG. 4B). Similarly, the housing component 421 defines a portion of each of two side exterior surfaces (e.g., the side exterior surfaces on the left and top of the housing structure 406, as oriented in FIG. 4B).

The housing structure 406 may define a first cavity along a first side of the housing structure 406 (e.g., a front-facing side), and a second cavity along a second side of the housing structure 406 (e.g., a rear-facing side) opposite the first side. Components such as the component set 404 (and optionally portions of the rear cover assembly 402) may be positioned in the second cavity, a shown in FIG. 4A, and components such as portions of the front cover assembly 408 may be positioned in the first cavity.

The front cover assembly 408 may include a front cover, such as the front cover 302 in FIG. 3. The front cover assembly 408 may also include a display stack, and touch-and/or force-sensing systems, front-facing sensors such as ambient light sensors, proximity sensors, and the like.

The rear cover assembly 402 may include a rear cover, such as the rear cover 372 in FIG. 3. The rear cover assembly 402 may include wireless charging components, such as a wireless charging coil and magnetic coupling and alignment elements. The rear cover assembly 402 may include other components and/or structures as well. For example, the rear cover assembly 402 may also include a mounting structure including mounting tabs or other features, camera covers, optical structures, or the like.

The device 400 may include a component set 404 positioned at least partially in the interior cavity along a side of a mid-chassis section 428 of the housing structure 406. The component set 404 includes components of the device 400. The component set 404 may include a circuit board assembly, a battery, a haptic actuator, speakers, antennas and/or other communication components and systems, cameras, microphones, and the like. Components in the component set 404 may be mechanically and/or conductively coupled to components on the rear cover assembly 402 and the front cover assembly 408.

The housing structure 406 provides a mounting and/or support structure for components of the device 400, such as the component set 404, the rear cover assembly 402, and the front cover assembly 408. As described above with respect to FIG. 3, the housing structure 406 may include a middle housing component 410 (e.g., corresponding to the housing component 314) that, together with additional housing components 420, 421, 422, and 423 and joint structures 405 (FIG. 4A), defines peripheral exterior side walls of the device. The middle housing component 410 also defines a mid-chassis section 428 (e.g., corresponding to the mid-chassis 323). In some cases, the mid-chassis section 428 (also referred to simply as a chassis) is or includes a plate-like structure that extends from one side wall to another side wall (e.g., from the wall section 417 to the wall section 419).

FIG. 4B is an exploded view of the housing structure 406, in which the joint structures are omitted and the housing components are separated from the middle housing component 410. As shown in FIG. 4B, the middle housing component 410 and the side walls may be a single, unitary structure. For example, the middle housing component 410 and the wall sections 417, 419 may be formed by extruding an initial structure (e.g., forming an extruded metal material) that defines the general shape and configuration of the middle housing component 410 and the wall sections 417, 419 (e.g., resembling an "H" shape in cross-section), and then using one or more additional machining or other forming processes to define the final shapes and features of the middle housing component 410 and wall sections 417, 419. The extrusion defining the initial structure of the middle housing component 410 may be formed from a metal material such as aluminum, steel, stainless steel, titanium, or another suitable metal. In some cases, the extrusion may be formed from a polymer material, such as a fiber-reinforced polymer. Machining operations may be applied to the extrusion to form features such as holes, mounting bosses, recesses, protrusions, and the like. Holes that are formed (e.g., via machining or other operations) may accommodate circuit board interconnections, mechanical clips and retention features, buttons, switches, antennas, SIM card trays, and the like.

The housing structure 406 may be formed by structurally joining housing components (e.g., the housing components 420, 421, 422, 423, which may correspond to or be embodiments of housing components 312, 313, 315, and 316) to the middle housing component 410 and to adjacent housing components via joint structures 405 (which may correspond to or be embodiments of joint structures 318). The joint structures 405 may contact, cover, encapsulate, and/or engage with retention features of the housing components and/or the middle housing component 410. As noted above, the wall sections 417, 419 (which may also be referred to as side walls) are part of the single unitary structure of the middle housing component 410, and the joint structures 405 may also function to structurally join the housing components 420, 421, 422, 423 to the middle housing component 410. When coupled via the joint structures 405, the middle housing component 410, the housing components 420, 421, 422, 423, and the joint structures 405 may define a main housing assembly that defines the exterior side surfaces of the device 400.

The mid-chassis section 428 (also referred to simply as a chassis 428) may provide numerous advantages to the device 400. For example, the chassis 428 may act as a mounting structure for device components, such as the battery, circuit board assembly, front and rear cover assemblies, and the like. In this way, fewer components need to be coupled to the front and rear cover assemblies, thereby reducing the complexity of those modules and reducing the number of interconnections (e.g., electrical connections) that need to be made between the various device subassemblies (e.g., between the front cover assembly, rear cover assembly, and other device assemblies).

The chassis 428 also serves a thermal management function for the device 400. The chassis 428 may be formed of or include a thermally conductive material, and heat-producing and/or heat-sensitive components may be thermally coupled to the chassis 428 to help draw heat away from those components or otherwise distribute heat within the device in an advantageous manner. For example, the chassis 428 may be formed from a metal such as aluminum, steel, titanium, metal alloys, or the like. Heat producing and/or heat sensitive components may be thermally coupled to the chassis 428 via thermal couplings, such as graphite films or layers, graphite-wrapped compliant members, thermal paste, or the like. The thermal couplings may have sizes and may be positioned at locations on the chassis 428 that allow the chassis 428 to draw heat away from the heat-producing and/or heat-sensitive components. For example, a circuit board assembly may be thermally (as well as structurally) coupled to the chassis 428 via graphite thermal couplings. Heat from the circuit board assembly (e.g., from a processor of the circuit board assembly) may be transferred to the chassis 428 through the thermal coupling, thereby helping remove heat from the circuit board assembly and reducing the temperature or other thermal impact on the circuit board assembly. The heat may also spread along the chassis 428, resulting in decreased peak temperatures in the device.

Further, the size and location of the thermal couplings on the chassis 428 may be configured to help reduce the amount of heat (e.g., the temperature) reaching user-contacting surfaces or structures of the device 400. For example, by positioning the thermal couplings proximate a center or mid-line of the chassis 428 (e.g., away from the wall sections 417, 419), heat may be directed or concentrated away from the wall sections 417 and 419, which a user may contact when holding the device 400. By contrast, without the thermal couplings, heat from device components, such as from a processor positioned near one of the side walls, may result in a high peak temperature along that side wall, which may make the device uncomfortable to hold. Other device components may be thermally coupled to the chassis 428 as well, including but not limited to a battery, a wireless charging coil, battery charging circuitry, and a display. Device components may be thermally coupled to either side of the chassis 428. In some cases, the chassis 428 is thermally coupled to device components along both sides of the chassis 428 (e.g., along the side facing the front cover assembly and along the opposite side facing the rear cover assembly.

The thermal function of the chassis 428 may improve the operation of the device 400 in several ways. For example, higher processor and battery charge/discharge speeds may be achieved, as they can be operated at higher temperatures without resulting in the device becoming too hot to hold. As another example, the device may remain cooler during operation (e.g., having a lower peak temperature and/or a lower average temperature), rendering the device more comfortable to use and potentially reducing stresses due to thermal cycling.

Device components on one side of the chassis 428 may need access to the other side of the chassis 428. Accordingly, the chassis 428 may include holes extending therethrough to facilitate interconnections and other types of access through the chassis 428. For example, the front cover assembly 408 may include components such as a display stack and for-ward-facing sensors (e.g., a proximity sensor, ambient light sensor) that connect (e.g., via flexible circuit boards or other conductive couplings) to components in the component set 404. Similarly, the component set 404 may include devices that require access to the front cover assembly 408 (and/or the exterior of the device via the front of the device), such as a forward-facing camera, facial recognition system, and speaker. Accordingly, the chassis 428 may include or define holes, such as holes 412, 414, and 415, to allow access through the chassis 428. For example, components of a front-facing sensor region (e.g., front-facing camera, facial recognition system) that are structurally coupled to the device along one side of the chassis 428 (e.g., the bottom side, which is shown facing up in FIG. 4A) may access the front cover assembly 408 through the hole 414, while electrical connectors 418 and 416 on the front cover assem-bly 408 (for sensors and a display, respectively) may access components on the other side of the chassis 428 via holes 415 and 412, respectively. In some cases, the number and size of holes in the chassis 428 is minimized in order to maximize the structural and thermal functions of the chassis 428.

The chassis 428 may also include or define holes 426 (426-1, . . . , 426-3). The holes 426 may facilitate mechanical and/or conductive couplings between the front cover assem-bly 408 and the housing structure 406, between the rear cover assembly 402 and the housing structure 406, and/or between the front cover assembly 408 and the rear cover assembly 402. For example, the holes 426 may define pass-throughs to allow board-to-board connectors, flexible circuit elements, cables, and the like, to conductively couple components on opposite sides of the chassis 428. As another example, spring coupling elements may be coupled to the housing structure 406 and may be positioned in the holes 426 (such as the spring coupling element 618, FIG. 6B), and tabs or other features on the front cover assembly 408 and/or the rear cover assembly 402 (e.g., on a metal frame of the front cover assembly) may be structurally and conductively coupled to the spring coupling elements.

As noted above, the chassis 428 may define an array of mounting bosses 427 (427-1, . . . , 427-4) integrally formed with a plate structure of the chassis 428. The mounting bosses 427 may be machined from the same component as the chassis 428 and the wall sections 417, 419 (e.g., an extruded initial structure), such that they are integrally formed with the plate structure of the chassis 428. The mounting bosses may be configured to engage fasteners, such as threaded fasteners (e.g., screws, bolts, etc.) that are used to secure components to the chassis 428. For example, a circuit board assembly (e.g., the circuit board assembly 320, FIG. 3) may be coupled to all or some of the array of mounting bosses 427 via a set of threaded fasteners. While FIGS. 4A-4B illustrate one example arrangement of mount-ing bosses, this is merely one example arrangement, and more or fewer mounting bosses may be provided in a given implementation. The locations of the mounting bosses may also differ from those shown depending on the positioning of the components that are to be attached to the chassis 428 via the mounting bosses.

Figure 4C:
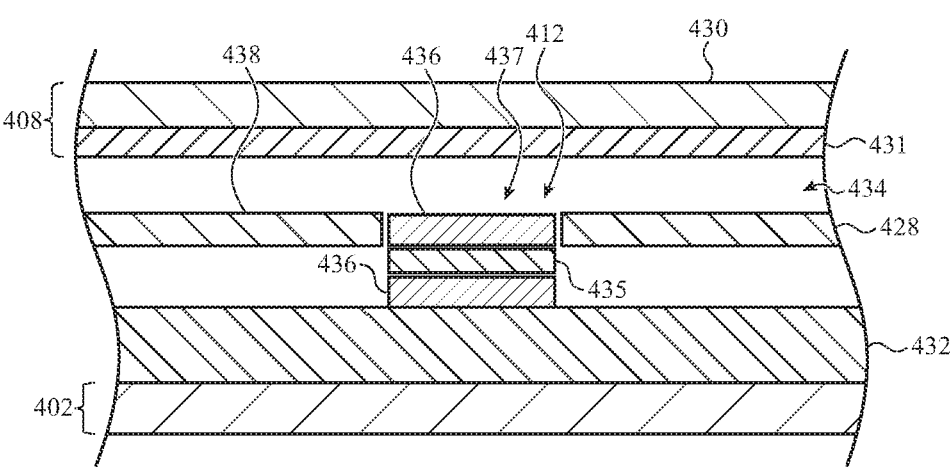
FIG. 4C depicts a partial cross-sectional view of an example electronic device.

FIG. 4C is a partial cross-sectional view of the device 400, viewed along line 4C-4C in FIG. 4B, illustrating an example arrangement of components in the device 400 proximate a hole 412 extending through the chassis 428. As shown in FIG. 4C, a front cover assembly 408 may be positioned along one side (e.g., above) the chassis 428, and a rear cover assembly 402 may be positioned along the opposite side of the chassis 428, along with a component 432 of the com-ponent set.

The front cover assembly 408, which includes a display 431 along a bottom of a transparent cover 430, may be positioned above the chassis 428 (and optionally set apart from the chassis 428 by a gap 434), and may span or be positioned over a hole 412 in the chassis 428. Under some circumstances, the display 431 may contact the chassis 428, such as due to touch inputs being applied to the cover 430, drop events, or other use or misuse of the device 400. In such cases, holes in the chassis 428 may produce local areas of high stress or pressure where the display is forced against the edges of the hole. These local stress areas may produce temporary or permanent artifacts on the display 431, such as local bright spots, which may damage the display and/or produce a poor user experience. Accordingly, shims, such as the shim 435, may be provided in the holes to form a structural stack 437 that reduces or eliminates the stresses at the edges of the hole 412. For example, FIG. 4C illustrates an example in which a flexible circuit element 436 passes through the hole 412 to connect to a component 432 on the opposite side of the chassis 428. The flexible circuit element 436 may form a loop-like shape, and a shim 435 may be positioned in the loop (e.g., between two portions of the looped flexible circuit element 436). The shim 435 may be configured to have a thickness and/or other dimension or physical property that results in a structural stack 437 extending from the component 432 (or other structure below the chassis 428) to the top surface (or display-facing side) of the chassis 428. For example, a top surface of the structural stack 437 may be substantially even (e.g., coplanar) with the top surface of the chassis 428. Thus, in cases where the cover 430 and display 431 are deflected into or otherwise forced against the chassis 428 and the structural stack 437, the display is not forced into the hole 412 or against the edges of the hole 412, as the structural stack 437 effectively provides a structural support at the same height and/or plane as the chassis 428. Similar structural stacks 437 may be provided in or proximate other holes in the chassis 428 that are below the display 431. In such cases, the size, arrangement, number, positioning, materials, and other properties of the shims (and/or other components) that define the structural stack may be configured so that the top of those structural stacks are also substantially even (e.g., coplanar) with the top surface of the chassis 428. In some cases, the shims may be formed of or include polymer material, and may be attached to other shims or components via adhesive, mechanical fasteners, or the like. In some cases, the shims may be formed from metal or another suitable material.

Figure 5A:
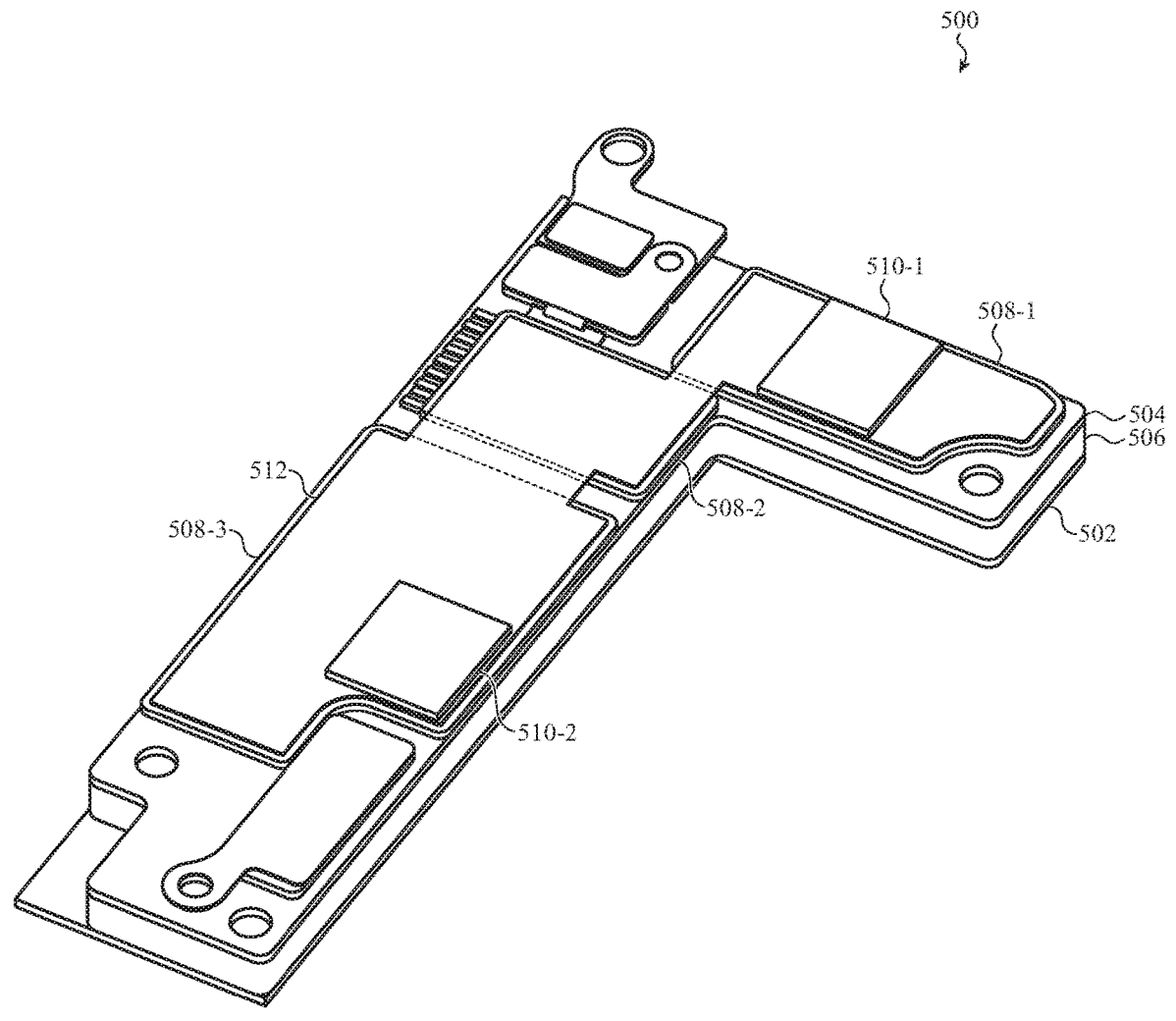
FIGS. 5A-5B depict an example circuit board assembly for an electronic device.
Figure 5B:
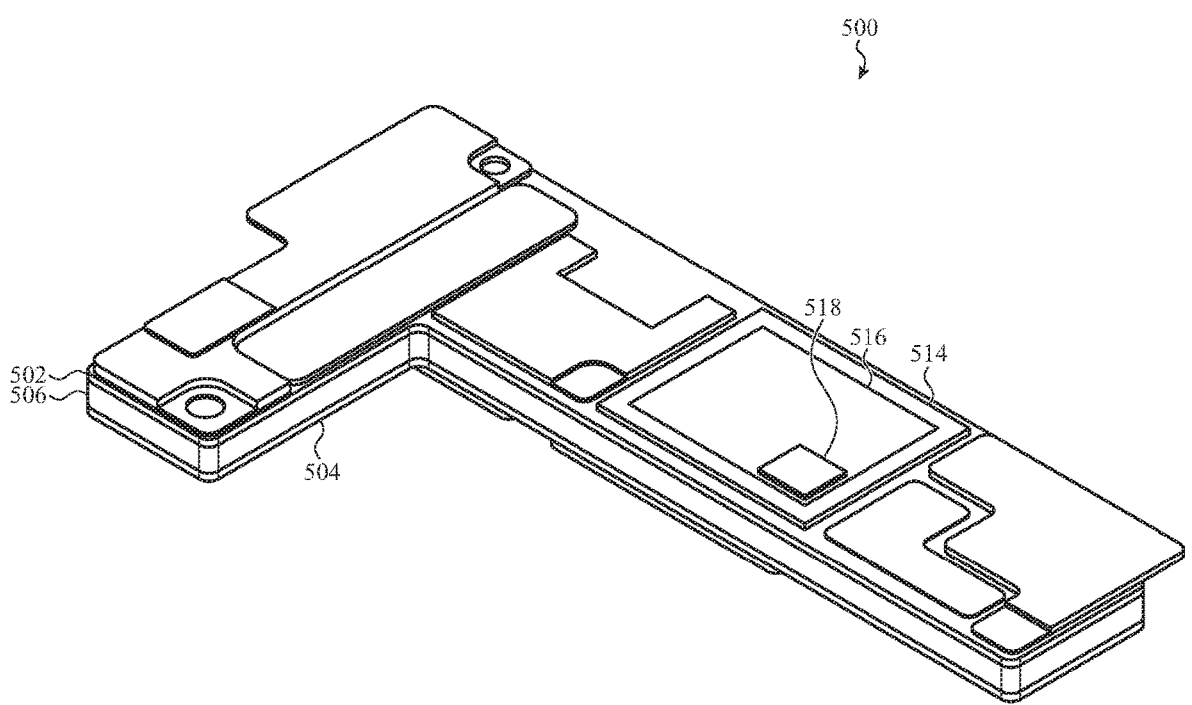

FIGS. 5A-5B illustrate an example circuit board assembly 500. The circuit board assembly 500 may correspond to or be an embodiment of the circuit board assembly 320, or other circuit board assemblies described herein. The circuit board assembly 500 may include a first substrate 502 (e.g., circuit board), a second substrate 504 (e.g., a circuit board), and a wall structure 506. An internal cavity may be defined between the first substrate 502, second substrate 504, and wall structure 506, and components such as processors and other electronic components may be positioned in the internal cavity (e.g., coupled to one or both of the first substrate 502 and the second substrate 504).

In some cases, processors and other electronic components may also be coupled to the external surfaces of one or both of the first and second substrates 502, 504. Cowlings (e.g., cowlings 508-1, 508-2, and 508-3 in FIG. 5A and cowling 514 in FIG. 5B) may be positioned over external components to protect, shield, and/or otherwise enclose the exterior components. The cowlings 508, 514 may be formed from or include metal (e.g., an aluminum alloy, such as 7075 aluminum alloy or 7475 aluminum alloy), or another suitable material. Other example materials include 5000 series aluminum alloys, 6000 series aluminum alloys, and other 7000 series aluminum alloys.

The electrical components of the circuit board assembly 500, such as processors, may generate heat. The heat generated may cause the device to become hot. Accordingly, the circuit board assembly 500 may include structures to help remove and/or dissipate heat from the electrical components, while also directing or drawing the heat away from user-contacting surfaces of the device that may become too hot to comfortably touch, such as the side walls of the device (e.g., the wall sections 417, 419, FIGS. 4A-4B). For example, as noted above, the cowlings 508, 514 may be formed from metal (e.g., aluminum) or another thermally conductive material, and may be thermally conductive to aid in extracting, dissipating, and/or otherwise removing heat from the underlying electrical components. In some cases, the cowlings 508, 514 contact an underlying electrical component. In some cases, a thermally conductive material, such as a thermally conductive paste or glue, may be positioned between and in contact with the electrical components and the cowlings.

Thermally conductive layers 512 and 516 may be positioned on one or more surfaces of the cowlings 508, 514, respectively. The thermally conductive layers 512, 516 may be formed from or include graphite, metal foils or films, or the like. The thermally conductive layers 512, 516 may be coupled to the cowlings 508, 514 via adhesives, direct bonding, mechanical fasteners, or the like. In some cases, the thermally conductive layers 512, 516 may be formed via a material deposition process, such as chemical vapor deposition, plasma vapor deposition, or the like.

The thermally conductive layers 512, 516 may be configured to spread and/or distribute heat from the cowlings. For example, a processor positioned under a cowling may result in uneven heating of the cowling (e.g., the area of the cowling directly above and/or in contact with the processor may become hotter than surrounding areas). The thermally conductive layers 512, 516 may distribute the heat of the cowlings more evenly over the full area of the thermally conductive layers 512, 516. This may help dissipate the heat from the cowling, and may also lower peak temperatures along the thermally conductive layers 512, 516. More particularly, the high thermal conductivity of the thermally conductive layers 512, 516 may help produce a more even surface temperature along the surfaces of the thermally conductive layers 512, 516, as compared to a cowling without a thermally conductive layer.

The thermally conductive layers 512, 516 may each cover or be coupled to one or more cowlings. For example, the thermally conductive layer 512 in FIG. 5A extends over three separate cowlings, 508-1, 508-2, and 508-3. Accordingly, the thermally conductive layer 512 can extract and distribute heat from multiple different cowlings.

The circuit board assembly 500 may also include thermal bridges 510-1, 510-2 (FIG. 5A) and 518 (FIG. 5B) that contact the thermally conductive layers 512, 516 and contact another structure of the device to conduct heat from the cowlings and thermally conductive layers to the other structures. For example, the thermal bridges 510-1, 510-2 may be positioned on the side of the circuit board assembly 500 that faces the mid-chassis section of a housing component (e.g., the mid-chassis section 323 in FIG. 3, the mid-chassis section 428 in FIGS. 4A-4B). In such case, the thermal bridges 510-1, 510-2 may contact the mid-chassis section 428, thereby forming a thermal path from the cowlings to the mid-chassis section 428. As described herein, the mid-chassis section may be formed from a metal material, and may define a plate-like structure through a central region of the phone. The mid-chassis may have a surface area (e.g., along one if its sides) that is greater than about 50% of the front or back surface area of the phone, greater than about 60% of the front or back surface area of the phone, greater than about 70% of the front or back surface area of the phone, or greater than about 80% of the front or back surface area of the phone. Accordingly, the mid-chassis has a significant size and thus a significant thermal mass, and can absorb, distribute, and/or dissipate heat from the thermal bridges 510-1, 510-2. Further, as noted herein, the thermal bridges may be generally located towards the interior of the device (e.g., the midline), and away from exterior peripheral walls or surfaces of the device. For example, a center of the thermal bridge 510-2 is positioned offset from the midline of the segment of the circuit board assembly 500 on which it is positioned (e.g., further to the right as oriented in FIG. 5A). As described herein, this arrangement tends to dissipate heat from the circuit board assembly 500 further away from the exterior surfaces of the device.

The thermal bridge 518, which is positioned on a side of the circuit board assembly 500 that faces the rear cover assembly, may contact the rear cover assembly. For example, the rear cover assembly may include a frame (e.g., the frame 604, FIG. 6A) that defines an interior surface of the rear cover assembly. The frame of the rear cover assembly may be formed from or include metal, such as aluminum, stainless steel, metal alloys, or the like. The thermal bridge 518 may contact and transfer heat to the frame. The frame may help remove, dissipate, and/or distribute the heat from the electrical component.

The thermal bridges 510-1, 510-2, 518 may be compliant in order to accommodate various gaps between the circuit board assembly (e.g., the coated cowlings of the circuit board assembly) and the mid-chassis and the rear cover assembly. In some cases, the thermal bridges 510-1, 510-2, 518 include a compliant structure, such as a foam, wrapped with a thermally conductive layer, such as a graphite layer. The foam, or other suitable compliant member or material, may provide compliance (e.g., allowing the thermal bridges to deform between two structures) while also providing a return force that forces the thermal bridge into contact with the structures. The thermally conductive layer may be looped around the compliant structure or otherwise make physical contact with the structures that are to be thermally coupled (e.g., a thermally-coated cowling and the mid-chassis section or the rear cover assembly).

The cowlings, thermally conductive layers, and thermal bridges 510-1, 510-2, 518 cooperate to perform several thermal functions. For example, they act as a heat sink for the components of the circuit board assembly, helping to maintain lower component temperatures, which can help improve efficiency, processing speed, component life, and the like. Additionally, the locations of the thermal bridges 510-1, 510-2, 518 are selected to position the heat transfer areas away from structures of the device that could become uncomfortably hot to the touch. For example, in order to mitigate the effect of heat on the side walls of the device, which may be formed of metal and may render the device uncomfortable to use if they become too hot, the thermal bridges may be positioned proximate to a midline of the chassis section, or otherwise offset inward from the walls of the device (e.g., from the wall section 419). In this way, heat from the circuit board assembly 500 may be generally guided towards structures in the center of the device, helping reduce the temperatures at the side walls or other external structures of the device (especially those that may be good thermal conductors).

Figure 5C:
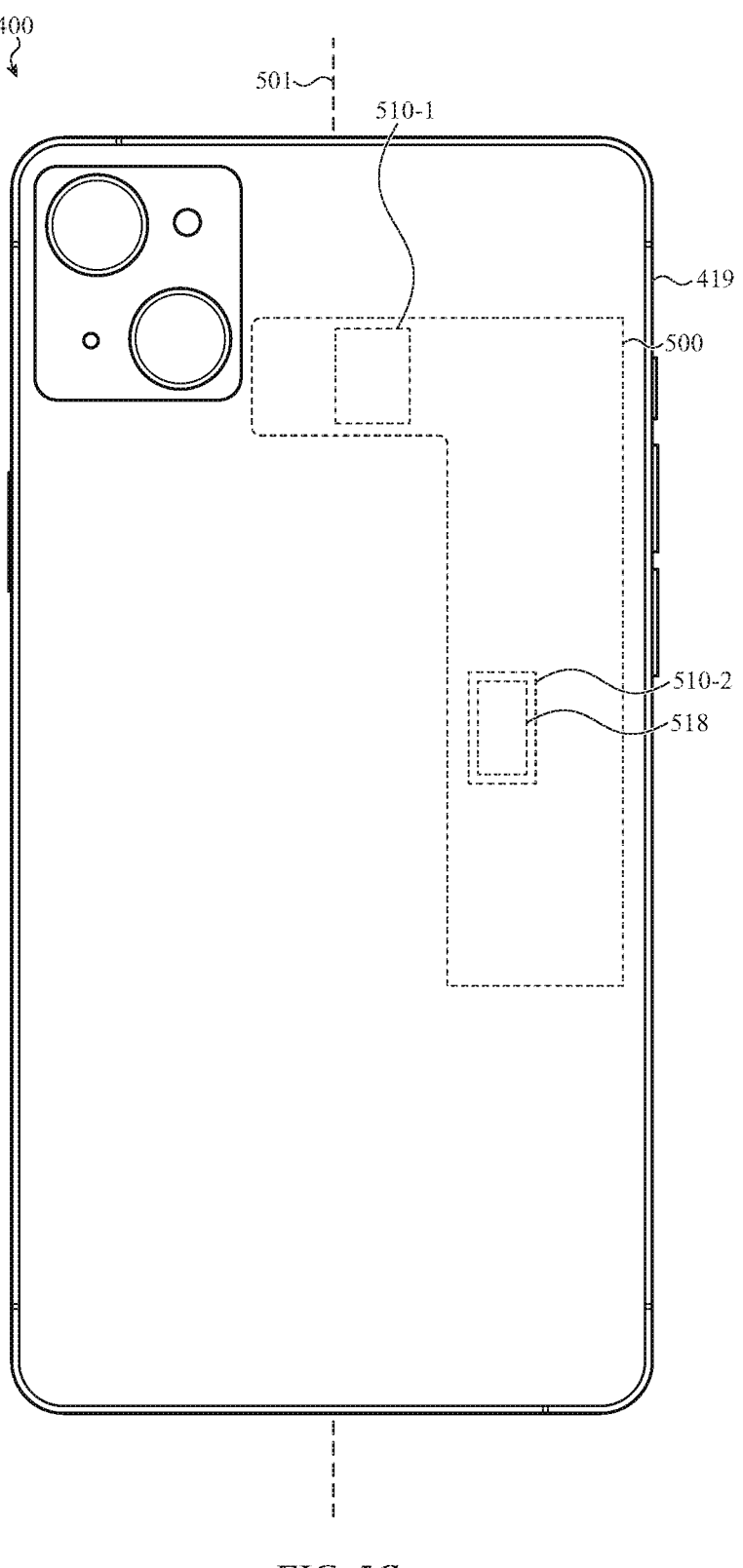
FIG. 5C depicts an example electronic device.

FIG. 5C illustrates a plan view of a back of the device 400, illustrating the circuit board assembly and the thermal bridges 510-1, 510-2, 518. As shown, the thermal bridges 510-1, 510-2, 518 are biased towards the midline 501 of the device. Stated another way, the thermal bridges 510-1, 510-2, 518 are positioned, on their respective cowlings, closer to the midline 501 of the device than the side walls (e.g., the side wall 419). In this way, heat generated by components under the cowlings may be predominantly directed to the middle or center of the device, rather than the outer periphery.

The mid-chassis section of a housing component may define various features to accommodate device components in a space-efficient manner. For example, as shown in FIGS. 4A and 4B, the chassis 428 may include recesses 425-1, 425-2 formed along a side of the chassis 428 in a battery mounting region, and adhesive for adhering the battery 440 to the chassis 428 may be received in the recesses 425-1, 425-2. For example, as shown in FIG. 4A adhesive films 438, 439, (e.g., pressure-sensitive adhesive films), may be positioned on the battery 440 such that when the battery 440 is positioned on the chassis 428, the adhesive films 438, 439 are positioned in the recesses 425-1, 425-2, respectively. The adhesive films 438, 439 may be strips of adhesive positioned on a bonding side of the battery 440. The battery 440 may extend a first distance along a length axis of the device (e.g., the vertical axis, as oriented in FIG. 4B) and a second distance along a width axis of the device (e.g., the horizontal axis as oriented in FIG. 4B), and the adhesive films or strips may extend along the length axis (e.g., substantially the entire length of the battery, such as greater than about 80% of the length axis, greater than about 90% of the length axis, or greater than about 95% of the length axis).

The adhesive films 438, 439 may be positioned on the battery 440 to accommodate graphical or other features on the surface of the battery as well. For example, a first strip of adhesive film 438 may be positioned along a first edge of the bonding side of the battery 440, and a second strip of adhesive film 439 may be positioned along a second edge of the bonding side of the battery 440. A middle portion of the bonding side of the battery between the first and second strips may be free of adhesive. Graphical markings, such as bar codes, QR codes, numerical codes, serial numbers, batch numbers, manufacturing information, images, or other graphical markings may be positioned on the bonding side of the battery 440 between the strips of adhesive. In this way, the graphical marking(s) may be un-occluded by the adhesive films.

The adhesive films 438, 439 may together cover a substantial amount of the surface area of the bonding side of the battery 440 (e.g., the side of the battery 440 that faces the chassis 428). For example, in some cases, the adhesive films 438, 439 together cover greater than about 60% of the surface area of the bonding side, greater than about 70% of the bonding side, or greater than about 80% of the bonding side.

Figure 5D:
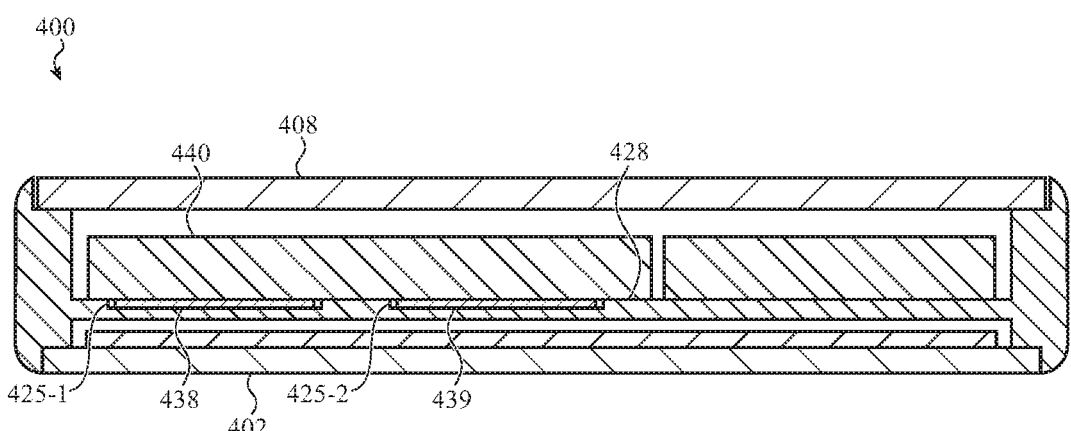
FIG. 5D depicts a partial cross-sectional view of an example electronic device.

The recesses in the chassis 428 help reduce the thickness of the device by accommodating the adhesive therein so the battery can be positioned more closely to the surface of the chassis 428 in the battery mounting. FIG. 5D is a partial cross-sectional view of the device 400, viewed along line 5D-5D in FIG. 4B. As shown, the adhesive films 438, 439 are positioned in the recesses 425-1, 425-2. In some cases, the thickness of the adhesive films 438, 439 is substantially equal to the depth of the recesses 425-1, 425-2. Accordingly, the mounting surface of the battery may contact the chassis 428. In some cases, the thickness of the adhesive films 438, 439 may be between about 5 microns and about 30 microns greater than the depths of the recesses. This may help ensure that the adhesive films 438, 439 make positive contact with the battery 440 and the chassis 428, and can account for manufacturing, assembly, or other tolerances in the battery 440, chassis 428, adhesive films 438, 439, or the like. The depth of the recesses 425-1, 425-2 may be between about 50 microns and about 100 microns, or between about 50 microns and about 250 microns. In some cases, the depth of the recesses 425-1, 425-2 may be between about 100 microns and about 500 microns. Other depths are also contemplated, and may be selected based on the particular thickness of the adhesive films 438, 439 (e.g., such that the depths are greater than or equal to the thickness of the films).

Figure 5E:
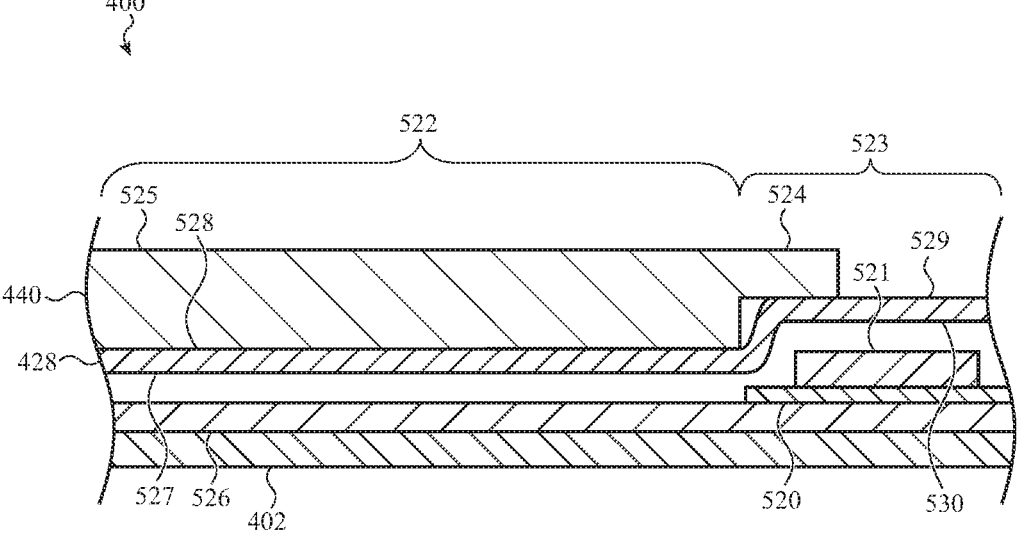
FIG. 5E depicts a partial cross-sectional view of an example electronic device.

The chassis 428 may include or define other features that physically accommodate device components to help reduce overall size and/or thickness of the device. FIG. 5E is a partial cross-sectional view of the device 400 viewed along line 5E-5E in FIG. 4B, illustrating a portion of the chassis 428 that is configured to structurally accommodate a portion of a battery and a portion of a display component. In particular, the chassis 428 defines a first portion 522 defining a first protrusion 527 along a first side of the chassis 428

(e.g., along the bottom side, as depicted in FIG. 5E) and defining a first recess 528 along a second side of the chassis 428 opposite the first side (e.g., along the top side, as depicted in FIG. 5E). The chassis 428 further defines a second portion 523 defining a second protrusion 529 along the second side of the chassis 428 and a second recess 530 along the first side of the chassis 428. The first and second protrusions and first and second recesses may be defined by a single, continuous piece of the chassis 428, which may have a substantially continuous thickness. A jog, bend, or deflection in the chassis 428 may define the protrusions and recesses as shown in FIG. 5E. In some cases, the first and second portions 522, 523 of the chassis 428 are formed by machining the middle housing component.

The recesses and protrusions defined by the first and second portions 522, 523 may accommodate irregular shaped (e.g., non-planar) components or assemblies. The recesses and protrusions may allow for efficient nesting of components to reduce the overall thickness of the device. For example, the battery 440, which is positioned on a first side of the chassis 428, may include a battery cell portion 525 that includes a battery cell and has a first thickness, and a battery circuit portion 524 that includes a battery circuit component (e.g., a battery management unit) and has a second thickness that is less than the first thickness. The thinner portion of the battery may define a recess along at least one side of the battery.

A display assembly 526, which is positioned on a second side of the chassis 428 opposite the first side, may include an irregular, non-planar chassis-facing surface. For example, a circuit element 521 may be positioned along a chassis-facing surface of the display assembly 526 (e.g., on a circuit substrate 520, such as a flexible circuit element, that is looped back along and coupled to the chassis-facing surface). The configuration of protrusions and recesses of the chassis 428 may be configured to accommodate these irregularly shaped and/or non-planar components. For example, a first portion of the battery 440 (e.g., the battery cell portion 525) may extend into the first recess 528 defined by the first portion 522 of the chassis 428, and a second portion of the battery 440 (e.g., the battery circuit portion 524) may be positioned over the second protrusion 529 defined by the second portion 523. A first portion of the display assembly 526 may be positioned opposite the first protrusion 527 (and an air gap may be defined between the first portion of the display and the first protrusion 527 of the chassis 428), while a second portion of the display assembly 526 (e.g., the circuit element 521) may extend into the second recess 530. Further, the second protrusion 529 may extend into the recess defined by the thinner, battery circuit portion 524. The arrangement of recesses and protrusions formed by the jog in the chassis 428 allows the display assembly 526 and the battery 440 to be positioned closer to one another, as compared to a planar or flat chassis, while still maintaining suitable distances between the chassis and the components.

Figure 5F:
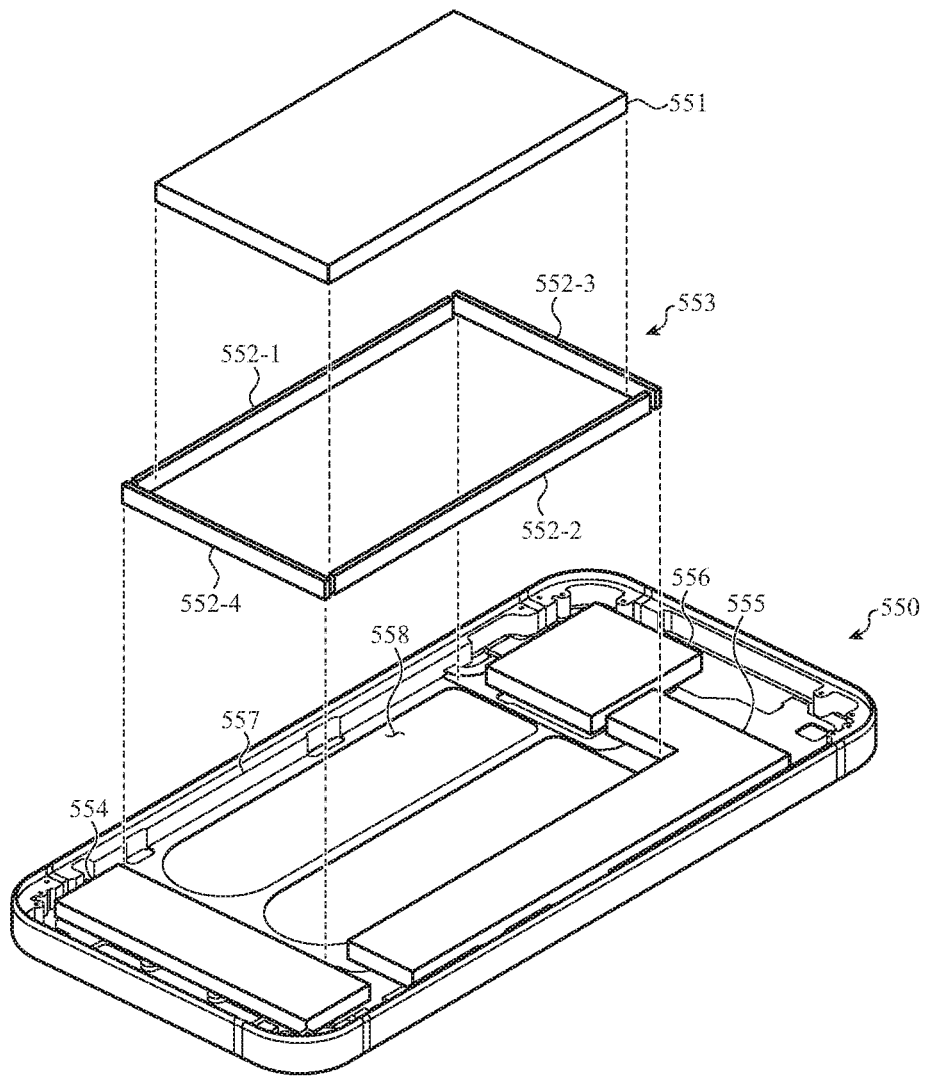
FIG. 5F depicts a partial exploded view of an example electronic device.

FIG. 5F illustrates an example device 550 that includes an impact barrier structure 553 that extends around a periphery of a battery 551. The device 550 may correspond to or be an embodiment of the device 400, and the battery 551 may correspond to or be an embodiment of the battery 440. The impact barrier structure 553 is configured to protect the sides of the battery from impacting or contacting other components or structures within the device 550. Such contact or impacts may damage the battery or the components of the device. For example, in some cases, components that are adjacent the sides of the battery 551 may be irregular, sharp, have prominent edges or features, and may include components such as screws, bolts, fasteners, or the like, which may produce high stresses on the battery 551 in the case of contact or impact. Accordingly, the impact barrier structure 553 may provide a less irregular surface around the periphery of the battery 551 to reduce stresses from the surrounding components, as well as absorb some or all of the impact force and prevent or inhibit contact between the battery and neighboring components.

The impact barrier structure 553 may include one or more barrier members. For example, the impact barrier structure 553 may include a first barrier member 552-1 positioned between the battery and a wall 557 of the housing component, and a second barrier member 552-2 positioned between the battery 551 and a circuit board assembly 555 (e.g., corresponding to or an embodiment of the circuit board assembly 500). In some cases, the impact barrier structure 553 may include a third barrier member 552-3 positioned between the battery 551 and a camera module 556, and a fourth barrier member 552-4 positioned between the battery 551 and another component 554 within the device. The impact barrier structure 553 may include more, fewer, or a different arrangement of barrier members 552, and may be configured so that one barrier member is positioned along each peripheral side of the battery 551. The barrier members 552 may be substantially planar on at least the side facing the battery, and optionally along the opposite side as well.

The barrier members 552 may be formed from a nonconductive polymer material, such as a polyethylene, polycarbonate, or the like. In some cases, the barrier members 552 also form an electrical isolation barrier between the battery 551 and other components of the device. In some cases, the barrier members 552 may be formed from metal, carbon fiber, or another suitable material.

The barrier members 552 may be secured within the device in various ways. For example, the barrier members 552 may be adhered to components or structures within the system. For example, the first barrier member 552-1 may be adhered to the first wall, the second barrier member 552-2 may be adhered to the circuit board assembly 555, the third barrier member 552-3 may be adhered to the camera module 556, and the fourth barrier member 552-4 may be adhered to the other component 554 of the device.

In some cases, the barrier members may be secured to a chassis 558 of the device (e.g., corresponding to or an embodiment of the chassis 428). For example, the chassis 558 may be a metal chassis, and at least one of the barrier members 552 (and optionally all of the barrier members 552) may be coupled to the metal chassis, such as by welding, brazing, mechanical fasteners (e.g., screws, bolts, etc.), staking, or the like.

Figure 6A:
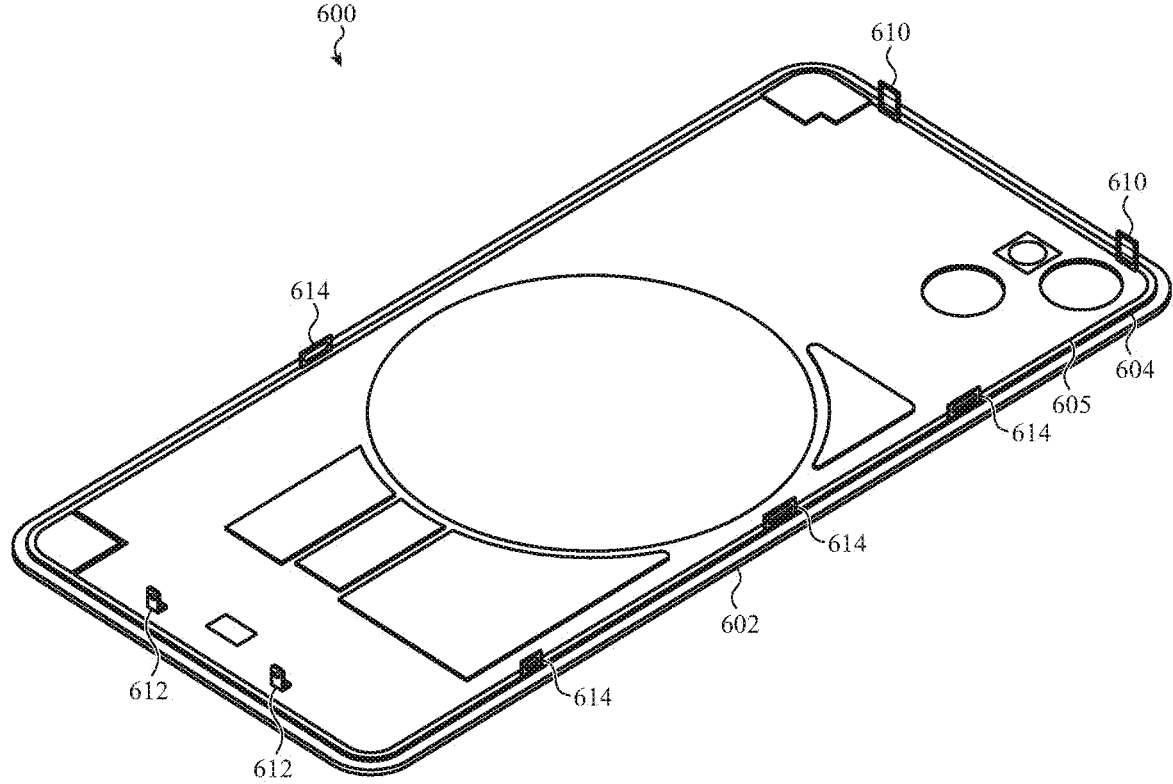
FIG. 6A depicts an example rear cover assembly for an electronic device.

FIG. 6A illustrates a rear cover assembly 600. The rear cover assembly 600 may correspond to or be an embodiment of the rear cover assemblies 273, 373, 408, or other rear cover assemblies described herein. As described herein, the cover assembly 600 may be coupled to a housing or housing structure (e.g., the housing structure 310, 406, or other housing structures described herein).

The rear cover assembly 600 includes a rear cover 602 (e.g., corresponding to or an embodiment of the rear covers 272, 372, or other rear covers described herein), and a frame 604 coupled to the rear cover 602. The frame 604 may be formed from metal, and may include mounting and/or retention features that engage with complementary features and/or mechanisms of a housing or housing structure (e.g., the housing structure 406, FIG. 4A). For example, the rear cover assembly 600 includes tabs 610 and 614, and fastening features 612. The tabs 610 may engage complementary retention features of a housing structure to retain the rear cover assembly 600 to the housing structure. For example, the rear cover assembly 600 may be positioned at an angle to the housing structure to allow protrusions of the housing structure to extend into openings in the tabs 610. The rear cover assembly 600 may then be pivoted towards the housing structure (e.g., while maintaining engagement between the protrusions and the tabs 610) so the rear cover assembly 600 can be secured to the housing structure. When the rear cover assembly 600 is in position relative to the housing structure, the fastening features 612 may align with corresponding fastening features of a front cover assembly, and may be fastened via screws, bolts, or other fasteners that extend through holes in the fastening features 612 (and optionally the fastening features of the front cover assembly as well). The fasteners may extend into and/or be anchored to a hole (e.g., a threaded hole) in a housing structure.

The frame 604 may include or define a plate-like structure that extends over the interior surface of the rear cover 602 (e.g., over substantially all of the rear cover 602, as shown), and defines an interior surface of the rear cover assembly 600. In some cases, a layer 605, such as a graphite film, polymer film, ink, paint, cosmetic layer, or the like, may be positioned on the frame 604.

The rear cover assembly 600 also includes an array of tabs 614. The tabs 614 may be part of the frame 604, or they may be attached to the frame 604 (or another component of the rear cover assembly 600). For example, the frame 604 may be formed from or include a metal structure, and the tabs 614 may be unitary with the frame 604 (e.g., formed of the same metal part as the frame 604). In other cases, the tabs 614 may be formed separately from the frame 604 and attached to the frame via welding, adhesive, soldering, brazing, fasteners, or another suitable technique. The tabs 614 may be conductively coupled to the frame 604 or another component of the rear cover assembly 600, and may be used to define a conductive path between the rear cover assembly 600 and a housing structure or other portion of a device, as described with respect to FIG. 6B.

Figure 6B:
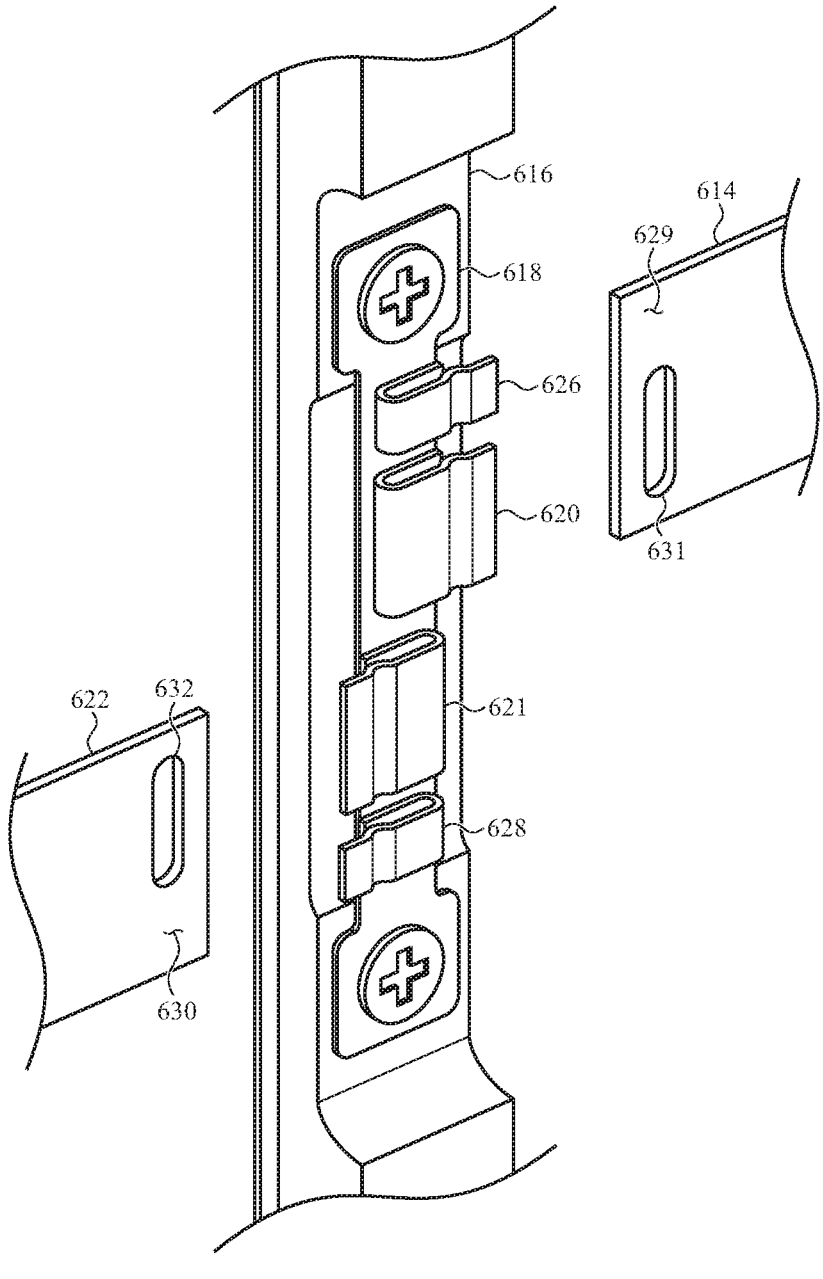
FIG. 6B depicts a spring clip system for an electronic device.

FIG. 6B illustrates a portion of a device, generally corresponding to region 6B-6B in FIG. 4B, showing how tabs of front and rear cover assemblies may be attached to a housing component 616 (which may be an embodiment of or otherwise correspond to a wall section 417 or 419). For ease of illustration, portions of the housing structure 406 are shown in cross-section. As shown in FIG. 6B, a spring coupling element 618 may be coupled to a housing structure. For example, the spring coupling element 618 may be coupled to a wall section of a housing structure, such as the wall sections 317, 319, 417, 419, or other wall sections (or other housing structures or components) described herein. The spring coupling element 618 may be coupled via fasteners, welding, soldering, brazing, or the like.

The spring coupling element 618 may be conductively coupled to the housing structure 616, and may be configured to both mechanically and electrically couple to the tabs 622, 614 of front and rear cover assemblies, respectively. The spring coupling element 618 may include spring clips configured to mechanically and electrically couple to the tabs 614, 622 of the rear and front cover assemblies, respectively. In some cases, the spring coupling element 618 includes multiple spring clips that engage a single tab. For example, the spring coupling element 618 may include spring clips 620, 626 that engage the tab 614 (of the rear cover assembly), and spring clips 621, 628 that engage the tab 622 (of the front cover assembly). In some cases, the spring clips may be configured to contact different portions of the tabs to optimize or otherwise facilitate different functions. For example, the spring clips 620, 621 may be configured to mechanically retain the tabs 614, 622, while the spring clips 626, 628 may be configured to conductively couple to the tabs 614, 622 to define a conductive coupling between the front cover assembly, the rear cover assembly, and the housing component 616. The spring clips 620, 621 may define protrusions or other features that engage with holes 631, 632 of the tabs 614, 622 (or lips, recesses, or other features) to provide mechanical retention between the tabs and spring clips.

While the spring clips 620, 621 may also conductively couple to the tabs 614, 622, the interlocking or engaging features of the clips 620, 621 and tabs 614, 622 may not provide a sufficiently reliable conductive coupling. For example, movement of the tabs relative to the spring clips may cause a protrusion and a recess or hole to disengage or otherwise produce a suboptimal conductive connection. Accordingly, the spring clips 626, 628 may engage a different portion of the tabs 614, 622, such as conductive coupling regions 629, 630 of the tabs 614, 622, thereby providing a reliable and consistent conductive coupling that can accommodate slight movements and/or misalignments. The conductive coupling regions 629, 630 may be next to the holes 631, 632. The dual clip system thus provides both reliable mechanical coupling and reliable conductive coupling between the cover assemblies and the housing structure with the same tab. Moreover, providing clips for both the front cover assembly and the rear cover assembly on a single structure provides a low-resistance conductive path between the cover assemblies and the housing structure, while reducing overall part count and device complexity.

Both the spring clips 626, 628 and the tabs 614, 622 may be formed from metal or another conductive material. In some cases, the tabs and spring clips are part of an electrical ground plane for the device. For example, the tabs 614, 622 may be conductively coupled to components and/or structures of the front and rear cover assemblies that are part of a designated electrical ground or reference plane. Additionally, the spring clips 626, 628 may be conductively coupled to components and/or structures that are coupled to the housing structure 616 that are part of a designated electrical ground or reference plane. Thus, the spring clips and tabs define a conductive path to define a single electrical ground for the device.

Figure 7A:
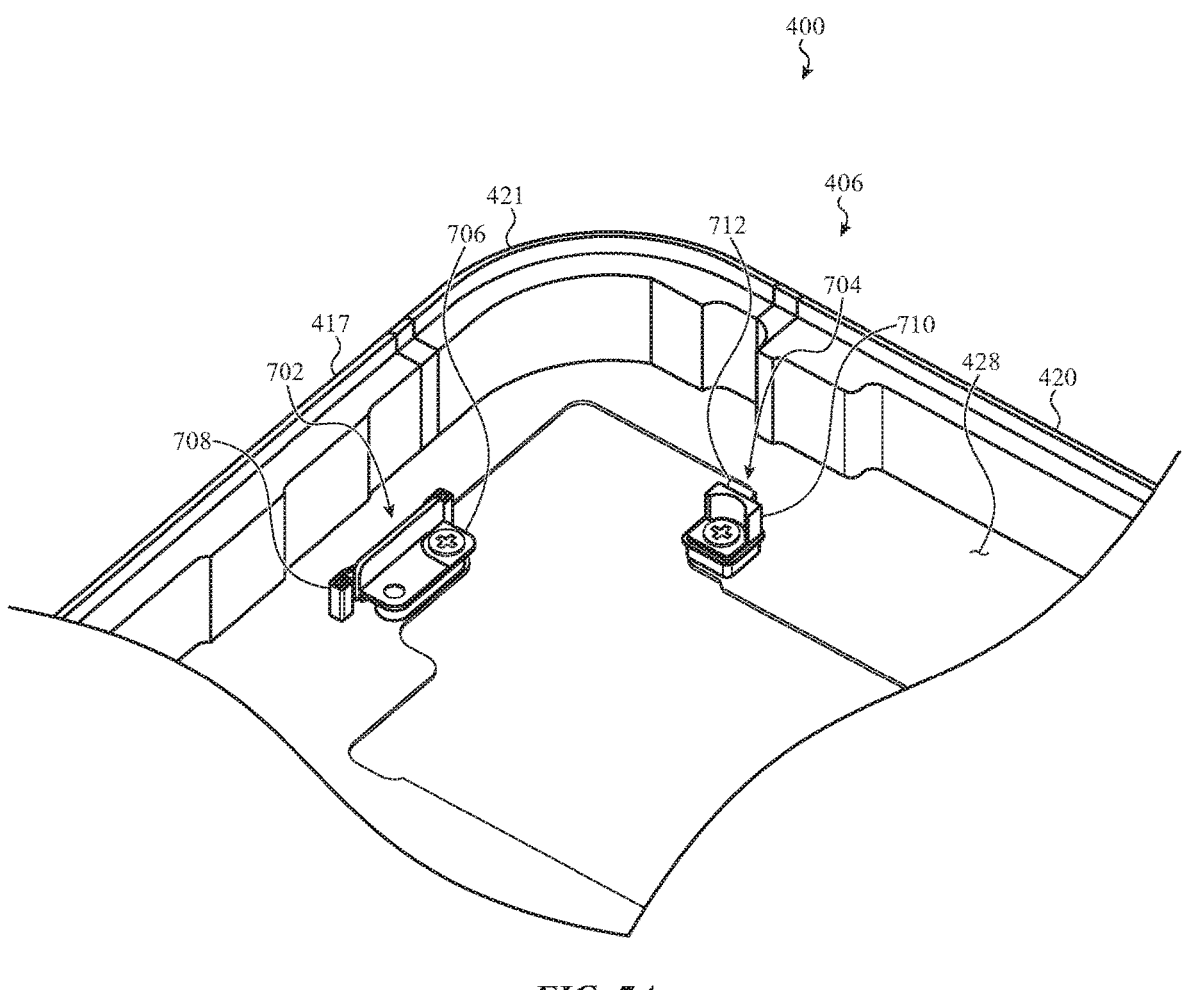
FIGS. 7A-7B depict a portion of a camera region of an electronic device.

FIG. 7A shows a portion of the device 400 (e.g., a portion of the housing structure 406) where one or more camera modules may be positioned in the device. As described herein, the housing structure 406 may define a mid-chassis section 428, which may define a rear-facing surface (shown in FIG. 7A) and a front-facing surface opposite the rear facing surface. Rear-facing cameras 750, 751 (shown in FIG. 7B, which may correspond to or be embodiments of the cameras 361, 362 in FIG. 3) may be positioned on and secured to the rear-facing surface of the mid-chassis section 428, and may face away from the mid-chassis section 428 (e.g., to capture images through the rear cover). In the example shown, the cameras are positioned proximate a corner of the device 400, such as the corner defined by the housing components 420, 421, and the wall section 417.

In order to reliably and securely position the cameras in position in the device 400, the device 400 may include biasing spring structures 702, 704 that engage with a camera bracket (e.g., the camera bracket 720, FIG. 7B) to bias the camera bracket, and thus the camera modules coupled to the camera bracket, towards a desired reference position (e.g., towards a corner of the housing structure 406). The biasing spring structures 702, 704 may include base structures 706, 710 that extend from the chassis 428. The base structures 706, 710 may be fastened to the chassis 428 (e.g., via screws, bolts, adhesives, mechanical interlocking features, or the like), or they may be unitary with the chassis 428. In the latter case, they may be machined from the same piece of material as the chassis 428 (e.g., they may be machined features of the chassis 428). The biasing spring structures 702, 704 may also include spring members 708, 712 coupled to the base structures 706, 710. The spring members may provide the biasing force that biases the camera bracket 720 towards the target position.

Figure 7B:
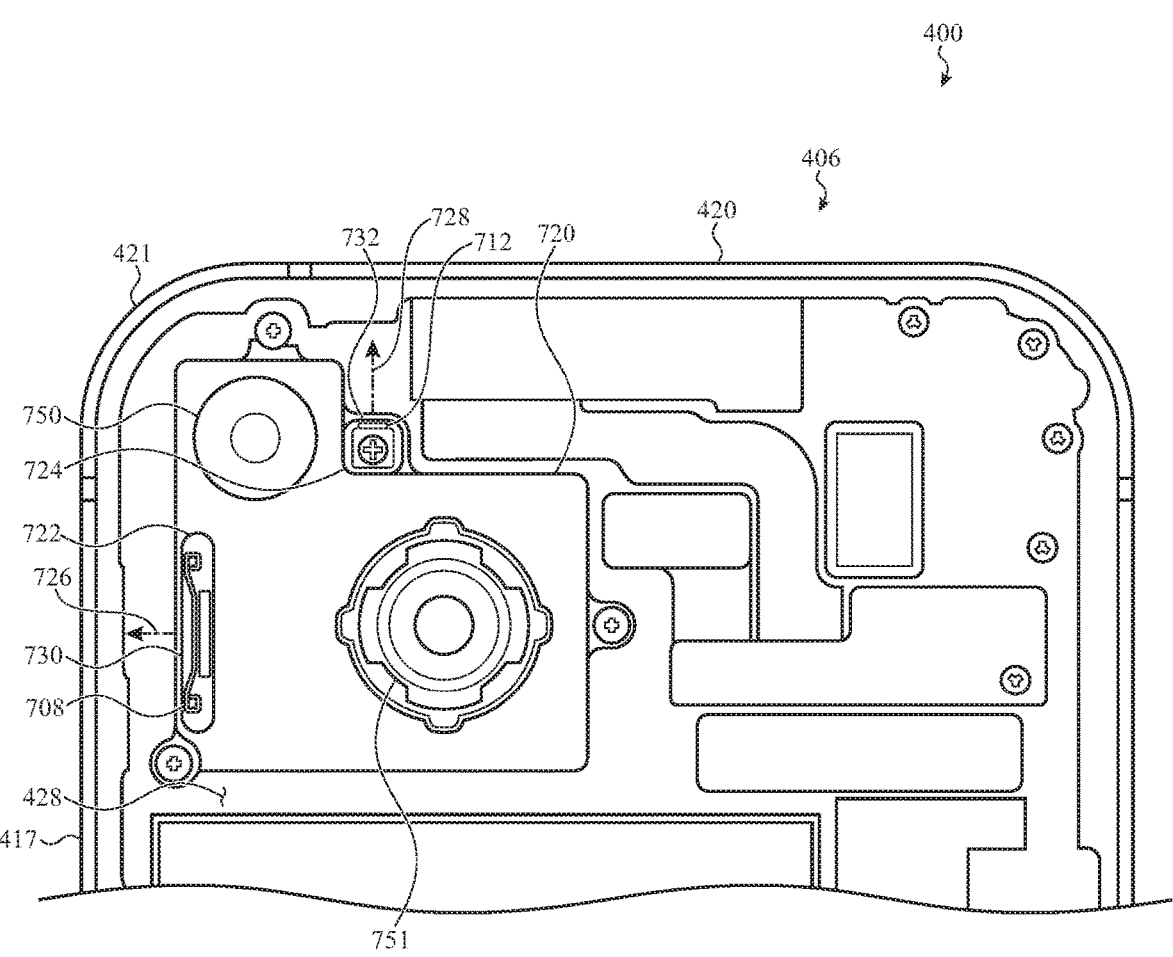

FIG. 7B shows the device 400 with the camera bracket 720 in position in the housing structure 406. The camera bracket 720 may define holes 722, 724 into which the biasing spring structures 702, 704 may extend in order to engage the camera bracket 720 and bias the camera bracket 720 towards or into the desired reference position. The holes 722, 724 may define interior surfaces 730, 732 that engage or are contacted by the spring members 708, 712. The spring members 708, 712 contact the interior surfaces 730, 732 and push the camera bracket 720 along the biasing directions 726, 728. Thus, in this example, the spring members 708, 712 bias the camera bracket 720 towards the top of the device (e.g., towards housing component 420) and towards the side of the device (e.g., towards wall section 417). Together, the spring members 708, 712 may bias the camera bracket 720 towards the corner of the device 400.

Figure 8:
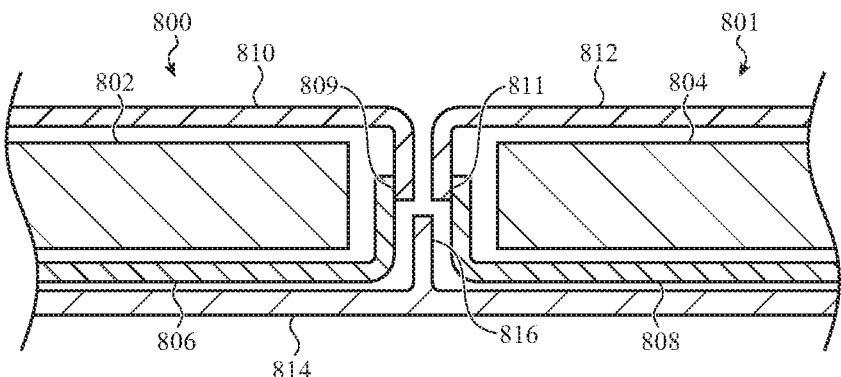
FIG. 8 depicts a partial cross-sectional view of a camera region of an electronic device.

FIG. 8 illustrates a partial cross-sectional view of a device through a pair of cameras, such as rear facing cameras 261, 262, 263 in FIG. 2, cameras 361, 362 in FIG. 3, or other cameras described herein (and in particular cameras that are next to one another). Cameras 802, 804 may be positioned in camera enclosures 800, 801, respectively. The camera enclosures 800, 801 may include first enclosure components 806, 808, and second enclosure components 810, 812. The second enclosure components 810, 812 may be coupled to the first enclosure components 806, 808 at seams 809, 811. The first enclosure components 806, 808 may each define a bottom of their respective camera enclosures 800, 801, and the second enclosure components 810, 812 may each define a top of their respective camera enclosures 800, 801. The camera enclosures 802, 804 may be coupled to a camera bracket 814, which may define a flange 816 that is positioned between the first camera and the second camera. The flange 816 may have a top edge that is below the seams 809, 811. In some cases, a portion of at least one of the second enclosure components 810, 812 extends at least partially over the top edge of the flange 816. Because the top edge of the flange 816 is below the seams 809, 811, the cameras 802, 804 may be positioned closer to one another than may be possible with other flange configurations. More particularly, the camera enclosures 800, 801, and more particularly the upper or second enclosure components 810, 812 can be positioned nearer to one another (and optionally overlapping the top of the flange 816) without having to provide a clearance distance to the sides of the flange 816. By contrast, a taller flange 816 may result in the camera enclosures 800, 801 being positioned further apart to provide sufficient clearance between the sides of the enclosures 800, 801 and the flange 816. Thus, the relative positioning of the flange 816 and the seams 809, 811 of the camera enclosures (e.g., with the top edge of the flange 816 below the seams 809, 811) allows for greater packing efficiency and smaller overall device sizes.

Figure 9A:
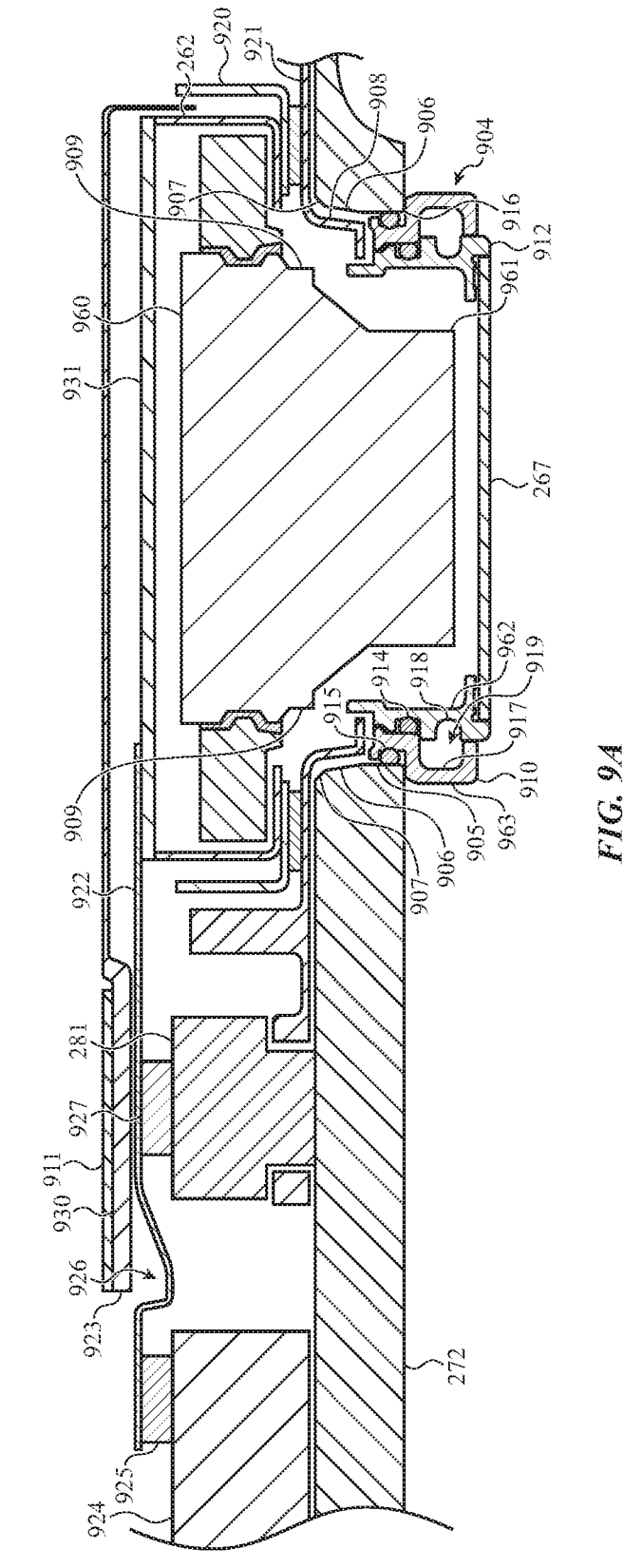
FIG. 9A depicts a partial cross-sectional view of a camera region of an electronic device.

FIG. 9A is a partial cross-sectional view of the device 200, viewed along line 9A-9A in FIG. 2, showing aspects of a rear-facing sensor region with a rear-facing camera. While FIG. 2 illustrates an exploded view, FIG. 9A represents the device 200 in an at least partially assembled state. It will be understood that the features described with respect to the device 200 may apply equally to any other devices and/or rear-facing sensor regions described herein.

FIG. 9A illustrates the camera 262 and a depth sensing device 281 (which may represent other optical components as well, such as a second camera). The device 200 includes a frame member 921 that is coupled to a rear cover 272 (and is part of a rear cover assembly) of the device 200. Components of a rear-facing sensor array, such as cameras of a camera array, camera brackets (e.g., a camera bracket 920), depth sensing devices, microphones, strobes or flashes, or the like, may be attached to the frame member 921.

The camera 262 may be conductively coupled to other components within the device 200. For example, a flexible circuit element 922 may conductively couple the camera 262 to a circuit component 924, such as a circuit board assembly (e.g., the circuit board assembly 220, FIG. 2, or another suitable circuit component. In some cases, the flexible circuit element 922 may conductively couple to the circuit component 924 via a connector system 925 (e.g., a zero insertion-force connector or other board-to-board connector system). Due to the generally planar orientation of the path of the flexible circuit element 922 between the camera 262 and the circuit component 924, slight deviations in the positioning of the camera 262 and the circuit component 924 may cause a flexible circuit element to bind, bend, or otherwise not properly align with the connector on the circuit component 924. Additionally, in order to reach the circuit component 924, a flexible circuit element may extend over another component or system, such as the depth sensing device 281. Accordingly, the flexible circuit component 922 defines a relief section 926 that provides a degree of compliance to the flexible circuit component 922 to accommodate position tolerances of the system components without imparting undue stresses to the flexible circuit component 922, the connector system 925, the camera 262, or other components. The relief section 926 may take the form of one or more curved or bent portions of the flexible circuit component 922 that can further bend or flex to allow lateral movement (e.g., left to right as shown in FIG. 9A) of the flexible circuit component 922 without causing buckling or binding of the flexible circuit component 922 or otherwise imparting undue stresses to the flexible circuit component 922, the connector system 925, the camera 262, or other components.

In some cases, the relief section 926 may be positioned between a hard-stack region and the connector system 925. For example, where the flexible circuit component 922 passes over the depth sensing device 281 (or other component of the device 200, such as a rear-facing camera), the flexible circuit component 922 may be captured between components of a stack of components, such as between a spacer 927 (e.g., a foam, shim, shroud, cowling, or other structure, material, or component positioned over the depth sensing device 281) and a camera cowling 923. In some cases, positioning the flexible circuit component 922 in the stack over the depth sensing device 281 helps retain the flexible circuit component 922 in place and reduce stresses on the interface between the flexible circuit component 922 and the camera 262, while positioning the relief section 926 between the connector system 925 and the hard-stack region provides compliance to the flexible circuit component 922 to reduce stresses on both the connector system 925 and the hard-stack region.

A cowling 923 may be positioned over the camera 262, the depth sensing device 281, and other components as well (e.g., the cameras 261, 263, FIG. 2). In some cases, the cowling 923 covers substantially all of a rear-facing sensor array (e.g., the sensor array 260, FIG. 2). The cowling 923 may be configured to physically protect the components of the sensor array, and may provide electrical shielding (e.g., shielding against electromagnetic interference, radio-frequency signals, and the like). The cowling 923 may be formed from metal, such as aluminum, steel, metal alloys, or the like. In some cases, the cowling 923 is formed from or includes a 7000 series aluminum alloy, such as a 7475 series aluminum alloy.

The cowling 923 may have different thicknesses at different regions of the cowling 923, and may be formed with recesses, jogs, protrusions, and/or other shapes. For example, a first portion 930 of the cowling 923 (e.g., a portion that is positioned over the depth sensing device 281 and/or other cameras such as the cameras 261, 263) may have a first thickness, and a second portion 931 of the cowling 923 (e.g., a portion that is positioned over the camera 262) may have a second thickness that is less than the first thickness. The second portion 931 may also be jogged upwards relative to the first portion 930, such as to provide greater clearance between the cowling 923 and the camera 262. In some cases, the camera 262 extends higher than the depth sensing device 281 and/or other components under the cowling 923, and the additional clearance under the jogged second portion 931 accommodates the larger camera 262 while maintaining suitable clearances. The first thickness may be between about 0.25 mm and about 0.35 mm, and the second thickness may be between about 0.18 and about 0.25 mm.

The second portion 931 may be made thinner than the first portion 930 by chemical etching or another material removal process (e.g., machining). In some cases, the second portion 931 may be made thinner by a forming process such as forging, stamping, molding, or the like.

The first portion 930 may define a recessed exterior surface, relative to the exterior surface of the second portion 931. In some cases, a thermally conductive material 911, such as a graphite material, may contact or be positioned along the exterior surface of the first portion 930. In some cases, the thermally conductive material 911 may be coupled to a structure that is positioned over the cowling 923 when the device 200 is assembled. For example, the thermally conductive material 911 may be positioned on a front cover assembly (e.g., the interior surface of the front cover assembly 201, FIG. 2), and may be positioned over and/or in contact with the exterior surface of the first portion 930 when the front cover assembly is attached to the housing (e.g., the housing 210). In some cases, the thermally conductive material 911 is coupled (e.g., adhered) to the first portion 930 of the cowling and is positioned proximate and/or in contact with the front cover assembly when the front cover assembly is attached to the housing. The thermally conductive material 911 may conduct heat produced by the components of the rear-facing sensor array (e.g., the cameras of a camera array) away from the cameras and towards another component or structure of the device. For example, the thermally conductive material 911 may help draw heat away from the rear-facing sensor array and into the front cover assembly, for example.

A portion of the camera 262, such as a portion of a lens assembly 960, may extend into and optionally through a hole 916 that extends through the rear cover 272. The lens assembly 960 may define a base portion 909 that has a first outer diameter and an end portion 961 that has a second outer diameter that is smaller than the first outer diameter. A portion of the camera 262 (e.g., an end portion 961 of the lens assembly 960) may extend past the rear exterior surface of the rear cover 272. As described herein, a trim assembly may surround and/or protect the portion of the camera 262 that extends past the rear exterior surface of the rear cover 272.

In some cases, a certain clearance distance may be required between the lens assembly 960 and adjacent components in the device 200, such as to prevent inadvertent contact between the lens assembly 960 and the adjacent components during assembly and/or use of the device. Accordingly, the hole 916 may define a multi-segment hole surface to accommodate the lens assembly 960 while minimizing the size of the opening along the exterior surface of the rear cover 272. For example, the hole 916 may be defined by a hole surface having a tapered portion 906 proximate the opening of the hole that is along the interior surface of the rear cover 272, and a cylindrical portion 905 proximate the opening of the hole that is along the exterior surface of the rear cover 272. The tapered portion 906 may define a frusto-conical surface. The tapered portion 906 provides clearance for the lens assembly 960 proximate the wider base portion 909 of the lens assembly. The clearance provided by the tapered portion 906 facilitates various structural and positioning advantages. For example, the exterior opening of the hole can be made smaller (as compared to a cylindrical or straight-walled hole) because the tapered portion 906 provides additional clearance near a wider portion of the lens assembly 960. Additionally or alternatively, the lens assembly 960 may be positioned further in the hole 916 without placing the lens assembly 960 too close to the hole surface. In some cases, the edge of the interior opening defines a chamfered surface 907.

In some cases, the frame member 921 may define a tapered wall section 908 that extends into the hole 916. The tapered wall section 908 may define a tapered shape that is substantially parallel to the tapered portion 906 of the hole surface. The matching taper of the tapered wall section 908 and the tapered portion 906 of the hole 916 provide the advantages of the tapered hole portion while also providing additional protection, light blocking, and other functionality of the tapered wall section 908 in the hole. In some cases, as described herein, trim assemblies that extend around the lens assembly 960, protect the lens assembly 960, and hold a camera cover may be attached to the tapered wall section 908.

As noted above, a device may include trim assemblies for rear-facing cameras, such as the camera 262 (as well as cameras 261, 263 in FIG. 2, or other cameras described herein). FIG. 9A illustrates an example trim assembly 904, which may be an embodiment of the trim assemblies 269, FIG. 2. Other cameras of a device may also include the same or a similar trim assembly as that shown in FIG. 9A, or they may use different trim assemblies. The trim assembly 904 may include an inner trim ring 912 extending around a lens portion of the camera 262 (e.g., the lens assembly 960) and may define a first surface 962 facing the lens portion, and a second surface opposite the first surface 962 and defining a first channel 918. The trim assembly 904 may further include an outer trim ring 910 extending around the inner trim ring 912 and defining a third surface facing the second surface of the inner trim ring and defining a second channel 917, and a fourth surface 963 opposite the third surface and defining a peripheral exterior surface of the trim assembly 904. The first and second channels 917, 918 may define a hollow chamber 919 between the inner trim ring 912 and the outer trim ring 910. The hollow chamber 919 may provide a weight savings over a trim assembly that does not include the channels 917, 918, and may also lower material costs for the device. In some cases, the hollow chamber 919 may be filled with a material, such as a polymer material, foam, adhesive, or the like.

The inner trim ring 912 may support a camera cover 267 or window through which the camera receives light. The camera cover 267 may be adhered or otherwise attached to a mounting surface of the inner trim ring 912.

Sealing members may also be provided between the trim rings and/or the hole surface. For example, a first sealing member 915 may be positioned between and in contact with the outer trim ring 910 and the hole surface (e.g., the cylindrical portion 905 of the hole 916). A second sealing member 914 may be positioned between and in contact with the inner trim ring 912 and the outer trim ring 910. The sealing members may be formed from rubber, foam, or another deformable or compliant material that intimately contacts the surfaces of the trim rings and/or the hole surface (or other surfaces). The sealing members may inhibit ingress of liquid, water, dust, and/or other contaminants.

The trim rings 910, 912 may be formed from or include a metal material, such as aluminum, steel, zinc, titanium, metal alloys, or the like. One or both of the trim rings 910, 912 may alternatively be formed from a polymer material, a composite material, or another suitable material or combination of materials. The trim rings 910, 912 may be formed from the same material (e.g., aluminum), or they may be formed from different materials (e.g., an aluminum trim ring and a polymer trim ring).

Figure 9B:
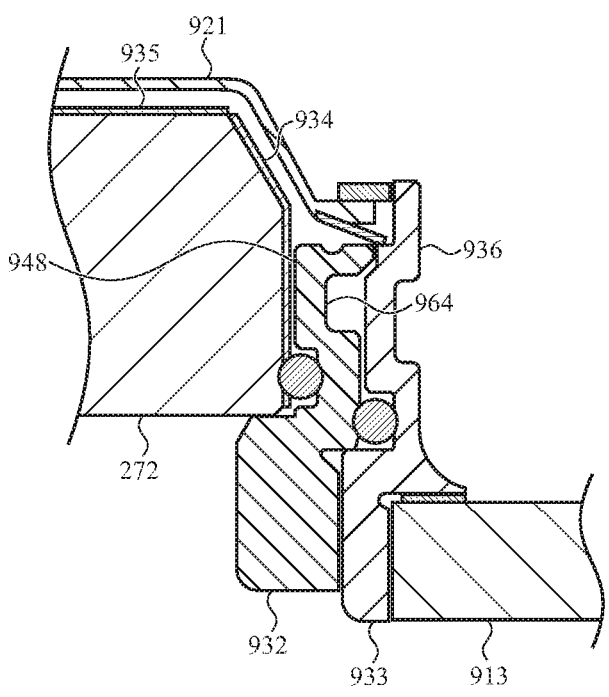
FIGS. 9B-9G depict partial cross-sectional views of example trim assemblies for an electronic device.

FIGS. 9B-9F illustrate additional example trim assemblies and other features of the rear camera regions. For simplicity, FIGS. 9B-9F illustrate various trim assemblies, masks, frame structures, and the like, coupled to the rear cover 272 and including the camera cover 913, though it will be understood that they may be used with other rear covers and/or camera covers as well. FIG. 9B illustrates an example trim assembly that includes an inner trim ring 933 coupled to an outer trim ring 932. A camera cover 913 may be coupled to the inner trim ring 933. The inner and outer trim rings 933, 932 may include flange portions 936, 948, respectively, that extend into the hole 916 (FIG. 9A of the rear cover 272. The flange portions may correspond to the portions of the trim rings that are within the hole and/or extend into the interior of the device, while external portions of the trim rings may correspond to the portions that extend past the rear exterior surface of the cover 272. The flange portions 936, 948 may be coupled to one another, and/or to the frame member 921. For example, the flange portions 936, 948 may be welded, brazed, adhered, or otherwise coupled to one another and/or to the frame member 921. The flange portion 948 of the outer trim ring 932 may define a recess or channel 964 in a surface that faces the inner trim ring 933, thereby defining a hollow chamber between the outer and inner trim rings 933, 932. The hollow chamber may provide weight and material reductions as described above.

As shown in FIG. 9B, coatings 934 and 935 may be applied to surfaces of the rear cover 272. The coatings 934, 935 may be opaque and/or light-blocking coatings to prevent or inhibit the visibility of the internal components through the rear cover 272. The coatings 934, 935 may be formed from or include ink, dyes, paint, or deposited coatings (e.g., coatings deposited using PVD processes, CVD Processes, or the like). The coating 935 may be positioned along an interior surface of the rear cover 272, opposite the rear exterior surface of the rear cover 272. The coating 934 may be positioned along the hole surface, including along the tapered portion of the hole surface and the cylindrical portion of the hole surface. The coatings 934, 935 may be formed from or include the same material, or different materials. In some cases, the coatings 934, 935 may have a same or substantially the same color, providing a uniform appearance through the rear cover 272 (which may be transparent or translucent glass material, sapphire, glass ceramic, ceramic, or the like). In some cases, sealing members that contact the coated hole surface (e.g., sealing member 915, FIG. 9A) may have a same or substantially the same color as the coatings. In some cases, flange portions of the trim rings (and in particular the flange portion of the outer trim rings) may have a same or substantially the same color as the coatings.

In some cases, the external portions of the trim rings have a different color than the flange portions. For example, the flange portion of the inner trim ring may have a first color (e.g., that matches the coatings), while the external portion may have a different color. The different colored portions of the trim rings may be produced in various ways. For example, one or both portions of a trim ring may be painted, coated, plated, textured, anodized, etched, dyed, or the like, to produce desired colors along the flange and external portions.

Figure 9C:
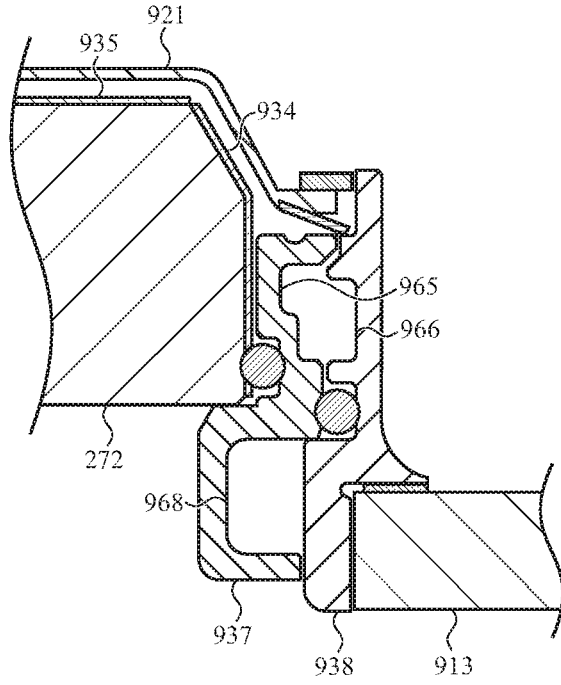

FIG. 9C illustrates an example trim assembly that includes an inner trim ring 938 and an outer trim ring 937. The outer trim ring 937 defines a first channel 965 in its flange portion and a second channel 968 in an external portion (e.g., the portion of the outer trim ring 937 that extends beyond the rear exterior surface of the rear cover 272). Additionally, the inner trim ring 938 defines a third channel 966 in its flange portion that is opposite the first channel 965 and, together with the first channel 965, defines a first hollow chamber between the flange portions. The second channel 968 defines a second hollow chamber between the external portions of the trim rings. The hollow chambers may provide weight and material reductions as described above. Discussions of other aspects of the trim rings (e.g., materials, attachment techniques, colors, etc.) described herein with respect to other trim rings may apply equally to the trim rings 937, 938.

Figure 9D:
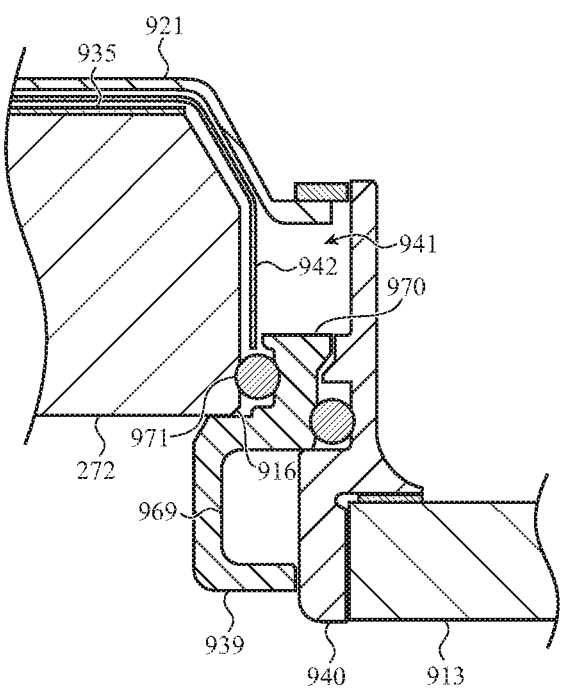

FIG. 9D illustrates an example trim assembly that includes an inner trim ring 940 and an outer trim ring 939. The outer trim ring 939 defines a channel 969 in an external portion. The channel 969 defines a first hollow chamber between the outer trim ring 939 and the inner trim ring 940. Additionally, the outer trim ring 939 includes a partial flange portion 970 that extends only partially into the hole (e.g., less than about 50% of the length of the hole, less than about 40% of the length of the hole, less than about 30% of the length of the hole). The partial flange portion 970 may define a second hollow chamber 941 between the hole surface and the flange portion of the inner trim ring 940. The hollow chambers may provide weight and material reductions as described above. FIG. 9D also illustrates a shroud 942 that may be positioned on or along one or more surfaces of the rear cover 272. For example, the shroud 942 may extend along at least a portion of the interior surface of the rear cover 272 and may extend into the hole 916 along the hole surface. The shroud 942 may inhibit the visibility of the internal components through the rear cover 272. The shroud 942 may also have a color that matches or substantially matches the color of a coating (e.g., the coating 935) that is positioned on the interior surface of the rear cover 272, thereby providing a uniform appearance through the rear cover 272. The shroud 942 may be used in addition to or instead of a coating on the hole surface. In some cases, the shroud 942 may extend only partially into the hole 916, such that a sealing member 971 does not contact the shroud (but rather is between and in contact with the outer trim ring 939 and the hole surface). In such cases, at least the portion of the hole surface that the shroud 942 does not overlap may include a color-matched coating. Discussions of other aspects of the trim rings (e.g., materials, attachment techniques, colors, etc.) described herein with respect to other trim rings may apply equally to the trim rings 939, 940.

Figure 9E:
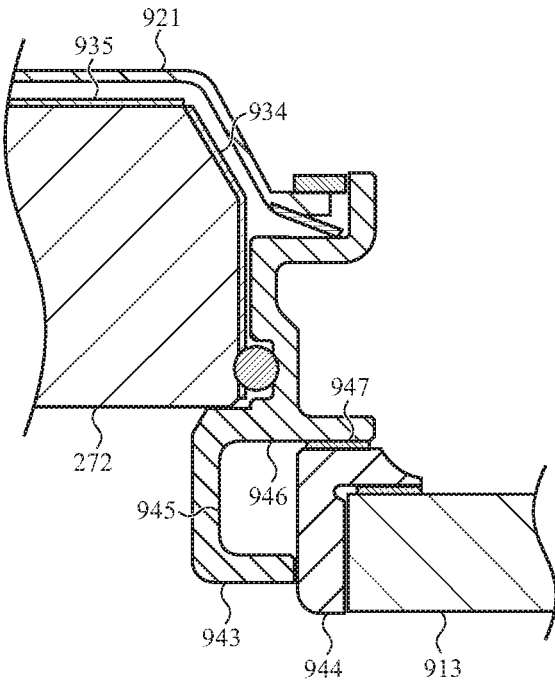

FIG. 9E illustrates an example trim assembly that includes an inner trim ring 944 and an outer trim ring 943. The outer trim ring 943 defines a channel 945 in an external portion, the channel 945 defining a hollow chamber between the outer trim ring 943 and the inner trim ring 944. Additionally, the inner trim ring 944 lacks a flange portion, and instead is coupled to a mounting surface 946 of the exterior portion of the outer trim ring 943. Thus, as shown, the inner trim ring 944 may not extend into the hole (e.g., the entirety or substantially the entirety of the inner trim ring 944 may be outside of the hole). The inner trim ring 944 may be coupled to the outer trim ring 943 in various ways. For example, an adhesive 947 may adhere the inner trim ring 944 to the mounting surface 946. In other examples, instead or in addition to the adhesive, the inner trim ring 944 may be coupled via welding, brazing, mechanical interlocking features (e.g., threads), fasteners, or the like. Discussions of other aspects of the trim rings (e.g., materials, attachment techniques, colors, etc.) described herein with respect to other trim rings may apply equally to the trim rings 943, 944.

Figure 9F:
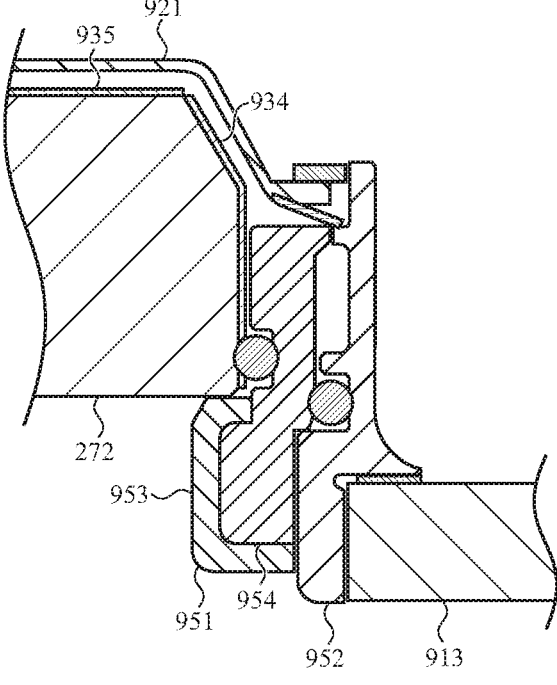

FIG. 9F illustrates an example trim assembly that includes an inner trim ring 952 and an outer trim ring 951. The outer trim ring 951 may include a structural component 954 and an exterior shell 953. The structural component 954 may define a flange portion and an external portion, and the exterior shell 953 may be coupled to the external portion (or other portion of the structural component 954), and may define an exterior surface of the outer trim ring 951 that is visible from the outside of the device. The structural component 954 and the exterior shell 953 may be formed from different materials. For example, the structural component 954 may be formed from a polymer material, while the exterior shell 953 may be formed from a metal material. In such cases, the structural component 954 and the exterior shell 953 may be coupled together via an insert molding process. For example, the exterior shell 953 may be positioned in a mold cavity, and a polymer material may be introduced into the mold to engage the exterior shell 953 and form the shape of the structural component 954. In some cases, the exterior shell 953 may be a coating, plating (e.g., a metallic plating), deposited coating (e.g., a PVD or CVD coating), or the like. The structural component 954 and the exterior shell 953 may have different colors. For example, the structural component 954 may have a color that matches or substantially matches the color of a coating (e.g., the coatings 935, 934) that is positioned on a surface of the rear cover 272, thereby providing a uniform appearance through the rear cover 272. Discussions of other aspects of the trim rings (e.g., materials, attachment techniques, colors, etc.) described herein with respect to other trim rings may apply equally to the trim rings 951, 952.

Figure 9G:
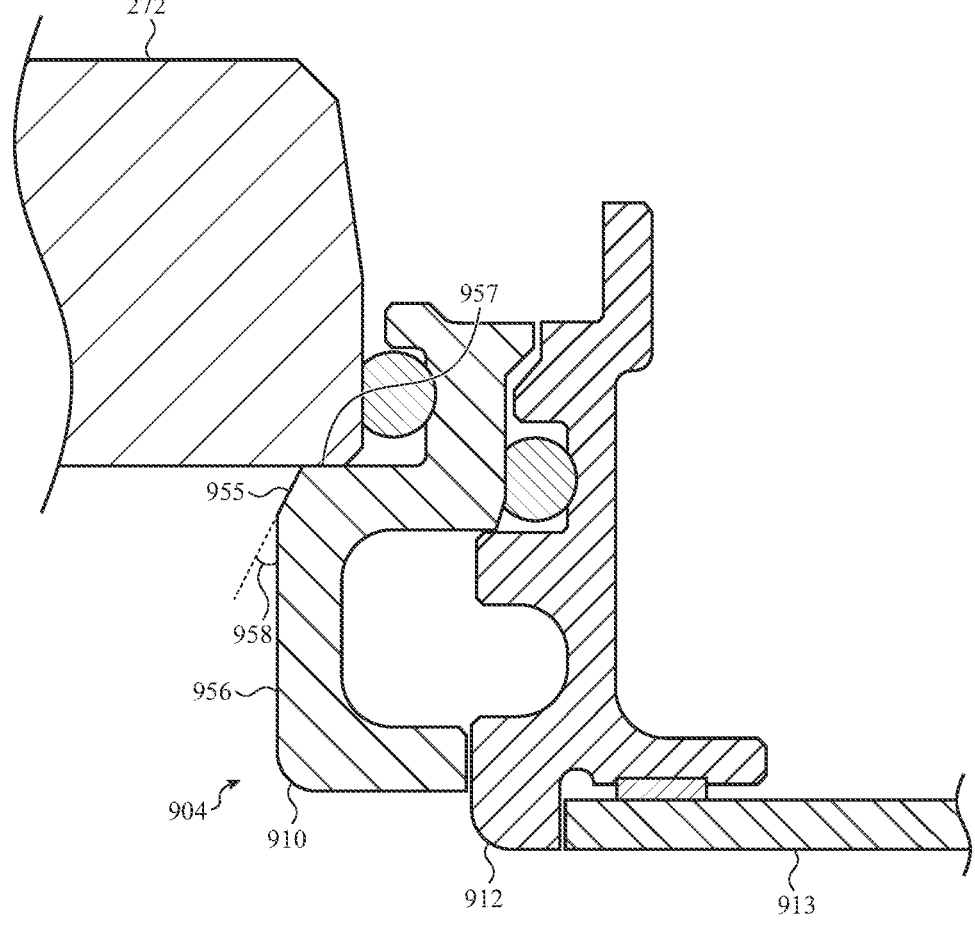

FIG. 9G illustrates a detail view of the trim assembly 904 of FIG. 9A, illustrating the inner trim ring 912 and the outer trim ring 910. The outer trim ring 910 defines an interface surface 957 that is positioned on (in contact with) the rear exterior surface of the rear cover 272, as shown. The outer trim ring 910 further defines an exterior peripheral surface 956 that has a first texture, and a chamfer surface 955 that extends from the interface surface 957 to the exterior peripheral surface 956 and has a second texture different from the first texture. In some cases, the first texture of the exterior peripheral surface 956 has a lower surface roughness than the second texture. In some cases, the exterior peripheral surface 956 has a polished appearance, and the chamfer surface 955 has a textured or non-polished appearance. The chamfer surface 955 may be subjected to a texturing process, such as blasting (e.g., bead blasting, sand blasting, etc.), machining, grinding, etching, or another suitable process to produce the target texture. The exterior peripheral surface 956 may be subjected to a polishing process to produce the target texture for the exterior peripheral surface 956. In some cases, the different textures, and in particular the higher surface roughness of the chamfer surface 955 relative to the exterior peripheral surface 956, may have the result of reducing the appearance of the height of the outer trim ring 910 (e.g., the distance that the outer trim ring 910 extends past the exterior surface of the rear cover 272).

The chamfer surface 955 may define an angle 958 with respect to the exterior peripheral surface 956. The angle 958 may be less than 45 degrees. In such cases, the chamfer region defined by the chamfer surface 955 may have a greater height (e.g., along the vertical dimension shown in FIG. 9G) than width (e.g., along the horizontal dimension shown in FIG. 9G). Stated another way, the angle 958 may produce a chamfer region that is taller than it is deep. In some cases, the height of the chamfer region may be between about 0.25 mm and about 0.40 mm, and the width of the chamfer region may be between about 0.10 mm and about 0.20 mm.

Figure 9H:
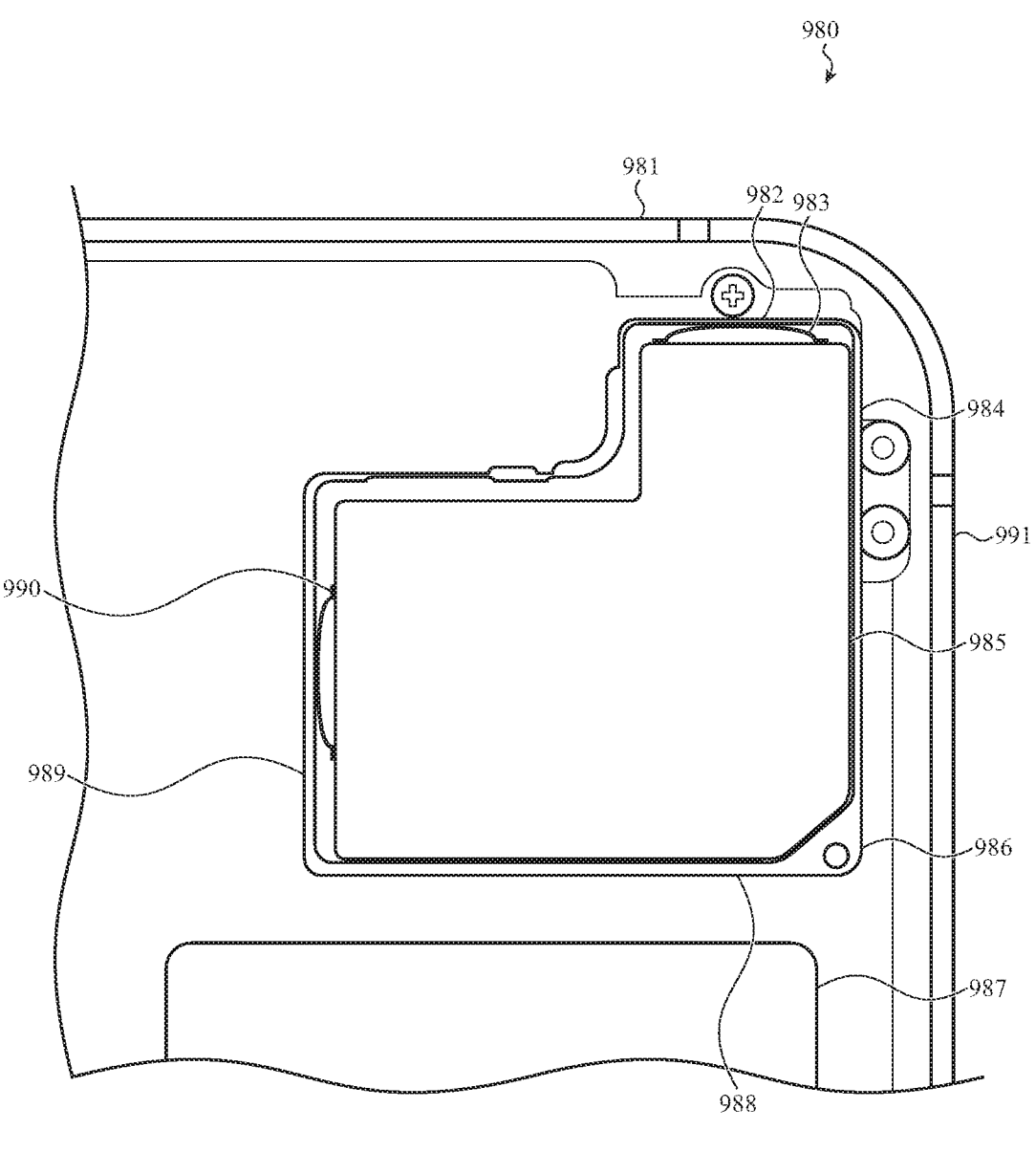
FIG. 9H depicts a camera region of another example electronic device.

FIG. 9H illustrates a portion of a device 980, which may be an embodiment of the device 200 in FIG. 2, showing a portion of a rear-facing sensor array. The view shown in FIG. 9H may correspond to a view of the device with the front cover assembly removed. The device 980 includes a wall structure 986 and a camera bracket 985 positioned in the wall structure 986.

The wall structure 986 may at least partially surround the camera bracket 985. For example, the wall structure 986 may define a first wall segment 982 extending along a first side of the camera bracket 985 and positioned between the camera bracket 985 and a top side wall 981 of the housing component. The wall structure 986 may further define a second wall segment 984 extending along a second side of the camera bracket 985 and positioned between the camera bracket 985 and a lateral side wall 991 of the housing component. The wall structure 986 may further define a third wall segment 988 extending along a third side of the camera bracket opposite the first side and positioned between the camera bracket and a battery 987. The wall structure 986 may further define a fourth wall segment 989 extending along a fourth side of the camera bracket 958 opposite the second side and positioned between the camera bracket and another internal component or structure (e.g., a speaker module).

First and second biasing springs 983, 990 may be positioned along a first and a second side of the camera bracket 985, respectively. The first and second biasing springs 983, 990 may be coupled to the wall segments of the wall structure 986 and positioned between the wall segments and the camera bracket 985, such that they impart biasing forces between the wall segments and the camera bracket 985. For example, the first biasing spring 983 biases the camera bracket towards a battery 987 along a first direction (e.g., downwards, away from the top side wall 981 of the device), and the second biasing spring 990 biases the camera bracket 985 towards the lateral side wall 991 of the device. In some cases, the second biasing spring 990 may bias the camera bracket 985 in the opposite direction (e.g., it may be positioned between the second wall segment 991 and the camera bracket 985). The second biasing spring 990 may bias the camera bracket 985 in a direction that is transverse to the first direction.

Figure 10A:
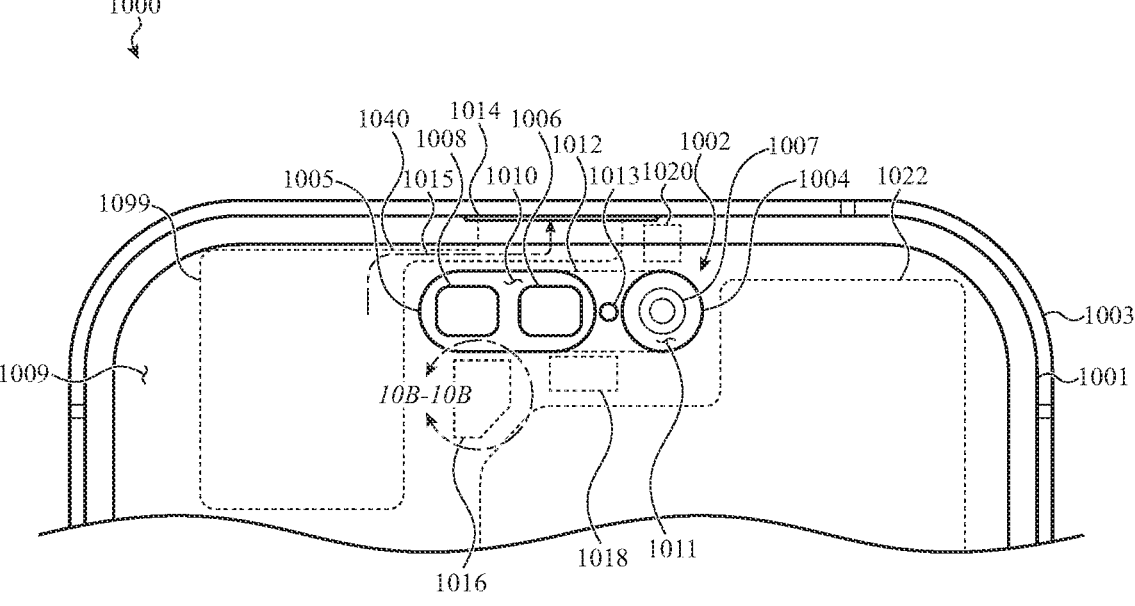
FIG. 10A depicts a portion of an example electronic device.

As noted above, a device may include a front-facing sensor region positioned along a front of a device. FIG. 10A illustrates an example device 1000 with such a configuration. The device 1000 may correspond to or be an embodiment of the electronic devices 100, 200, or any other device described herein.

The device 1000 includes a front-facing sensor region 1002, which may correspond to or be an embodiment of the front-facing sensor region 111 described with respect to FIG. 1A. The front-facing sensor region 1002 may appear as a pill-shaped region along the display 1009 of the device. The front-facing sensor region 1002 may appear as an inactive area of the display 1009, and may be completely surrounded by active areas of the display.

As described herein, the front-facing sensor region 1002 may provide both input and output functionality for the device 1000. For example, the front-facing sensor region 1002 may include sensors such as a facial recognition system and a front-facing camera. Additionally, as described herein, the front-facing sensor region 1002 may include a supplemental display region 1012 that appears to be part of the graphically inactive area of the display, but in fact can be used to provide graphical outputs to a user. For example, as described herein, the supplemental display region 1012 may be used to selectively produce graphical outputs (such that a graphical output is displayed within the front-facing sensor region 1002). When not producing graphical outputs, the supplemental display region 1012 in the front-facing sensor region 1002 may appear the same as or similar to an inactive region (e.g., a portion of the cover that does not have an underlying display).

The front-facing sensor region 1002 may be defined at least in part by one or more holes formed through the display to allow optical access through the display for optical components such as a front-facing camera 1007 and a facial recognition system (which may include an optical emitter 1008 and an optical receiver 1006). For example, a first hole 1004 may be formed through the display (e.g., through all or a subset of the layers of a display stack), and a front-facing camera 1007 may be positioned relative to the first hole 1004 such that the camera 1007 can capture images through the front cover 1001 of the device 1000. A second hole 1005 may be formed through the display (e.g., through all or a subset of the layers of the display stack), and an optical emitter 1008 and an optical receiver 1006 may be positioned relative to the second hole 1005 such that infrared light can be emitted and received through the front cover 1001 of the device 1000. As described herein, the optical emitter 1008 may be an infrared illuminator module, and the optical receiver 1006 may be an infrared image capture device.

In some cases, the front-facing sensor region 1002 may include one or more masks, coatings, and/or other materials or treatments to define the boundaries of the front-facing sensor region 1002 and obscure internal components of the device through the front-facing sensor region 1002. For example, masks 1010, 1011 may be applied to the cover 1001 to provide a substantially uniform appearance to the front-facing sensor region 1002 and/or to block visibility into the device through the front-facing sensor region 1002. The masks 1010, 1011 may be positioned on an interior surface of the front cover 1001 in the areas where the first and second holes 1005, 1004 of the display are positioned. In some cases, the display stack overlaps the masks 1010, 1011 behind the masks, such that the masks 1010, 1011 occlude or block the visibility of the openings in the display. The mask 1010 may define one or two holes above the optical emitter 1008 and optical receiver 1006. For example, the mask 1010 may define a single hole that surrounds both the optical emitter 1008 and optical receiver 1006, or separate holes for each of the optical emitter 1008 and optical receiver 1006. The mask 1011 may define a single hole that surrounds the front-facing camera 1007.

Further, a coating that is substantially opaque visually but at least partially transparent to infrared light may be applied to the cover 1001 over the optical emitter 1008 and the optical receiver 1006. The front-facing sensor region 1002 may be configured so that when the display 1009 is inactive (e.g., not illuminated and/or producing a graphical output), the front-facing sensor region 1002 and the display appear to be substantially continuous. Stated another way, when the display 1009 is inactive, there may be little or no discernable visual difference between the display 1009 and the front-facing sensor region 1002. To achieve this, the visually opaque, infrared-transmissive coating and the mask 1010 may be designed to have similar optical properties (e.g., color, reflectance, opacity, etc.) to the display when the display is inactive.

As described herein, the front-facing sensor region 1002 may include sensors such as a facial recognition system and a front-facing camera. Additionally, as described herein, the front-facing sensor region 1002 may include a supplemental display region 1012 that appears to be part of the graphically inactive area of the display, but in fact can be used to provide graphical outputs to a user. For example, graphical outputs produced by the display 1009 (e.g., graphical user interfaces of the device's operating system and/or applications) may not extend into or be displayed by the supplemental display region 1012. However, the supplemental display region 1012 may be used to display icons, glyphs, lights, or other graphical outputs to provide information to a user. As one nonlimiting example, an indicator 1013 may be displayed in the supplemental display region 1012 to notify the user of an event or of a state of the device. For example, the indicator 1013 may indicate that a new message (e.g., email, text message, application notification) has been received, or it may indicate that the front-facing camera or facial-recognition sensor is active.

The dotted line in FIG. 10A illustrating the boundary between the supplemental display region 1012 and the main active region of the display 1009 may be a programmatic boundary (e.g., the display 1009 does not display main graphical output within the border), or a physical or optical boundary (e.g., it may be defined by a coating, ink, or the like). In some cases, substantially all of the supplemental display region 1012 is defined by a mask that covers and blocks the display, but defines one or more holes that allow light from the display to pass through to produce a graphical output within the supplemental display region 1012. For example, the indicator 1013 may represent or be defined by a hole through an opaque mask that is positioned above the display. For example, a supplemental display region mask may be positioned between the masks 1010, 1011 and over an active portion of the display. The supplemental display region mask may define a hole, and when the underlying region of the display is illuminated, the indicator 1013 appears illuminated. The supplemental display region mask may be a portion of a continuous mask (which may define the masks 1010, 1011 and the supplemental display region mask). In other examples, the supplemental display region mask may be a different mask from the masks 1010, 1011 (e.g., e.g., formed from one or more different materials and/or layers).

Further, the front-facing sensor region 1002, or a portion thereof, may be touch- and/or force-sensitive, such that a user can provide touch inputs to the front-facing sensor region 1002. For example, touching or tapping on the front-facing sensor region 1002 may cause a camera application to launch on the device 1000. As another example, touching or tapping on the front-facing sensor region 1002 when a notification is active in the supplemental display region 1012 may cause an application or other information related to the notification to be displayed on the device.

FIG. 10A illustrates other features of the front of the device 1000. For example, the device 1000 may include a speaker port 1014 positioned between the cover 1001 and the housing 1003. The speaker port 1014, which may correspond to or be an embodiment of the speaker port 110 in FIG. 1A, may be positioned outside of the active area of the display 1009, and may be defined along at least a first side by a notch formed in the cover 1001, and on at least a second side by the housing 1003. A grate element or other protective structure may be positioned within the speaker port 1014 to inhibit ingress of debris into the device 1000. A speaker assembly 1099 may be positioned below the front cover 1001 and may be coupled to an audio passage 1040 that is configured to transmit audio from the speaker assembly 1099. The audio passage 1040 may extend from the speaker assembly 1099 to the speaker port 1014. Sound may travel through the audio passage 1040, as illustrated by path 1015, to exit the device and be audible to a user. The device 1000 may also include a microphone 1020 positioned within the device and configured to receive sound through the speaker port 1014.

The device 1000 may also include an ambient light sensor 1018, which may be positioned outside of the front-facing sensor region 1002 and below the display 1009 (e.g., such that the ambient light sensor 1018 captures light through the display stack in an active area of the display).

The device 1000 may also include a proximity sensor 1016, which may be positioned outside of the front-facing sensor region 1002 and below the display 1009 (e.g., such that the proximity sensor 1016 emits and/or receives light through the display stack in an active area of the display to detect proximity of an object to the device). The proximity sensor 1016 may operate (e.g., emitting light and receiving reflected light) when the display stack is active (e.g., actively displaying graphical outputs).

Figure 10B:
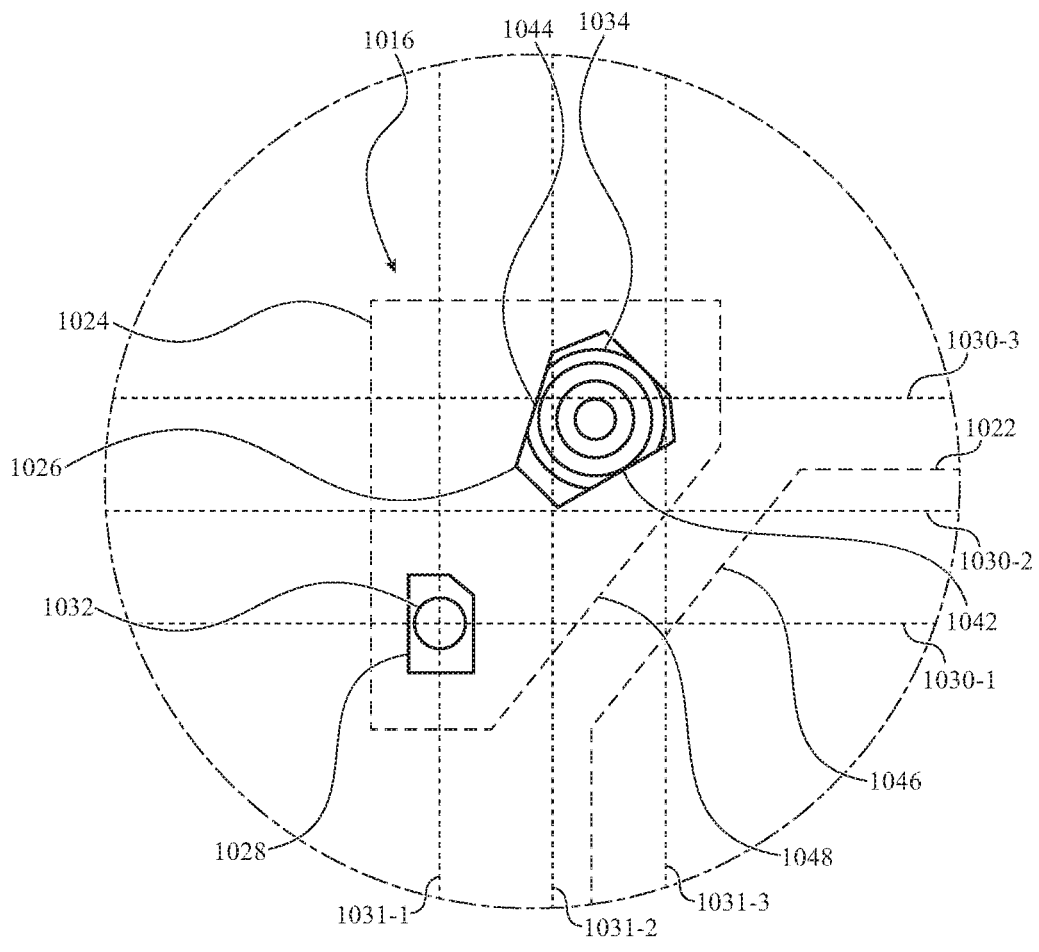
FIG. 10B depicts a proximity sensor of an electronic device.

FIG. 10B depicts area 10B-10B in FIG. 10A, illustrating details of the proximity sensor 1016 and its relationship to the display 1009. The proximity sensor 1016 may include an optical emitter 1032 (e.g., a laser emitter) configured to emit light onto an object, and an optical receiver 1034 configured to receive and/or detect light, from the emitter, that is reflected by the object. The optical emitter 1032 may emit light having a wavelength in a range from about 1300 nanometers (nm) to about 1400 nm. In some cases, the optical emitter 1032 emits light having a wavelength of 1370 nm. The wavelength of the optical emitter 1032 may be selected to reduce or minimize the extent to which emission of light by the optical emitter 1032 interferes with the display 1009. For example, certain wavelengths of light (e.g., between about 900 nm and about 1000 nm) may cause the display 1009 to produce an optical artifact (or otherwise be visible on the front of the device). Accordingly, the selected wavelength (e.g., in a range from about 1300 nm to about 1400 nm) may reduce or eliminate visible artifacts (e.g., flashes, bright spots, distortions, etc.) on the front of the device when the optical emitter 1032 is emitting light.

In some cases, the optical emitter 1032 and the optical receiver 1034 are positioned diagonally relative to a grid or pattern of traces in the display stack. For example, the display stack may include a first set of conductive traces 1030 oriented perpendicular to a second set of conductive traces 1031 (e.g., forming a grid of traces). For simplicity, three of each set of conductive traces are shown (1030-1, 1030-2, 1030-3 and 1031-1, 1031-2, 1031-3), though these are merely a portion of the conductive traces present in the display stack. The conductive traces may be electrodes for a touch sensor, electrodes for a display component, or for other purposes. In the case of a display component, the first or second set of conductive traces 1030, 1031 may be a set of anodes for an OLED display, and the other of the first or second set of conductive traces 1030, 1031 may be a set of cathodes for the OLED display. The conductive traces may be optically transmissive (e.g., transparent) conductive traces and may be formed from or include indium tin oxide (ITO), silver nanowire, conductive polymers, or the like, and may be positioned on a substrate of the display.

In some cases, the optical receiver 1034 may be positioned diagonally from the optical emitter 1032, relative to the grid of traces formed by the first and second traces 1030, 1031. This arrangement may reduce or minimize optical effects of the traces, such as the traces reflecting light emitted from the optical emitter 1032 into the optical receiver 1034. For example, FIG. 10B illustrates a pair of conductive traces 1030-1 and 1031-1 intersecting above the optical emitter 1032. When the optical emitter 1032 emits light, the light may be reflected by and/or propagated along the conductive traces 1030-1, 1031-1. If the optical receiver 1034 were positioned, relative to the optical emitter 1032, along either of the conductive traces 1030-1, 1030-2, the light reflected by and/or propagated along the conductive traces may be detected by the optical receiver 1034, which may negatively impact the signal to noise ratio of the proximity sensor 1016. More particularly, the proximity sensor 1016 may determine the proximity of an object (e.g., a user's face, the inside of a user's pocket, etc.) to the device by emitting light from the optical emitter 1032 and receiving a reflected portion of the light at the optical receiver 1034. If light from the optical emitter 1032 leaks into the optical receiver 1034 (e.g., due to being reflected or otherwise directed to the optical receiver 1034 via the conductive traces), the ability of the optical receiver 1034 to distinguish between the leaked light and light reflected from an external object may be hindered (e.g., the signal-to-noise ratio may be increased). By positioning the optical receiver 1034 along a direction that is oblique to traces 1030, 1031, the amount of traces that pass over both the optical emitter 1032 and the optical receiver 1034 may be reduced. In some cases, there are no traces 1030, 1031 that are positioned over both the optical emitter 1032 and the optical receiver 1034. In some cases, the optical receiver 1034 and the optical emitter 1032 may be positioned along a direction that is between about 40 and 50 degrees relative to the either the traces 1030 or the traces 1031. In some cases, the optical emitter 1032 may be positioned along a direction that is about 45 degrees relative to the either the traces 1030 or the traces 1031. In some cases, the optical emitter 1032 and the optical receiver 1034 are positioned below a portion of the display where no traces are present (e.g., a gap in the grid of traces).

The optical emitter 1032 and the optical receiver 1034 may be positioned below holes 1028, 1026, respectively, defined through a backing layer of the display 1009. The backing layer may be a metal (or other material) sheet or layer that is part of the display stack. The backing layer may be opaque, and as such the holes 1028, 1026 provide optical access for the optical emitter 1032 and the optical receiver 1034. The optical emitter 1032 and the optical receiver 1034 may emit and receive light, respectively, through the portions of the display 1009 that are above the emitter and receiver, and through the holes 1028, 1026.

In some cases, the hole 1026 (for the optical receiver 1034) has a greater size than the hole 1028. The hole 1026 may also be shaped to minimize or attenuate crosstalk between the optical emitter 1032 and the optical receiver 1034. For example, the hole 1026 may be narrower where it is nearest the optical emitter 1032, and wider where it is further away from the optical emitter 1032, thereby presenting a smaller opening near the emitter, where light is more likely to be reflected by the display and/or cover into the receiver. The hole 1026 may have a first side 1042 that extends along an oblique direction (relative to the conductive traces) and a second side 1044 that extends along a different oblique direction (relative to the conductive traces), to define the tapered shape of the hole 1026 (e.g., tapering from a wider end remote from the hole 1028 to a narrower end proximate the hole 1028).

The proximity sensor 1016 may include a housing 1024, and may be positioned in the device proximate a bracket structure 1022. The bracket structure 1022 may be a bracket structure for a rear-facing camera or sensor array. The bracket structure 1022 may define an angled wall section 1046, which may be positioned along a direction that is oblique to traces 1030, 1031. The housing 1024 may define a wall section 1048 that is also oblique to the traces 1030, 1031, and may be parallel to the wall section 1046 (and set apart from the wall section 1046 by a gap). The angled wall sections 1046, 1048 may allow the proximity sensor 1016 to be positioned close to the bracket structure 1022 while still providing sufficient target clearance between the components. Moreover, the angled wall sections 1046, 1048 may allow the proximity sensor 1016 and bracket structure 1022 to be positioned closer to each other than may be possible if either or both components had full corners, which may ultimately reduce the overall width of the device or otherwise allow greater space within the device for other components.

Figure 11A:
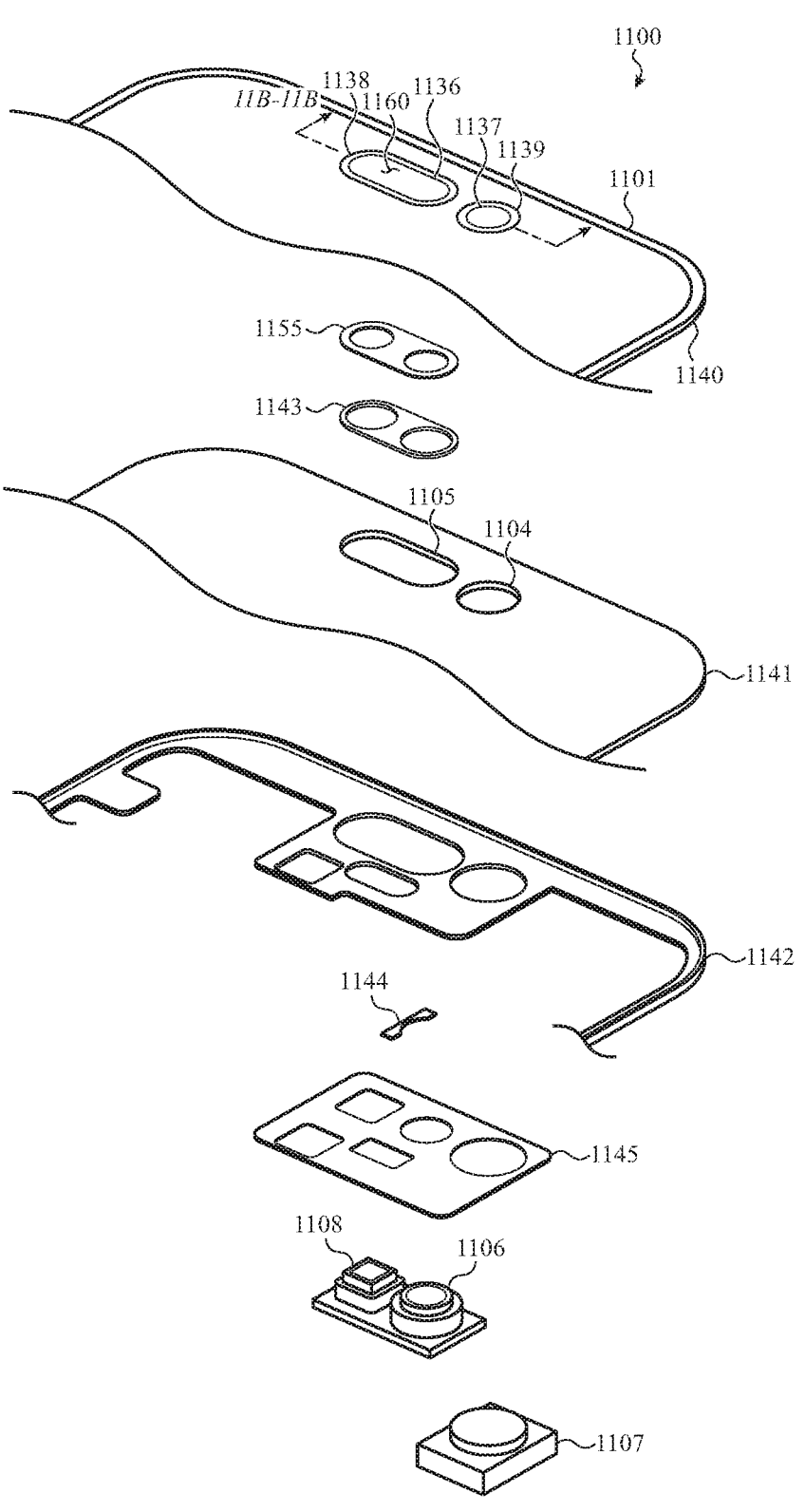
FIG. 11A depicts a partial exploded view of a front-facing sensor region of an example electronic device.

FIG. 11A illustrates a partially exploded view of a device 1100. The device 1100 may correspond to or be an embodiment of the electronic devices 100, 200, or any other device described herein. FIG. 11A illustrates various components of a front-facing sensor region, such as the front-facing sensor region 1002. The device 1100 includes a front cover 1101, which may correspond to or be an embodiment of the front cover 1101, or another front cover described herein. The front cover 1101 may include one or more opaque masks, including masks 1140, 1138, and 1139. The mask 1140 may define and/or extend around an outer periphery of the active display region of a display. The mask 1138 may extend around or define a window region 1136, through which components of a facial recognition system (e.g., the optical emitter 1008 and the optical receiver 1006) may emit and/or receive light. As described above with respect to FIG. 10A, the mask 1138 may define a single opening for both an optical emitter and an optical receiver (as shown in FIG.

11A), or a separate opening for each of the optical emitter and optical receiver. A visually opaque, infrared-transmissive coating 1160 may be applied to the interior surface of the front cover 1101 in the window region 1136, as described herein. The mask 1139 may extend around or define a window region 1137, through which a front-facing camera (e.g., the camera 1007) may receive light.

The masks 1138, 1139, and 1140 may be formed from or include the same material or combinations of materials (optionally including multiple layers of material). In some cases, the masks are formed from or include different materials or combinations of materials. For example, the mask 1138 may be formed from a different material (or combination of materials) than the mask 1140. The masks 1138, 1139, and 1140 may be formed from or include inks, paints, dyes, deposited coatings (e.g., CVD coatings, PVD coatings or the like). In some case, one or more of the masks may be formed from a transparent polymer (optionally defining a surface texture), and an ink, dye, or other opaque coating (e.g., applied to the textured surface). FIG. 12G illustrates an example mask with a light-transmissive (e.g., transparent) polymer and an opaque coating. The masks 1138, 1139, 1140 (and optionally additional masks) may be positioned between the front cover 1101 and any edge region of the display 1141 to mask the edge of the display.

The display 1141 may be coupled to the front cover 1101, such as with an adhesive, and the front cover 1101 may be coupled to the frame 1142 (e.g., corresponding to or an embodiment of the frame 204, FIG. 2). The display 1141 may include holes 1104, 1105 formed therethrough. The holes 1104, 1105 may be aligned with (and provide optical access through the display for) an optical emitter 1108, an optical receiver 1106, and a camera 1107 (which may correspond to or be embodiments of the optical emitter 1008, optical receiver 1006, and camera 1007 in FIG. 10A, or other corresponding components described herein).

The device 1100 may include light inhibiting structures to inhibit light that is emitted from the optical emitter 1108 being reflected through the front cover 1101 towards the optical receiver 1106 (e.g., producing crosstalk or otherwise reducing the signal-to-noise ratio). For example, as described herein, the device 1100 may include an upper light-absorbing structure 1143 that includes a portion positioned between the optical emitter 1108 and the optical receiver 1106 (and optionally defines two holes, one for each of the optical emitter 1108 and the optical receiver 1106). The upper light-absorbing structure 1143 may be formed from or include a foam, a polymer structure, an ink layer, a paint, a coating, or the like. In some cases, the upper light-absorbing structure 1143 may be coupled to the interior surface of the front cover 1101 via an adhesive 1155. In some cases, a lower light-absorbing structure 1144 may be coupled to a bracket 1145 to which the optical emitter 1108 and the optical receiver 1106 are coupled. The light-absorbing structures 1143, 1144, and the adhesive 1155 may be configured to block and/or absorb light, as described herein.

Figure 11B:
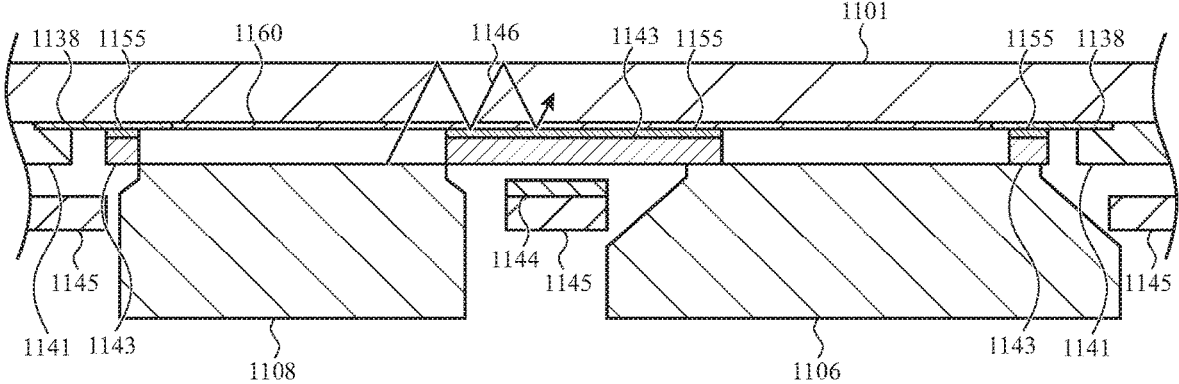
FIGS. 11B-11E depict partial cross-sectional views of example front-facing sensor regions.

FIG. 11B is a partial cross-sectional view of the device 1100 viewed along line 11B-11B in FIG. 11A. As noted above, the optical emitter 1108 may be configured to illuminate an object, such as a user's face, and the optical receiver 1106 may receive a portion of the light that is reflected from the user's face (e.g., in order to biometrically identify the user for authentication or other purposes). The light emitted by the optical emitter 1108 passes through the front cover 1101 over the optical emitter 1108, and the reflected portion of the light passes back through the front cover 1101 over the optical receiver 1106. However, a portion of the light emitted from the optical emitter 1108 may in some cases be reflected or propagated through the cover 1101, as illustrated by light 1146. If the light 1146 is ultimately received by the optical receiver 1106, it may interfere with the operation of the optical receiver 1106, such as by decreasing the signal-to-noise ratio, or otherwise distorting or interfering with the image received by the optical receiver 1106. Accordingly, the light-absorbing features, including the light-absorbing structures 1143, 1144, and the adhesive 1155, may absorb, block, or otherwise interfere with the internal propagation of light 1146 through the cover 1101. For example, the adhesive 1155 may be formed from or include a light-absorbing material, such as a light-absorbing ink, light-absorbing particles, or the like. The adhesive 1155 may be a pressure-sensitive adhesive film, a heat-sensitive adhesive film, a liquid adhesive, or the like. The upper light-absorbing structure 1143 may be formed from or include a light-absorbing material, such as a light-absorbing ink, light-absorbing particles, or the like. In some cases, the upper light-absorbing structure 1143 is compliant (e.g., a foam material) such that the optical emitter 1108 and the optical receiver 1106 deform the structure slightly, thereby sealing the optical emitter 1108 and the optical receiver 1106 against the upper light-absorbing structure 1143. The adhesive 1155 may be adhered to a visually opaque, infrared-transmissive coating 1160 that may be positioned on the front cover 1101 in the window region 1136.

The lower light-absorbing structure 1144 may be positioned below the upper light-absorbing structure 1143, and may be configured to absorb (or otherwise not reflect) other light that may be incident thereon. For example, some light may pass through the upper light-absorbing structure 1143, and the lower light-absorbing structure 1144 may absorb some of that light, thereby reducing the amount of light reflecting within the system that could ultimately be received by the optical receiver 1106. The lower light-absorbing structure 1144 may be formed from or include a light-absorbing ink, light-absorbing paint, light absorbing particles, a light-absorbing film or coating, or the like.

The visually opaque, infrared-transmissive coating 1160, the adhesive 1155, and the upper light-absorbing structure 1143 (and/or other light-absorbing materials or layers in the stack) may have indices of refraction that are substantially similar to the index of refraction of the front cover 1101. By selecting materials that have similar indices of refraction, light being reflected within the material of the cover 1101 (e.g., the light 1146) may be more likely to be transmitted through the interface between the materials, rather than be reflected internally. By allowing the light to pass out of the cover 1101 (and into the adhesive 1155 and upper light-absorbing structure 1143), the amount of light that is ultimately propagated towards and into the optical receiver 1106 may be reduced. In some cases, the indices of refraction of the visually opaque, infrared-transmissive coating 1160, the adhesive 1155, and the upper light-absorbing structure 1143 may have indices of refraction that differ from the index of refraction of the front cover 1101 by less than about 10%, less than about 7%, less than about 5%, less than about 2%, or less than about 1%. In some cases, the adhesive 1155 and the upper light-absorbing structure 1143 may include light-absorbing media in a matrix. In such cases, the matrix may have an index of refraction that is substantially similar to that of the cover 1101 (or an adjacent layer in the stack), and the light-absorbing media may have an index of refraction that differs by a greater amount.

Figure 11C:
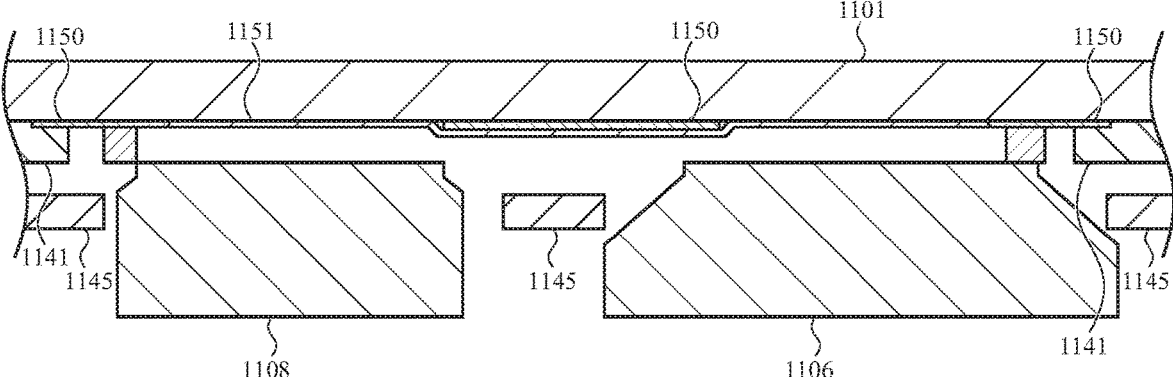

FIG. 11C illustrates another example arrangement of light-absorbing materials and/or structures within the device 1100. In the example shown in FIG. 11C, a light-absorbing layer 1150 may be positioned on the interior surface of the cover 1101, and a visually opaque, infrared-transmissive coating 1151 may be positioned over the light-absorbing layer 1150 (e.g., such that the coating 1151 covers the window region 1136). The light-absorbing layer 1150 may be between the cover 1101 and the coating 1151. In some examples, the coating 1151 may not cover the light-absorbing layer 1150, or only partially covers the light-absorbing layer 1150. The light-absorbing layer 1150 may be an ink, dye, paint, deposited coating (e.g., CVD or PVD coating), or combinations thereof. The light-absorbing layer 1150 may also include light-absorbing media in a matrix material. The light-absorbing layer 1150 may have an index of refraction that is substantially similar to that of the cover 1101, as described above with respect to other light-absorbing materials.

Figure 11D:
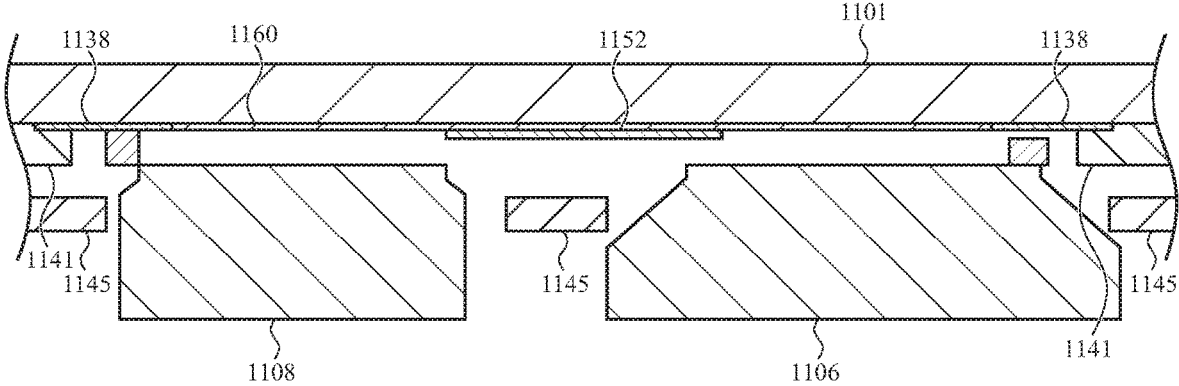

FIG. 11D illustrates another example arrangement of light-absorbing materials and/or structures within the device 1100. In the example shown in FIG. 11D, a light-absorbing layer 1152 may be positioned on the cover 1101 below the visually opaque, infrared-transmissive coating 1160. The light-absorbing layer 1152 may be an ink, dye, paint, deposited coating (e.g., CVD or PVD coating), light-absorbing adhesive, light-absorbing foam, or combinations thereof. The light-absorbing layer 1152 may also include light-absorbing media in a matrix material. The light-absorbing layer 1152 may have an index of refraction that is substantially similar to that of the cover 1101 and the visually opaque, infrared-transmissive coating 1151, as described above with respect to other light-absorbing materials.

Figure 11E:
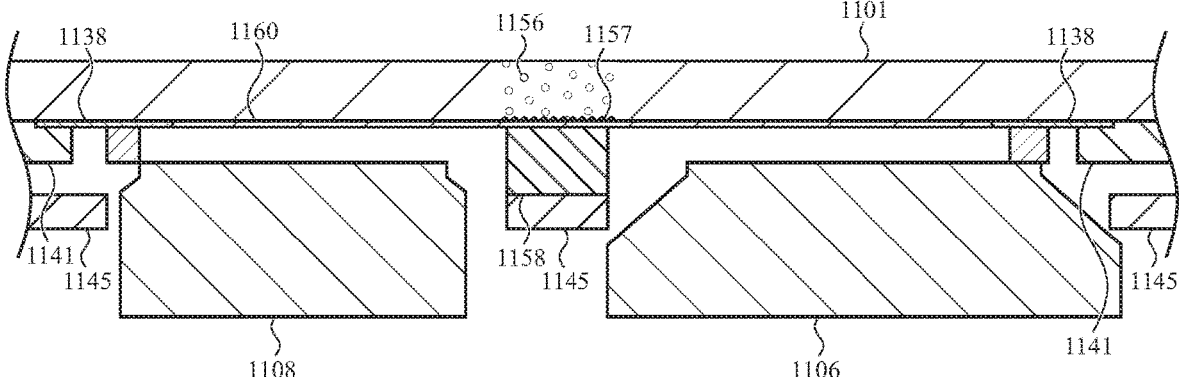

FIG. 11E illustrates additional techniques for absorbing the internal propagation of light through the cover 1101 from the optical emitter 1108 to the optical receiver 1106. For example, the cover 1101 may include internal light-absorbing features 1156 (referred to herein as internal features 1156). In some cases, the internal features 1156 may be marks formed within the material of the cover 1101 via laser marking. The marks may be darkened portions of the material in the cover 1101 or voids formed in the cover 1101. The marks may be formed in a three-dimensional pattern that is configured to reduce light transmission and/or internal reflection in the horizontal direction (e.g., as oriented in FIG. 11E), while minimizing or generally having little effect on the visual appearance of the markings as viewed from the front of the device. The marks may be formed in a predetermined three-dimensional pattern, or they may be formed in a random or pseudorandom pattern. In some examples, the marks may be formed in a substantially planar array that extends vertically (as oriented in FIG. 11E) from the interior surface of the cover 1101 to the exterior surface of the cover 1101. The internal features 1156 may be other types of features and may be formed in different ways. For example, the internal features 1156 may be ions that are introduced into the cover 1101 via a chemical bath. As another example, the internal features 1156 may be localized pigments within the cover 1101. The internal features 1156 may block, absorb, reflect, or otherwise interfere with light that is propagating internally through the cover 1101 towards the optical receiver 1106.

In some cases, the cover 1101 may include a textured region 1157. The textured region 1157 may cause light that would otherwise be reflected from the interior surface of the cover 1101 to be absorbed, reflected along a different direction (e.g., away from the optical receiver 1106), directed out of the cover 1101 (e.g., towards the inside of the device and optionally towards a light absorbing material, such as a light absorbing foam 1158), or otherwise interfered with. The texture of the textured region 1157 may be formed via laser treatment, chemical etching, blasting, machining (e.g., grinding, lapping), or any other suitable technique.

The light-absorbing components, materials, features, structures, and other techniques described with respect to FIGS. 11A-11E may be used alone or in combination with others. For example, internal light-absorbing features may also be included in the cover 1101 in the example shown in FIG. 11B. As another example, the light-absorbing adhesive 1155 and light-absorbing structure 1143 shown in FIG. 11B may be included in the example shown in FIG. 11C, in which a light-absorbing layer 1150 is positioned between the cover 1101 and the infrared-transmissive coating 1151. Other combinations of the described components, materials, features, structures, and other techniques are also contemplated.

As described herein, light-absorbing materials or structures may be configured to absorb light by their presence in the device. The light-absorbing materials and/or structures described herein may have an absorbance (e.g., the logarithm of the ratio of incident to transmitted radiant power through the material or structure) greater than about 0.5, greater than about 0.75, greater than about 1.0, greater than about 1.5, or another suitable absorbance value.

Figures 12A, 12B:
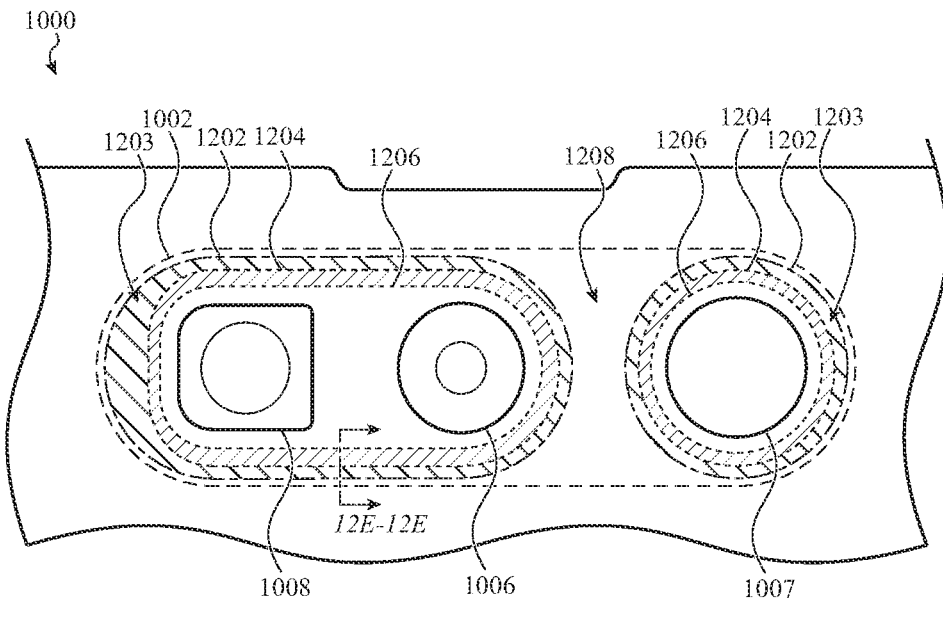
FIGS. 12A-12D depict example front-facing sensor regions for an electronic device.

FIG. 12A illustrates an example configuration of the layers of a display stack in the area of the front-facing sensor region 1002. As shown in FIG. 12A, the dotted line defining the perimeter of the front-facing sensor region 1002 may correspond to a perimeter of a mask (e.g., an ink, dye, coating, or the like) positioned on the cover (e.g., along a bottom or interior surface). For example, the dotted line defining the perimeter of the front-facing sensor region 1002 may correspond to the outer perimeter of the mask 1138 in FIG. 11A (which may be positioned along an interior surface of the cover and between the cover and the display). The mask may extend to the boundaries 1206. In some cases, the mask may extend to the lines defining the optical emitter 1008, the optical receiver 1006, and the front-facing camera 1007, or to another location within the front-facing sensor region 1002.

The boundaries 1202 may define the boundaries of the areas of the display that include active display pixels (e.g., pixels that the device uses to produce graphical outputs). As described above, in some cases, the device 1000 may include a supplemental display region 1208 between components of the front-facing sensor region 1002 (e.g., between a front-facing camera 1007 and a facial recognition system). The supplemental display region 1208 may include active pixels that may be used to display graphical outputs, such as icons, shapes, indicator lights, or the like. The supplemental display region 1208 may also be touch- and/or force-sensitive. For example, the supplemental display region 1208 may include all of the layers of the display stack, including any touch- and/or force-sensitive layers and graphically active layers. The supplemental display region 1208 may act as a functionally and/or physically distinct input and output region. For example, the display may generally define a region outside (e.g., surrounding) the front-facing sensor region 1002 that includes a first touch-sensitive region and a first display region. Inside the front-facing sensor region 1002, the display may generally define a second touch-sensitive region (e.g., using display pixels at or near the border of the front-facing sensor region 1002 and/or in a supplemental display region) and a second display region (e.g., the supplemental display region 1208).

The boundaries 1204 may define the boundaries of the active touch-sensitive areas of the display stack. Stated another way, the area between 1202 and 1204 may correspond to one or more touch-sensing components, such as layers of the display stack, that can sense touch inputs (e.g., one or more electrode layers that define touch pixels, or other touch-sensitive components). Thus, as shown in FIG. 12A, the active touch-sensitive area of the display stack extends further into the front-facing sensor region 1002 than the active display pixels, and defines an extended touch-sensitive area 1203 in the front-facing sensor region 1002. The extended touch-sensitive area 1203 may be positioned below a mask (e.g., ink, dye, coating, etc., such as the mask 1138 in FIG. 11A) that is positioned on the cover to at least partially define the front-facing sensor region 1002. By extending the active touch-sensitive area 1203 beyond the active display pixels and into the front-facing sensor region 1002, the front-facing sensor region 1002 may exhibit improved touch sensing responsiveness. For example, the extra area of touch sensitivity within the front-facing sensor region 1002 reduces the area in the front-facing sensor region 1002 that lacks touch-sensing components (e.g., electrodes or touch pixels). In some cases, the area of the front-facing sensor region 1002 that lacks touch-sensing components is less than about 0.25 square inches. In some cases, as described herein, the front-facing sensor region 1002 can sense touch inputs applied thereto, even when the touch inputs are applied to or encompass areas of the front-facing sensor region 1002 that lack touch-sensing components. FIGS. 13A-13F further illustrate the touch sensitivity of the front-facing sensor region 1002.

In some cases, the touch pixels and/or electrode patterns that are proximate the boundaries 1204 (e.g., closest to the holes formed through the display stack) may be different from the touch pixels and/or electrode patterns elsewhere in the display (e.g., in the main display region). For example, the touch pixels and/or electrode patterns that are proximate the boundaries 1204 (e.g., surrounding the touch-inactive region of the front-facing sensor region 1002) may have a different size, shape, arrangement, pattern, distribution, or other property, than the touch pixels and/or electrode patterns in the main display region.

The boundaries 1206 may define the boundaries of inactive areas of the display stack (e.g., areas that do not produce graphical outputs and that are not touch- and/or force-sensitive). Stated another way, the area between 1204 and 1206 may correspond to one or more layers of the display stack that are inactive and do not produce graphical outputs or sense touch inputs. For example, the display stack may include layers and/or materials that do not sense touches or produce graphics, such as light diffusers, polarizers, adhesives, and the like. Such layers may extend beyond the active display and active touch-sensitive areas of the display. In some cases, the boundaries 1206 correspond to (e.g., define) the holes formed through the display stack to provide unobstructed optical access by components of the front-facing sensor region 1002 to the cover. Stated another way, the line 1206 may correspond to an edge of the display stack.

As described herein, touch-sensing functionality may be provided in the front-facing sensor region 1002 despite areas of the front-facing sensor region 1002 lacking touch-sensing components. For example, as described above, the holes formed through the display stack to accommodate optical components (e.g., optical emitters, receivers, cameras) lack touch-sensing layers. Nevertheless, a device may detect touch inputs applied to the front-facing sensor region 1002 even when the touch is centered over a portion of the front-facing sensor region 1002 that lacks touch-sensing components (e.g., over the holes for the optical components). For example, the touch-sensing layers of the display may include touch pixels (e.g., formed from or including touch-sensing electrodes) that detect or facilitate detection of a touch input, such as via capacitive coupling between a finger and the pixels. When a user touches the front-facing sensor region 1002 in an area that lacks touch pixels, such as directly over the optical emitter 1008, optical receiver 1006, or camera 1007, the touch pixels of the display that are positioned around the periphery of the front-facing sensor region 1002 may capacitively couple to the user's finger. The electrical response of the peripheral touch pixels to a touch input in the front-facing sensor region 1002 may be different than an electrical response of the touch pixels in a main display region when subjected to a conventional touch input. For example, the peripheral touch pixels may detect less capacitive coupling, and/or a smaller area of capacitive coupling, than may be detected for conventional touch inputs in a main display region.

In order to facilitate detection of touch inputs to the front-facing sensor region 1002, sample inputs may be provided to a sample front-facing sensor region 1002 to determine the electrical response that is detected in response to the sample inputs. For example, a series of taps, touches, gestures (e.g., swipes), etc., in different areas of the front-facing sensor region 1002 may be provided, and the electrical response of the peripheral touch pixels recorded for each touch. The device may then be configured to recognize that a particular electrical response (e.g., a certain capacitive change detected by a certain set of touch pixels) corresponds to a particular input. In some cases, the sample inputs may be used to train a machine learning model that is then used by the device to detect inputs. For example, signals or other information or electrical characteristics from the touch pixels may be provided to a machine learning model (which is trained using the sample inputs), which determines whether the signals or other information/characteristics are indicative of a touch input.

In some cases, a device may employ different touch-sensing schemes in different regions of the display. For example, in the main display region (e.g., everywhere other than the front-facing sensor region 1002), the device may employ a first touch-sensing scheme, and proximate the front-facing sensor region 1002, the device may employ a second touch-sensing scheme. The first touch-sensing scheme may be a conventional touch-sensing scheme, such as where the centroid of touch inputs are determined based on electrical characteristics detected at a set of touch pixels. The second touch-sensing scheme may employ a machine learning model, where signals or other information or electrical characteristics from the touch pixels proximate the front-facing sensor region 1002 may be provided to a machine learning model, which determines whether the signals or other information/characteristics are indicative of a touch input.

FIG. 12B illustrates another example configuration of the layers of a display stack in the area of a front-facing sensor region 1211 of a device 1210. The device 1210 may correspond to or be an embodiment of the device 1000. As shown in FIG. 12B, the dotted line defining the perimeter of the front-facing sensor region 1211 may correspond to a perimeter of a mask (e.g., an ink, dye, coating, or the like) positioned on the cover (e.g., along a bottom or interior surface). For example, the dotted line defining the perimeter of the front-facing sensor region 1211 may correspond to the mask 1138 in FIG. 11A (which may be positioned along an interior surface of the cover and between the cover and the display). Also, the boundaries 1212 may define the boundaries of the areas of the display that include active display pixels (e.g., pixels that the device uses to produce graphical outputs). In this example, the boundaries 1212 may be the same as those depicted in FIG. 12A.

The boundaries 1214 may define the boundaries of the active touch-sensitive area of the display stack. Thus, as shown in FIG. 12B, the active touch-sensitive area of the display stack extends between the optical emitter 1008 and the optical receiver 1006, thereby increasing the area inside the front-facing sensor region 1211 that is touch sensitive (as compared to FIG. 12A, for example). Stated another way, the front-facing sensor region 1211 has individual holes through the display stack for each optical component of the front-facing sensor region 1211, thereby increasing the area of the front-facing sensor region 1211 that is touch sensitive. This configuration also reduces the proportion of the area within the front-facing sensor region 1211 that lacks touch-sensing components (e.g., electrodes), which may improve the overall touch sensitivity or touch responsiveness of the front-facing sensor region 1211. The portion of the touch-sensitive area of the display stack extending between optical emitter 1008 and the optical receiver 1006 may define a supplemental touch-sensitive area 1213.

Similar to FIG. 12A, the boundaries 1216 may define the boundaries of inactive areas of the display stack (e.g., areas that do not produce graphical outputs and that are not touch- and/or force-sensitive). Thus, as described above, the boundaries 1216 may correspond to the holes formed through the display stack to provide unobstructed optical access by components of the front-facing sensor region 1211 to the cover.

Figure 12C:
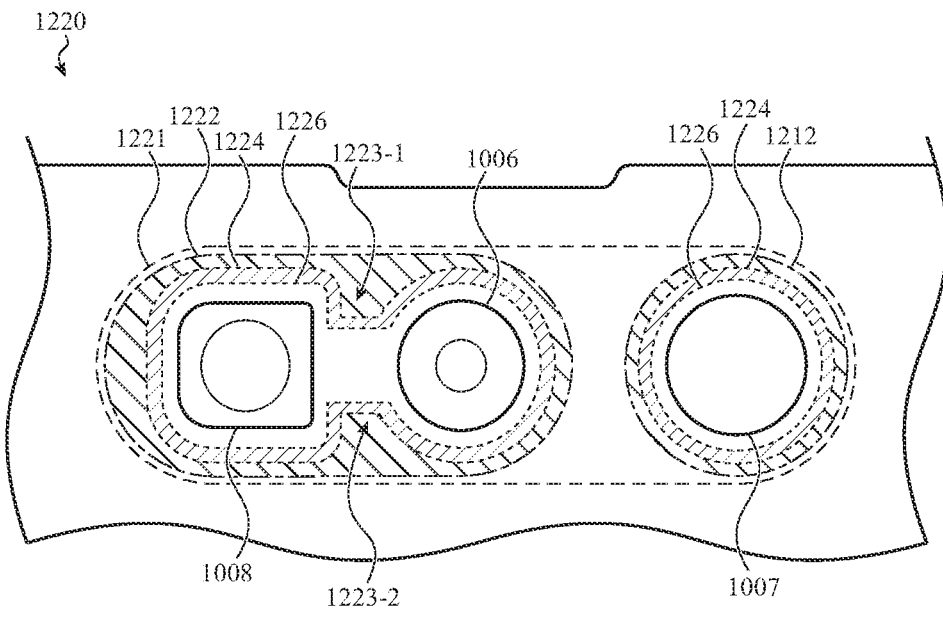

FIG. 12C illustrates another example configuration of the layers of a display stack in the area of a front-facing sensor region 1221 of a device 1220. The device 1220 may correspond to or be an embodiment of the device 1000. As shown in FIG. 12C, the dotted line defining the perimeter of the front-facing sensor region 1221 may correspond to a perimeter of a mask (e.g., an ink, dye, coating, or the like) positioned on the cover (e.g., along a bottom or interior surface). For example, the dotted line defining the perimeter of the front-facing sensor region 1221 may correspond to the mask 1138 in FIG. 11A (which may be positioned along an interior surface of the cover and between the cover and the display). Also, the boundaries 1222 may define the boundaries of the areas of the display that include active display pixels (e.g., pixels that the device uses to produce graphical outputs). In this example, the boundaries 1222 may be the same as those depicted in FIG. 12A.

The boundaries 1224 may define the boundaries of the active touch-sensitive area of the display stack. Thus, as shown in FIG. 12C, the active touch-sensitive area of the display stack defines extension regions 1223-1 and 1223-2 that extend into the region between the optical emitter 1008 and the optical receiver 1006, but do not extend fully across the region between the optical emitter 1008 and the optical receiver 1006. Accordingly, the extension regions 1223-1 and 1223-2 increase the area inside the front-facing sensor region 1221 that is touch sensitive (as compared to FIG. 12A, for example), while still defining a single opening for the optical emitter 1008 and the optical receiver 1006. Stated another way, the front-facing sensor region 1221 has a single hole through the display stack for the optical emitter and receiver, and a single hole for the front-facing camera 1007.

This configuration also reduces the proportion of the area within the front-facing sensor region 1221 that lacks touch-sensing components (e.g., electrodes), which may improve the overall touch sensitivity or touch responsiveness of the front-facing sensor region 1221. The extension regions 1223-1 and 1223-2 may define supplemental touch-sensitive areas within the front-facing sensor region 1221.

Similar to FIG. 12A, the boundaries 1226 may define the boundaries of inactive areas of the display stack (e.g., areas that do not produce graphical outputs and that are not touch- and/or force-sensitive). Thus, as described above, the boundaries 1226 may correspond to the holes formed through the display stack to provide unobstructed optical access by components of the front-facing sensor region 1221 to the cover.

Figure 12D:
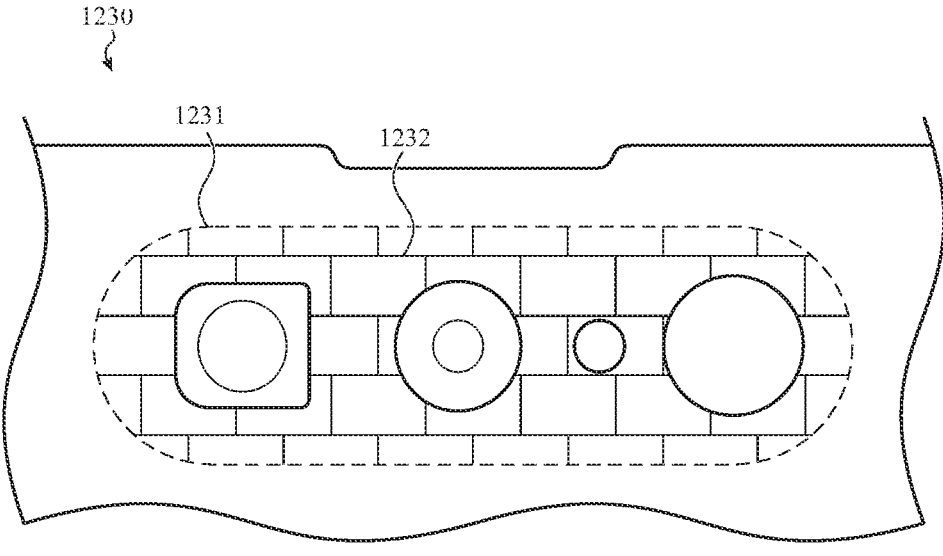

FIG. 12D illustrates another example configuration of a front-facing sensor region 1231 of a device 1230. The device 1230 may correspond to or be an embodiment of the device 1000. As shown, the front-facing sensor region 1231 may include a pattern of conductive elements 1232. The conductive elements 1232 may be, for example, conductive material traces applied to the front cover of the device 1230 (e.g., the interior surface of the front cover). As another example, the conductive elements 1232 may be positioned on a mask or coating layer that is positioned along the interior surface of the front cover. In other examples, the conductive elements 1232 may be positioned on or otherwise incorporated with any suitable layer, stackup, or coating, of a front-facing sensor region. The conductive elements 1232 may be formed from a conductive material, such as metal traces (e.g., CVD or PVD metal traces), carbon fiber filaments, indium tin oxide traces, wires, silver nanowire traces, or any other suitable material.

The conductive elements 1232 may provide a conductive or capacitive coupling between a touch input applied to the front-facing sensor region 1231 and touch pixels on a touch-sensing layer (or layers) of a display stack. More particularly, in the example of FIG. 12D, the touch-sensitive layers may terminate at or near the boundary illustrated by the dotted line 1231, and the conductive elements 1232 extend to (and optionally overlap or are coupled to) the touch-sensitive layers. When a user applies a finger on the front-facing sensor region 1231, a capacitive coupling (or conductive coupling) between the user's finger and the conductive elements 1232 may ultimately change a capacitive or conductive coupling between the conductive elements 1232 and the touch pixels (or touch sensing electrodes) of the touch-sensitive layers that are proximate and/or surround the edge of the front-facing sensor region 1231 (e.g., proximate the dotted line boundary in FIG. 12D). The touch-sensing system of the device may detect the changes caused by user contact with the front-facing sensor region 1231 (and the consequent capacitive coupling to the conductive elements 1232) and determine whether (and where) a touch input has been applied.

While FIGS. 12A-12D show various components, borders, boundaries, layers, and the like, it will be understood that these are not necessarily visible or visually discernable (with an unaided eye) from the front of the devices. Rather, as described herein, masks, coatings, and/or other layers, components, materials, treatments, etc., may be provided along the interior surface of the cover. For example, in some cases, the devices include a mask (e.g., the mask 1138, FIG. 11A) and, optionally, a visually opaque, infrared-transmissive coating, that define the visual appearance of the front-facing sensor region. In some cases, a mask defines one or more holes for the optical components of the front-facing sensor region (e.g., ring-like masks defining a central opening). In some cases, such as over the optical emitter and/or receiver of a facial recognition system) an infrared-transmissive coating is positioned in the opening of the mask and defines the visual appearance of that portion of the front-facing sensor region. Each ring-like mask in a front-facing sensor region may accommodate one or more optical components. For example, as shown in FIG. 11A, the mask 1138 may define an opening for both an optical emitter and an optical receiver, and the mask 1139 may define an opening for a front-facing camera. In other examples, separate openings in one or more masks are defined for the optical emitter and the optical receiver.

Figure 12E:
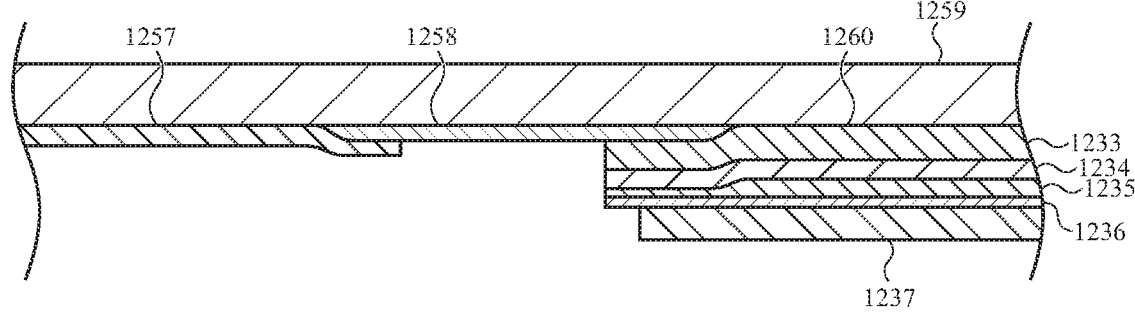
FIGS. 12E-12H depict partial cross-sectional views of example front-facing sensor regions.

FIG. 12E is a partial cross-sectional view of a portion of a front-facing sensor region. The view shown in FIG. 12E may generally correspond to a section viewed along line 12E-12E in FIG. 12A. FIG. 12E illustrates a portion of a visually opaque, infrared-transmissive coating 1257 (also referred to simply as a coating 1257) that may be positioned over an optical component of the front-facing sensor region (e.g., an optical emitter and/or optical receiver). The coating 1257 may partially overlap a mask structure 1258 that defines an opening for the optical component. The visually opaque, infrared-transmissive coating 1257 and the mask structure 1258 may correspond to or be embodiments of other visually opaque, infrared-transmissive coatings and masks described herein (e.g., the coating 1160 and the mask 1138, FIG. 11B). The coating 1257 and the mask structure 1258 are positioned on an interior surface of a front cover 1259.

A display stack 1260 may partially overlap the mask structure 1258, as described herein. In particular, the mask structure 1258 may occlude or block the visibility of the edge of the display stack 1260 where a hole is formed through the display stack 1260 to accommodate a front-facing optical component. The display stack may include a first adhesive layer 1233 (e.g., an optically clear adhesive), a polarizer layer 1234, a second adhesive layer 1235 (e.g., an optically clear adhesive), a display layer 1236 (e.g., a layer that includes light-emitting components, light emitting diodes, organic light emitting diodes, and/or components thereof), and a support layer 1237. Where the display stack 1260 overlaps the mask structure 1258, the display stack 1260, or portions thereof, may be deflected and/or deformed, as shown by the jogs in the adhesive layers 1233, 1235 and the polarizer layer 1234. More particularly, the additional height or thickness of the mask structure 1258 may cause the display (or portions thereof) to be deflected and/or deformed away from the interior surface of the front cover 1259. These deflections and/or deformations may produce visual artifacts that are visually apparent on the front of the device (e.g., distortions, waviness, color variations, etc.). Accordingly, a display stack may be configured as shown in FIG. 12F to help eliminate or reduce the extent of the deflections and/or deformations in the display stack.

Figure 12F:
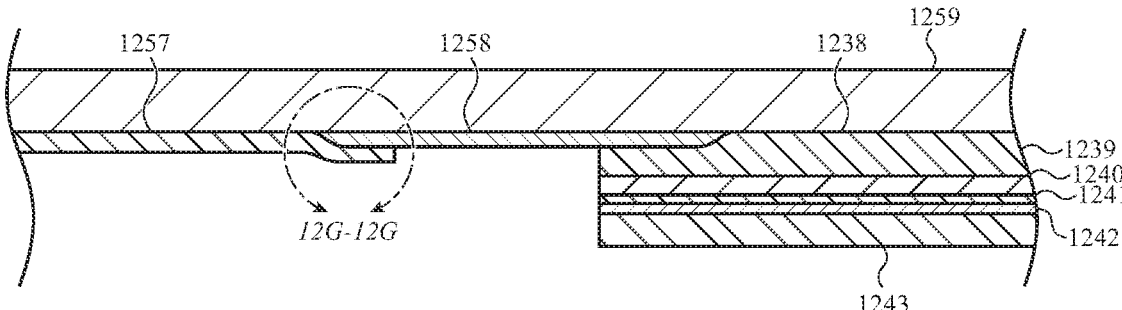
Figure 12G:
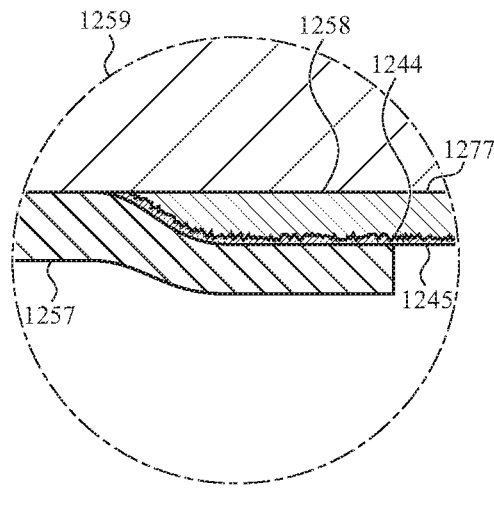

As shown in FIG. 12F, a display stack 1238 includes a first adhesive layer 1239 (e.g., an optically clear adhesive), a polarizer layer 1240, a second adhesive layer 1241 (e.g., an optically clear adhesive), a display layer 1242 (e.g., a layer that includes light-emitting components, light emitting diodes, organic light emitting diodes, and/or components thereof), and a support layer 1243. As shown in FIG. 12F, the first adhesive layer 1239 may be formed from a liquid or flowable adhesive, such that the adhesive itself may flow to accommodate the mask structure 1258 (e.g., defining a recess that corresponds to the elevated surface defined by the mask structure 1258), without imparting a corresponding downward force or deflection on the lower layers of the display stack 1238. In particular, an adhesive film that does not flow or compress significantly may, when placed on the mask structure 1258 as shown, deflect downward, causing a corresponding downward deflection of display layers that are lower in the stack. By using a liquid or other flowable adhesive, the process of applying the display stack to the front cover 1259 can cause the adhesive layer 1239 to conform to the shape of the mask structure 1258 without deflecting the lower display layers. The adhesive layer 1239 may thereafter be cured (e.g., via an ultraviolet curing process) or otherwise allowed to harden, and thereby bond the display stack to the cover 1259.

In some cases, the support layer 1243 may extend to the edge of the display stack (as shown in FIG. 12F), or optionally beyond the edge of the display stack. The support layer 1243 may prevent or inhibit deformation or deflection of the display stack due to the display stack overlapping the mask structure 1258. Accordingly, the support layer 1243 extending to or beyond the edge of the display stack may help reduce deformation or deflection of the display stack at its edge. Additionally, the added rigidity of the support layer 1243 may help ensure that the adhesive layer 1239 deforms and/or flows to conform to the mask structure 1258 (e.g., rather than the adhesive layer 1239 forcing the display layers below it to deform or deflect due to the mask thickness).

FIG. 12G is a detail view of the area 12G-12G in FIG. 12F, showing where the visually opaque, infrared-transmissive layer 1257 overlaps the mask structure 1258 and illustrating example features of the mask structure 1258. For example, the mask structure 1258 may include a base material 1277, which may be a polymer coating layer such as a UV curable acrylic, an adhesive, or the like. The base material 1277 may define a textured surface 1244 along a bottom of the base material 1277 (e.g., opposite the surface that contacts the cover 1259). The textured surface 1244 may be formed using an imprinting operation, in which a texture template or mold is applied to the base material 1277 to define the texture. For example, an acrylic or other flowable polymer material may be applied to the cover 1259, and a mold or other imprinting component may be applied to the interior surface of the material to define the texture of the textured surface 1244, and may subsequently be cured or otherwise allowed to harden. In other examples, the textured surface 1244 is formed (either on an uncured/flowable material or a cured/hardened material) using laser etching, chemical etching, blasting (e.g., sand blasting), abrasion, photolithography, or another suitable texture forming operation. The texture of the textured surface 1244 may have a random or pseudorandom pattern, or they may have a regular or periodic pattern. The parameters and/or properties of the texture may be configured to produce a certain visual appearance when the mask structure 1258 is viewed through the cover 1259. For example, the mask structure 1258 may be configured to have a visual appearance that is the same as or substantially similar to the visual appearance of the display when the display is inactive. Example properties and/or parameters of the texture that are tuned or selected to produce the target visual appearance include texture feature depth, height, surface roughness value (e.g., Ra, Rq), texture feature pitch, texture feature angle, texture feature shape, texture pattern, and the like.

A mask coating 1245 may be applied to the textured surface 1244 of the base material 1277. The mask coating 1245 may be opaque (e.g., an opaque mask) or otherwise configured to block the visibility of internal components.

The mask coating 1245 may be a deposited coating (e.g., a PVD coating, CVD coating, or the like), ink, paint, dye, or another suitable material. The thickness of the mask structure 1258 (e.g., the base material 1277 and the mask coating 1245) may have a thickness between about 5 microns and about 15 microns (e.g., at its thickest location and/or as an average thickness). The mask coating 1245 may conform to the textured surface 1244, such that the mask coating 1245 defines a complementary texture and/or shape of the textured surface 1244.

Figure 12H:
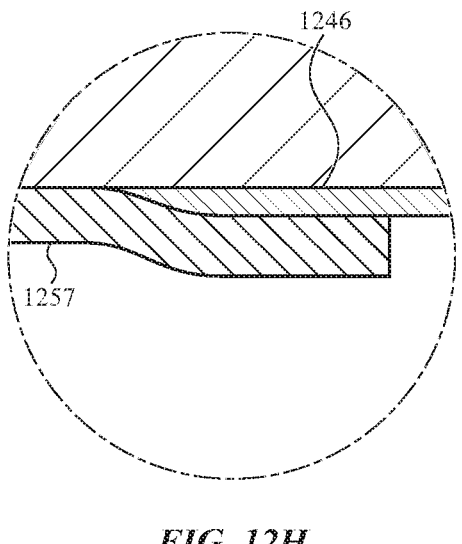

FIG. 12H is a detail view of the region where the visually opaque, infrared-transmissive layer 1257 overlaps a mask, illustrating another example mask 1246 that may be employed. In this example, the mask may be formed from one or more layers of masking material (e.g., ink, dye, paint, a deposited coating, etc.). The mask 1246 may have a thickness that is less than about 10 microns, less than about 7 microns, less than about 5 microns, or another suitable thickness. The thin mask 1246 may provide opaque or visibility-blocking masking while reducing the extent to which overlapping materials and components (e.g., the coating 1257, a display stack) are deformed or deflected where they overlap the mask 1246.

Figure 12I:
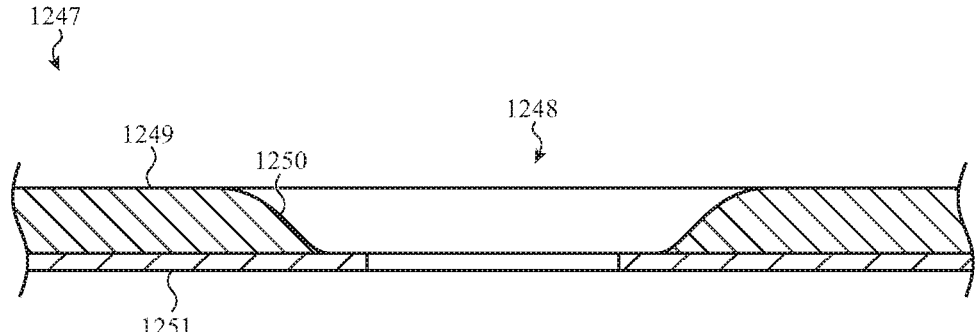
FIGS. 12I-12J depict partial cross-sectional views of example display layers.

FIG. 12I illustrates a partial cross-sectional view of a display layer 1247 that may be used in a display stack. The display layer 1247 may correspond to or be embodiments of display layers 1236 (FIG. 12E), 1242 (FIG. 12F), or other display layers described herein. The display layer 1247 includes a display panel 1251, which may be or may include a substrate and associated display components. For example, in the case of an OLED display, the display panel 1251 may include anode layers, cathode layers, conductive layers, emissive layers, etc. An encapsulation layer 1249 may be positioned over the display panel 1251. The encapsulation layer 1249 may encapsulate or otherwise cover at least one side of the display panel 1251, and may protect the display panel 1251. The encapsulation layer 1249 may be formed from a polymer material, and may be applied to the display panel 1251 using an ink jet printing technique, or another suitable deposition process.

FIG. 12I illustrates a portion of the display layer 1247 where a hole 1248 may be formed, such as to accommodate an optical component of a front-facing sensor region (e.g., a front-facing camera, an optical emitter and/or receiver of a facial recognition system, or the like). Where the hole 1248 is formed through the display panel 1251, the encapsulation layer 1249 may define an angled or tapered surface 1250, where the material of the encapsulation layer 1249 ends. In some cases, this tapered surface 1250 may contribute to irregularities in the layers of a display stack above the display layer 1247. For example, a polarizer layer (e.g., the polarizers 1234, 1240, FIGS. 12E, 12F) that is positioned above the display layer 1247 may deform or deflect downwards where it overlaps the tapered surface 1250. This deflection or deformation of the polarizer layer may produce an irregular or distorted visual appearance of the display in the area near the hole.

Figure 12J:
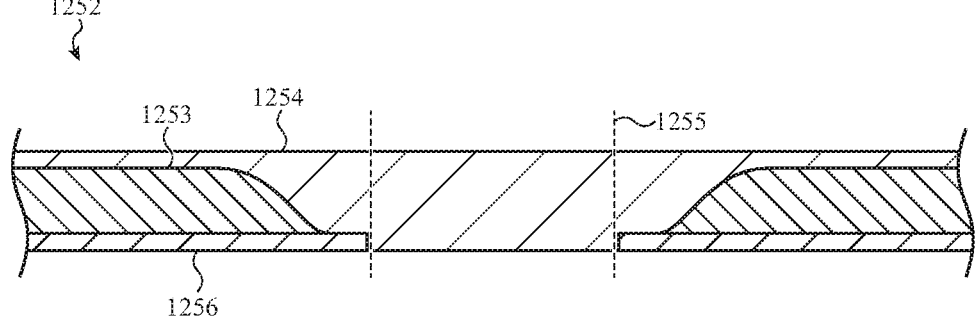

FIG. 12J illustrates a partial cross-sectional view of another example display layer 1252 that may be used in a display stack. The display layer 1252 may correspond to or be embodiments of display layers 1236 (FIG. 12E), 1242 (FIG. 12F), or other display layers described herein. The display layer 1252 includes a display panel 1256, which may be or may include a substrate and associated display components. For example, in the case of an OLED display, the display panel 1256 may include anode layers, cathode layers, conductive layers, emissive layers, etc. A first encapsulation layer 1253 may be positioned over the display panel 1256. The first encapsulation layer 1253 may encapsulate or otherwise cover at least one side of the display panel 1256, and may protect the display panel 1256. The first encapsulation layer 1253 may be formed from a polymer material, and may be applied to the display panel 1256 using an ink jet printing technique, or another suitable deposition process.

The display layer 1252 also includes a second encapsulation layer 1254. The second encapsulation layer 1254 may be formed of the same material or a different material than the first encapsulation layer 1253 (and may be formed using the same or a different process). The second encapsulation layer 1254 may be formed after the first encapsulation layer 1253 is formed. For example, the first encapsulation layer 1253 may be applied to the display panel 1256 (including defining an angled or tapered surface proximate the hole in the display panel 1256), and the second encapsulation layer 1253 may be applied over the top of the first encapsulation layer 1253, and may fill in the hole, as shown in FIG. 12I. After the second encapsulation layer 1253 is formed, a hole 1255 may be formed through the second encapsulation layer, aligned with the hole in the display panel 1256, to form the hole 1255 through the display layer 1252 that accommodates an optical component of a front-facing sensor array.

The second encapsulation layer 1254 may define a substantially planar surface along the top of the display layer 1252, even over the angled or tapered surface defined by the first encapsulation layer 1253 and over the hole formed through the display panel 1256. The planar top surface of the display layer 1252 may reduce or eliminate deformation and/or deflection of overlying layers in a display stack, especially around the hole 1255. In particular, a layer positioned on top of the display layer 1252 (e.g., an adhesive layer, polarizer layer, etc.) will be resting on a uniformly flat surface, instead of a surface that includes a sloping, tapered, or angled surface proximate the hole in the display. Accordingly, the overlying layers may deform or deflect less (or not at all) in the area around the holes through the display. In some cases, the second encapsulation layer 1254 may be referred to as a planarization layer, as it can define a substantially planar upper surface of the display layer 1252 (while conforming to non-planar regions or portions of the first encapsulation layer 1253), and may improve the planarity of the surface as compared to the first encapsulation layer 1253 alone.

FIGS. 13A-13F illustrate example touch-sensing operations of the front-facing sensor region 1002 of the device 1000. FIGS. 13A-13F illustrate touch-sensing operations with respect to the example device 1000, though it will be understood that the touch-sensing operations may apply equally to other devices with front-facing sensor regions as described herein.

Figure 13A:
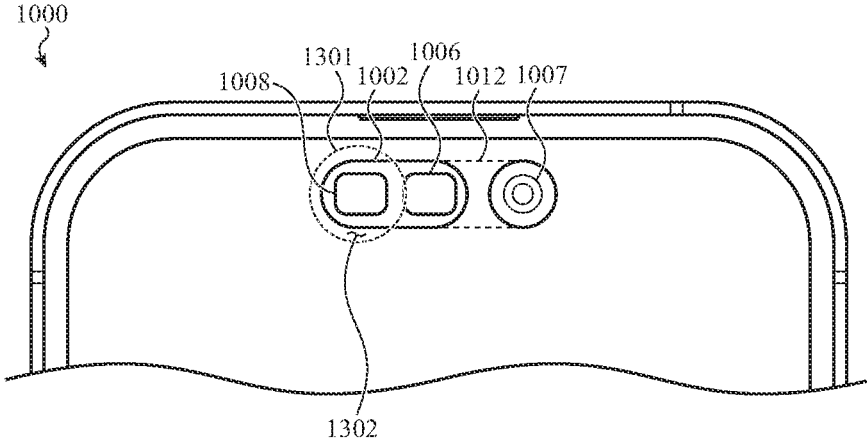
FIGS. 13A-13F depict example touch inputs and graphical outputs in a front-facing sensor region.

FIG. 13A illustrates a touch input 1301 applied to a first region of the front-facing sensor region 1002, such as a graphically inactive region of the front-facing sensor region 1002 (e.g., where no graphical outputs are produced and/or where no display component is visible or can produce visible graphical outputs). The area of touch input 1301 may generally correspond to an area of contact between a user's finger and the cover of the device 1000. In some cases, the area of the touch input 1301 corresponds to an area in which a threshold capacitive change is detected (e.g., due to the presence of the user's finger), regardless of whether the user's finger is contacting the cover over the entire area of the touch input 1301.

As shown in FIG. 13A, while the touch input 1301 is generally centered on the optical emitter of the front-facing sensor region 1002 (e.g., on a graphically inactive portion of the front-facing sensor region 1002), a portion 1302 of the touch-sensitive region of the display may detect the touch input 1301. The portion 1302 of the touch-sensitive region of the display corresponds to a portion inside the touch input 1301, and optionally includes part of the extended touch-sensitive area of the front-facing sensor region 1002 (e.g., the extended or supplemental touch-sensitive areas 1203, 1213, 1223). In some cases, the extended touch-sensitive area facilitates the detection of touch inputs on the front-facing sensor region 1002 by extending the touch-sensitive area of the display below the masked boundary of the front-facing sensor region 1002. Stated another way, the boundary of the touch-sensitive surface of the device may be smaller than (e.g., inside) the visible boundary of the front-facing sensor region 1002. Accordingly, even though the touch input 1301 may be generally centered over an area of the front-facing sensor region 1002 that lacks touch-sensitive components (e.g., over the optical emitter 1008), the touch input may still be detected. Various techniques and structures for detecting touch inputs in the front-facing sensor region (even without directly underlying touch-sensitive components) are described herein, including the extended or supplemental touch-sensitive areas or patterns of conductive elements in the sensor region, and may be used to detect the touch input 1301 or other touch inputs described herein.

Figure 13B:
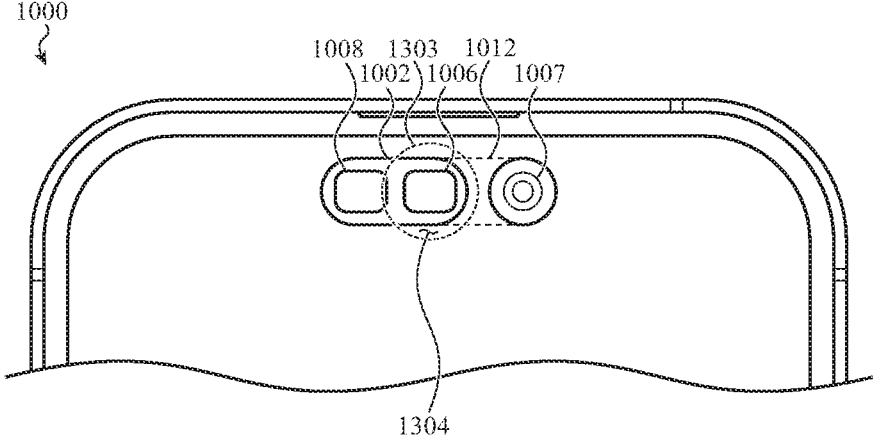

FIG. 13B illustrates the device 1000 receiving a touch input 1303. In this case, the touch input 1303 is generally centered over the optical receiver 1006 (e.g., on a graphically inactive portion of the front-facing sensor region 1002). Similar to FIG. 13A, while the touch input 1303 is generally centered on the optical receiver (e.g., where the display stack is not touch sensitive), a portion 1304 of the touch-sensitive region of the display may detect the touch input 1303. In this case, the portion 1304 may include the extended touch-sensitive area of the front-facing sensor region 1002, as well as the supplemental display region 1012. In particular, the supplemental display region 1012 may be both touch-sensitive and graphically active, and as such can detect touch inputs that are applied to or proximate that region.

Figure 13C:
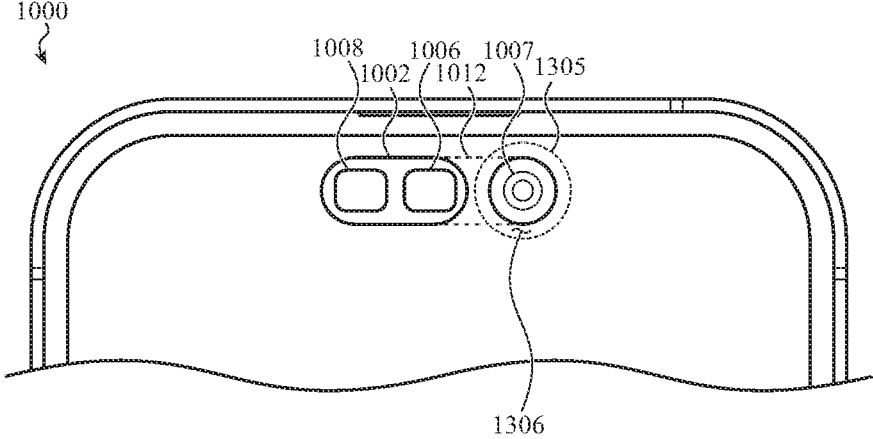

FIG. 13C illustrates the device 1000 receiving a touch input 1305. In this case, the touch input 1305 is generally centered over the front-facing camera 1007 (e.g., on a graphically inactive portion of the front-facing sensor region 1002). Similar to FIGS. 13A-13B, while the touch input 1305 is generally centered on the front-facing camera 1007 (e.g., where the display stack is not touch sensitive), a portion 1306 of the touch-sensitive region of the display may detect the touch input 1305. In this case, the portion 1306 may include the extended touch-sensitive area of the front-facing sensor region 1002, as well as the supplemental display region 1012. In particular, the supplemental display region 1012 may be both touch-sensitive and graphically active, and as such can detect touch inputs that are applied to or proximate that region.

FIGS. 13A-13C illustrate example touch inputs applied to three different regions of the front-facing sensor region, including a first touch input applied over a first optical component (e.g., the input 1303 over the optical receiver 1006), a second touch input applied over a second optical component (e.g., the input 1305 over the front-facing camera 1007), and a third input applied over another optical component (e.g., the input 1301 over the optical emitter 1008). The device may perform different actions in response to detecting these inputs. For example, the device may perform a first action (e.g., display a notification window) in response to the first input, and a second action (e.g., display an application user interface) in response to the second input. Other actions are also contemplated.

FIGS. 13A-13C illustrate three example positions in the front-facing sensor region 1002 in which touch inputs may be applied and detected. However, these are merely examples, and the front-facing sensor region 1002 may be configured to detect touch inputs applied to (e.g., centered on) any location in the front-facing sensor region 1002, including on the supplemental display region 1012, between the optical emitter 1008 and the optical receiver 1006, or the like. In some cases, the device may detect multi-touch inputs applied to the front-facing sensor region 1002 (e.g., two, three, of more fingers touching the front-facing sensor region at the same time).

Figure 13D:
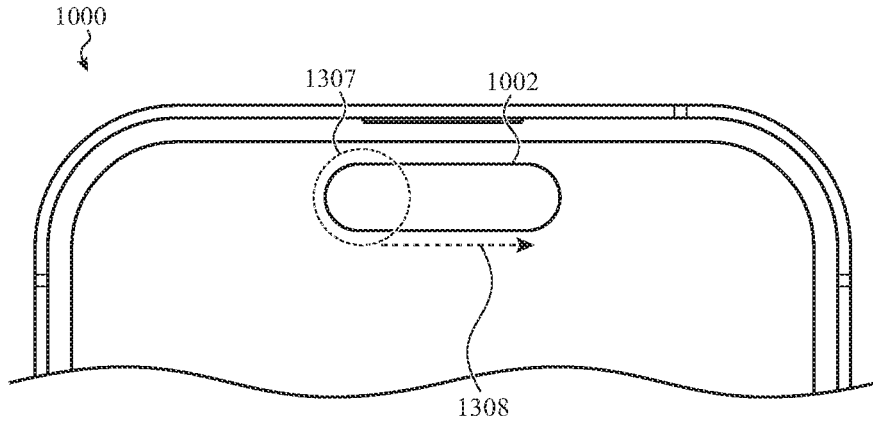

The front-facing sensor region 1002 may detect gesture inputs, as described herein. FIG. 13D illustrates an example gesture input applied to the front-facing sensor region 1002. In this example, the input is initiated at touch location 1307, and includes a swipe gesture in which the user's finger or other implement slides along the surface of the front cover in the front-facing sensor region 1002, as indicated by arrow 1308. The gesture may occur entirely within the front-facing sensor region 1002, or any portion of it may be outside the front-facing sensor region 1002 (e.g., it may start or end outside the front-facing sensor region). Additionally, while FIG. 13D illustrates a substantially linear horizontal gesture, other gestures may also be detected, such as vertical gestures, curved or non-linear gestures, multi-finger gestures, and the like. For example, the front-facing sensor region 1002 may detect swipe input gestures along the front-facing sensor region 1002 (e.g., horizontally or vertically).

Inputs detected at the front-facing sensor region 1002 may cause the device to perform certain operations, such as launching an application (e.g., a camera or image-capture application), locking or unlocking the device, launching an application or user interface associated with a notification, or the like. In some cases, the operations that are initiated by an input on the front-facing sensor region 1002 may be user-selectable. In some cases, a user may map one or more different inputs to one or more different device functions. For example, a user may map a swipe in a right-to-left direction to a device unlock function, a swipe in a left-to-right direction to a device lock function, a tap in a first location (e.g., over the optical emitter 1008) to an "answer call" function, and a tap in a second location (e.g., over the front-facing camera 1007) to a "decline call" function. Other functions, other touch inputs, and other mappings therebetween are also contemplated.

FIGS. 13A-13C show various features and components of the front-facing sensor region 1002, such as the optical emitter 1008, optical receiver 1006, front-facing camera 1007, and certain borders and boundaries. These features and components are not necessarily visible when the device 1000 is viewed from the front. For example, as described herein, masking layers (e.g., the mask 1138 in FIG. 11A), optical coatings (e.g., the coating 1160, FIG. 11B), and the like, may produce a front-facing sensor region that appears to be a substantially uniform pill-shaped area (as generally depicted in FIG. 13D), optionally with a visible hole or opening for at least the front-facing camera 1007.

Figure 13E:
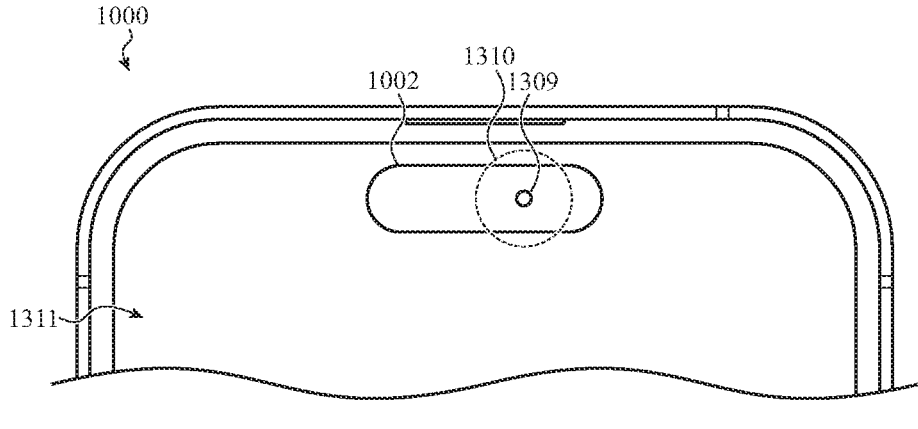
Figure 13E:
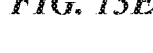
Figure 13F:
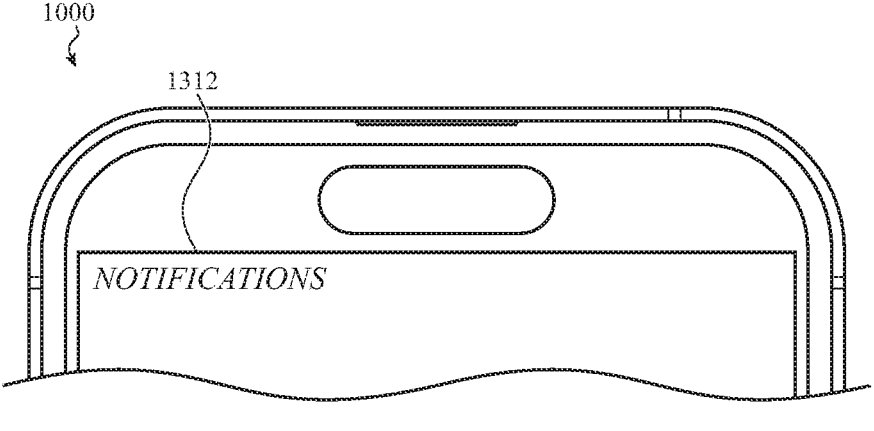

In some cases, as described herein, the front-facing sensor region 1002 includes both input and output functionality (in addition to the optical and/or sensor functionality of the front-facing sensor region). FIGS. 13E-13F illustrate an example operation in which a visual output is provided in the front-facing sensor region 1002, and a touch-based input causes the device to take an action (which may be related to the visual output). For example, FIG. 13E illustrates the device 1000 displaying a graphical output 1309 in the front-facing sensor region 1002. The graphical output 1309 may be produced by a portion of the display (e.g., by a supplemental display region in the front-facing sensor region 1002, such as the supplemental display regions 1208, 1218 in FIGS. 12A-12B). More particularly, a portion of the display may extend between the hole for the front-facing camera 1007 and the hole for the optical receiver 1006 (or the optical emitter 1008, or another component). That portion of the display may produce a graphical output 1309, such as a dot (as shown), an image, an icon, or the like. The graphical output 1309 may be produced in response to a detection of a notification event at the device 1000. Example notification events may include, without limitation, incoming calls (e.g., voice, video), incoming messages (e.g., text messages, email messages), incoming notifications from applications on the device, calendar notifications, task notifications, alarms, timers, and alerts. When the notification event is detected, the graphical output 1309 may be produced, thereby alerting the user to the occurrence of the notification event.

The portion of the display that displays the graphical output 1309 may be graphically inactive except for displaying graphical outputs related to even notifications. For example, the supplemental display region may be excluded from the main display region of the display. Stated another way, the supplemental display region may be inactive, even when the main display region of the display is active, but may be used to temporarily produce graphical outputs in response to intermittent event occurrences. Thus, when a notification of an event is received, a main display region may be outputting a first graphical output and the supplemental display region may be inactive or may be displaying some other graphical output that is not contiguous with or part of the graphical output on the main display region. In response to detection of the event, the supplemental display region outputs a second graphical output (e.g., the graphical output 1309). In some cases, different graphical outputs are produced in the supplemental display region at different times and for different purposes. For example, a dot may be displayed in response to one type of event (e.g., an incoming text message), and an icon may be displayed in response to a second type of event (e.g., an incoming email). Multiple graphical outputs may also be displayed in the supplemental display region at the same time (e.g., an email icon indicating the presence of a new email message, and a phone icon indicating a missed call).

The front-facing sensor region 1002 may also receive a touch input, as described herein. For example, FIG. 13E illustrates a touch input 1310 applied to the front-facing sensor region 1002. The response of the device 1000 to the touch input 1310 may depend on the particular event that caused the graphical output 1309 to be outputted. For example, if the graphical output 1309 was produced as a result of detecting an incoming email message, the touch input 1310 may cause the device to display or initiate an email application; if the graphical output was produced as a result of detecting an incoming text message, the touch input 1310 may cause the device to display or initiate a text message application. In some cases, the touch input 1310 may produce the same response regardless of the triggering event. For example, the touch input 1310 may cause the device to display a notification list or other interface. The front-facing sensor region 1002 may be responsive to the touch input 1310 (or other touch inputs) only when a notification is active (e.g., when the graphical output 1309 or another graphic is displayed), or regardless of whether a graphical output is being displayed.

FIG. 13F illustrates an example graphical output 1312 that may be displayed in response to the touch input 1310 in a main region 1311 (FIG. 13E) of the display (e.g., a region of the display outside the supplemental display region). As shown, the graphical output 1312 may be a notification window, list, or other graphical object, which may include information about one or more event notifications, such as the particular event notification that initiated the display of the graphical output 1309. As noted above, in some cases, the notification window is displayed in response to the touch input 1310 only when the notification graphical output 1309 is active, or any time the touch input 1310 is received (regardless of the status of a notification graphical output).

Figure 14A:
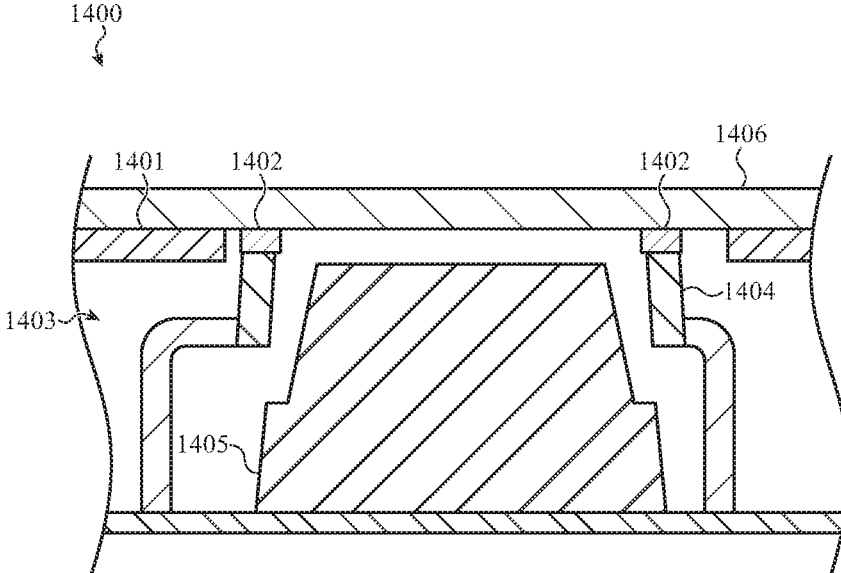
FIGS. 14A-14B depict partial cross-sectional views of example front-facing cameras for an electronic device.

FIG. 14A is a partial cross-sectional view of a device 1400, viewed along a line corresponding to the line 14A-14A in FIG. 1A. The device 1400 may correspond to or be an embodiment of the devices 100, 140, 200, 300, 400 or any other device described herein. FIG. 14A illustrates a portion of an example front-facing camera 1403, which may be part of a front-facing sensor region as described herein. The front-facing camera 1403 may correspond to the front facing camera 1007, or any other front-facing camera described herein. The camera 1403 may be an autofocus camera, such that a lens assembly 1405 (or a portion thereof) may move within the camera housing 1404 (e.g., vertically, as oriented in FIG. 14A).

A display stack 1401 that is coupled to an interior surface of a front cover 1406 may define a hole, and the camera 1403 may extend through the hole or otherwise be positioned below the hole, thereby allowing the camera 1403 access to the front cover 1406. The camera housing 1404 may be coupled to the interior surface of the front cover 1406 via a light-blocking structure 1402. The light-blocking structure 1402 may be a ring-like structure, and may be adhered to either or both the interior surface of the front cover 1406 or the camera housing 1404. In some cases, the light-blocking structure 1402 may be or may include a compliant material, such as a foam, that forms an intimate (e.g., light-blocking) contact with the interior surface of the front cover 1406 and the camera housing 1404. The light-blocking structure 1402 may be configured to prevent or inhibit ingress of light (e.g., light that exits the display stack 1401 from the edges that define the hole) into the camera housing 1404. The light-blocking structure 1402 may also prevent or inhibit ingress of dust or other contaminants in to the camera housing 1404.

Figure 14B:
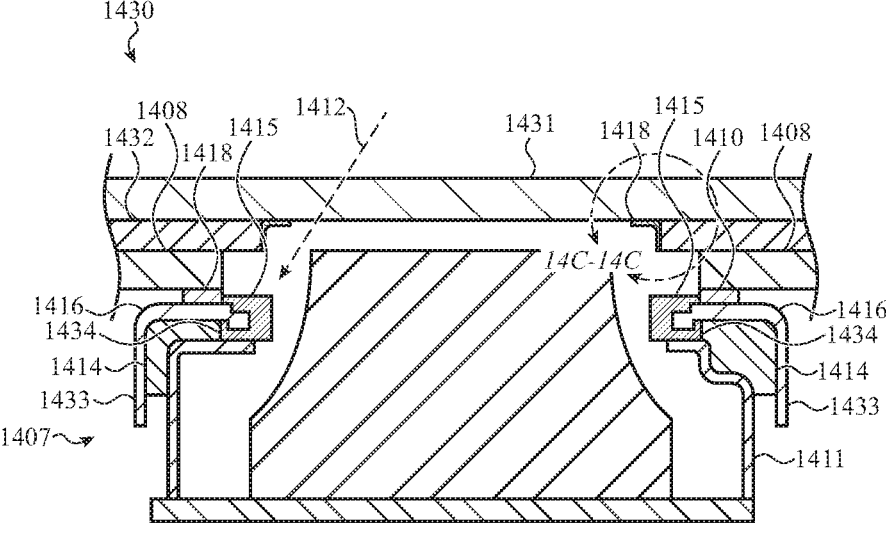

FIG. 14B is a partial cross-sectional view of a device 1430, viewed along a line corresponding to the line 14A-14A in FIG. 1A. The device 1430 may correspond to or be an embodiment of the devices 100, 140, 200, 300, 400, or any other device described herein. FIG. 14B illustrates a portion of an example front-facing camera 1407, which may be part of a front-facing sensor region as described herein. The front-facing camera 1407 may correspond to the front facing camera 1007, or any other front-facing camera described herein. The camera 1407 may be an autofocus camera, such that a lens assembly (or a portion thereof) may move within the camera housing 1411 (e.g., vertically, as oriented in FIG. 14B).

As shown in FIG. 14B, the camera housing 1411 is coupled to a bracket 1416. The bracket 1416 may be a bracket to which multiple components of a front-facing sensor array may be attached, including for example an optical emitter and an optical receiver. The bracket 1416 may correspond to or be an embodiment of the bracket 1145 in FIG. 11A. The bracket 1416 may be coupled to a front cover assembly of a device. For example, the bracket 1416 may be coupled to a support layer 1408 (e.g., a metal or polymer sheet that defines an interior surface of the front cover assembly and/or a display stack). A compliant structure 1410 may be positioned between the bracket 1416 and the support layer 1408, and may define a seal between the bracket 1416 and the support layer 1408. The seal may prevent or inhibit ingress of dust or other contaminants into the camera housing 1411, where it could interfere with the camera (e.g., the lens, sensor, etc.). The compliant structure 1410 may be formed from or include a foam, compliant polymer, or the like. In some cases, the compliant structure 1410 includes or is coupled to the bracket 1416 and/or the support layer 1408 via an adhesive, such as a PSA, liquid adhesive, or the like.

In some cases, as described herein, a light-blocking structure 1418 may be positioned on an edge of a display 1432. The light-blocking structure 1418 may block or inhibit light from leaking from the edge of the display 1432 (e.g., the edge of the display 1432 that defines the hole through which the camera 1407 captures images) and interfering with the camera (e.g., degrading image quality, degrading focusing or other image capture operations, etc.). The light-blocking structure 1418 may also conductively couple a coating applied to the front cover 1431 to the support layer 1408 of the front cover assembly, as described herein.

The bracket 1416 may include a frame portion 1433, which may be formed from or include metal (e.g., a stamped metal structure), polymer, or the like. The bracket 1416 may also define a surround structure 1415 that is coupled to the frame portion 1433 and at least partially, and optionally completely, surrounds the opening in the frame portion 1433 that accommodates the camera 1407 (e.g., the hole through which the lens assembly extends). The surround structure 1415 may provide several functions. For example, the surround structure 1415 may define an overhang 1434 that extends below the lower surface of the frame portion 1433 to define a barrier or dam between the frame portion 1433 and the camera housing 1411. More particularly, the camera housing 1411 may be positioned against the overhang 1434, and an adhesive 1414 may be introduced into a space defined between the frame portion 1433 and the camera housing 1411. The surround structure 1415 defines a barrier or dam that prevents or inhibits the adhesive 1414 (e.g., a liquid adhesive) from flowing into the interior of the camera 1407.

The surround structure 1415 may also inhibit the visibility of internal components through the front cover 1431. For example, internal components of the device may be exposed to view when the device is viewed at certain angles, as illustrated by the example line 1412. The surround structure 1415 may cover components that might otherwise be visually distinguishable, such as the frame portion 1433 (e.g., the end of the frame portion 1433). In some cases, the surround structure 1415 is also large enough to cover or occlude other components that might otherwise be visible, such as the top of the camera housing 1411, the compliant structure 1410, etc. The edges of the frame portion 1433 may be recessed relative to the surround structure 1415, as shown, such that the surround structure 1415 also occludes the top of the frame portion 1433 and prevents the top or edges of the frame portion 1433 from being visible (e.g., along line 1412).

The surround structure 1415 may be formed from a polymer material that is molded to the frame portion 1433 (e.g., via insert molding). The surround structure 1415 may be coupled to the frame portion 1433 via an interlocking structure (as shown), which may be formed during a molding process (e.g., insert molding) in which the material for the surround structure 1415 is introduced into a mold and caused to conform to an interlock structure defined by the frame portion 1433.

The surround structure 1415 may have properties that inhibit light reflection or are otherwise configured to reduce the visibility of the surround structure 1415 through the front cover 1431. For example, the surround structure 1415 may have a dark (e.g., black) color, which may reduce the extent to which the surround structure 1415 is visually distinguishable through the front cover 1431. The surround structure 1415 may also have a textured surface or otherwise be treated to produce diffuse reflections with low visibility through the front cover 1431. The textured surface may be formed by molding (e.g., the mold surface that defines the shape of the surround structure 1415 may define the surface texture), machining, etching, or any other suitable process.

The surround structure 1415 may be a monolithic structure, such as a single piece of polymer, and surface treatments, such as a surface texture, may be formed in the surface of the monolithic structure. In some cases, the surround structure 1415 may include multiple structures, components, or materials, such as a polymer base structure and a coating (e.g., a paint, dye, ink, film, deposition layer, etc.) that defines at least part of the exposed exterior surface of the surround structure 1415.

Figure 14C:
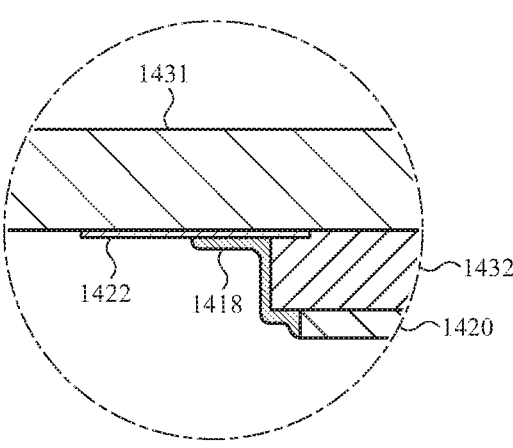
FIGS. 14C-14E illustrate partial cross-sectional views of example front-facing sensor regions for an electronic device.

FIG. 14C illustrates a detail view of area 14C-14C in FIG. 14B, illustrating an example light-blocking structure 1418 positioned on an edge of the display 1432. As described herein, a front cover may include opaque masks that define borders around the holes where front-facing optical components are positioned. FIG. 14C illustrates an example opaque mask 1422, which may correspond to or be an embodiment of the mask 1139 in FIG. 11A. As shown in FIG. 14C, the light-blocking structure 1418 contacts the opaque mask 1422, covers the edge of the display 1432, and contacts a support layer 1420. The support layer 1420 may be a metal plate, sheet, or layer that is positioned along the underside of the display. The support layer 1420 may correspond to or be an embodiment of the support layer 1408, or it may be a different component. The light-blocking structure 1418 may block light from the edges of the display 1432 from entering into the camera or otherwise leaking out from the edge of the display. The light-blocking structure 1418 may be formed from or include an opaque and/or light absorbing material, such as an ink, paint, polymer coating, or the like.

The light-blocking structure 1418 may also be formed from or include a conductive material, and may define a conductive path from the mask 1422 to the support layer 1420. This conductive path may define a discharge path for electrical charges that might otherwise accumulate on the mask 1422. For example, without the discharge path defined by the light-blocking structure 1418, electrical charges may accumulate on the mask 1422, which may interfere with the function of the display (e.g., graphical output functions, touch-sensing functions), or other components of the system. Accordingly, the conductivity of the light-blocking structure 1418 allows the light-blocking structure 1418 to perform multiple functions, including blocking light from the display and mitigating or eliminating electrical charge accumulation on the mask 1422. The conductivity of the light-blocking structure 1418 may be achieved in various ways. For example, the light-blocking structure 1418 may be formed from a conductive ink, a deposited metal or other conductive layer, or the like.

Figure 14D:
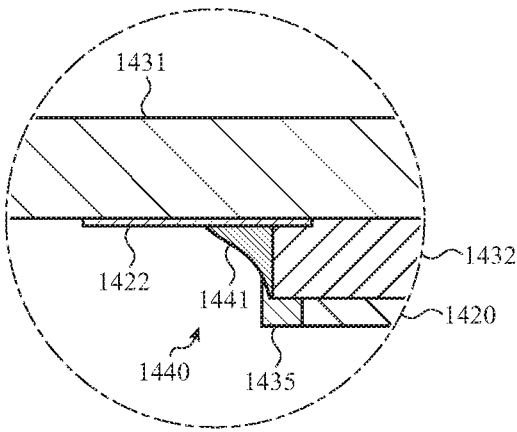

FIG. 14D illustrates another example light-blocking structure 1440 that may be used to block light from the edge of the display 1432 and define a discharge path from the mask 1422. As shown in FIG. 14C, the light-blocking structure 1418 is a unitary structure (e.g., a single layer or deposition of ink). The light-blocking structure 1418 may be formed by a single deposition process of an ink or other material. In the example of FIG. 14D, the light-blocking structure 1440 may include multiple portions or segments, including a first portion 1441 that contacts the mask 1422 and blocks the edge of the display 1432, and a second portion 1435 that contacts the first portion 1441 and the support layer 1420. The first and second portions 1441, 1435 may be conductive to define a discharge path between the mask 1422 and the support layer 1420, as described above. The first portion 1441 and the second portion 1435 may be formed from or include an opaque and/or light absorbing material, such as an ink, paint, polymer coating, or the like. The first and second portions 1441, 1435 may be formed from the same or different materials (e.g., the same or different conductive inks), and may be deposited in two separate deposition operations (e.g., two passes of a deposition nozzle). In some cases, the first and second portions 1441, 1435 have different optical or visual properties. For example, the first portion 1441 may be opaque and/or light absorbing, and the second portion 1435 may be more optically transmissive (e.g., because the second portion 1435 does not necessarily serve a light-blocking function).

Figure 14E:
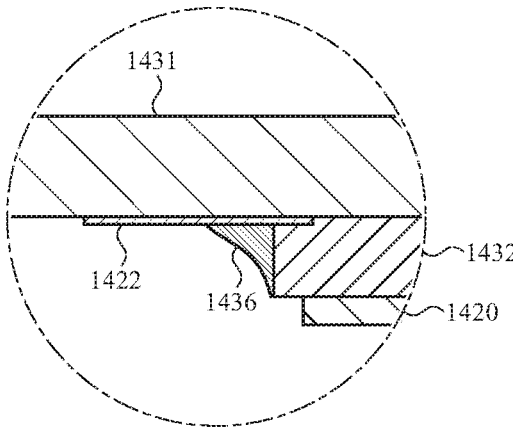

FIG. 14E illustrates another example light-blocking structure 1436 that may be used to block light from the edge of the display 1432. In this example, the light-blocking structure 1436 may cover the edge of the display 1432, but does not contact the support layer 1420. In this example, a discharge path from the mask 1422 may be omitted, or a different discharge path may be provided. The light-blocking structure 1436 may be formed from or include an opaque and/or light absorbing material, such as an ink, paint, polymer coating, or the like Devices as described herein include audio ports, such as speaker ports (also referred to as receiver ports) positioned so as to direct sound into a user's ear when the device (e.g., phone) is held near the user's head, such as during a telephone call. FIGS. 15A-15F illustrate example configurations and components of a speaker port as described herein.

Figure 15A:
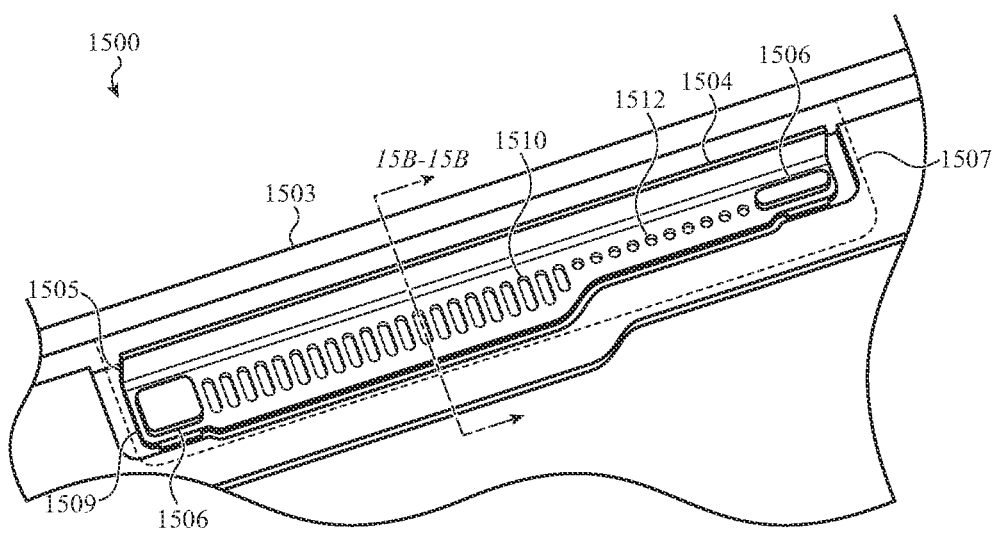
FIG. 15A depicts a partial view of a speaker configuration of an example electronic device.

FIG. 15A illustrates a partial view of a device 1500 corresponding to area 15A-15A in FIG. 1A, with components (e.g., a cover) removed. The device 1500 may correspond to or be an embodiment of the device 100, 140, 200, 300, 400, or any other device described herein.

In some cases, a cover may define a notch 1507 (or recess) along an edge of the cover, shown in FIG. 15A as a dotted line (illustrating the position of the notch in the cover). The notch 1507, along with a housing component 1503 that defines a side exterior surface of the device 1500, may define a void 1559 (FIG. 15B) that is part of an audio passage for a device speaker. The void 1559 may be an open cavity defined by the notch 1507 and the housing component 1503, and may be bounded by a set of four sides, three of which are defined by the cover (as illustrated by the notch 1507), and one of which is defined by an inner surface of the housing component 1503, as shown in FIG. 15A. As further illustrated in FIG. 15B, the void 1559 may also be positioned between a portion 1558 of the housing component 1503 that defines a portion of a front surface of the device, and a portion of the cover 1501 that defines another portion of the front surface of the device. As described herein, the void 1559 defines an end portion or opening of the audio passage that transmits audio output from a speaker assembly through the device and to the exterior of the device.

Figure 15B:
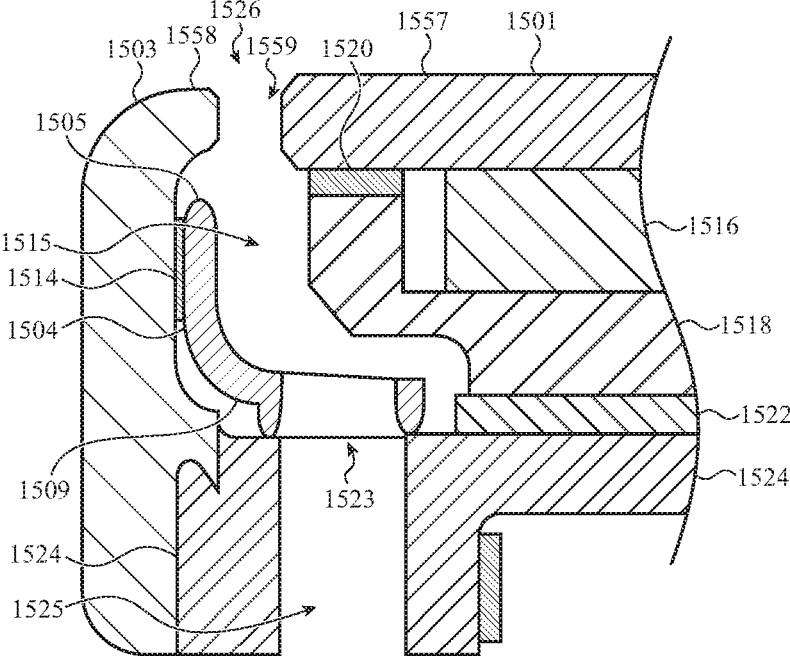
FIG. 15B depicts a partial cross-sectional view of an example electronic device, illustrating an example configuration of a speaker opening.

As shown in FIG. 15A, the device 1500 includes a grate element 1504 positioned in the audio passage from a speaker within the device 1500 to the speaker port of the device (e.g., the speaker port 1526 in FIG. 15B, which may correspond to the speaker port 110 in FIG. 1A). The grate element 1504 may be positioned over an opening that defines part of the audio passage. The grate element 1504 may define a base portion 1509 and a flange portion 1505. The base portion 1509 may be positioned over the opening of the audio passage and may define an array of openings, such as openings (or slits) 1510 and 1512, therethrough. The grate element 1504 may define an outward-facing surface (e.g., the surface visible in FIG. 15A, and shown as a top or upper surface in FIG. 15B). The outward-facing surface of the grate element 1504 may be offset from the front exterior surface 1557 of the cover 1501 by a distance that is greater than the thickness of the cover 1501. Thus, the outward-facing surface of the grate element 1504 is below the bottom or interior surface of the cover 1501 (e.g., it is not within the void 1559 defined between the notch 1507 and the housing component 1503).

The openings 1510, 1512, which may also be referred to as acoustic passages, may be configured to allow sound to pass through the grate element 1504. For example, sound output from an internal speaker may pass through the openings 1510, 1512 and exit the device via the speaker port 1526. In some cases, a microphone may be positioned within the device and receive sound through the speaker port 1526. In which case, sound from outside the device 1500 may reach the microphone through the openings 1510, 1512.

The grate element 1504 may be configured to inhibit the ingress of debris (e.g., dirt, sand, lint, etc.) into the device, while allowing sound to pass through. The openings 1510, 1512 may be elongated openings positioned along a length of the grate element 1504, as shown in FIG. 15A. The openings 1510, 1512 may be smaller than a target size. For example, the openings 1510, 1512 may have widths ranging from about 0.1 mm to about 0.5 mm. In some cases, the openings 1510, 1512 have widths smaller than about 0.5 mm. In some cases, each opening of the array of openings has an elongated shape with a length at least twice the width.

The openings 1510, 1512 may also have different sizes, based on the size of the opening in the audio passage where the grate element 1504 is located. For example, where the opening in the audio passage is smaller, the openings in the grate element may have a length that is less than the length of the grate openings where the audio passage is larger. In some cases, the smaller openings 1512 and the larger openings 1510 may both resemble pill-shaped holes, with the larger openings 1510 having a greater length than the smaller openings 1512. In some cases, the openings 1512 may be circular holes, and the openings 1510 may be pill-shaped holes. In some cases, an acoustic screen or mesh may cover the openings 1510, 1512 to further inhibit ingress of contaminants. Additional openings of different sizes and/or shapes may also be included (e.g., pill-shaped openings smaller than the openings 1510 but larger than the openings 1512).

The grate element 1504 may be molded from a polymer material. Thus, the openings 1510, 1512 may be defined by the molded polymer material, rather than a mesh, fabric, screen, or the like.

The grate element 1504 may be secured to the device via fasteners, welds, heat stakes, or the like. FIG. 15A illustrates example interlock structures 1506 used to secure the grate element 1504 to the device 1500. The interlock structures 1506 may be polymer rivet-like structures that extend through openings in the grate element 1504 and are deformed along the top of the grate element 1504 to secure the grate element 1504 to the housing. In other examples, the interlock structures 1506 may be weldments, screws, bolts, or the like. Adhesives may also be used instead of or in addition to interlock structures.

FIG. 15B illustrates a partial cross-sectional view of the device 1500, viewed along line 15B-15B in FIG. 15A. FIG. 15B also includes components that were omitted from FIG. 15A for clarity, such as a cover 1501, display stack 1516, display frame 1518, and adhesives 1520, 1522.

As shown in FIG. 15B, the flange portion 1505 of the grate element 1504 may be attached to a housing component 1503 of the device 1500 (e.g., with adhesive 1514). The base portion 1509 may be positioned over an opening 1523 of an audio passage 1525. A speaker assembly and/or microphone may be acoustically coupled to the audio passage 1525, thereby sending and/or receiving sound through grate element 1504 and the audio passage 1525. The opening 1523 and the audio passage 1525 may be formed through a portion of the housing of the device 1500. For example, as shown in FIG. 15B, the housing may include or define a support structure 1524. The support structure 1524 may be a separate material or structure from the housing component 1503 (as shown), or it may be unitary with the housing component 1503 (e.g., machined or otherwise formed from a single piece of material). In some cases, the support structure 1524 may be a polymer material that is molded against and secured to the housing component 1503 (e.g., via mechanical interlocking, adhesive bonds, etc.).

As described herein, the speaker port 1526 may be defined on at least one side by the housing component 1503, and on at least one other side by a cover 1501 (e.g., by three sides of a notch 1507 in the cover). As noted above, the speaker port 1526 (and the void 1559) may be defined between a portion 1558 of the housing component 1503 that defines a portion of a front surface of the device, and a portion of the cover 1501 that defines another portion of the front surface of the device.

In order to provide a greater area for the display 1516 (e.g., to allow the use of a larger display 1516), the speaker port 1526 may be positioned further towards the housing component 1503 than the audio passage 1525. This may result in the audio passage 1525 having a jog between an upper portion 1515 and a lower portion (e.g., indicated by element number 1525). The configuration of the grate element 1504 accounts for the jog in the audio passage. For example, the "L" shape of the grate element 1504 allows the flange portion 1505 to be attached to an inner surface of the housing component 1503 (e.g., via adhesive 1514), while the base portion 1509 rests on and may be secured to the support structure 1524 (e.g., on an internal shelf defined by the support structure 1524 and offset inward from the front exterior surface of the device, as shown in FIG. 15B) and covers the opening 1523. Because the flange portion 1505 extends upwards from the base portion 1509, the flange portion 1505 may cover the inner surface of the housing component 1503 and occlude the surface from visibility through the speaker port 1526. In some cases, the flange portion 1505 may be formed from a dark (e.g., black) material or otherwise have a dark coloring to limit visibility into the internals of the device 1500. In some cases, the grate element 1504 is a unitary polymer structure having a consistent color. The grate element 1504 may define a surface texture that is configured to diffusely reflect light or otherwise reduce the visibility of and/or reflections from the grate element 1504.

Figure 15C:
FIG. 15C depicts a partial cross-sectional view of example electronic device, illustrating another example configuration for a speaker opening.
Figure 15C:
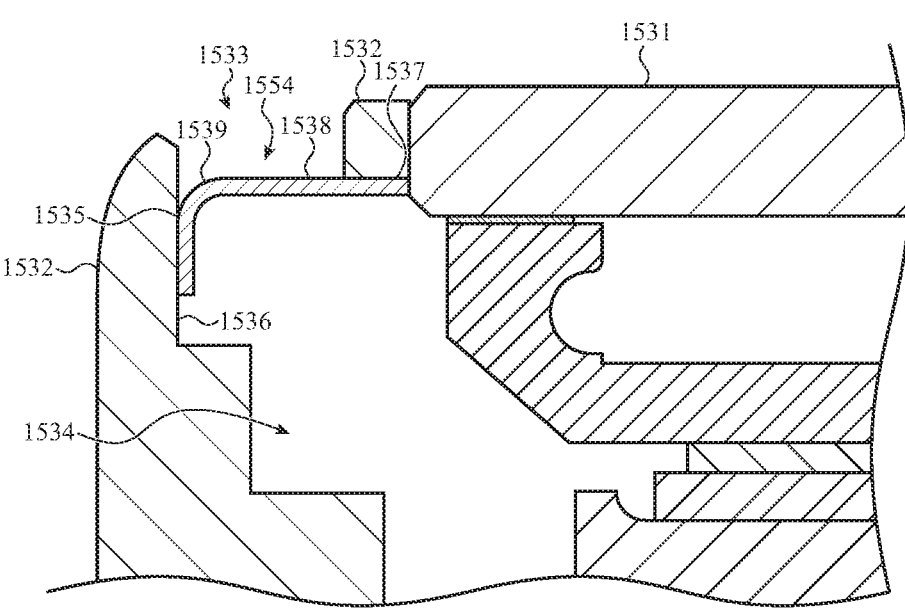

FIG. 15C illustrates a partial cross-sectional view of another example device 1530, generally corresponding to a view along line 15B-15B in FIG. 15A, illustrating another example configuration of a speaker port 1533. In this example, a hole is formed in a housing component 1532, defining a void 1554. A front cover 1531 is positioned along a side of the housing component 1532. In some cases, the housing component 1532 defines a protruding feature in which the hole is formed, and the front cover 1531 may define a notch or recess that accommodates the protruding feature.

An acoustic cover 1539 may be positioned below the void 1554. The acoustic cover 1539 may be configured to inhibit the ingress of debris (e.g., dirt, sand, lint, etc.) into the device (e.g., into an audio passage 1534), while allowing sound to pass through. The acoustic cover 1539 may be attached to the housing component 1532 at multiple locations. For example, an upper portion 1538 of the acoustic cover 1539 may be attached to an interior surface 1537 of the housing component 1532 (e.g., a surface parallel to the front surface of the front cover 1531), and a side portion 1535 of the acoustic cover 1539 may be coupled to an interior side surface 1536 of the housing component 1532 (e.g., a surface perpendicular or otherwise not parallel to the front surface of the front cover 1531). The acoustic cover 1539 may be attached to the housing component 1532 at these locations via adhesive, fusion bonding (e.g., welding, soldering, brazing), fasteners (e.g., screws), or the like.

The acoustic cover 1539 may be or may include an acoustic mesh. The acoustic mesh may be a metal mesh or a polymer mesh, or another suitable type of mesh. In the case of a metal mesh, the mesh may be welded to the surfaces 1536, 1537 of the housing component 1532.

Figure 15D:
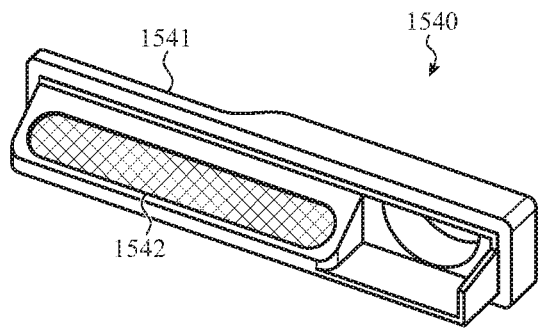
FIG. 15D depicts an example acoustic cover structure for an electronic device.
Figure 15E:
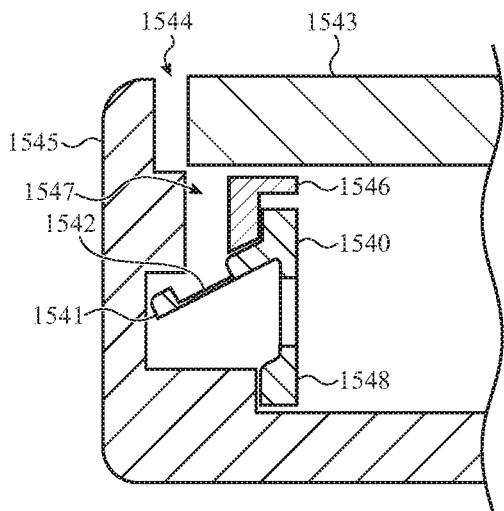
FIG. 15E depicts a partial cross-sectional view of an electronic device with the acoustic cover structure of FIG. 15D.

FIG. 15D illustrates an example acoustic cover structure 1540 that may be included in a device to inhibit ingress of debris into the device through an audio passage, while allowing sound to pass through to the external environment. The acoustic cover structure 1540 may include a frame structure 1541 (e.g., a molded element) and an acoustic cover 1542 (e.g., an acoustic mesh, screen, grate, or the like). FIG. 15E illustrates the acoustic cover structure 1540 positioned in a device. The acoustic cover structure 1540 may be coupled to a housing component 1545, and may be positioned below a void 1544 that defines the end of the acoustic passage through the device. Similar to the discussion above with respect to FIGS. 15A-15B, the void 1544 may be defined between a front cover 1543 (e.g., by a notch or recess defined along a side or edge of the front cover 1543) and a side of the housing component 1545. In some cases, the acoustic cover structure 1540 may be positioned below a portion 1547 of an audio passage that is defined by the housing component 1545 and a support structure 1546 (e.g., a polymer material that is molded against and secured to the housing component and that optionally mechanically couples different housing components together). A speaker assembly may be coupled to the acoustic cover structure 1540 along an inner surface 1548 of the acoustic cover structure to direct sound through the acoustic cover structure 1540 and though the void 1544.

Figure 15F:
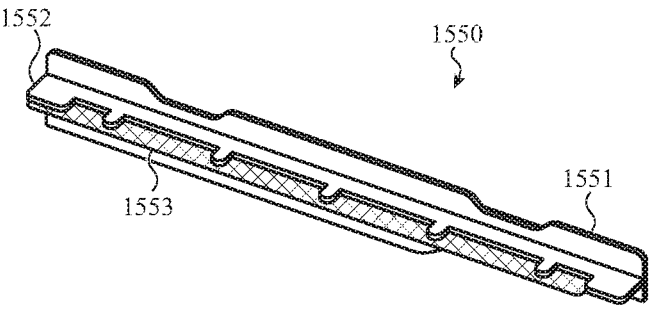
FIG. 15F depicts another example acoustic cover structure for an electronic device.

FIG. 15F illustrates an example acoustic cover structure 1550 that may be used to inhibit ingress of debris into the device through an audio passage, while allowing sound to pass through to the external environment. The acoustic cover structure 1550 may be used in the device 1500 as an alternative to the grate element 1504. The acoustic cover structure 1550 may include a frame including a flange portion 1551 and a mesh retention portion 1552 (e.g., a molded element). The flange portion 1551 and the mesh retention portion 1552 may be a unitary polymer structure. The acoustic cover structure 1550 may also include a screen mesh 1553 coupled to the frame (e.g., to the mesh retention portion 1552). The screen mesh 1553 may be coupled to the mesh retention portion by an insert molding process, in which the screen mesh 1553 is positioned in a mold cavity, and a polymer material is introduced into the cavity to form the frame and overmold over (e.g., at least partially encapsulate) an edge portion of the screen mesh 1553 to secure the screen mesh 1553 to the frame. The flange portion 1551 may be attached to an inner surface of a housing component (e.g., the housing component 1503) via an adhesive (e.g., the adhesive 1514, FIG. 15B), while the mesh retention portion and/or the screen mesh 1553 rests on (and may be secured to) a support structure, similar to the configuration of the grate element 1504 shown in FIG. 15B. In some cases, the screen mesh 1553 may be a perforated metal sheet or plate, a metal or other material mesh, or another suitable structure for inhibiting debris while passing sound. The screen mesh 1553 may define an array of perforations, each perforation having a diameter ranging between 100 microns and 200 microns.

As noted above, the devices described herein may include a flash (e.g., a light source) that is configured to illuminate a scene to facilitate capturing images with one or more cameras of the electronic device. The flash, also referred to as a flash module or more broadly a light source, may include one or more light emitting diodes (LEDs) that produce the light to illuminate the scene. The flash module may be part of or positioned proximate a sensor array to facilitate illumination of scenes for flash photography.

Figure 16A:
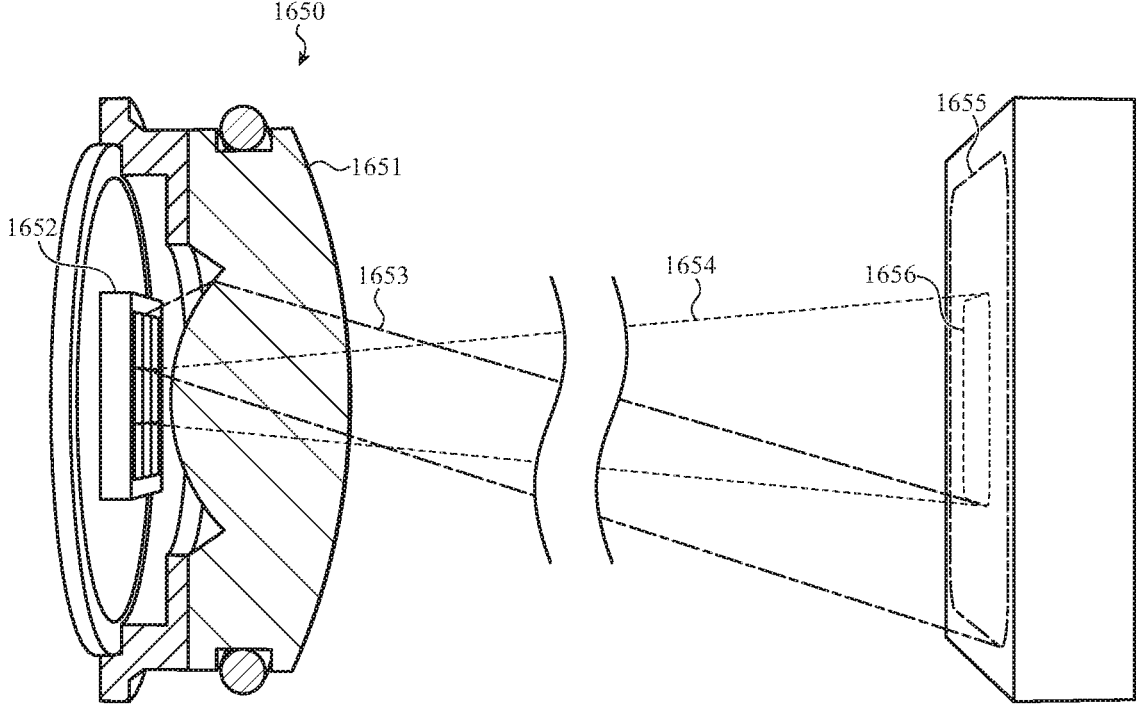
FIG. 16A depicts a flash module illuminating different fields of view.

As described herein, devices may include rear-facing sensor arrays that include multiple cameras (e.g., a camera array), each having a different field of view. In order to illuminate the fields of view of each camera, a single flash may illuminate a field of view that corresponds to the camera having the largest (e.g., widest) field of view. In some cases, in order to more closely pair the field of view of a camera to the field of view that a flash illuminates, a light emitting component may be configured to illuminate different fields of view, depending on the particular camera that is in use. FIG. 16A illustrates an example flash 1650 that includes a segmented light emitting component 1652 that can illuminate different subsets of its illuminable regions to illuminate different fields of view. Further, the flash 1650 includes a flash lens 1651 positioned over the light emitting component 1652 that is configured to refract the light emitted by the segments of light emitting component 1652 to illuminate a target field of view.

For example, when a camera with the narrowest field of view is in use, the light emitting component 1652 may illuminate a segment (or segments) that illuminate a first field of view 1656 that corresponds to (e.g., illuminates all or substantially all) of the field of view of the camera. When a camera with a wider field of view is in use, the light emitting component 1652 may illuminate a segment (or segments) that illuminate a second field of view 1655 that corresponds to (e.g., illuminates all or substantially all) of the field of view of the wider camera. FIG. 16A illustrates a first example light pattern 1654, showing how a first portion of the flash lens 1651 (e.g., a central portion) refracts the light to illuminate the first field of view 1656, and a second example light pattern 1653, showing how a second portion of the flash lens 1651 (e.g., a peripheral portion) refracts the light to illuminate the second field of view 1655. More particularly, the position of the illuminated segments and the configuration of the lens can refract or otherwise project the light along a different angle, thereby illuminating a different (e.g., wider) field of view. For simplicity, FIG. 16A only shows one peripheral segment illuminating the entire second field of view 1655, though it will be understood that multiple segments may be used to illuminate the second field of view 1655. Further, it will be understood that the light emitting component 1652 can illuminate different segments to illuminate additional fields of view (e.g., a third field of view, a fourth field of view, etc.).

Flashes with segmented light emitting components and non-segmented light emitting components may be used with the devices described herein, and examples of each are shown and described with respect to FIGS. 16B-17F.

Figures 16B, 16C:
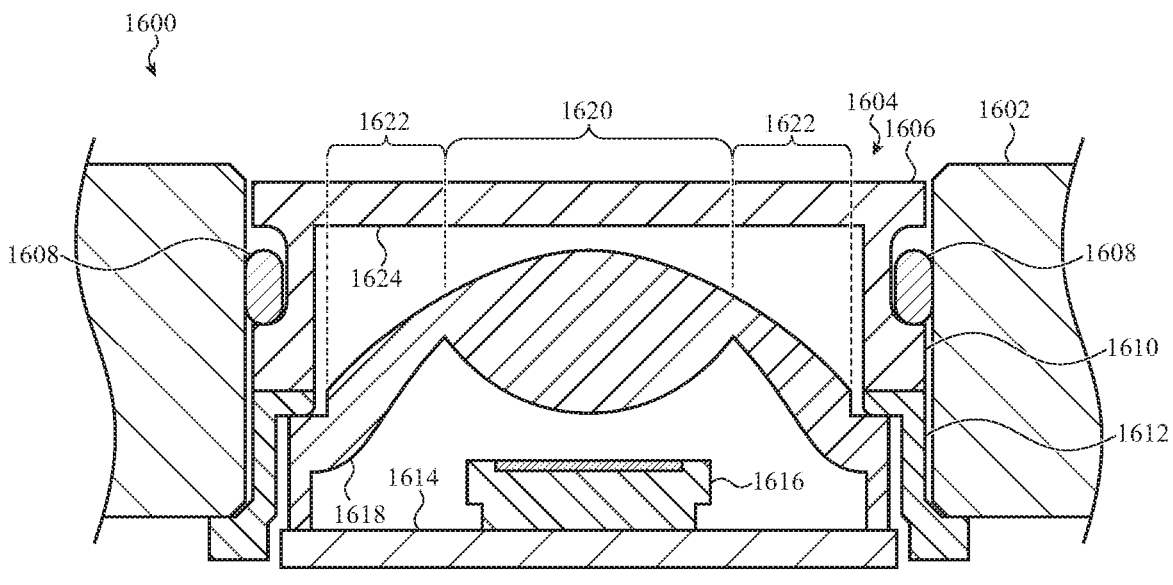
FIGS. 16B-16C depict partial cross-sectional views of a flash module.

FIG. 16B illustrates a partial cross-sectional view of a flash module 1604 in a device 1600, viewed along a line corresponding to line 16B-16B in FIG. 1B. The flash module 1604 may correspond to or be an embodiment of the flashes 148, 136, or any other flash described herein, and the device 1600 may correspond to or be an embodiment of the devices 100, 140, 200, 300, 400, or any other device described herein.

The flash module 1604 includes a flash body 1606. The flash body 1606 may be positioned in a hole formed through a cover 1602 (e.g., a rear cover of the device, such as the rear cover 132). A sealing member 1608 may be positioned between the flash body 1606 and the inner surface of the hole to inhibit ingress of liquid and/or other contaminants into the device.

The flash body 1606 may include a first portion 1610 and a second portion 1612. The first and second portions 1610, 1612 may have different optical and/or other properties. For example, the first portion 1610 may be transparent, while the second portion 1612 may be opaque (or otherwise less optically transmissive than the first portion 1610). The opaque second portion 1612 may be configured to impede or inhibit the visibility of internal components to users of the device. In some cases, flash body 1606 is formed by a multi-shot molding process, in which a transparent polymer (e.g., a polycarbonate) is injected into a mold to form the first portion 1610, and an opaque polymer (e.g., a polycarbonate) is injected into the mold to form the second portion 1612. In such cases, the first and second portions are different portions of a monolithic polymer structure. In some cases, the same polymer composition is used for the first and second portions, with the second portion having an additional component to make it opaque.

The flash body 1606 also defines a window portion 1624, which may extend over a lens 1618 of the flash module 1604 and may be separated from the lens 1618 by an air gap. The window portion 1624 may include features such as ridges along an inner surface of the window portion 1624, as described with reference to FIG. 18.

The flash module 1604 includes a lens 1618 and a light emitting structure 1616. The light emitting structure 1616 may include one or more light emitting diodes (LEDs), or other light emitting components. As described herein, the light emitting structure 1616 may include a single illuminable element that produces a single illumination pattern (e.g., field of illumination) when activated. In other cases, the light emitting structure 1616 may be configured to produce multiple illumination patterns, such as by illuminating different illuminable regions of the light emitting structure 1616. Where the light emitting structure 1616 is configured to produce multiple illumination patterns, the light emitting structure may include a multi-segment LED, as described with respect to FIGS. 16A and 17A-17F. The light emitting structure 1616 may be coupled to a circuit board 1614 or other substrate.

In one example in which the flash module 1604 is incorporated into the device 100 or the device 200, the light emitting structure 1616 may include a multi-segment LED. In another example in which the flash module 1604 is incorporated into the device 140, the device 300, or the device 400, the light emitting structure 1616 may include a single-segment LED (or another light emitting component that is not configured to produce multiple different fields of illumination).

The lens 1618 is configured to project light emitted by a light emitting component of the light emitting structure 1616 to produce a flood of light corresponding to a field of view of a rear-facing camera. The lens 1618 may include a flash-directing region 1620 and a support region 1622. The flash-directing region 1620 may have a shape (e.g., a biconvex shape) that is configured to transmit, through the window portion 1624, light from the light emitting component to illuminate a field of view of the camera. The support region 1622 may be configured to structurally couple and support the lens 1618 in the flash module 1604. The lens 1618 may be formed of a single piece of material (e.g., a single piece of glass, polycarbonate, crystal, or other suitable material) that defines the flash-directing region 1620 and the support region 1622. The support region 1622 may be secured to the flash body 1606 and to the circuit board 1614 or other substrate.

With reference to FIG. 16C, the flash-directing region 1620 and the support region 1622 may each be configured to refract or otherwise direct light in a particular way. For example, the flash-directing region 1620 may be configured to illuminate a particular field of view, using light from the light emitting structure 1616, to illuminate a scene for image capture. As one example, the field of illumination may be equal to or greater than the field of view of the widest-angle camera lens of a device. In other cases, the lens is configured to produce a different field of illumination. FIG. 16C illustrates example rays 1626, 1628 from the light emitting structure 1616 passing through the flash-directing region 1620 of the lens 1618 to illuminate a scene according to a field of illumination as defined by the configuration of the light emitting structure 1616 and the flash-directing region 1620.

The support region 1622 may provide structural support for the flash-directing region 1620, supporting the flash-directing region 1620 in a particular position within the flash module and relative to the light emitting structure 1616. The support region 1622 may also be configured to have an optical effect on the appearance of the flash module 1604 from outside the device. In particular, the support region 1622 may be configured to limit the visibility of surfaces and components inside the flash module 1604. The support region 1622 may have a lensing effect such that light reflected from internal surfaces and components may be visible through the window portion 1624 of the flash module 1604. In some cases, these components or surfaces may have irregular shapes and/or contrasting colors that are visible through the lens. Accordingly, the support region 1622 may be shaped to limit the visibility of certain components and/or surfaces.

FIG. 16C illustrates example rays of light reflected from internal surfaces or components of the flash module 1604, including a ray 1630 reflected from an internal component 1621 (e.g., a circuit-board mounted component), and a ray 1632 reflected from an internal surface 1623. In some cases, the support region 1622 may be configured to eliminate or change the path of ray 1630, such that the light reflected from the internal component 1621 does not pass through the window portion 1624, and therefore is not visible to a user. For example, the support region 1622 may be configured with a shape so that support region 1622 transmits, through the window portion 1624, light reflected by the flash body 1606 (e.g., light is reflected from the internal surface 1623 such that the internal surface 1623 is seen rather than an underlying component). The light reflected by the flash body, and thus transmitted through the window portion 1624, may be reflected by an opaque portion of the flash body 1606 (e.g., the second portion 1612).

The particular paths of the rays 1630 and 1632 are merely examples to illustrate how the support region 1622 may cause visibility of certain structures and components of the flash module 1604, and are not necessarily indicative of any particular preferred optical arrangement or outcome. For example, in some cases a support region 1622 may be configured so that neither the internal component 1621 nor the internal surface 1623 are visible through the window portion 1624. As another example, a support region 1622 may be configured so that only light reflected from an internal surface 1623 is visible through the support region 1622 (e.g., thereby preventing the visibility of other internal components). In such cases, the internal surface 1623 may have a particular color or appearance (e.g., an opaque white appearance) in order to produce a target appearance from outside the device.

The support region 1622 may also include coatings, textures, films, masks, or other treatments or features that define the visual appearance of the flash module from the outside of the device. For example, the support region of the lens may define an outer surface facing the window portion 1624 of the flash body 1606 and an inner surface opposite the outer surface, and a portion of at least one of the outer surface or the inner surface may have a textured surface. The textured surface may further reduce the visibility of internal components (and/or the lens itself), such as by producing a diffuse reflection from the textured surface and/or prevent the lens from projecting the appearance of internal components. The textured surface may have a different surface texture than a surface defined by the flash-directing region of the lens (which may be polished or otherwise substantially free of surface texture).

As described above, a light emitting structure may be illuminable in multiple different illumination patterns in order to produce different fields of illumination. The different fields of illumination may correspond to or be used with different lenses (or different zoom levels of a single lens) so that the field of illumination is substantially the same as the field of view of the lens (or zoom level) being used. Stated another way, the different fields of illumination allow a single flash module to provide flash coverage for multiple lenses/cameras of differing focal length and field of view.

Figure 17A:
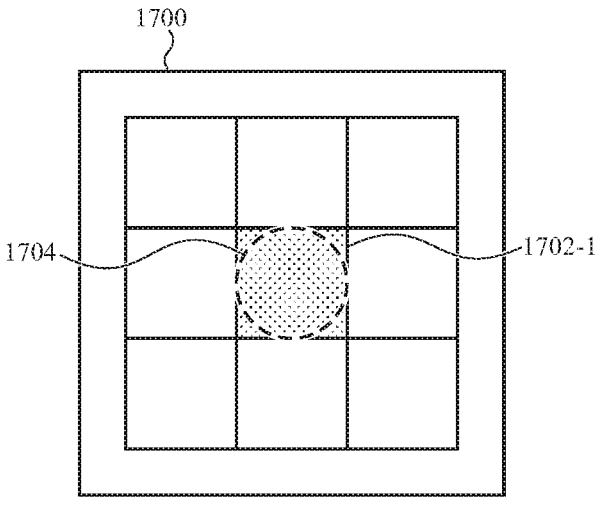
FIGS. 17A-17F depict example illumination patterns for a light emitting structure of a flash module.

FIGS. 17A-17F illustrate aspects of an example flash module 1701 with a light emitting structure that is illuminable in multiple different illumination patterns, as well as example fields of illumination resulting from the different illumination patterns. As shown in FIG. 17A, a light emitting structure 1700 may include multiple illuminable regions 1702, such as an array of illuminable regions 1702. In this example the light emitting structure 1700 includes a grid of nine square illuminable regions 1702 of equal size, though this is merely one example arrangement. In some cases, the illuminable regions 1702 have other sizes, shapes, and/or arrangements. For example, some of the illuminable regions 1702 may be rectangular, and may have a different size compared to other regions. The particular sizes, shapes, and/or arrangements of the illuminable regions 1702 may be selected in conjunction with the configuration of the flash lens in order to illuminate the target field of view (e.g., to produce the target field of illumination). In some cases, the central illuminable region 1702-1 is the largest illuminable region of the light emitting structure 1700.

The illuminable regions may each correspond to a different LED, or they may be segments of a single LED. In some cases, the illuminable regions can be separately illuminated (e.g., an LED or segment of an LED can produce or not produce light in response to an appropriate command or signal). In other cases, different illumination patterns can be produced by selectively blocking light over a single light source (e.g., with filters or other components above the light source that can be selectively switched from transparent to opaque).

FIG. 17A illustrates the light emitting structure 1700 while a central illuminable region 1702-1 is illuminated (as indicated by the stipple pattern). The area 1704 provides an illustration of a comparative area and/or outer perimeter location of the illumination pattern produced by the central illuminable region 1702-1. For example, the resulting illumination pattern is relatively small as compared to the illumination patterns as illustrated by areas 1706 and 1708 in FIGS. 17C and 17E.

Figure 17B:
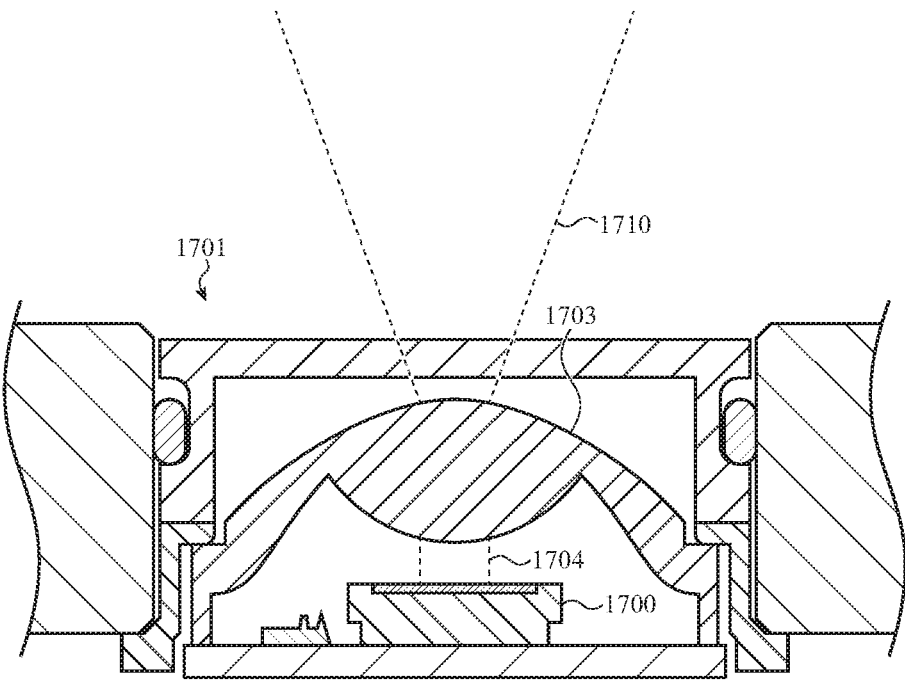

FIG. 17B illustrates an example cross-sectional view of the flash module 1701 while the central illuminable region 1702-1 is illuminated. The lens 1703 refracts the light pattern (indicated by area 1704) to produce the field of illumination 1710. In the example of FIGS. 17A-17B, the field of illumination 1710 is the smallest illumination pattern that the flash module 1701 is configured to produce. This field of illumination 1710 may be used when capturing an image with a lens having a relatively small field of view (e.g., as compared to the patterns in FIGS. 17C-17F), such as a telephoto lens. As described above, this field of illumination (e.g., the angle of the field of illumination) may also be substantially equal to or greater than the field of view of the camera with which it is used.

Figure 17C:
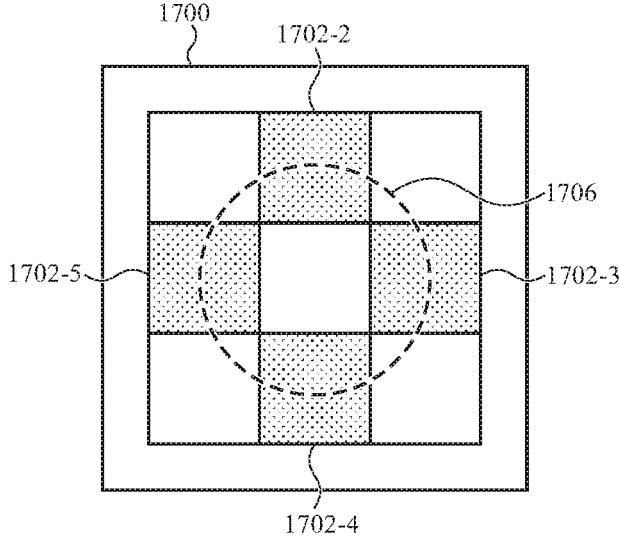
Figure 17D:
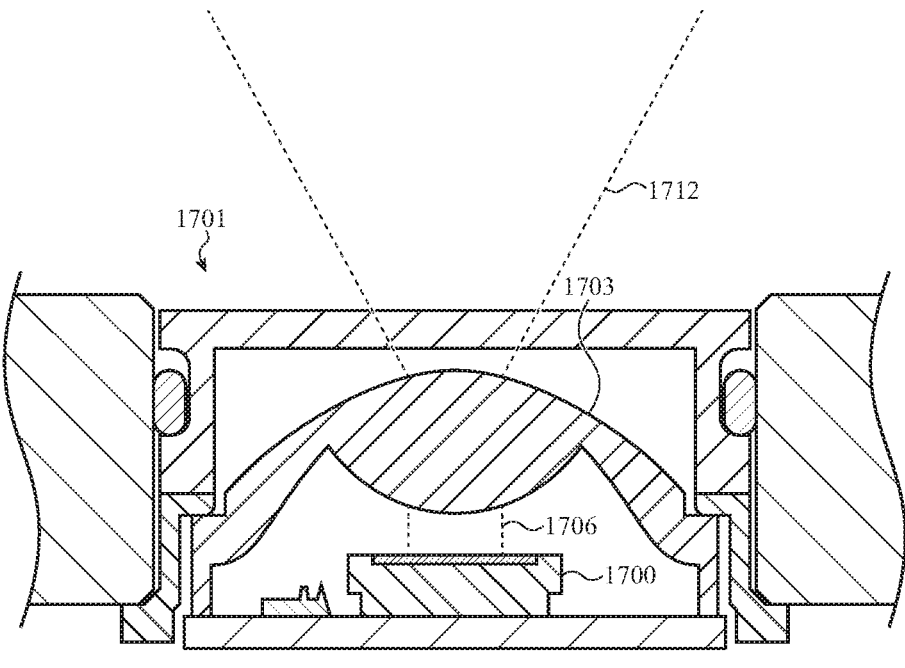

FIGS. 17C-17D illustrate the flash module 1701 when the light emitting structure 1700 is producing a second illumination pattern. In particular, as shown in FIG. 17C, illuminable regions 1702-2-1702-5 are illuminated (e.g., a first subset of the illuminable regions that are positioned about a periphery of the central illuminable region 1702-1). The area 1706 provides an illustration of a comparative size and/or outer perimeter location of the illumination pattern produced by the illuminable regions 1702-2-1702-5. For example, the resulting illumination pattern has a size (e.g., an area) that is between illumination patterns as illustrated by areas 1704 and 1708 in FIGS. 17A and 17E.

FIG. 17D illustrates an example cross-sectional view of the flash module 1701 while the illuminable regions 1702-2-1702-5 are illuminated. The lens 1703 refracts the light pattern (indicated by area 1706) to produce the field of illumination 1712. In the example of FIGS. 17C-17D, the field of illumination 1712 is the second largest illumination pattern that the flash module 1701 is configured to produce. This field of illumination 1712 may be used when capturing an image with a lens having a wider field of view than the field of illumination 1710 in FIG. 17B. For example, in a device with three cameras each having a different field of view, the field of illumination 1712 may be used when capturing an image with the lens having the middle field of view.

Figure 17E:
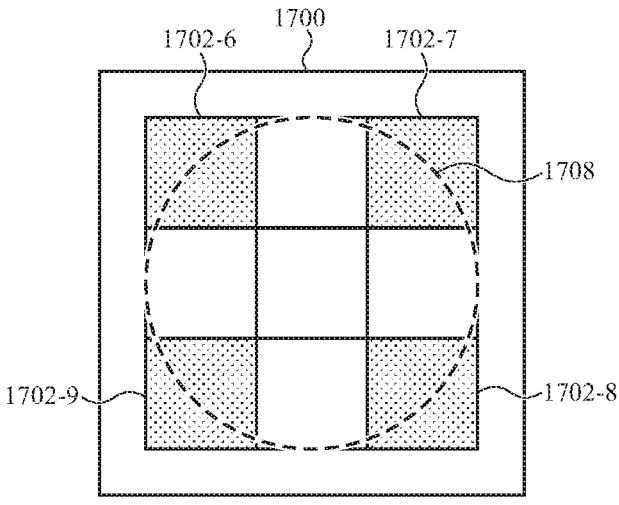
Figure 17F:
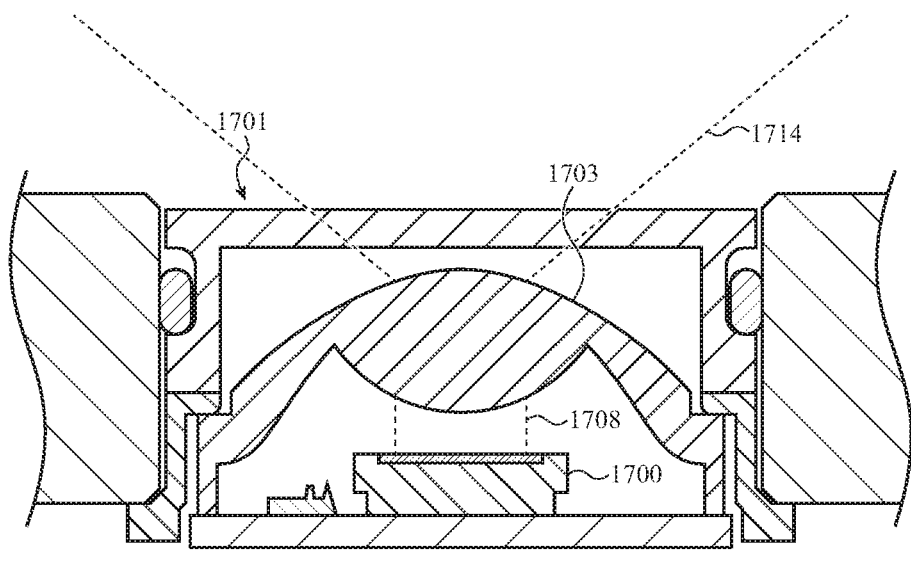

FIGS. 17E-17F illustrate the flash module 1701 when the light emitting structure 1700 is producing a third illumination pattern. In particular, as shown in FIG. 17E, illuminable regions 1702-6-1702-9 are illuminated (e.g., a second subset of the illuminable regions that are positioned about a periphery of the central illuminable region 1702-1). The area 1708 provides an illustration of a comparative size and/or outer perimeter location of the illumination pattern produced by the illuminable regions 1702-6-1702-9. For example, the resulting illumination pattern has a size (e.g., an area) that is greater than the illumination patterns illustrated by areas 1704 and 1706 in FIGS. 17A and 17C.

FIG. 17F illustrates an example cross-sectional view of the flash module 1701 while the illuminable regions 1702-6-1702-9 are illuminated. The lens 1703 refracts the light pattern (indicated by area 1708) to produce the field of illumination 1714. In the example of FIGS. 17E-17F, the field of illumination 1714 is the largest illumination pattern that the flash module 1701 is configured to produce. This field of illumination 1714 may be used when capturing an image with a lens having a wider field of view than the fields of illumination 1710 in FIG. 17B and 1712 in FIG. 17D. For example, in a device with three cameras each having a different field of view, the field of illumination 1714 may be used when capturing an image with the lens having the widest field of view.

In some cases, the light emitting structure 1700 is configured such that the illumination patterns achieve target illumination parameters. The sizes, shapes, and/or positions of the illuminable regions (and/or the particular selection of illuminable regions used to produce an illumination pattern) may be selected to produce a target intensity, illuminance, brightness, or other optical property. For example, different illuminable regions may be configured to produce a different luminous flux in order to achieve target flash performance.

Figure 18A:
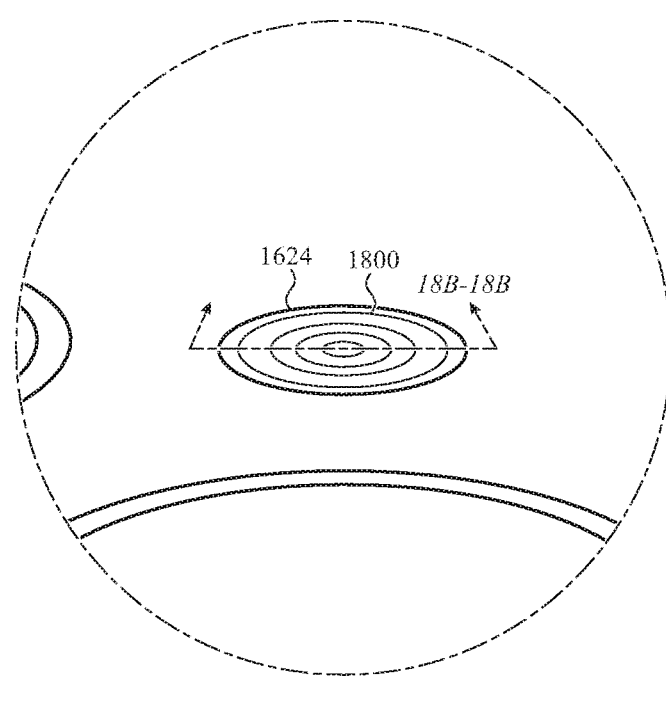
FIG. 18A depicts an example configuration of a window portion of a flash module.

FIG. 18A illustrates a perspective view of a window portion 1624 of the flash module 1604 of FIGS. 16B-16C, positioned in a rear-facing sensor region of a device. As shown, the window portion 1624 includes features 1800 that are configured to produce a pattern that is visible from the outside of the device. The features 1800, which may be or may include a series of concentric ridges, may appear similar to a Fresnel lens. However, as described herein, the features 1800 may have no or only minimal lensing effects, and may not significantly change the field of view that the flash module 1604 illuminates. For example, the field of view illuminated with the flash module with the window portion 1624 may differ from a field of view illuminated with a flash module without the window portion 1624 (or with a flat, featureless window portion) by less than about 10%, less than about 15%, or less than about 2%.

Figure 18B:
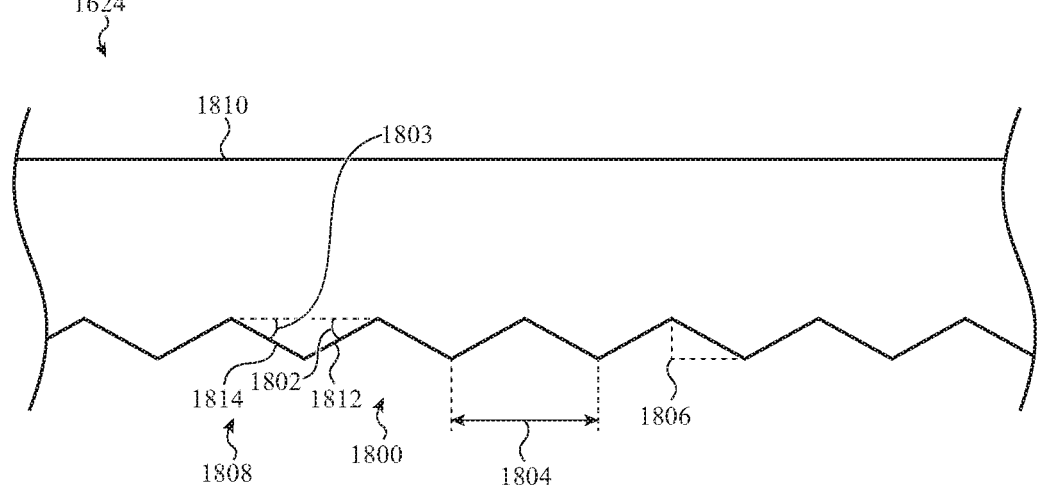
FIG. 18B depicts a partial cross-sectional view of the window portion of FIG. 18A.

FIG. 18B illustrates a partial cross-sectional view of the window portion 1624 of the flash module 1604 of FIGS. 16B-16C, viewed along line 18B-18B in FIG. 18A, for example. As described above, the window portion 1624 may include features 1800 along a bottom or interior side 1808 of the window portion 1624, the interior side 1808 opposite an exterior side 1810 (which defines part of an exterior surface of a rear-facing sensor array). The features 1800 may be configured to visually occlude the components inside the flash module 1604 without substantially changing the direction and/or angle of the field of illumination of the flash module 1604. For example, the features 1800 may be symmetrical ring-like ridges whose cumulative effect on the angle, distribution, or other property of light passing through the window portion 1624 is negligible or below a threshold amount. In some cases, the features 1800 may be configured to change the field of illumination of the light leaving the lens 1618 by less than about 10 degrees. The features 1800 may produce a pattern that is visible from the exterior side 1810 of the window portion 1624. For example, the features may include a plurality of concentric ring-like ridges, producing a pattern of concentric rings that is visible from the exterior side 1810 of the window portion 1624.

When viewed from the outside, the features 1800 may impart a Fresnel-like appearance to the window portion 1624, which produces a textured or ridged appearance to the window portion 1624 (despite the exterior side being planar) and reduces the ability to see clearly through the window portion 1624. Stated another way, the features 1800 may obscure the appearance of the inside of the flash module. However, the particular shape and configuration of the features 1800 may be specifically configured not to act as a Fresnel (or other) lens, such that the features 1800 have relatively little impact on the field of illumination, as described above.

As shown in FIG. 18B, the features 1800, which are defined by symmetrical peaks with flat sides, may have an angle 1802, height (trough-to-peak) 1806, and pitch (e.g., peak-to-peak distance) 1804. For example, each feature 1800 may be a ridge defined by a peak having a first side (e.g., side 1812) extending from the flash window at a first angle (e.g., angle 1802) and a second side (e.g., side 1814) extending from the flash window at a second angle (e.g., angle 1803), the first angle and the second angle having a same magnitude and an opposite sign. Thus, the peaks are symmetrical. The other features may have peaks with substantially equal angles (e.g., each peak may be defined by two sides extending from the flash window at the first angle and the second angle, respectively).

Each feature 1800 may be substantially identical to each other feature. In some cases, the angle 1802 may be between about 5 degrees and about 20 degrees, between about 6 degrees and about 14 degrees, or other suitable ranges. The height 1806 may be between about 0.002 mm and about 0.01 mm, between about 0.005 mm and 0.009 mm, or other suitable ranges. The pitch may be between about 0.08 mm and about 0.2 mm, between about 0.1 mm and about 0.16 mm, or other suitable ranges.

While FIGS. 18A-18B describe the window portion 1624, it will be understood that the same or similar features may be present on any flash window described herein. For example, the flash module 1701 may include the same or similar features, and thus may have the same or similar external appearance, as the flash module 1604.

Figure 19A:
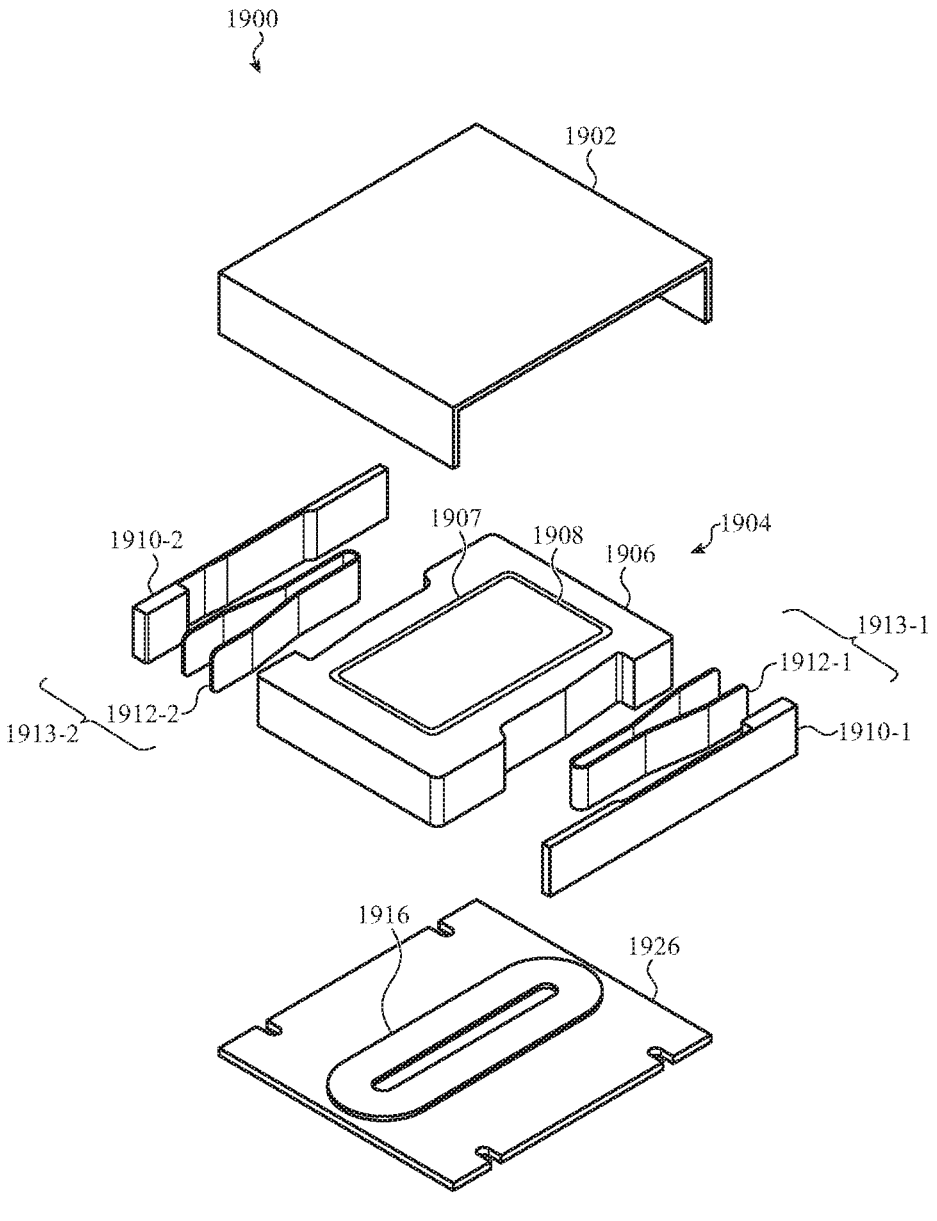
FIG. 19A depicts a partial exploded view of an example haptic engine.
Figure 19B:
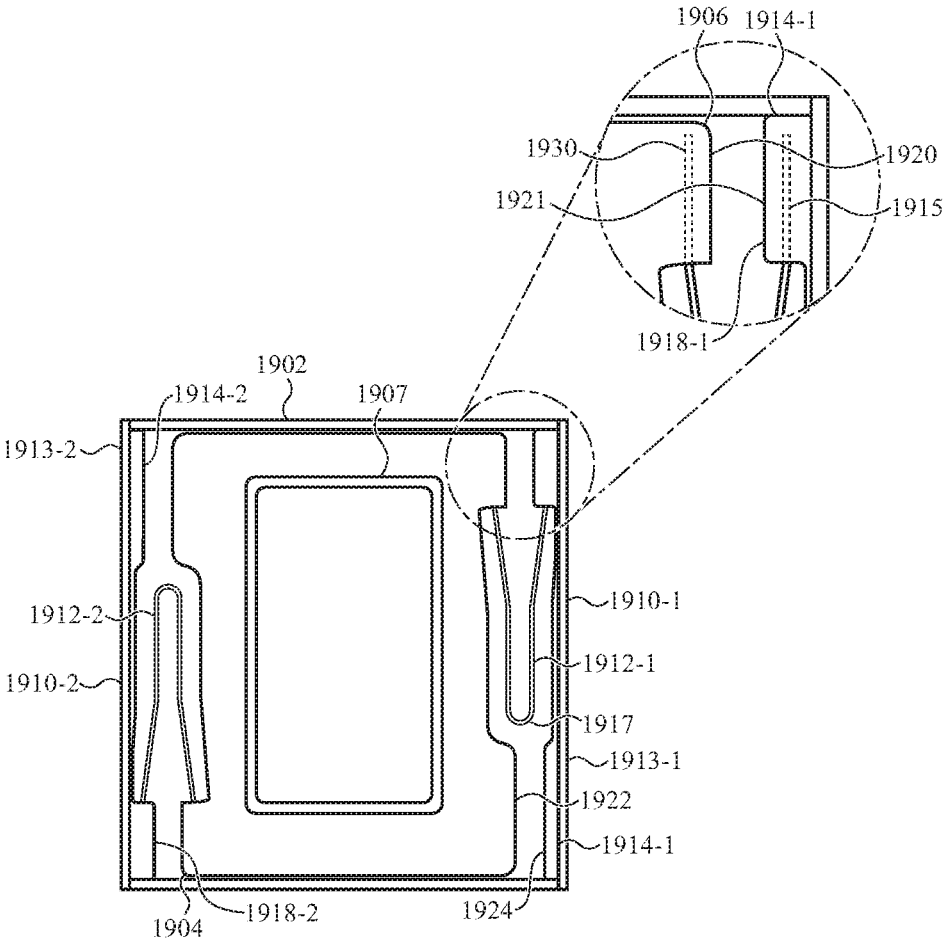
FIG. 19B depicts a top view of the haptic engine of FIG. 19A.

FIGS. 19A-19B illustrate an example haptic engine 1900 that may be used in electronic devices as described herein. The haptic engine 1900 may correspond to or be an embodiment of the haptic actuator 222, 322, or other haptic actuators described herein. The haptic engine 1900 may be positioned in an interior cavity of a device and may be configured to produce a haptic output along an exterior surface of the device in response to an actuation signal.

The haptic engine 1900 may include an integrated design in which body components that define sides of the haptic engine 1900 (e.g., exterior, structural sides) include molded elements that at least partially encapsulate, and thus mechanically couple to, spring elements (e.g., flexures) that are used to suspend or flexibly couple a movable mass within the haptic engine 1900. The movable mass may also include molded elements that at least partially encapsulate, and thus mechanically couple to, the spring elements. In this way, the mechanical coupling of the spring elements to the structural components of the haptic engine 1900 may be accomplished via mechanical overmolds, instead of welds, fasteners, or other attachment techniques. This may provide numerous advantages, including reduction of overall part count and manufacturing time and operations, as a subassembly that includes both housing components, spring elements, and the movable mass may be assembled in an insert molding process.

For example, with reference to FIGS. 19A-19B, the haptic engine 1900 may include a first body component 1913-1 defining a first side of the haptic engine. The first body component 1913-1 may include a first spring flexure 1912-1 and a first end element 1918-1 molded over a portion of the first spring flexure 1912-1 (e.g., molded over an end portion 1915 of the first spring flexure 1912-1, as shown in the detail view of FIG. 19B). The haptic engine 1900 may also include a second body component 1913-2 defining a second side of the haptic engine opposite the first side and comprising a second spring flexure 1912-2 and a second end element 1918-2 molded over a portion of the second spring flexure 1912-2 (e.g., molded over an end portion of the second spring flexure 1912-2, similar to the detail view shown in FIG. 19B). The end elements 1918 (e.g., 1918-1, 1918-2) may be part of or defined by polymer elements 1914 (e.g., 1914-1, 1914-2) that are molded over or otherwise engaged with metal wall structures 1910 (e.g., wall structures 1910-1, 1910-2). The spring flexures 1912 may be formed from metal, (e.g., they may be bent sheet-metal members), or another suitable compliant material.

The haptic engine 1900 further includes a movable mass component 1904 coupled to the first spring flexure 1912-1 and the second spring flexure 1912-2. The movable mass component 1904 may include a molded polymer frame 1906, a magnet 1908 coupled to the molded polymer frame 1906 (and configured to produce a magnetic field configured to interact with a coil to induce linear movement of the movable mass component), and optionally a metallic weight 1907 coupled to the polymer frame 1906. The haptic engine 1900 may also include a coil 1916 configured to induce a linear movement of the movable mass component 1904 in response to an actuation signal, thereby producing the haptic output. For example, when an actuation signal is provided to the coil 1916, a force may be imparted on the movable mass component 1904, which causes the movable mass component 1904 to move, thereby flexing the spring flexures 1912 (e.g., cyclically causing one flexure to compress and the other to expand). Bend portions of the spring flexures (e.g., bend portion 1917, FIG. 19B) may deform in response to the linear movement of the movable mass component 1904. The actuation signal may be provided in response to various conditions and/or events, such as detection of a touch input by the device in which the haptic engine 1900 is included.

The spring flexures 1912 may be coupled to the movable mass component 1904 and to the end elements 1918 of the body components 1913 via mechanical engagement and/or encapsulation produced by overmolding polymer materials over the end portions of the spring flexures. For example, metal wall structures 1910 of the body components, the magnet 1908 (and optionally the metallic weight 1907), and the spring flexures 1912 may be introduced into a mold cavity. One or more polymer materials may then be injected into the mold cavity, thereby causing the polymer materials to at least partially encapsulate or otherwise engage the end portions of the spring flexures 1912, the metal wall structures 1910, and the magnet 1908 (and optionally the metallic weight 1907). The polymer material that forms the polymer elements 1914 and the polymer frame 1906 may be a liquid crystal polymer material, a fiber-reinforced polymer, or the like. Further, while a single insert molding process is described above, it will be understood that multiple insert molding processes may be used, such as a first insert molding process to couple the spring flexures to the movable mass component and a second to couple the spring flexures to the metal wall structures.

The detail view of FIG. 19B illustrates an example configuration of the haptic engine 1900 after the molding process. The end element 1918-1 at least partially encapsulates (e.g., is molded over) the first end portion 1915 of the spring flexure 1912-1, and polymer frame 1906 at least partially encapsulates (e.g., is molded over) the second end portion 1930 of the spring flexure 1912-1. The encapsulation of the end portions of the spring flexures mechanically retain the spring flexures to the movable mass component 1904 and the body components 1913. Thus, a single subassembly is produced that includes two body components, spring flexures, and the movable mass, and in which the mechanical attachment of the spring flexures to the movable mass component 1904 and to the wall structures is achieved via the encapsulation of the end portions of the spring flexures in the polymer materials of the movable mass component 1904 and the body components 1913. While the detail view of FIG. 19B illustrates only one spring flexure, it will be understood that each spring flexure may have the same or similar configuration.

The polymer elements 1914 and the polymer frame 1906 may also include travel-limiting features that limit travel of the movable mass component 1904 during movement of the movable mass component 1904. For example, as shown in the detail view of FIG. 19B, the polymer element 1914-1 defines an impact surface 1921, and the polymer frame 1906 defines an impact surface 1920. The impact surfaces 1920, 1921 may be configured such that they are the surfaces of the polymer frame 1906 and the body components 1913 that are nearest to one another, such that they contact one another to limit travel of the movable mass component 1904 (if the linear motion or oscillation of the movable mass component 1904 has sufficient amplitude). Because the impact surfaces are defined by the polymer elements 1914 and the polymer frame 1906, they may be formed as flat, featureless surfaces, and if they impact one another, the force of the impact may be distributed over a relatively large area. Further, the polymer materials may produce less noise than other materials should they impact one another. By contrast, if the spring flexures were instead welded to the body components 1913 and/or the movable mass component 1904, or secured with fasteners, the weldments, fasteners, or other sharp or irregular metal components may impact each other when the movable mass component 1904 moves, which may damage the haptic engine, produce undesirable audible noise, or the like. The haptic engine 1900 may be configured so that the impact surfaces do not contact one another during normal haptic outputs. Rather, the impact surfaces may be provided to limit travel in overtravel circumstances, such as if the device is dropped or some other condition causes the movable mass component 1904 to move more than intended.

In some cases, additional impact surfaces are provided between the movable mass component 1904 and the body components 1913. For example, impact surfaces 1922, 1924 may be provided at the opposite end of the spring flexures (e.g., proximate the bend portion). The impact surfaces 1922, 1924 may be configured to contact one another at the same time that the impact surfaces 1920, 1921 contact one another, thereby preventing or inhibiting a twisting or rotating motion being imparted to the movable mass component 1904 (e.g., linear motion of the movable mass component 1904 may be maintained, even when the movable mass component 1904 is impacting the body components 1913). While polymer features that define impact surfaces are described with respect to one side of the haptic engine 1900 (e.g., proximate the first spring flexure), corresponding features and impact surfaces may be provided on both sides of the haptic engine, as depicted in FIG. 19B, such that travel may be limited in a similar manner in both directions of motion of the movable mass component 1904.

The haptic engine further includes a main body defined by a middle body component that defines a portion of four additional sides of the haptic engine 1900 and at least partially defines an interior cavity of the haptic engine 1900. The middle body component may include, for example, an upper component 1902, which may define three sides of the haptic engine 1900, and a lower component 1926, which may define one side of the haptic engine 1900. The upper component 1902 and the lower component 1926 may be welded together (or otherwise attached, such as via fasteners, adhesive, etc.) to define the main body of the haptic engine 1900. The coil 1916 may be coupled to the lower component 1926, such that it is positioned on an interior of the middle body component. In some cases, the coil 1916 may be coupled to the upper component 1902, or a second coil may be coupled to the upper component 1902.

The body components 1913 may be coupled to the middle body component to secure the components of the haptic engine 1900 and to define the external structure of the haptic engine 1900. For example, the metal wall structures of the body components 1913 may be welded to the middle body component (e.g., to at least one of the upper or lower component 1902, 1926).

Figure 20A:
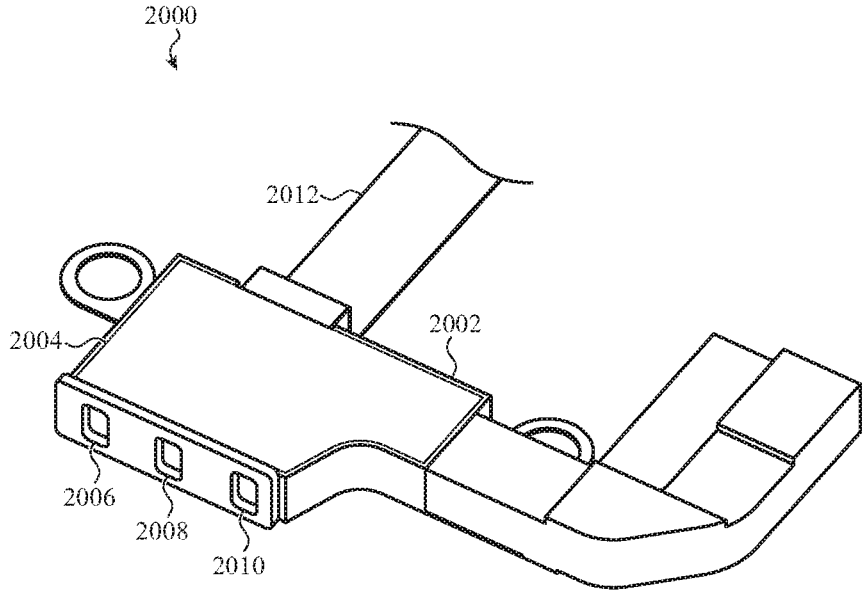
FIG. 20A depicts an example integrated module for an electronic device.
Figure 20B:
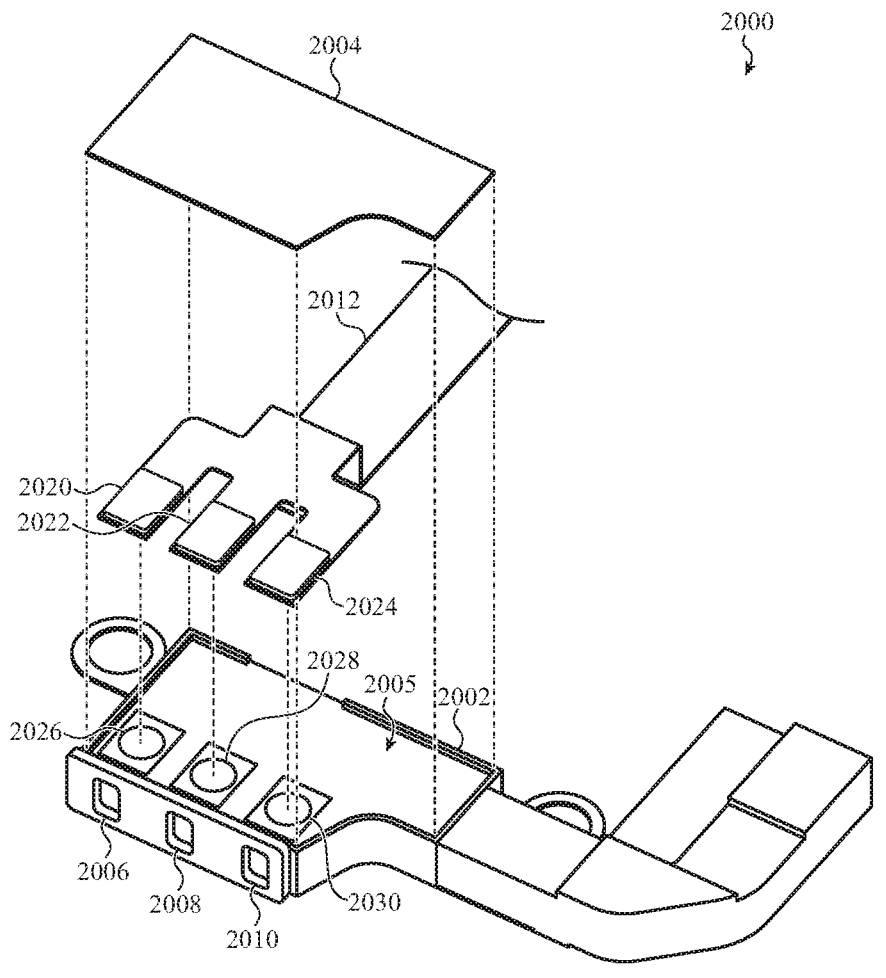
FIG. 20B depicts a partial exploded view of the integrated module of FIG. 20A.

FIGS. 20A-20B illustrate an example integrated module 2000 that may include multiple system components that share a common housing and a common electrical connection. The integrated module 2000 may improve manufacturing and assembly efficiency and reduce part count as compared to configurations in which the system components do not share a housing or electrical connection. The integrated module 2000 may be configured to house multiple components therein, such as a pressure sensor 2020, a microphone 2022, and a barometric vent 2024 (e.g., a pressure equalizing structure), though these are merely example components that may be incorporated in the integrated module 2000. The integrated module 2000 may be configured to facilitate environmental access to the exterior environment, such as via openings 2006, 2008, 2010, which may be coupled to one or more corresponding holes formed through a housing component. Thus, the integrated module 2000 may include components that rely on environmental access to the exterior environment, such as speakers, microphones, pressure sensors, temperature sensors, humidity sensors, barometric or pressure-equalizing structures, and the like.

As shown, the integrated module 2000 includes a housing base 2002 and a housing cover 2004 that define an internal cavity 2005. The components (e.g., the components 2020,

2022, 2024) may be positioned in the internal cavity, and may be at least partially enclosed in the integrated module 2000. The housing base 2002 may define openings 2006, 2008, and 2010, which may be connected via internal passages to the internal openings 2026, 2028, and 2030. Components 2020, 2022, 2024 may be coupled to a flexible circuit element 2012, and may be attached to the housing base 2002 within the internal cavity 2005 and over the internal openings 2026, 2028, and 2030, such that the components 2020, 2022, 2024 are in fluidic communication with the exterior environment through the openings 2006, 2008, 2010 and the internal openings 2026, 2028, and 2030 (and the internal passages joining them). The components 2020, 2022, 2024 (and optionally the flexible circuit element 2012) may be attached to the housing base 2002 via adhesive, such as a pressure sensitive adhesive.

As noted above, the components 2020, 2022, 2024 may be coupled to a single flexible circuit element 2012. The flexible circuit element 2012 may be coupled to another component within a device, such as a circuit board assembly, and may carry electrical signals to and from the components 2020, 2022, 2024. In some cases, the flexible circuit element 2012 may include holes providing fluidic access through the circuit element 2012 for the components 2020, 2022, 2024. In some cases, the circuit element 2012 is positioned on top of the components 2020, 2022, 2024 or otherwise does not interfere with fluidic coupling between the components 2020, 2022, 2024 and the internal passages in the housing base 2002.

The circuit element 2012 with the components 2020, 2022, 2024 attached thereto may be attached to the housing base 2002, and the housing cover 2004 may be attached to the housing base 2002, prior to final assembly of the device. Accordingly, the integrated module 2000 may be completed as a subassembly that can be integrated with the device quickly and efficiently. For example, the integrated module 2000 may be positioned in the device (e.g., such that the openings 2006, 2008, 2010 communicate with one or more openings formed through a housing component of a device) and secured to the device (e.g., with fasteners, adhesives, etc.), and the circuit element 2012 may be conductively coupled to another circuit component, such as a circuit board assembly.

Figure 20C:
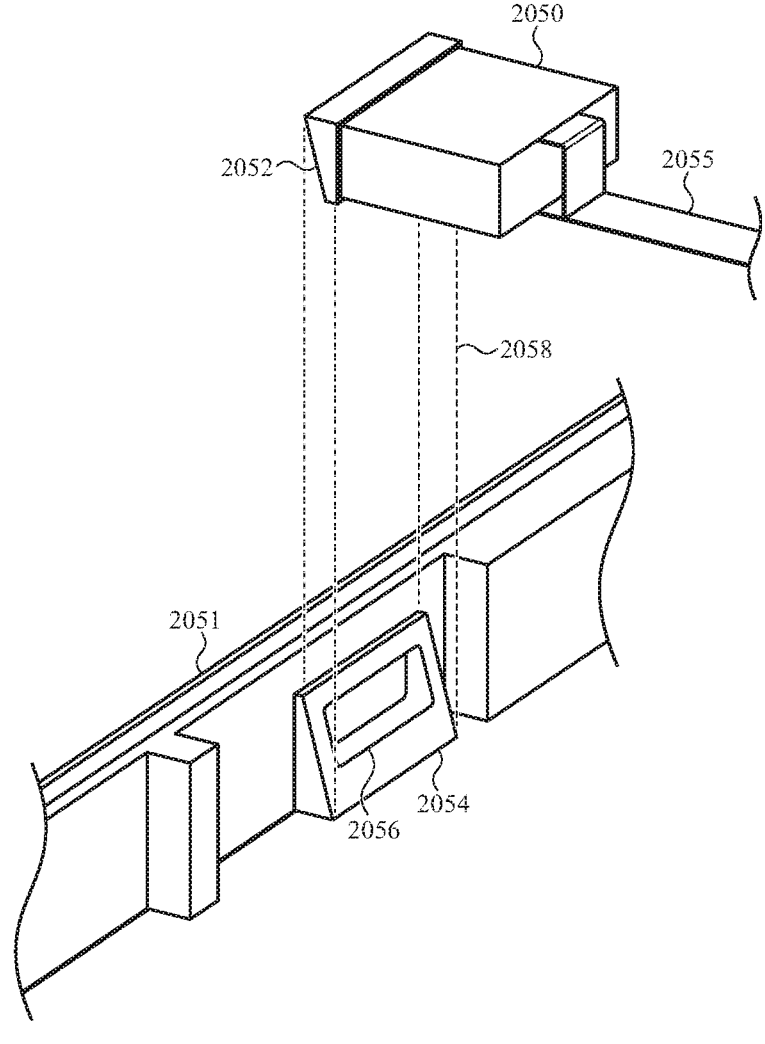
FIG. 20C depicts a partial exploded view of a device with an integrated module.

FIG. 20C illustrates an example configuration of a housing component 2051 and an integrated module 2050 (which may correspond to or be an embodiment of the integrated module 2000) that are configured for a vertical assembly technique. The integrated module 2050 may include multiple system components mounted therein, and a common flexible circuit element 2055 coupled to the multiple system components and extending from the housing. Example components that may be positioned in the integrated module 2050 include, without limitation, speakers, microphones, pressure sensors, temperature sensors, humidity sensors, barometric or pressure-equalizing structures, and the like.

The housing component 2051 may define an angled mounting structure 2054 and a hole 2056 extending through the housing component 2051 and the angled mounting structure 2054. The angled mounting structure 2054 may be unitary with the housing component 2051. For example, the angled mounting structure 2054 may be a machined, molded, or forged feature of the housing component 2051. The hole 2056 (which is shown as a single hole, but could also be multiple separate holes) may provide fluidic coupling between the exterior environment of the device and the integrated module 2050. The angled mounting structure 2054 may be configured to mate with a corresponding angled mounting structure 2052 defined by the integrated module 2050. For example, the angled mounting structure 2054 of the housing component 2051 and the angled mounting structure 2052 of the integrated module 2050 may have complementary angles that allow the angled mounting structures to mate to one another when the integrated module 2050 is moved along a single direction 2058 into the device. Stated another way, the integrated module 2050 can be placed in the device into its final position with a motion along a single direction (e.g., vertically), and the placement will result in the angled mounting structure 2052 intimately mating (e.g., along a single plane) to the angled mounting structure 2054. Further, a force associated with placing the integrated module 2050 in the device along the direction 2058 (and/or a retention force on the integrated module 2050 such as provided by a fastener that secures the integrated module 2050 to the device housing) may provide a sealing force between the angled mounting structures. For example, a vertical retention force applied to the integrated module 2050 will also produce a sealing force (e.g., pressing the angled mounting structures together in a horizontal direction) on the faces of the angled mounting structures. By contrast, if the mounting faces were vertically oriented, a vertical retention force would not provide a sealing force in a horizontal or perpendicular direction.

In some cases, a gasket or seal material (e.g., a compliant foam) may be positioned between the surfaces of the angled mounting structures to seal the fluidic passage defined through the housing component 2051 and the integrated module 2050. Additionally or alternatively, one or more adhesives (e.g., PSA, HSA, liquid-dispensed adhesive, etc.) may be provided between the surfaces of the angled mounting structure and/or any gasket or sealing materials.

In order to prevent or limit damage to the front cover of mobile devices, such as mobile phones and tablet computers, screen cover accessories may be attached to the front (and optionally rear) covers of such devices. Screen covers, which may also be referred to as screen protectors, may also be used to provide optical functionality, such as to reduce the viewing angle of the screen (e.g., for privacy and/or security), to add a textured or matte surface (e.g., to reduce glare) or the like.

Screen covers may be formed from or include glass or polymer sheets (which may be transparent or optically transmissive), and optionally one or more coatings, textures, or treatments, that overlie the front cover. As described herein, devices may include front-facing sensor arrays that include optical components that emit and/or receive light through the front cover of a device. For example, front-facing cameras capture images using light received through the front cover, and a facial recognition system may emit light (e.g., a pattern of dots and/or a flood of illumination) through the front cover, and receive portions of the emitted light that is reflected from the face of a user. In some cases, a screen cover may define cutouts or holes over the locations of front-facing sensors, or may be shaped or otherwise configured so that they do not cover some or all of the front-facing sensors of a device, such that the screen cover and/or coatings, textures, adhesives of the screen cover do not optically interfere with the front-facing sensors.

As described herein, a front-facing sensor region may be positioned within an active display region of a display, such that the front-facing sensor region is completely surrounded on all sides by active display regions (e.g., graphical outputs on the display, such as a user interface, may completely surround the front-facing sensor region). Additionally, the device may be able to detect touch inputs applied to the front-facing sensor region, despite the front-facing sensor region lacking full coverage of touch-sensing components. Accordingly, it may be inconvenient to use a screen cover that has a hole or opening for the front-facing sensor region. For example, a hole may introduce a recess around or near the front-facing sensor region, which may interfere with the way touch inputs are detected and/or how a user's finger contacts the front-facing sensor region when providing a touch input. Additionally, a hole in the screen cover may negatively affect the perception of the front-facing sensor region as an area of the display with which a user can interact (e.g., it may reduce the likelihood that a user will recognize the front-facing sensor region as a supplemental input region of the device).

Figure 21A:
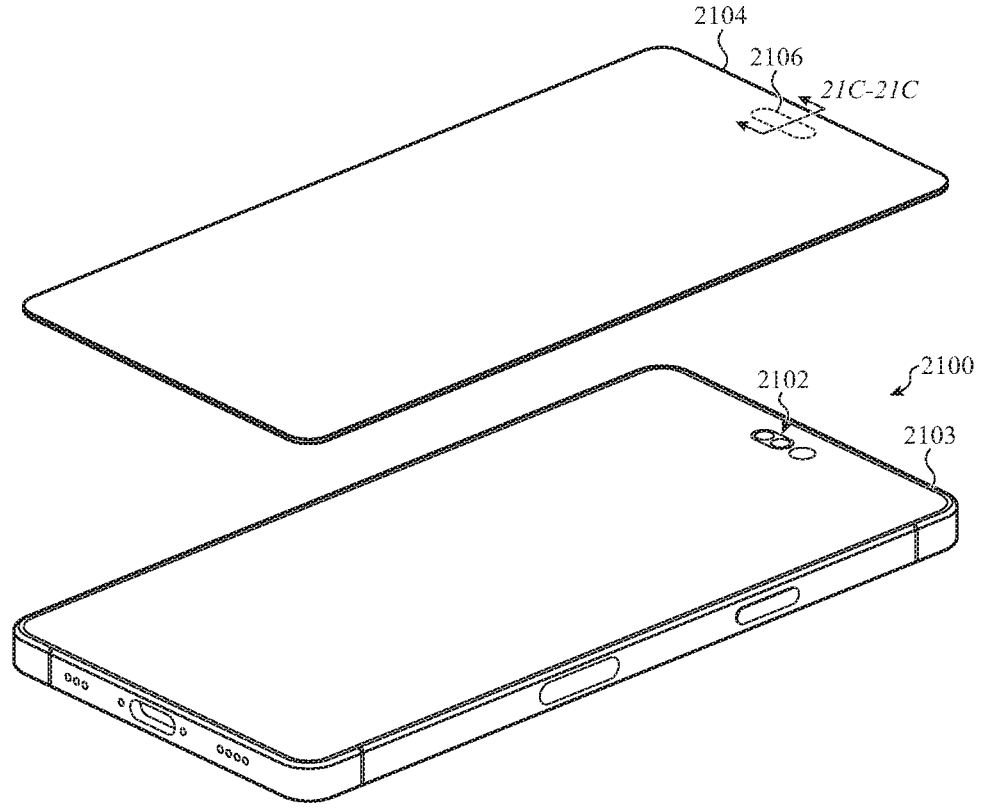
FIG. 21A depicts a partial exploded view of a device with a screen cover.

FIG. 21A illustrates an example device 2100 and a screen cover 2104 for use with the device 2100. The device 2100 may correspond to or be an embodiment of the device 100, 140, 200, 300, 400, or any other device described herein. The device 2100 may include a front cover 2103 (which may correspond to or be an embodiment of the front covers 102, 202, 302, or any other front covers described herein), and a front-facing sensor region 2102 (which may correspond to or be an embodiment of the front-facing sensor region 111, 113, 1002, 1211, 1221, 1231, or any other front-facing sensor region described herein).

The screen cover 2104 may be configured to be positioned on the front cover 2103, and may be attached to the front cover 2103 via adhesive (e.g., a PSA or adhesive film), electrostatic bonds, or the like. The screen cover 2104 may define a window region 2106 that is configured to be positioned over or otherwise aligned with the front-facing sensor region 2102 and which may differ from the surrounding regions of the screen cover 2104 in one or more ways. For example, as described herein, the window region 2106 may correspond to a hole in an optical coating, texture, adhesive, or other layer of the screen cover 2104 that might otherwise interfere with the front-facing sensor region 2102. The window region 2106 thus allows the screen cover 2104 to extend over the front-facing sensor region (e.g., instead of forming a hole through the front-facing sensor region), while also reducing or eliminating effects on the operation of the front-facing sensor array.

Figure 21B:
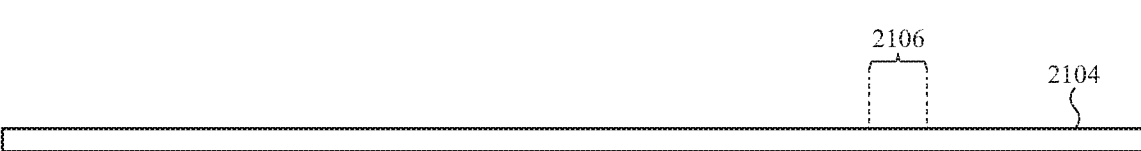
FIG. 21B depicts a side view of an example screen cover.
Figure 21C:
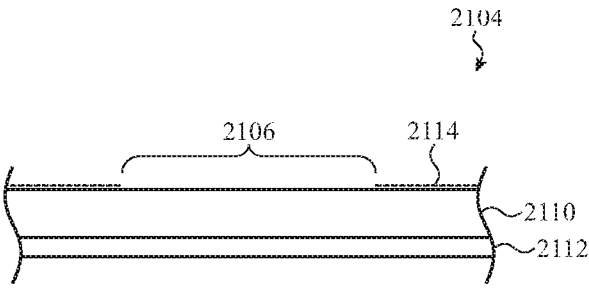
FIGS. 21C-21D depict partial cross-sectional views of example screen protectors.

FIG. 21B is a side view of the screen cover 2104, illustrating the location of the window region 2106. FIG. 21C is a cross-sectional view of an example of the screen cover 2104, viewed along line 21C-21C in FIG. 21A, in which a top or exterior side of the screen cover 2104 includes a feature layer 2114. The screen cover 2104 also includes a substrate 2110, and an optional adhesive 2112. The substrate may be formed from or include a glass material. The glass material may be a silica-based glass material, an aluminosilicate glass, a boroaluminosilicate glass, an alkali metal aluminosilicate glass (e.g., a lithium aluminosilicate glass), or a chemically strengthened glass. Other example materials for the cover 102 include, without limitation, sapphire, ceramic, glass-ceramic, crystallizable glass materials, or plastic (e.g., polycarbonate). In some cases the substrate is a single monolithic piece of material, and in other cases it may have multiple layers. The adhesive 2112 may be an optically clear adhesive, and may be configured to retain the screen cover 2104 to a front cover of a device. In some cases, the adhesive 2112, the substrate 2110, and/or the feature layer 2114 may have substantially similar indices of refraction.

The feature layer 2114 may be a coating, texture, layer, film, or other material or treatment, and may be configured to define a function or property of the screen cover 2104. For example, the feature layer may be an anti-glare layer configured to reduce glare from the front of the screen cover. As another example, the feature layer may be an anti-reflective layer configured to improve light transmission through the screen cover 2104 and/or the front cover 2103. As another example, the feature layer may be a privacy layer configured to reduce the viewing angle of the display (e.g., so only individuals directly in front of the screen can view the graphical output). As yet another example, the feature layer may be a surface texture that is configured to reduce friction along and/or specular reflections from the front surface of the screen cover 2104. The feature layer 2114 may also have functions, or combinations of functions, instead of or in addition to those described here.

Feature layers 2114 may take various different forms. Feature layers 2114 may be formed in or part of the substrate 2110, or they may be coatings, films, or other materials that are attached to a surface of the screen cover 2104. For example, the feature layer 2114 may include one or more layers of polymer material, such as polarizer films or louvered films (e.g., light control films). As another example, the feature layer 2114 may be one or more deposited coatings, such as a PVD layer or CVD layer. As yet another example, the feature layer 2114 may be a texture formed into the surface of the substrate via machining, etching (e.g., chemical, plasma, laser), abrasive blasting, or the like.

Figure 21D:
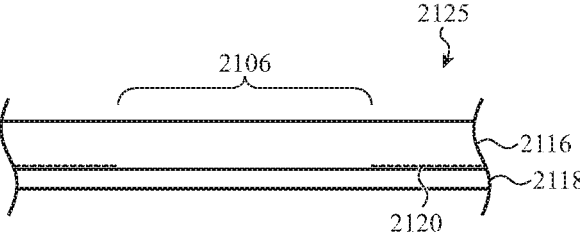

FIG. 21D illustrates a cross-sectional view of another example of a screen cover 2125, viewed along a line corresponding to the line 21C-21C in FIG. 21A, in which a bottom or interior side of the screen cover 2125 includes a feature layer 2120. The screen cover 2125 includes a substrate 2116, which may correspond to or be an embodiment of the substrate 2110 in FIG. 21C, and an adhesive 2118, which may correspond to or be an embodiment of the adhesive 2112 in FIG. 21C. The substrate, optional adhesive, and feature layer of FIG. 21D may be the same as or similar to those discussed with respect to FIG. 21C, and as such a redundant description of those components and their examples is omitted for clarity. While the feature layer 2120 is shown along the bottom surface of the substrate 2116, the feature layer 2120 may instead be part of or incorporated in the adhesive 2118.

As shown in both FIGS. 21C and 21D, an opening may be formed in the feature layers 2114, 2120 to define the window region 2106. Thus, any optical effects of the feature layers 2114, 2120 are not present in the window region 2106 and will not interfere with the operation of the front-facing sensor region. As an example, a screen cover adapted for screen privacy may include a feature layer that includes or defines louvers that limit or reduce the maximum viewing angle of the screen, and may interfere with the operation of optical sensors such as cameras and facial recognition systems. Accordingly, the openings or discontinuities in the feature layers (which define the window region 2106) define an area where the louvers are not present, such that the operation of the optical sensors is not impacted. The window region 2106 provides analogous advantages for other types of feature layers as well. For example, the window region 2106 may define a region where a surface texture is not present, or where an anti-reflective and/or anti-glare coating is not present. Notably, in all cases, the window region 2106 does not include a hole through the substate, such that the substate of the screen cover still extends over the front-facing sensor region, thereby providing protection to the front-facing sensor region without producing a recess or surface irregularity that may negatively impact the function of the front-facing sensor region (e.g., by hindering the operation of the touch-sensing functions).

In some cases, the presence of a screen cover on a display may change or affect the electrical properties that are detected as part of detecting touch inputs on the front cover and/or in the front-facing sensor region. In some cases, a different touch sensing algorithm may be more effective at detecting touch inputs (e.g., to the front-facing sensor region) based on whether or not a screen cover is in use. Accordingly, the device may include a screen cover sensor (e.g., an optical sensor, electrostatic sensor, capacitive sensor, etc.) that can determine whether a screen cover is in use. If the device detects that a screen cover is not in use, it may use a first touch sensing algorithm or process for detecting touch inputs applied to the cover and/or the front-facing sensor region, and if the device detects that a screen cover is in use, it may use a second (e.g., different) touch sensing algorithm or process for detecting touch inputs applied to the cover and/or the front-facing sensor region.

As described herein, the ability to remove and/or dissipate heat from heat-generating components in a device may provide numerous advantages, such as facilitating faster processing speeds, more powerful electrical components, greater throughput, and lower operating temperatures. As described herein, circuit board assemblies may include processors and other heat generating components. Accordingly, heat removal and dissipation from circuit board assemblies may have a significant positive impact on the operation of the system.

Figure 22A:
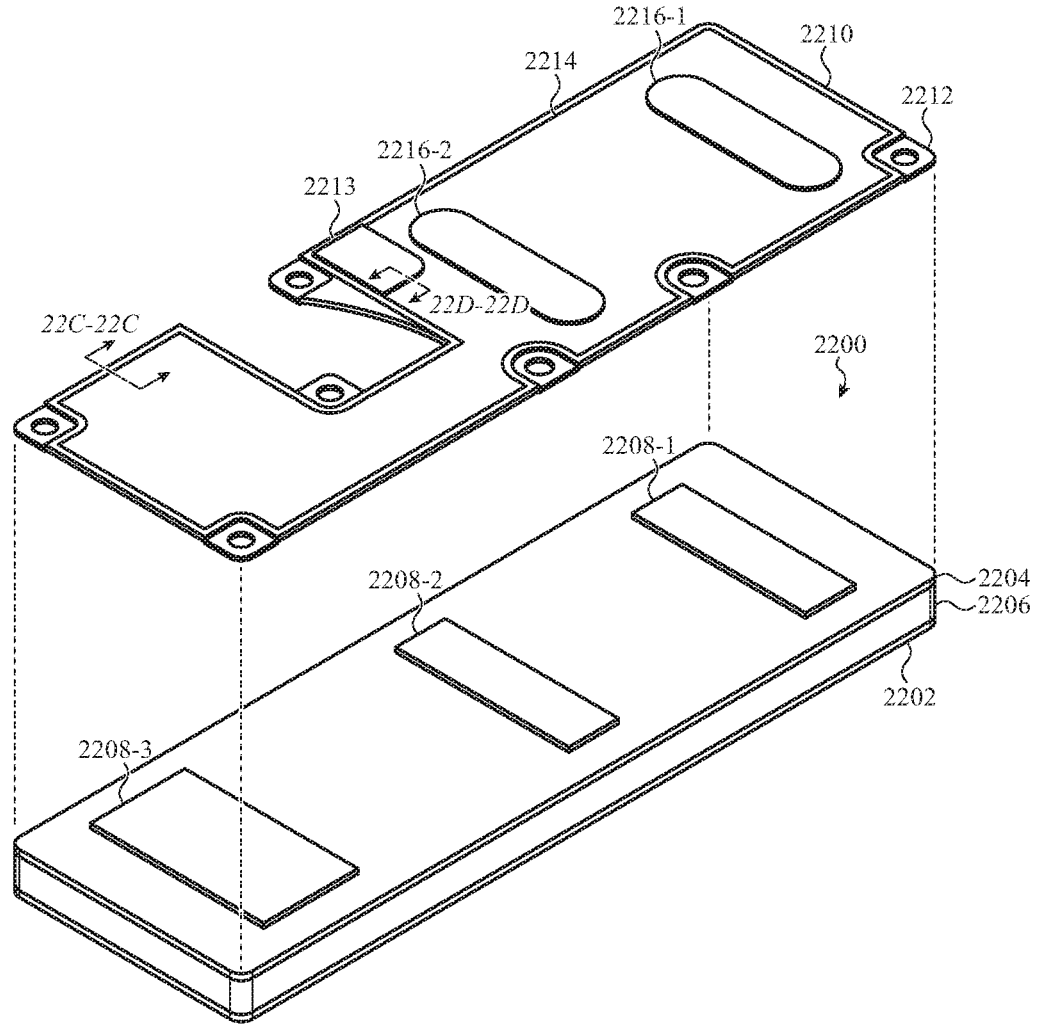
FIG. 22A depicts a partial exploded view of an example circuit board assembly.
Figure 22B:
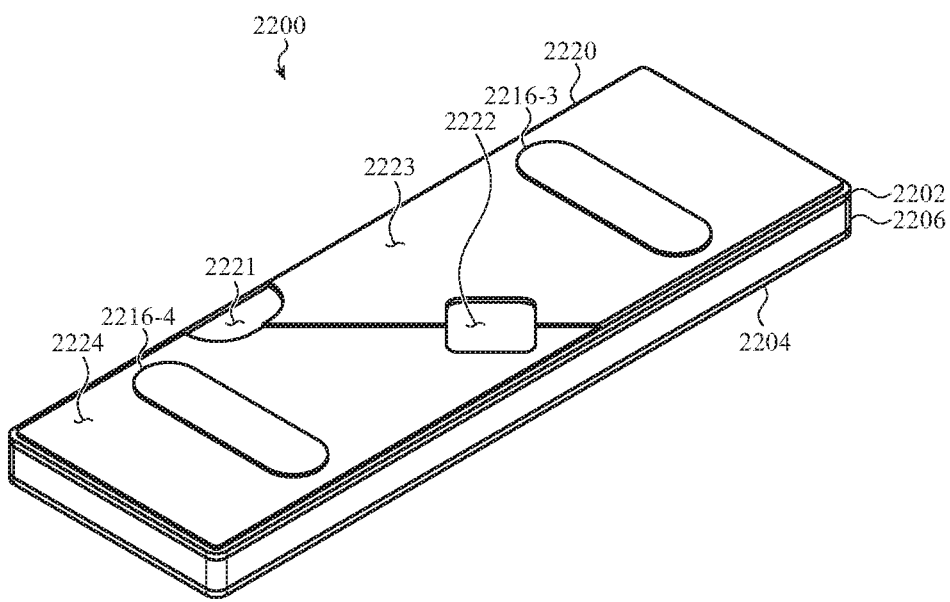
FIG. 22B depicts a bottom side view of the circuit board assembly of FIG. 22A.
Figure 22C:
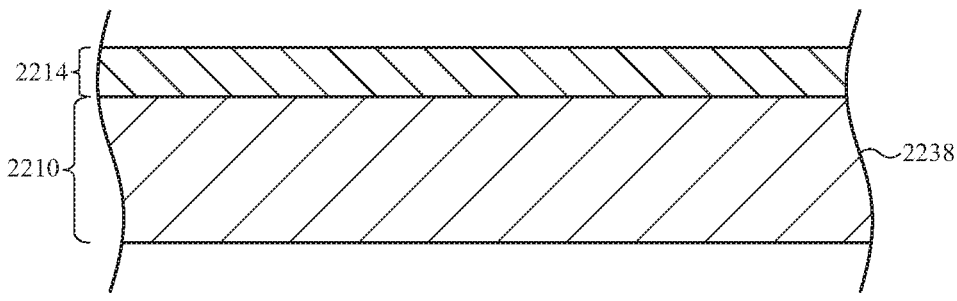
FIGS. 22C-22D depict partial cross-sectional views of a cowling for a circuit board assembly.

FIGS. 22A-22C illustrate an example circuit board assembly 2200. The circuit board assembly 2200 may correspond to or be an embodiment of the circuit board assembly 2200, or other circuit board assemblies described herein. The circuit board assembly 2200 may include a first substrate 2202 (e.g., a first circuit board), a second substrate 2204 (e.g., a second circuit board), and a wall structure 2206. An internal cavity may be defined between the first substrate 2202, second substrate 2204, and wall structure 2206, and circuit components such as processors and other electronic components may be positioned in the internal cavity (e.g., coupled to one or both of the first substrate 2202 and the second substrate 2204).

In some cases, processors and other electronic and/or circuit components may also be coupled to the external surfaces of one or both of the first and second substrates 2202, 2204. For example, as shown in FIG. 22A, components 2208 (e.g., 2208-1, 2208-2, and 2208-3) may be positioned on the exterior surface of the second substrate 2204. The components 2208 may be processors, integrated circuits, system-on-chips, or the like, which may generate heat during device operation.

A cowling 2210 may be positioned over (e.g., cover) the components 2208 to protect, shield, and/or otherwise enclose the components. The cowling 2210 may also conduct heat away from the components 2208 and optionally into another component or structure of the device. The cowling 2210 may cover substantially an entire top surface of the circuit board assembly (e.g., greater than about 90% of the top surface of the circuit board assembly and/or a circuit board thereof). In some cases, the cowling 2210 may cover more than about 80% of the top surface of the circuit board assembly and/or a circuit board thereof.

In order to achieve the mechanical, electrical, and/or thermal functions of the cowling 2210, the cowling 2210 may be formed from a metal material. Metals may provide good mechanical protection and thermal conductivity, but they may also be heavy relative to other materials. In order to achieve the mechanical, electrical, weight, and/or thermal targets for a particular device, the cowling 2210 may be formed from an aluminum alloy. The aluminum alloy may provide high thermal conductivity and mechanical strength, while also having a low weight (as compared to other metals, such as steel).

The cowling 2210 may be configured to cover substantially an entire surface of the second substrate 2204, and cover all or substantially all of the components 2208 positioned on the exterior of the second substrate 2204. In some cases, the cowling 2210 covers all processors that are positioned on the exterior of the second substrate 2204, as these may be the components that generate the most heat and/or most benefit from mechanical and/or electrical shielding provided by the cowling 2210.

In some cases the cowling 2210 is formed from or includes a 7000 series aluminum alloy, such as a 7475 series aluminum alloy. In some cases, the cowling 2210 is formed from or includes a 5000 series aluminum alloy, a 6000 series aluminum alloy, or another aluminum alloy. Other metals or thermally conductive materials may also be used, such as stainless steel, titanium, carbon fiber, or the like.

The cowling 2210 may be formed from a sheet of metal (e.g., 7475 aluminum) having a substantially uniform thickness. For example, the thickness of the sheet of aluminum from which the cowling 2210 is formed may deviate by less than about 10%, less than about 5%, or less than about 2.5%. The cowling 2210 may therefore have substantially the same thickness (e.g., a substantially uniform thickness) as the sheet, except where the cowling 2210 is optionally locally thinned (e.g., via chemical etching, machining, etc.), or where a forming operation (e.g., bending the metal sheet to form raised portions, fastening flanges, etc.) causes local deviations to the thickness of the material.

In some cases, the sheet from which the cowling 2210 is formed (and thus the cowling 2210) may have a thickness between about 0.25 mm and about 0.35 mm, between about 0.2 mm and about 0.32 mm, or another suitable thickness. The thickness of the sheet from which the cowling 2210 is formed (and thus the thickness of the cowling 2210) may be less than about 0.5 mm, less than about 0.4 mm, less than about 0.35 mm, or another suitable thickness.

The cowling 2210 may be shaped to define different features, such as fastening flanges 2212, raised portions 2213, or the like. In some cases, such features may be formed by a stamping process, which may introduce bends into the material of the cowling 2210. In some cases, the bend segments (e.g., portions of the cowling 2210 that are bent to define features of the cowling 2210) have bend radii that are greater than a minimum bend radius, which may help prevent cracking or breaking at or near the bends during forming and/or use of the cowling 2210. In some cases, the minimum bend radius is between about 0.3 mm and about 0.7 mm, or between about 0.4 mm and about 1.0 mm. In some cases, the bend radius is greater than about 0.4 mm, greater than about 0.5 mm, greater than about 0.75 mm, or another suitable dimension.

A thermally conductive structure, such as a first graphite structure 2214 may be positioned on the cowling 2210. The first graphite structure 2214 may be adhered to the cowling 2210. The first graphite structure 2214 may have a high thermal conductivity, and may aid in extracting, dissipating, and/or otherwise removing heat from the cowling and the underlying electrical components. For example, a processor positioned under a cowling may result in uneven heating of the cowling (e.g., the area of the cowling directly above and/or in contact with the processor may become hotter than surrounding areas). The first graphite structure 2214 may distribute the heat of the cowling more evenly over the full area of the first graphite structure 2214. This may help dissipate the heat from the cowling, and may also lower peak temperatures along the first graphite structure 2214. More particularly, the high thermal conductivity of the first graphite structure 2214 may help produce a more even surface temperature along the surfaces of the first graphite structure 2214, as compared to a cowling without a thermally conductive layer.

The first graphite structure 2214 may be formed from a single layer of graphite, or multiple layers of graphite (e.g., synthetic graphite). The multiple layers of graphite may be coupled together with adhesive. In cases where the first graphite structure 2214 is formed from multiple layers of graphite, the structure may have different thicknesses in different regions, formed by different numbers of layers of graphite.

The circuit board assembly 2200 may also include thermal bridges 2216 (e.g., 2216-1, 2216-2). The thermal bridges 2216 may include a compliant structure, such as a foam, wrapped with a thermally conductive layer, such as a graphite layer. The foam, or other suitable compliant member or material, may provide compliance (e.g., allowing the thermal bridges to deform between two structures) while also providing a return force that forces the thermal bridge into contact with the structures. The thermally conductive layer may be looped around the compliant structure or otherwise make physical contact with the structures that are to be thermally coupled. The thermal bridges 2216 may contact the first graphite structure 2214, as shown, and also contact another structure of the device to conduct heat from the cowling 2210 to the other structures. For example, the thermal bridges 2216 may be positioned on the side of the circuit board assembly 2200 that faces a front-cover assembly (e.g., the front-cover assembly 201 in FIG. 2). In such case, the thermal bridges 2216 may contact the front cover assembly (e.g., a graphite layer of the front cover assembly), thereby forming a thermal path from the cowling 2210 to the front cover assembly, via the first graphite structure 2214 and the thermal bridges 2216.

The thermal dissipation structures of the circuit board assembly, including the cowling 2210, the first graphite structure 2214, and the thermal bridges 2216 may dissipate heat from the circuit board assembly 2200 at a target rate. As described herein, greater heat dissipation from the circuit board assembly 2200 may allow higher processing speeds, higher processing efficiencies, lower component temperature, and other advantages. In some cases, the thermal dissipation structures (e.g., the cowling 2210, the first graphite structure 2214, and the thermal bridges 2216) dissipate heat at a rate between about 1000 milliwatts and about 3000 milliwatts, or between about 2500 milliwatts and about 3200 milliwatts, or between about 2650 milliwatts and about 3000 milliwatts. Thermal dissipation from the thermal dissipation structures includes heat transfer via conduction, radiation, and/or convection.

FIG. 22B illustrates a second side of the circuit board assembly 2200. The second side of the circuit board assembly 2200 may face the main housing structure of a device. A second thermally conductive structure, such as a second graphite structure 2220, may be positioned along the exterior surface of the first substrate 2202. The second graphite structure 2220 may have a non-planar exterior surface to accommodate the shape of the underlying structure and/or internal components to which the circuit board assembly 2200 may be coupled. In some cases, the topology of the second graphite structure 2220 conforms to the topology of the structure and/or components that underlie the circuit board assembly 2200 (e.g., that the second graphite structure 2220 is positioned against). In some cases, the circuit board assembly 2200 may include thermal bridges 2216 (e.g., 2216-3, 2216-4) positioned on the second side of the circuit board assembly. The thermal bridges 2216-3, 2216-4 may include a compliant structure, such as a foam, wrapped with a thermally conductive layer, such as a graphite layer. The foam, or other suitable compliant member or material, may provide compliance (e.g., allowing the thermal bridges to deform between two structures) while also providing a return force that forces the thermal bridge into contact with the structures. The thermally conductive layer may be looped around the compliant structure or otherwise make physical contact with the structures that are to be thermally coupled. The thermal bridges 2216 may contact the second graphite structure 2220, as shown, and also contact another structure of the device (e.g., an internal structure of a device) to conduct heat from the circuit board assembly 2200 to the other structures.

FIG. 22B illustrates one example configuration of the second graphite structure 2220 having different regions of different thicknesses, and thus different elevations or heights. For example, the regions 2221 and 2222 of the second graphite structure 2220 may have the lowest thickness, and thus define the lowest surface height of the second graphite structure 2220. The region 2224 may have a greater thickness than the regions 2221, 2222, and thus define a higher surface height of the second graphite structure 2220. The region 2223 may have the greatest thickness, and thus define the highest surface height of the second graphite structure 2220. As shown, the different thicknesses and heights may define recesses and protrusions, which may accommodate and/or generally conform to the heights of the structures and components to which the circuit board assembly 2200 is coupled.

As described above, the differences in thickness of the second graphite structure 2220 that result in the different surface heights (e.g., the recesses and protrusions of the graphite structure) may be formed by applying different numbers of graphite layers in different locations. Thus, while each individual layer of graphite (e.g., synthetic graphite) may be substantially uniform in thickness (e.g., between about 10 microns and about 20 microns), the use of different numbers of layers (and differently shaped layers) in different locations produces the desired topology for the second graphite structure 2220.

The second graphite structure 2220 may be configured to conduct or otherwise transfer heat from the circuit board assembly 2200 to other structures, components, or assemblies of the device. For example, the circuit board assembly 2200 may be coupled to a housing 210 (FIG. 2) such that the second graphite structure 2220 faces and/or contacts one or more components of the housing 210 (e.g., the support structure 219). The second graphite structure 2220 may transfer heat from the circuit board assembly 2200 to the support structure 219. In some cases, the second graphite structure 2220 dissipates heat at a rate between about 1000 milliwatts and about 2000 milliwatts, or between about 1500 milliwatts and about 4000 milliwatts. Thermal dissipation from the second graphite structure 2220 includes heat transfer via conduction, radiation, and/or convection. In some cases, the total thermal dissipation from the circuit board assembly 2200 includes thermal dissipation achieved with the second graphite structure 2220, the cowling 2210, the first graphite structure 2214, and the thermal bridges 2216.

The total thermal dissipation from the circuit board assembly 2200 may be between about 2000 milliwatts and about 5000 milliwatts, or between about 2500 milliwatts and about 3200 milliwatts.

FIG. 22C is a partial cross-sectional view of the cowling 2210 and the first graphite structure 2214, viewed along line 22C-22C in FIG. 22A. For example, the cowling 2210 may include an aluminum base structure 2238, which may be formed from a 7475 aluminum alloy, or another suitable aluminum alloy. The aluminum base structure 2238 may have a thickness between about 0.2 mm and about 0.3 mm. The thickness of the aluminum base structure may be less than about 0.5 mm, less than about 0.4 mm, less than about 0.3 mm, or another suitable thickness. The first graphite structure 2214 may include one or multiple layers of graphite. Where the first graphite structure 2214 includes multiple layers of graphite, the first graphite structure 2214 may include layers of adhesive, which couple the layers of graphite together and optionally couple the first graphite structure 2214 to the aluminum base structure 2238. One or more additional layers and/or materials may be positioned between the aluminum base structure 2238 and the first graphite structure 2214.

Figure 22D:
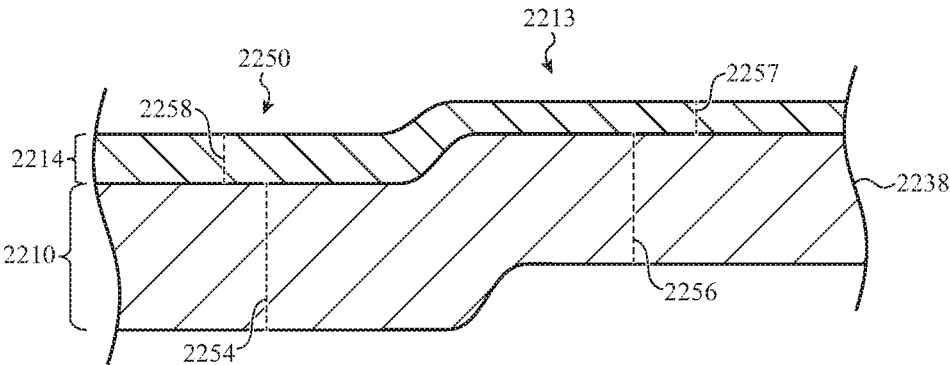

FIG. 22D is a partial cross-sectional view of the cowling 2210 and graphite structure 2214, viewed along line 22D-22D in FIG. 22A. FIG. 22D illustrates an example cross-section showing the cowling 2210 through the raised portion 2213 of the cowling and an adjacent portion 2250 (e.g., a main portion) of the cowling 2210. The raised portion 2213 of the cowling defines a protrusion along the upper surface, and a corresponding recess along the lower surface. The raised portion 2213 of the cowling may be formed by a stamping, forging, or other operation. As noted above, the raised portion 2213 may be provided in order to provide greater clearance under the cowling 2210, such as to accommodate a taller component (e.g., a circuit component) in the space below the cowling 2210.

In some cases, the cowling 2210 may have a different thickness in the raised portion 2213 than in other regions of the cowling 2210 (e.g., in the adjacent portion 2250). The difference in thickness may be produced by a thickness reduction operation to the aluminum base layer 2238. For example, the aluminum base layer 2238 may define a first thickness 2254 in one region (e.g., the adjacent or main portion 2250), and a second thickness 2256, less than the first thickness, in a second region (e.g., the raised portion 2213). The first thickness 2254 may be between about 0.2 mm and about 0.5 mm, and the second thickness 2256 may be between about 0.1 mm and about 0.3 mm. The thickness of the aluminum base layer 2238 in the raised portion 2213 may be reduced in various ways. For example, a localized etching process (e.g., chemical etching) may be applied to the aluminum base layer 2238 in the target region. In other examples, a machine operation, such as milling, grinding, abrasion, or the like, may be used to locally reduce the thickness of the aluminum base layer 2238. In examples where the reduced thickness is incorporated in a raised (or recessed) portion of the cowling 2210, the thickness reduction operation may be performed after the shaping operation that forms the raised or recessed portion. In other examples, the thickness reduction operation may be performed before the shaping operation. In some examples, a cowling includes regions of reduced thickness at locations that are not also shaped (e.g., are not raised or recessed). In some examples, recessed portions and/or protruding portions are produced by locally thinning the cowling in certain locations to produce the desired thickness profile.

As described above, the graphite structure 2214 may also have different thicknesses at different locations of the cowling 2210. For example, as shown in FIG. 22D, the graphite structure 2214 has a variable thickness, defining a second thickness 2257 in the raised portion 2213 of the cowling, and a first thickness 2258, greater than the second thickness, in the adjacent portion 2250 of the cowling. As shown, the upper surface of the cowling 2210 protrudes in the raised portion 2213. In other cases, a variable-thickness graphite structure 2214 is configured so that the upper surface of the cowling 2210 has a substantially planar upper surface. As described above, the different thicknesses of the graphite structure 2214 may be produced by including a different amount of layers of graphite in different regions of the graphite structure (e.g., fewer graphite layers in the thinner regions of the graphite structure 2214).

Figure 23:
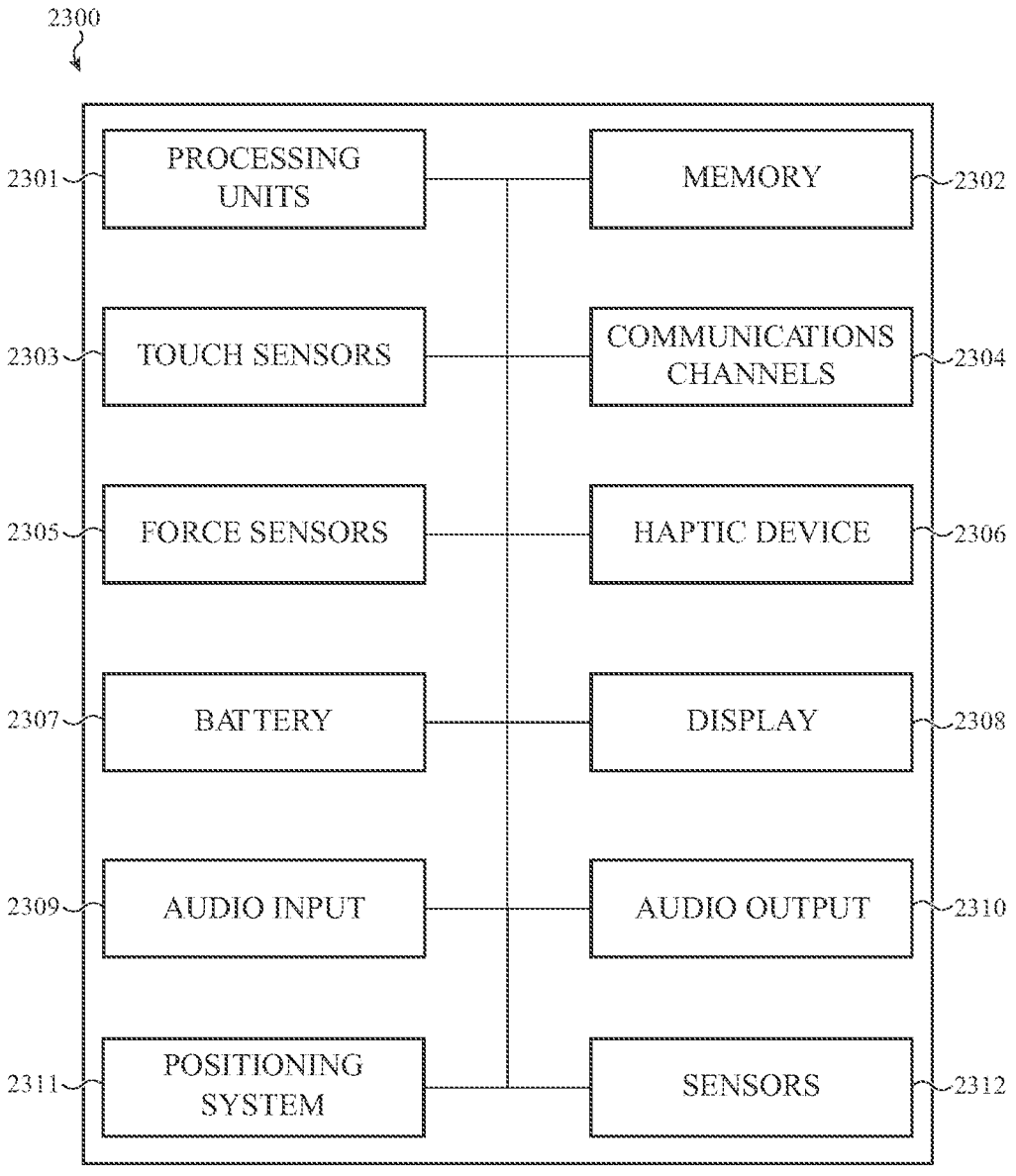
FIG. 23 depicts a schematic diagram of an example electronic device.

FIG. 23 depicts an example schematic diagram of an electronic device 2300. The electronic device 2300 may be an embodiment of or otherwise represent the device 100 (or other devices described herein, such as the devices 100, 140, 200, 300, 400, 550, 960, 1000, 1100, 1210, 1220, 1230, 1430, 1500, 1600, 2100 or the like). The device 2300 includes one or more processing units 2301 that are configured to access a memory 2302 having instructions stored thereon. The instructions or computer programs may be configured to perform one or more of the operations or functions described with respect to the electronic devices described herein. For example, the instructions may be configured to control or coordinate the operation of one or more displays 2308, one or more touch sensors 2303, one or more force sensors 2305, one or more communication channels 2304, one or more audio input systems 2309, one or more audio output systems 2310, one or more positioning systems 2311, one or more sensors 2312, and/or one or more haptic feedback devices 2306.

The processing units 2301 of FIG. 23 may be implemented as any electronic device capable of processing, receiving, or transmitting data or instructions. For example, the processing units 2301 may include one or more of: a microprocessor, a central processing unit (CPU), an application-specific integrated circuit (ASIC), a digital signal processor (DSP), or combinations of such devices. As described herein, the term "processor" is meant to encompass a single processor or processing unit, multiple processors, multiple processing units, or other suitably configured computing element or elements. The processing units 2301 may be coupled to a circuit board assembly, such as the circuit board assemblies 220, 320, 500, 555, 2200.

The memory 2302 can store electronic data that can be used by the device 2300. For example, a memory can store electrical data or content such as, for example, audio and video files, images, documents and applications, device settings and user preferences, programs, instructions, timing and control signals or data for the various modules, data structures or databases, and so on. The memory 2302 can be configured as any type of memory. By way of example only, the memory can be implemented as random access memory, read-only memory, Flash memory, removable memory, or other types of storage elements, or combinations of such devices. The memory 2302 may be coupled to a circuit board assembly, such as the circuit board assemblies 220, 320, 500, 555, 2200.

The touch sensors 2303 may detect various types of touch-based inputs and generate signals or data that are able to be accessed using processor instructions. The touch sensors 2303 may use any suitable components and may rely on any suitable phenomena to detect physical inputs. For example, the touch sensors 2303 may be capacitive touch sensors, resistive touch sensors, acoustic wave sensors, or the like. The touch sensors 2303 may include any suitable components for detecting touch-based inputs and generating signals or data that are able to be accessed using processor instructions, including electrodes (e.g., electrode layers), physical components (e.g., substrates, spacing layers, structural supports, compressible elements, etc.), processors, circuitry, firmware, and the like. The touch sensors 2303 may be integrated with or otherwise configured to detect touch inputs applied to any portion of the device 2300. For example, the touch sensors 2303 may be configured to detect touch inputs applied to any portion of the device 2300 that includes a display (and may be integrated with a display). The touch sensors 2303 may operate in conjunction with the force sensors 2305 to generate signals or data in response to touch inputs. A touch sensor or force sensor that is positioned over a display surface or otherwise integrated with a display may be referred to herein as a touch-sensitive display, force-sensitive display, or touchscreen.

The force sensors 2305 may detect various types of force-based inputs and generate signals or data that are able to be accessed using processor instructions. The force sensors 2305 may use any suitable components and may rely on any suitable phenomena to detect physical inputs. For example, the force sensors 2305 may be strain-based sensors, piezoelectric-based sensors, piezoresistive-based sensors, capacitive sensors, resistive sensors, or the like. The force sensors 2305 may include any suitable components for detecting force-based inputs and generating signals or data that are able to be accessed using processor instructions, including electrodes (e.g., electrode layers), physical components (e.g., substrates, spacing layers, structural supports, compressible elements, etc.), processors, circuitry, firmware, and the like. The force sensors 2305 may be used in conjunction with various input mechanisms to detect various types of inputs. For example, the force sensors 2305 may be used to detect presses or other force inputs that satisfy a force threshold (which may represent a more forceful input than is typical for a standard "touch" input). Like the touch sensors 2303, the force sensors 2305 may be integrated with or otherwise configured to detect force inputs applied to any portion of the device 2300. For example, the force sensors 2305 may be configured to detect force inputs applied to any portion of the device 2300 that includes a display (and may be integrated with a display). The force sensors 2305 may operate in conjunction with the touch sensors 2303 to generate signals or data in response to touch- and/or force-based inputs.

The device 2300 may also include one or more haptic devices 2306 (e.g., the haptic actuator 222, 322 of FIGS. 2-3). The haptic device 2306 may include one or more of a variety of haptic technologies such as, but not necessarily limited to, rotational haptic devices, linear actuators, piezoelectric devices, vibration elements, and so on. In general, the haptic device 2306 may be configured to provide punctuated and distinct feedback to a user of the device. More particularly, the haptic device 2306 may be adapted to produce a knock or tap sensation and/or a vibration sensation. Such haptic outputs may be provided in response to detection of touch and/or force inputs, and may be imparted to a user through the exterior surface of the device 2300 (e.g., via a glass or other surface that acts as a touch- and/or force-sensitive display or surface).

The one or more communication channels 2304 may include one or more wireless interface(s) that are adapted to provide communication between the processing unit(s) 2301 and an external device. The one or more communication channels 2304 may include antennas (e.g., antennas that include or use the housing components of the housings 104, 210, 310 as radiating members), communications circuitry, firmware, software, or any other components or systems that facilitate wireless communications with other devices. In general, the one or more communication channels 2304 may be configured to transmit and receive data and/or signals that may be interpreted by instructions executed on the processing units 2301. In some cases, the external device is part of an external communication network that is configured to exchange data with wireless devices. Generally, the wireless interface may communicate via, without limitation, radio frequency, optical, acoustic, and/or magnetic signals and may be configured to operate over a wireless interface or protocol. Example wireless interfaces include radio frequency cellular interfaces (e.g., 2G, 3G, 4G, 4G long-term evolution (LTE), 5G, GSM, CDMA, or the like), fiber optic interfaces, acoustic interfaces, Bluetooth interfaces, infrared interfaces, USB interfaces, Wi-Fi interfaces, TCP/IP interfaces, network communications interfaces, or any conventional communication interfaces. The one or more communications channels 2304 may also include ultra-wideband (UWB) interfaces, which may include any appropriate communications circuitry, instructions, and number and position of suitable UWB antennas.

As shown in FIG. 23, the device 2300 may include a battery 2307 that is used to store and provide power to the other components of the device 2300. The battery 2307 may be a rechargeable power supply that is configured to provide power to the device 2300. The battery 2307 may be coupled to charging systems (e.g., wired and/or wireless charging systems) and/or other circuitry to control the electrical power provided to the battery 2307 and to control the electrical power provided from the battery 2307 to the device 2300.

The device 2300 may also include one or more displays 2308 configured to display graphical outputs. The displays 2308 may use any suitable display technology, including liquid crystal displays (LCD), organic light emitting diodes (OLED), active-matrix organic light-emitting diode displays (AMOLED), or the like. The displays 2308 may display graphical user interfaces, images, icons, or any other suitable graphical outputs. The display 2308 may correspond to a display 103, 203, or other displays described herein.

The device 2300 may also provide audio input functionality via one or more audio input systems 2309. The audio input systems 2309 may include microphones, transducers, or other devices that capture sound for voice calls, video calls, audio recordings, video recordings, voice commands, and the like.

The device 2300 may also provide audio output functionality via one or more audio output systems (e.g., speakers) 2310, such as the speaker systems and/or modules 224, 250, 324, 350. The audio output systems 2310 may produce sound from voice calls, video calls, streaming or local audio content, streaming or local video content, or the like.

The device 2300 may also include a positioning system 2311. The positioning system 2311 may be configured to determine the location of the device 2300. For example, the positioning system 2311 may include magnetometers, gyroscopes, accelerometers, optical sensors, cameras, global positioning system (GPS) receivers, inertial positioning systems, or the like. The positioning system 2311 may be used to determine spatial parameters of the device 2300, such as the location of the device 2300 (e.g., geographical coordinates of the device), measurements or estimates of physical movement of the device 2300, an orientation of the device 2300, or the like.

The device 2300 may also include one or more additional sensors 2312 to receive inputs (e.g., from a user or another computer, device, system, network, etc.) or to detect any suitable property or parameter of the device, the environment surrounding the device, people, or things interacting with the device (or nearby the device), or the like. For example, a device may include temperature sensors, biometric sensors (e.g., fingerprint sensors, photoplethysmographs, blood-oxygen sensors, blood sugar sensors, or the like), eye-tracking sensors, retinal scanners, humidity sensors, buttons, switches, lid-closure sensors, or the like.

To the extent that multiple functionalities, operations, and structures described with reference to FIG. 23 are disclosed as being part of, incorporated into, or performed by the device 2300, it should be understood that various embodiments may omit any or all such described functionalities, operations, and structures. Thus, different embodiments of the device 2300 may have some, none, or all of the various capabilities, apparatuses, physical features, modes, and operating parameters discussed herein. Further, the systems included in the device 2300 are not exclusive, and the device 2300 may include alternative or additional systems, components, modules, programs, instructions, or the like, that may be necessary or useful to perform the functions described herein.

As described above, one aspect of the present technology is the gathering and use of data available from various sources to improve the usefulness and functionality of devices such as mobile phones. The present disclosure contemplates that in some instances, this gathered data may include personal information data that uniquely identifies or can be used to contact or locate a specific person. Such personal information data can include demographic data, location-based data, telephone numbers, email addresses, twitter IDs, home addresses, data or records relating to a user's health or level of fitness (e.g., vital signs measurements, medication information, exercise information), date of birth, or any other identifying or personal information.

The present disclosure recognizes that the use of such personal information data, in the present technology, can be used to the benefit of users. For example, the personal information data can be used to locate devices, deliver targeted content that is of greater interest to the user, or the like. Further, other uses for personal information data that benefit the user are also contemplated by the present disclosure. For instance, health and fitness data may be used to provide insights into a user's general wellness, or may be used as positive feedback to individuals using technology to pursue wellness goals.

The present disclosure contemplates that the entities responsible for the collection, analysis, disclosure, transfer, storage, or other use of such personal information data will comply with well-established privacy policies and/or privacy practices. In particular, such entities should implement and consistently use privacy policies and practices that are generally recognized as meeting or exceeding industry or governmental requirements for maintaining personal information data private and secure. Such policies should be easily accessible by users, and should be updated as the collection and/or use of data changes. Personal information from users should be collected for legitimate and reasonable uses of the entity and not shared or sold outside of those legitimate uses. Further, such collection/sharing should occur after receiving the informed consent of the users.

Additionally, such entities should consider taking any needed steps for safeguarding and securing access to such personal information data and ensuring that others with access to the personal information data adhere to their privacy policies and procedures. Further, such entities can subject themselves to evaluation by third parties to certify their adherence to widely accepted privacy policies and practices. In addition, policies and practices should be adapted for the particular types of personal information data being collected and/or accessed and adapted to applicable laws and standards, including jurisdiction-specific considerations. For instance, in the US, collection of or access to certain health data may be governed by federal and/or state laws, such as the Health Insurance Portability and Accountability Act (HIPAA); whereas health data in other countries may be subject to other regulations and policies and should be handled accordingly. Hence different privacy practices should be maintained for different personal data types in each country.

Despite the foregoing, the present disclosure also contemplates embodiments in which users selectively block the use of, or access to, personal information data. That is, the present disclosure contemplates that hardware and/or software elements can be provided to prevent or block access to such personal information data. For example, in the case of advertisement delivery services, the present technology can be configured to allow users to select to "opt in" or "opt out" of participation in the collection of personal information data during registration for services or anytime thereafter. In addition to providing "opt in" and "opt out" options, the present disclosure contemplates providing notifications relating to the access or use of personal information. For instance, a user may be notified upon downloading an app that their personal information data will be accessed and then reminded again just before personal information data is accessed by the app.

Moreover, it is the intent of the present disclosure that personal information data should be managed and handled in a way to minimize risks of unintentional or unauthorized access or use. Risk can be minimized by limiting the collection of data and deleting data once it is no longer needed. In addition, and when applicable, including in certain health related applications, data de-identification can be used to protect a user's privacy. De-identification may be facilitated, when appropriate, by removing specific identifiers (e.g., date of birth, etc.), controlling the amount or specificity of data stored (e.g., collecting location data at a city level rather than at an address level), controlling how data is stored (e.g., aggregating data across users), and/or other methods.

Therefore, although the present disclosure broadly covers use of personal information data to implement one or more various disclosed embodiments, the present disclosure also contemplates that the various embodiments can also be implemented without the need for accessing such personal information data. That is, the various embodiments of the present technology are not rendered inoperable due to the lack of all or a portion of such personal information data. For example, content can be selected and delivered to users by inferring preferences based on non-personal information data or a bare minimum amount of personal information, such as the content being requested by the device associated with a user, other non-personal information available to the content delivery services, or publicly available information.

The foregoing description, for purposes of explanation, used specific nomenclature to provide a thorough understanding of the described embodiments. However, it will be apparent to one skilled in the art that the specific details are not required in order to practice the described embodiments. Thus, the foregoing descriptions of the specific embodiments described herein are presented for purposes of illustration and description. They are not targeted to be exhaustive or to limit the embodiments to the precise forms disclosed. It will be apparent to one of ordinary skill in the art that many modifications and variations are possible in view of the above teachings. Also, when used herein to refer to positions of components, the terms above, below, over, under, left, or right (or other similar relative position terms), do not necessarily refer to an absolute position relative to an external reference, but instead refer to the relative position of components within the figure being referred to. Similarly, horizontal and vertical orientations may be understood as relative to the orientation of the components within the figure being referred to, unless an absolute horizontal or vertical orientation is indicated.

Features, structures, configurations, components, techniques, etc. shown or described with respect to any given figure (or otherwise described in the application) may be used with features, structures, configurations, components, techniques, etc. described with respect to other figures. For example, any given figure of the instant application should not be understood to be limited to only those features, structures, configurations, components, techniques, etc. shown in that particular figure. Similarly, features, structures, configurations, components, techniques, etc. shown only in different figures may be used or implemented together. Further, features, structures, configurations, components, techniques, etc. that are shown or described together may be implemented separately and/or combined with other features, structures, configurations, components, techniques, etc. from other figures or portions of the instant specification. Further, for ease of illustration and explanation, figures of the instant application may depict certain components and/or sub-assemblies in isolation from other components and/or sub-assemblies of an electronic device, though it will be understood that components and sub-assemblies that are illustrated in isolation may in some cases be considered different portions of a single electronic device (e.g., a single embodiment that includes multiple of the illustrated components and/or sub-assemblies).

What is claimed is:
1. A mobile phone comprising:
a display;
an enclosure enclosing the display and comprising:
    a front cover positioned over the display and defining a front exterior surface of the mobile phone;
    a housing component coupled to the front cover and defining a chassis section below the front cover and defining:
        a first side facing the front cover;
        a second side opposite the first side and defining a battery mounting recess;
        a first recess formed along the second side in the battery mounting recess; and
        a second recess, separate from the first recess, formed along the second side in the battery mounting recess;
    a battery positioned in the battery mounting recess and coupled to the chassis section;
    a first adhesive positioned in the first recess and adhering the battery to the chassis section; and
    a second adhesive positioned in the second recess and adhering the battery to the chassis section.

2. The mobile phone of claim 1, wherein the first recess and the second recess have a recess depth between about 50 and about 100 microns.

3. The mobile phone of claim 2, wherein a thickness of the first adhesive and the second adhesive is between about 5 microns and about 30 microns greater than the recess depth.

4. The mobile phone of claim 1, wherein:

the battery extends a first distance along a length axis and a second distance along a width axis;

the first adhesive is a first strip of adhesive positioned on a bonding side of the battery and extending along the length axis; and the second adhesive is a second strip of adhesive positioned on the bonding side of the battery and extending along the length axis.

5. The mobile phone of claim 4, wherein the first and second adhesives together cover greater than about 60% of a surface area of the bonding side of the battery.

6. The mobile phone of claim 4, wherein:

the first strip of adhesive is positioned along a first edge of the bonding side of the battery;

the second strip of adhesive is positioned along a second edge of the bonding side of the battery, the second edge opposite the first edge; and a graphical marking is positioned between the first strip of adhesive and the second strip of adhesive on the bonding side of the battery.

7. The mobile phone of claim 1, wherein the first and second adhesives are pressure sensitive adhesive films.

8. The mobile phone of claim 1, wherein the battery contacts a surface of the chassis section between the first recess and the second recess.

9. The mobile phone of claim 1, wherein:

the housing component comprises:

a first wall section defining a first side exterior surface of the mobile phone; and a second wall section defining a second side exterior surface opposite the first side exterior surface; and the chassis section is integrally formed with the first wall section and the second wall section.

10. The mobile phone of claim 1, further comprising an impact barrier structure within the enclosure and extending around a periphery of the battery.

11. The mobile phone of claim 10, wherein:

the housing component comprises a wall defining a side exterior surface of the enclosure;

the mobile phone comprises a circuit board assembly coupled to the chassis section; and the impact barrier structure comprises:

a first barrier member positioned between the battery and the wall; and a second barrier member positioned between the battery and the circuit board assembly.

12. The mobile phone of claim 11, wherein the chassis section is integrally formed with the wall.

13. The mobile phone of claim 11, wherein:

the mobile phone further comprises a camera module; and the impact barrier structure further comprises a third barrier member positioned between the battery and the camera module.

14. The mobile phone of claim 13, wherein the first barrier member, the second barrier member, and the third barrier member are formed from a nonconductive polymer material.

15. The mobile phone of claim 14, wherein:

the first barrier member is adhered to the wall;

the second barrier member is adhered to the circuit board assembly; and the third barrier member is adhered to the camera module.

16. The mobile phone of claim 13, wherein at least one of the first barrier member, the second barrier member, and the third barrier member is coupled to the chassis section.

17. The mobile phone of claim 16, wherein the at least one of the first barrier member, the second barrier member, and the third barrier member is welded to the chassis section.

\* \* \* \* \*